(12) United States Patent
Umezaki et al.

(10) Patent No.: US 8,743,044 B2
(45) Date of Patent: Jun. 3, 2014

(54) DISPLAY DEVICE

(75) Inventors: Atsushi Umezaki, Kanagawa (JP); Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/289,100

(22) Filed: Nov. 4, 2011

(65) Prior Publication Data
US 2012/0056860 A1 Mar. 8, 2012

Related U.S. Application Data

(63) Continuation of application No. 11/853,090, filed on Sep. 11, 2007, now Pat. No. 8,054,279.

(30) Foreign Application Priority Data

Sep. 29, 2006 (JP) ................. 2006-270016

(51) Int. Cl.
G09G 3/36 (2006.01)
(52) U.S. Cl.
USPC ........................................ 345/100
(58) Field of Classification Search
None
See application file for complete search history.

(56) References Cited

U.S. PATENT DOCUMENTS

| 4,578,597 | A | 3/1986 | Soneda et al. |
| 5,631,940 | A | 5/1997 | Fujikura |
| 5,648,790 | A | 7/1997 | Lee |
| 5,666,288 | A | 9/1997 | Jones et al. |
| 5,812,284 | A | 9/1998 | Mizutani et al. |
| 5,907,357 | A | 5/1999 | Maki |
| 6,144,466 | A | 11/2000 | Mizutani et al. |
| 6,278,295 | B1 | 8/2001 | Lovett |
| 6,426,743 | B1 * | 7/2002 | Yeo et al. ............... 345/213 |
| 6,611,248 | B2 | 8/2003 | Kanbara et al. |

(Continued)

FOREIGN PATENT DOCUMENTS

| CN | 1705042 A | 12/2005 |
| CN | 1758321 A | 4/2006 |

(Continued)

OTHER PUBLICATIONS

Soo Young Yoon et al.; "P-172: Late-News Poster: Highly Stable Integrated Gate Driver Circuit using a-Si TFT with Dual Pull-down Structure"; SID 05 Digest; vol. XXXVI, pp. 348-351; 2005.

(Continued)

*Primary Examiner* — Amare Mengistu
*Assistant Examiner* — Antonio Xavier
(74) *Attorney, Agent, or Firm* — Fish & Richardson P.C.

(57) ABSTRACT

To suppress fluctuation in the threshold voltage of a transistor, to reduce the number of connections of a display panel and a driver IC, to achieve reduction in power consumption of a display device, and to achieve increase in size and high definition of the display device. A gate electrode of a transistor which easily deteriorates is connected to a wiring to which a high potential is supplied through a first switching transistor and a wiring to which a low potential is supplied through a second switching transistor; a clock signal is input to a gate electrode of the first switching transistor; and an inverted clock signal is input to a gate electrode of the second switching transistor. Thus, the high potential and the low potential are alternately applied to the gate electrode of the transistor which easily deteriorates.

15 Claims, 104 Drawing Sheets

(56) References Cited

U.S. PATENT DOCUMENTS

| | | | |
|---|---|---|---|
| 6,667,506 B1 | 12/2003 | Reedy et al. | |
| 6,813,332 B2 | 11/2004 | Nagao et al. | |
| 6,928,136 B2 * | 8/2005 | Nagao et al. | 326/119 |
| 7,038,653 B2 | 5/2006 | Moon | |
| 7,057,598 B2 | 6/2006 | Azami et al. | |
| 7,106,292 B2 | 9/2006 | Moon | |
| 7,116,748 B2 | 10/2006 | Nagao et al. | |
| 7,221,197 B2 * | 5/2007 | Morita | 327/112 |
| 7,333,586 B2 | 2/2008 | Jang | |
| 7,336,254 B2 | 2/2008 | Iwasaki et al. | |
| 7,477,226 B2 | 1/2009 | Kim et al. | |
| RE40,673 E | 3/2009 | Kanbara et al. | |
| 7,687,808 B2 | 3/2010 | Umezaki | |
| 7,710,384 B2 | 5/2010 | Azami et al. | |
| 7,825,888 B2 | 11/2010 | Tobita et al. | |
| 7,859,510 B2 | 12/2010 | Umezaki | |
| 7,936,331 B2 | 5/2011 | Uh et al. | |
| 7,964,876 B2 | 6/2011 | Umezaki | |
| 8,264,445 B2 | 9/2012 | Azami et al. | |
| 8,456,396 B2 | 6/2013 | Umezaki | |
| 8,462,100 B2 | 6/2013 | Umezaki | |
| 8,605,027 B2 | 12/2013 | Pak et al. | |
| 8,643,586 B2 | 2/2014 | Umezaki | |
| 2003/0052848 A1 | 3/2003 | Yamaguchi | |
| 2003/0100160 A1 | 5/2003 | Gudesen | |
| 2003/0128180 A1 | 7/2003 | Kim et al. | |
| 2003/0234902 A1 * | 12/2003 | Sasaki et al. | 349/139 |
| 2004/0104882 A1 | 6/2004 | Kitani et al. | |
| 2004/0212632 A1 * | 10/2004 | Inada et al. | 345/690 |
| 2004/0227718 A1 | 11/2004 | Park | |
| 2005/0008114 A1 * | 1/2005 | Moon | 377/64 |
| 2005/0156856 A1 | 7/2005 | Jang et al. | |
| 2005/0185752 A1 * | 8/2005 | Sasaki et al. | 377/64 |
| 2005/0199960 A1 | 9/2005 | Hoffman et al. | |
| 2005/0200392 A1 | 9/2005 | Cho et al. | |
| 2005/0220262 A1 | 10/2005 | Moon | |
| 2005/0220263 A1 * | 10/2005 | Moon | 377/68 |
| 2005/0264514 A1 * | 12/2005 | Kim et al. | 345/100 |
| 2005/0285840 A1 | 12/2005 | Jang et al. | |
| 2006/0001637 A1 * | 1/2006 | Pak et al. | 345/100 |
| 2006/0061535 A1 * | 3/2006 | Kim et al. | 345/98 |
| 2006/0061562 A1 | 3/2006 | Park et al. | |
| 2006/0164376 A1 | 7/2006 | Moon | |
| 2006/0208977 A1 | 9/2006 | Kimura | |
| 2006/0232600 A1 * | 10/2006 | Kimura et al. | 345/605 |
| 2006/0256066 A1 | 11/2006 | Moon | |
| 2006/0262054 A1 * | 11/2006 | Yamazaki et al. | 345/77 |
| 2006/0280279 A1 | 12/2006 | Nagao et al. | |
| 2007/0018918 A1 * | 1/2007 | Chung | 345/76 |
| 2007/0063933 A1 | 3/2007 | Chung | |
| 2008/0079001 A1 | 4/2008 | Umezaki et al. | |
| 2008/0219401 A1 * | 9/2008 | Tobita | 377/79 |
| 2011/0227066 A1 | 9/2011 | Umezaki | |
| 2012/0049184 A1 | 3/2012 | Umezaki et al. | |
| 2013/0251091 A1 | 9/2013 | Nagao et al. | |

FOREIGN PATENT DOCUMENTS

| | | |
|---|---|---|
| EP | 0103645 A1 | 3/1984 |
| EP | 0535569 A2 | 4/1993 |
| EP | 0734026 A2 | 9/1996 |
| EP | 1160796 A2 | 12/2001 |
| EP | 1684310 A1 | 7/2006 |
| EP | 1 895 545 A2 | 3/2008 |
| JP | 58151719 A | 9/1983 |
| JP | 2001-273785 A | 10/2001 |
| JP | 2002-055644 A | 2/2002 |
| JP | 2002335153 A | 11/2002 |
| JP | 2003101406 A | 4/2003 |
| JP | 2003249848 A | 9/2003 |
| JP | 2004103226 A | 4/2004 |
| JP | 2004-157508 A2 | 6/2004 |
| JP | 2004-226429 A | 8/2004 |
| JP | 2005-094335 A | 4/2005 |
| JP | 2005143068 A | 6/2005 |
| JP | 2005-251335 A | 9/2005 |
| JP | 2005-285168 A | 10/2005 |
| JP | 2006-024350 A | 1/2006 |
| JP | 2006058770 A | 3/2006 |
| JP | 2006351171 A | 12/2006 |
| JP | 2007-257812 A | 10/2007 |
| JP | 2008-083692 A | 4/2008 |
| JP | 2008089874 A | 4/2008 |
| JP | 2010250030 A | 11/2010 |
| JP | 2012-083770 A | 4/2012 |
| JP | 2012095303 A | 5/2012 |
| JP | 2012168536 A | 9/2012 |
| JP | 2013-041660 A | 2/2013 |
| JP | 2013-050717 A | 3/2013 |
| TW | 200609885 A | 3/2006 |
| TW | 200614131 A | 5/2006 |
| TW | 200617834 A | 6/2006 |
| TW | 200623006 A | 7/2006 |

OTHER PUBLICATIONS

Binn Kim et al.; "a-Si Gate Driver Integration with Time Shared Data Driving"; IDW/AD '05; vol. XXXVI, pp. 1073-1076; 2005.

Mindoo Chun et al.; "Integrated Gate Driver Using Highly Stable a-Si TFT's"; IDW/AD '05; vol. XXXVI, pp. 1077-1080; 2005.

Chun-Ching Wei et al.; "Integrated Gate Driver Circuit Using a-Si TFT"; IDW/AD '05; vol. XXXVI, pp. 1023-1026; 2005.

Yong Ho Jang et al.; "P-5: A-Si TFT Integrated Gate Driver with AC-driven Single Pull-down Structure", SID 06 Digest; vol. XXXVII, pp. 208-211; 2006.

Jin Young Choi et al.; "P-218L: Late-News Poster: A Compact and Cost-efficient TFT-LCD through the Triple-Gate Pixel Structure"; SID 06 Digest; vol. XXXVII, pp. 274-276; 2006.

YongSoon Lee et al.; "16.2 Advanced TFT-LCD Data Line Reduction Method"; SID 06 Digest; vol. XXXVII, pp. 1083-1086; 2006.

Search Report (European Patent Application No. 07017777.9) dated Jul. 17, 2009.

Chinese Office Action (Application No. 201110096375.9) dated Jan. 30, 2013, with Full English Translation.

Binn Kim et al.; "a-Si Gate Driver Integration with Time Shared Data Driving"; IDW/AD '05; vol. 2, pp. 1073-1076; 2005.

Mindoo Chun et al.; "Integrated Gate Driver Using Highly Stable a-Si TFT's"; IDW/AD '05; vol. 2, pp. 1077-1080; 2005.

Chun-Ching Wei et al.; "Integrated Gate Driver Circuit Using a-Si TFT"; IDW/AD '05; vol. 2, pp. 1023-1026; 2005.

Taiwanese Office Action (TW Application No. 096135199) dated Oct. 18, 2013 with Full English translation, 7 pages.

Korean Office Action (Application No. 2011-0128785) dated Nov. 12, 2013 with English translation, 12 pages.

Dally, Wet al., "4.1 MOS Transistor,", Digital Systems Engineering, Mar. 30, 2003, Maruzen, p. 185 with English translation.

\* cited by examiner

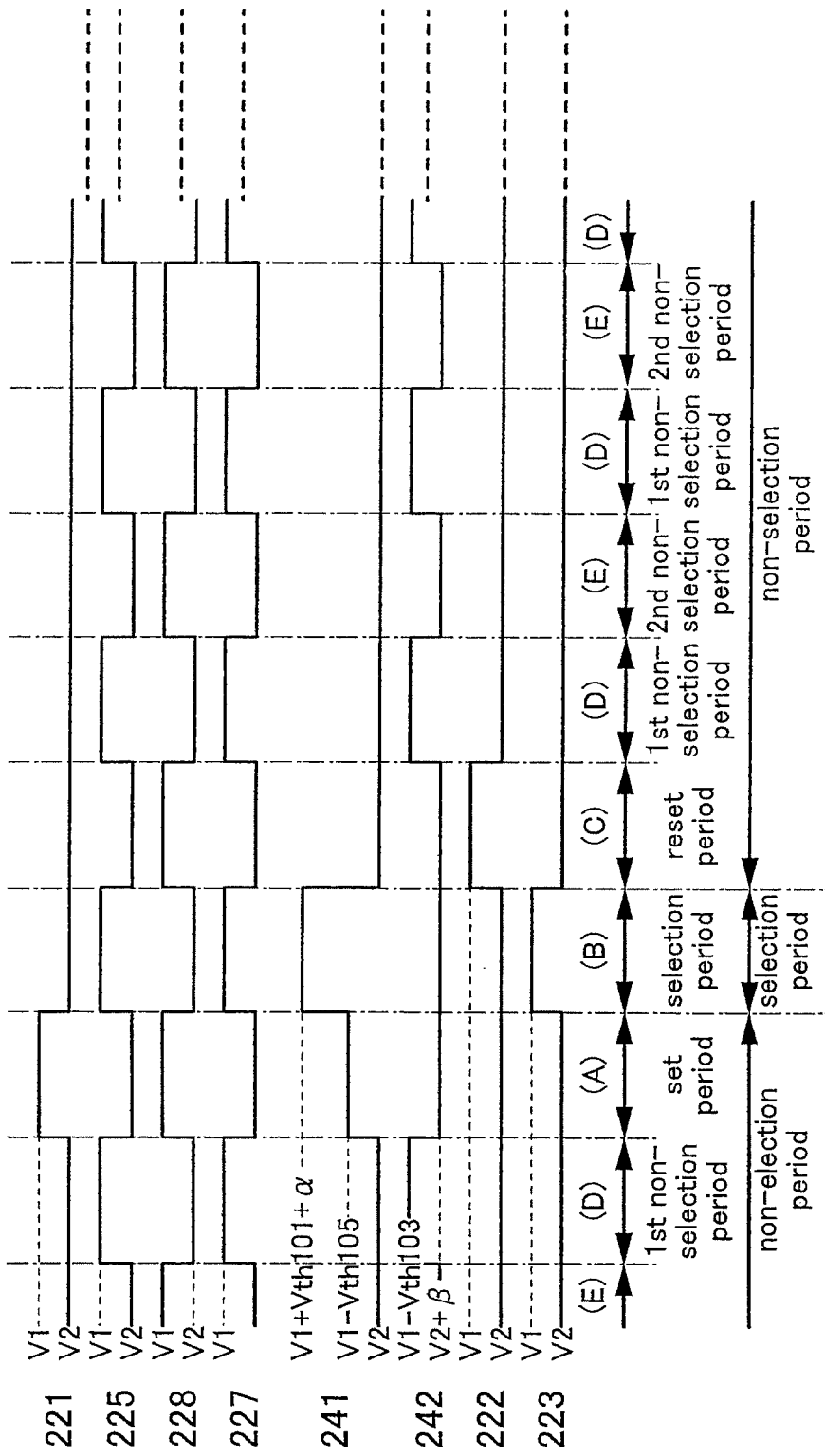

(A) set period (B) selection period (C) reset period (D)1st non-selection period (E)2nd non-selection period

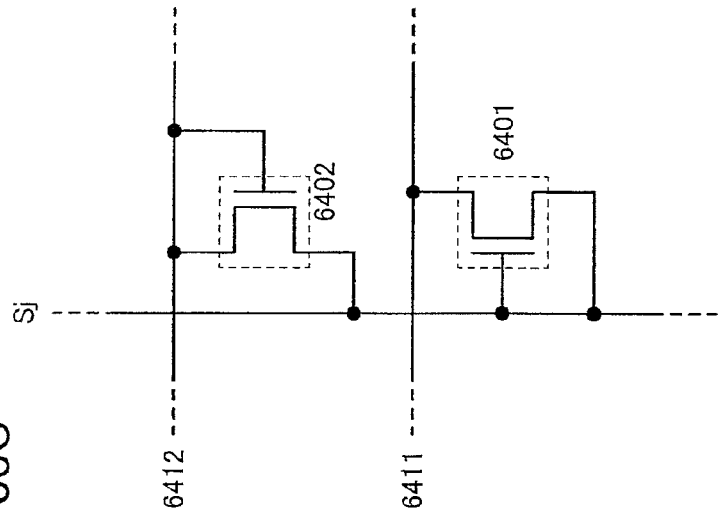
FIG. 38C
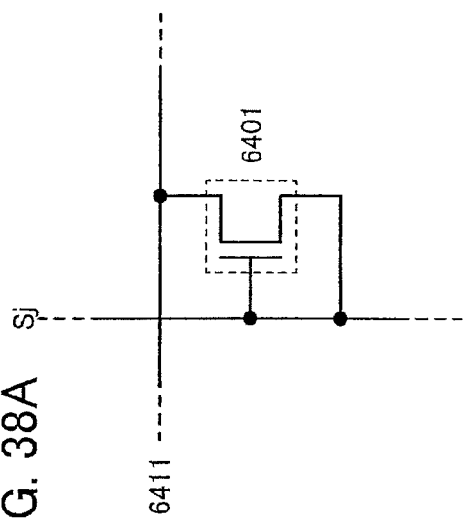
FIG. 38A
FIG. 38B

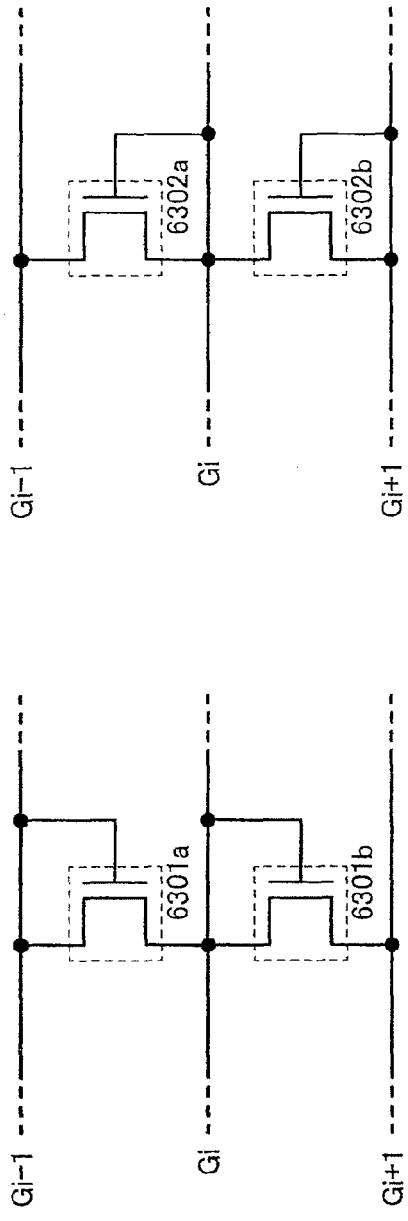
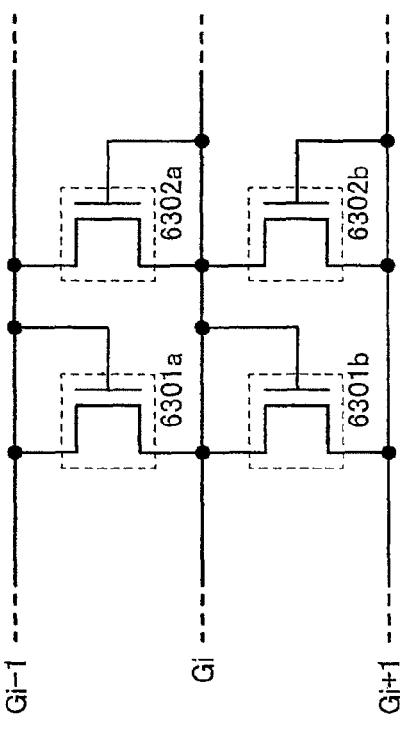
FIG. 39A  FIG. 39B  FIG. 39C

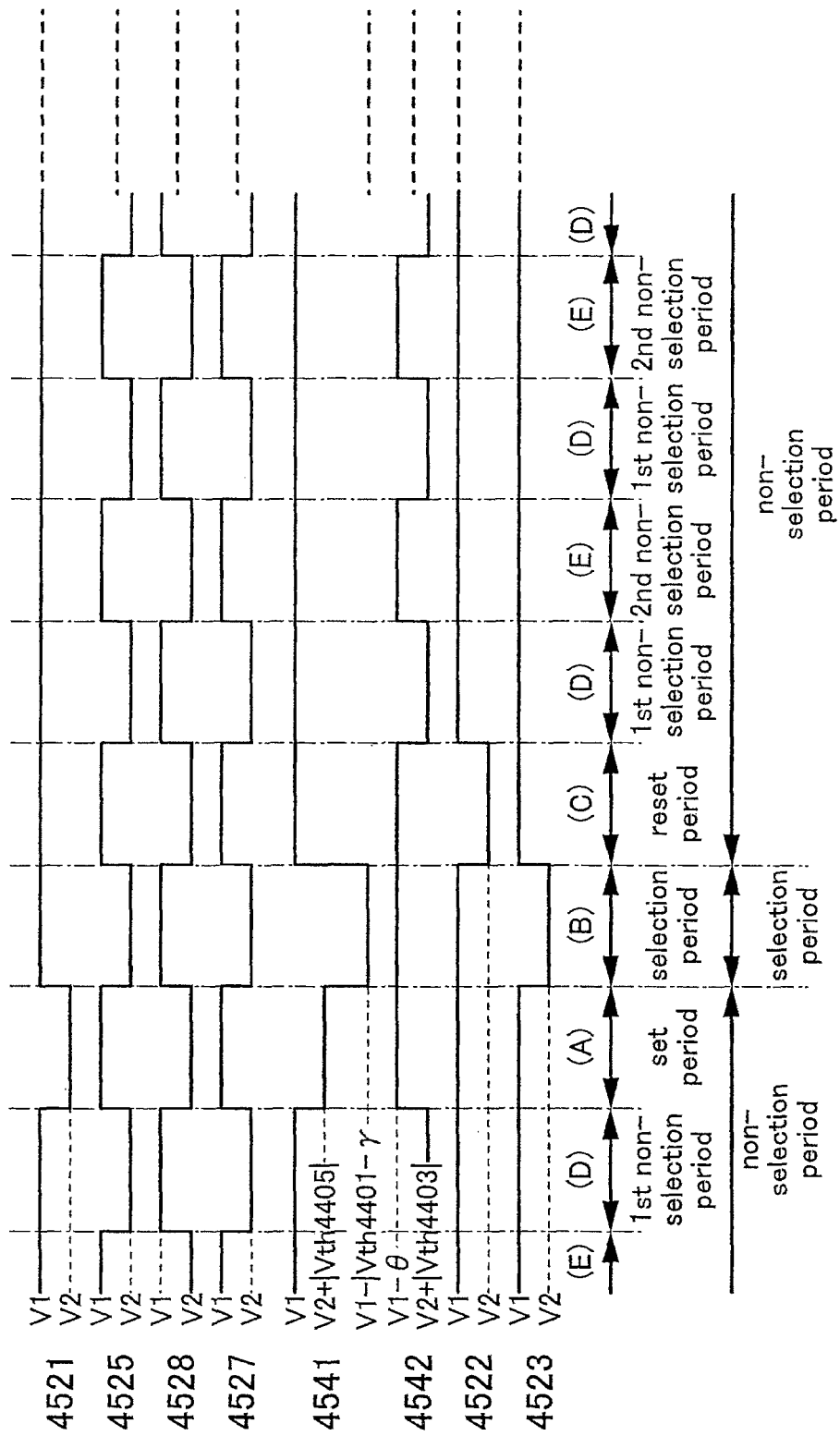

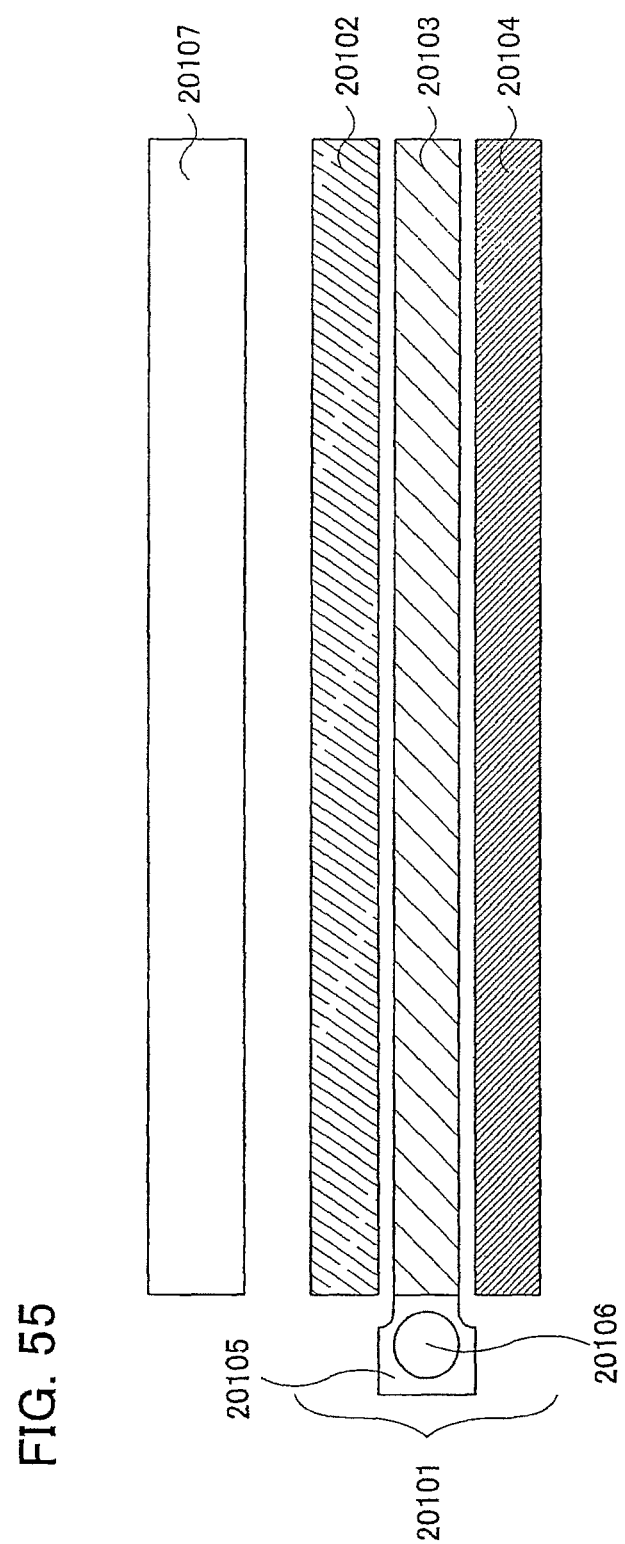

- semiconductor layer
- gate metal
- wiring
- light-transmitting conductive film FIG. 79A
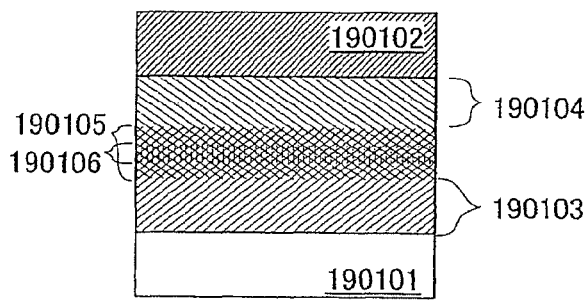
FIG. 79B
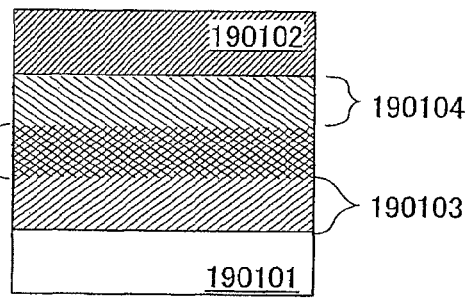
FIG. 79C
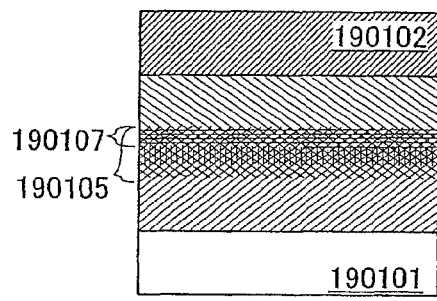
FIG. 79D
FIG. 79E
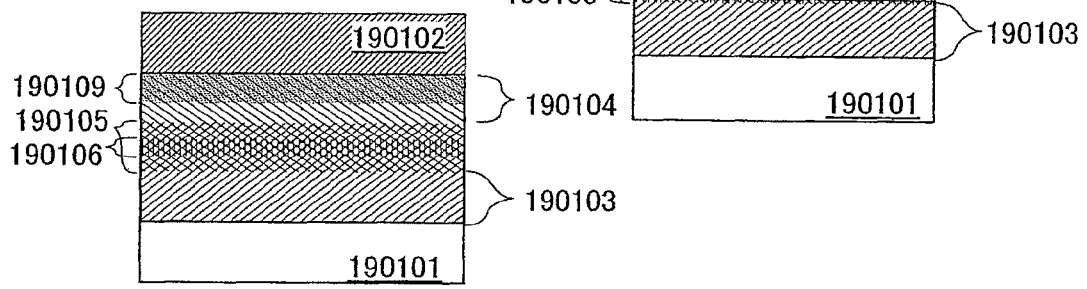

FIG. 82
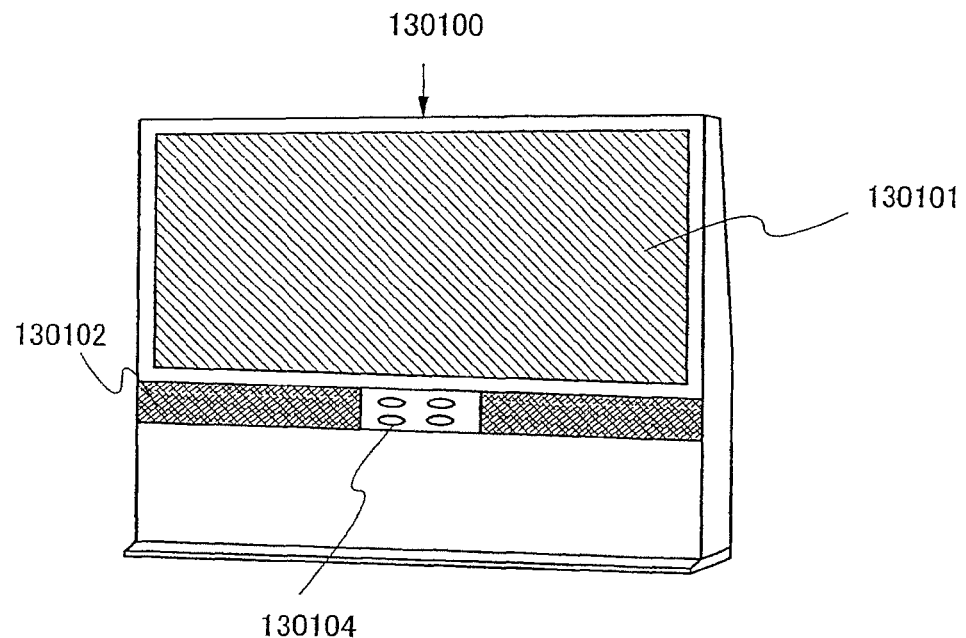
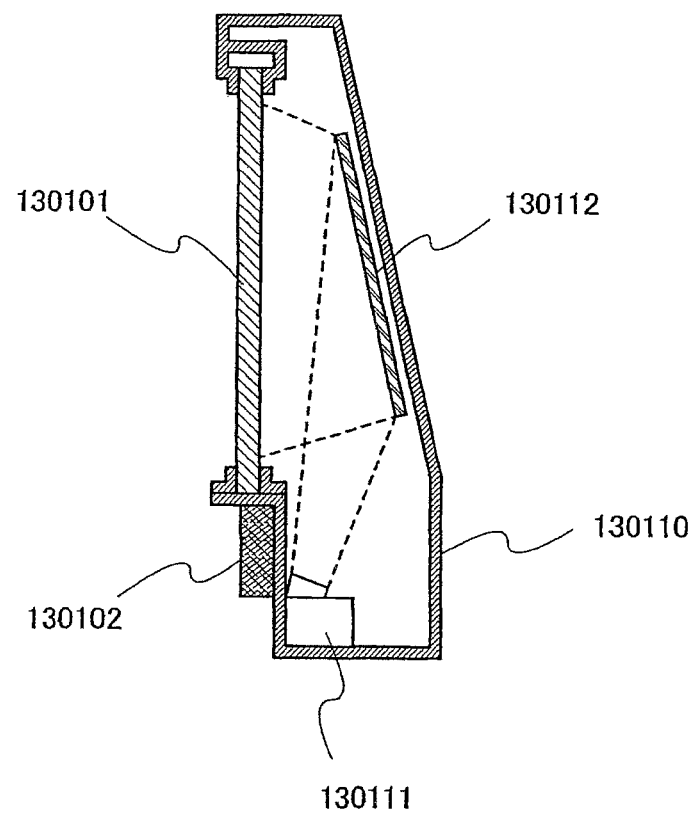

DISPLAY DEVICE

CROSS-REFERENCE TO RELATED APPLICATIONS

This application is a continuation of U.S. application Ser. No. 11/853,090, filed Sep. 11, 2007, now allowed, which claims the benefit of a foreign priority application filed in Japan as Serial No. 2006-270016 on Sep. 29, 2006, both of which are incorporated by reference.

BACKGROUND OF THE INVENTION

1. Field of the Invention

The present invention relates to a display device including a circuit formed by using a transistor. In particular, the present invention relates to a display device using an electro-optical element such as a liquid crystal element, a light-emitting element, or the like as a display medium, and an operating method thereof.

2. Description of the Related Art

In recent years, with the increase of large display devices such as liquid crystal televisions, display devices have been actively developed. In particular, a technique for forming a pixel circuit and a driver circuit including a shift register or the like (hereinafter also referred to as an internal circuit) over the same insulating substrate by using transistors formed of a non-crystalline semiconductor (hereinafter also referred to as amorphous silicon) has been actively developed, because the technique greatly contributes to low power consumption and low cost. The internal circuit formed over the insulating substrate is connected to a controller IC or the like (hereinafter also referred to as an external circuit) through an FPC or the like, and its operation is controlled.

A shift register which is formed by using transistors formed of a non-crystalline semiconductor (hereinafter also referred to as amorphous transistors) has been devised among the above-described internal circuits. FIG. 30A shows a structure of a flip-flop included in a conventional shift register (see Reference 1: Japanese Published Patent Application No. 2004-157508). The flip-flop in FIG. 30A includes a transistor 11, a transistor 12, a transistor 13, a transistor 14, a transistor 15, a transistor 16, and a transistor 17, and is connected to a signal line 21, a signal line 22, a wiring 23, a signal line 24, a power supply line 25, and a power supply line 26. A start signal, a reset signal, a clock signal, a power supply potential VDD, and a power supply potential VSS are input to the signal line 21, the signal line 22, the signal line 24, the power supply line 25, and the power supply line 26, respectively. An operating period of the flip-flop in FIG. 30A is divided into a set period, a selection period, a reset period, and a non-selection period as shown in a timing chart in FIG. 30B, and most of the operating period is the non-selection period.

Here, the transistor 12 and the transistor 16 are on in the non-selection period. Thus, since amorphous silicon is used for a semiconductor layer of each of the transistor 12 and the transistor 16, fluctuation in the threshold voltage (Vth) caused by deterioration or the like occurs. More specifically, the threshold voltage rises. That is, since each of the transistor 12 and the transistor 16 cannot be turned on because of rise in the threshold voltage, VSS cannot be supplied to a node 41 and the wiring 23 and the conventional shift register malfunctions.

In order to solve this problem, a shift register in which a threshold voltage shift of the transistor 12 can be suppressed has been devised in Reference 2 (Soo Young Yoon, et al., "Highly Stable Integrated Gate Driver Circuit using a-Si TFT with Dual Pull-down Structure", SOCIETY FOR INFORMATION DISPLAY 2005 INTERNATIONAL SYMPOSIUM DIGEST OF TECHNICAL PAPERS, Volume XXXVI, pp. 348 to 351), Reference 3 (Binn Kim, et al., "a-Si Gate Driver Integration with Time Shared Data Driving", Proceedings of The 12th International Display Workshops in conjunction with Asia Display 2005, pp. 1073 to 1076), and Reference 4 (Mindoo Chun, et al., "Integrated Gate Driver Using Highly Stable a-Si TFT's", Proceedings of The 12th International Display Workshops in conjunction with Asia Display 2005, pp. 1077 to 1080). In Reference 2, Reference 3, and Reference 4, a new transistor (described as a first transistor) is provided in parallel to the transistor 12 (described as a second transistor), and a threshold voltage shift of each of the first transistor and the second transistor is suppressed by inputting inverted signals to a gate electrode of the first transistor and a gate electrode of the second transistor in the non-selection period.

In addition, a shift register in which not only the threshold voltage shift of the transistor 12 but also a threshold voltage shift of the transistor 16 can be suppressed has been devised in Reference 5 (Chun-Ching, et al., "Integrated Gate Driver Circuit Using a-Si TFT", Proceedings of The 12th International Display Workshops in conjunction with Asia Display 2005, pp. 1023 to 1026). In Reference 5, a new transistor (described as a first transistor) is provided in parallel to the transistor 12 (described as a second transistor), and a new transistor (described as a third transistor) is provided in parallel to the transistor 16 (described as a fourth transistor). Then, a threshold voltage shift of each of the first transistor, the second transistor, the third transistor, and the fourth transistor is suppressed by inputting a signal to a gate electrode of the first transistor and an inverted signal to a gate electrode of the second transistor, and inputting a signal to a gate electrode of the third transistor and an inverted signal to a gate electrode of the fourth transistor in the non-selection period.

Further, the threshold voltage shift of the transistor 12 is suppressed by applying an AC pulse to the gate electrode of the transistor 12 in Reference 6 (Young Ho Jang, et al., "A-Si TFT Integrated Gate Driver with AC-Driven Single Pull-down Structure", SOCIETY FOR INFORMATION DISPLAY 2006 INTERNATIONAL SYMPOSIUM DIGEST OF TECHNICAL PAPERS, Volume XXXVII, pp. 208 to 211).

Note that each of display devices in Reference 7 (Jin Young Choi, et al., "A Compact and Cost-efficient TFT-LCD through the Triple-Gate Pixel Structure", SOCIETY FOR INFORMATION DISPLAY 2006 INTERNATIONAL SYMPOSIUM DIGEST OF TECHNICAL PAPERS, Volume XXXVII, pp. 274 to 276) and Reference 8 (Yong Soon Lee, et al., "Advanced TFT-LCD Data Line Reduction Method", SOCIETY FOR INFORMATION DISPLAY 2006 INTERNATIONAL SYMPOSIUM DIGEST OF TECHNICAL PAPERS, Volume XXXVII, pp. 1083 to 1086), the number of signal lines is reduced to one-third by using a shift register formed using an amorphous silicon transistor as a scan line driver circuit and inputting a video signal to each of subpixels of R, G, and B from one signal line. In each of the display devices in Reference 7 and Reference 8, the number of connections of a display panel and a driver IC is reduced.

SUMMARY OF THE INVENTION

According to a conventional technique, a threshold voltage shift of a transistor is suppressed by applying an AC pulse to a gate electrode of the transistor which easily deteriorates. However, in the case where amorphous silicon is used for a semiconductor layer of the transistor, naturally, it becomes a problem in that a threshold voltage shift of a transistor which forms a circuit generating the AC pulse occurs.

In addition, although it has been proposed that the number of connections of a display panel and a driver IC is reduced by reducing the number of signal lines to one-third (see Reference 7 and Reference 8), further reduction in the number of connections to a driver IC has been practically required.

That is, as problems which are not solved by the conventional technique, a problem of a circuit technique for controlling fluctuation in the threshold voltage of a transistor, a problem of a technique for reducing the number of connections of a driver IC mounted on a display panel, a problem of reduction in power consumption of a display device, and a problem of increase in size and high definition of a display device have been left.

It is an object of the present invention disclosed in this specification to provide an industrially beneficial technique by solving one or a plurality of the aforementioned problems.

In a display device in accordance with the present invention, a threshold voltage shift of a transistor can be suppressed by alternately applying a positive power source and a negative power source to a gate electrode of the transistor which easily deteriorates.

In addition, in a display device in accordance with the present invention, a threshold voltage shift of a transistor can be suppressed by alternately applying a high potential (VDD) and a low potential (VSS) to a gate electrode of the transistor which easily deteriorates through a switch.

Specifically, a gate electrode of a transistor which easily deteriorates is connected to a wiring to which a high potential is supplied through a first switching transistor and a wiring to which a low potential is supplied through a second switching transistor; a clock signal is input to a gate electrode of the first switching transistor; and an inverted clock signal is input to a gate electrode of the second switching transistor. Thus, the high potential and the low potential are alternately applied to the gate electrode of the transistor which easily deteriorates.

Note that various types of switches can be used as a switch shown in this document (a specification, a claim, a drawing, and the like). An electrical switch, a mechanical switch, and the like are given as examples. That is, any element can be used as long as it can control a current flow, without limiting to a certain element. For example, a transistor (e.g., a bipolar transistor or a MOS transistor) a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used as a switch. Alternatively, a logic circuit combining such elements can be used as a switch.

In the case of using a transistor as a switch, polarity (a conductivity type) of the transistor is not particularly limited because it operates just as a switch. However, a transistor of polarity with smaller off-current is preferably used when off-current is to be suppressed. A transistor provided with an LDD region, a transistor with a multi-gate structure, and the like are given as examples of a transistor with smaller off-current. In addition, it is preferable that an N-channel transistor be used when a potential of a source terminal of the transistor which is operated as a switch is closer to a low-potential-side power supply (e.g., Vss, GND, or 0 V), while a P-channel transistor be used when the potential of the source terminal is closer to a high-potential-side power supply (e.g., Vdd). This is because the absolute value of gate-source voltage can be increased when the potential of the source terminal of the transistor which is operated as the switch is closer to a low-potential-side power supply in an N-channel transistor and when the potential of the source terminal of the transistor which is operated as the switch is closer to a high-potential-side power supply in a P-channel transistor, so that the transistor can more accurately operate as a switch. This is also because a source follower operation is not often performed, so that reduction in output voltage does not often occur.

Note that a CMOS switch may be employed by using both N-channel and P-channel transistors. By employing a CMOS switch, the switch can more precisely operate as a switch because current can flow when the P-channel transistor or the N-channel transistor is turned on. For example, voltage can be appropriately output regardless of whether voltage of an input signal of the switch is high or low. In addition, since a voltage amplitude value of a signal for turning on or off the switch can be made small, power consumption can be reduced.

Note also that when a transistor is employed as a switch, the switch includes an input terminal (one of a source terminal and a drain terminal), an output terminal (the other of the source terminal and the drain terminal), and a terminal for controlling electrical conduction (a gate electrode). On the other hand, when a diode is employed as a switch, the switch does not have a terminal for controlling electrical conduction in some cases. Therefore, when a diode is used as a switch, the number of wirings for controlling terminals can be more reduced than the case of using a transistor as a switch.

Note that in this specification, when it is explicitly described that "A and B are connected", the case where elements are electrically connected, the case where elements are functionally connected, and the case where elements are directly connected are included therein. Here, each of A and B corresponds to an object (e.g., a device, an element, a circuit, a wiring, an electrode, a terminal, a conductive film, or a layer). Accordingly, in structures disclosed in this specification, another element may be interposed between elements having a connection relation shown in drawings and texts, without limiting to a predetermined connection relation, for example, the connection relation shown in the drawings and the texts.

For example, in the case where A and B are electrically connected, one or more elements which enable electrical connection of A and B (e.g., a switch, a transistor, a capacitor, an inductor, a resistor, and/or a diode) may be provided between A and B. In addition, in the case where A and B are functionally connected, one or more circuits which enable functional connection of A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a boosting circuit or a voltage lower control circuit) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without interposing another element or another circuit therebetween.

Note that when it is explicitly described that "A and B are directly connected", the case where A and B are directly connected (i.e., the case where A and B are connected without interposing another element or another circuit therebetween) and the case where A and B are electrically connected (i.e., the case where A and B are connected by interposing another element or another circuit therebetween) are included therein.

Note that when it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element can employ various types and can include various elements. For example, as a display element, a display device, a light-emitting element, and a light-emitting device, whose a display medium, contrast, luminance, reflectivity, transmittivity, or the like changes by an electromagnetic action, such as an EL element (e.g., an organic EL element, an inorganic EL element, or an EL element including both organic and inorganic materials), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be employed. Note that display devices using an EL element include an EL display; display devices using an electron emitter include a field emission display (FED), an SED-type flat panel display (SED: Surface-conduction Electron-emitter Display), and the like; display devices using a liquid crystal element include a liquid crystal display (e.g., a transmissive liquid crystal display, a semi-transmissive liquid crystal display, a reflective liquid crystal display, a direct-view liquid crystal display, or a projection liquid crystal display); and display devices using electronic ink include electronic paper.

Note that in this document (the specification, the claim, the drawing, and the like), various types of transistors can be employed as a transistor without limiting to a certain type. For example, a thin film transistor (TFT) including a non-single crystalline semiconductor film typified by amorphous silicon, polycrystalline silicon, microcrystalline (also referred to as semi-amorphous) silicon, or the like can be employed. In the case of using the TFT, there are various advantages. For example, since the TFT can be formed at temperature lower than that of the case of using single crystalline silicon, manufacturing cost can be reduced and a manufacturing device can be made larger. Since the manufacturing device can be made larger, the TFT can be formed using a large substrate. Therefore, since many display devices can be formed at the same time, the TFT can be formed at low cost. In addition, a substrate having low heat resistance can be used because of low manufacturing temperature. Therefore, the transistor can be formed over a light-transmitting substrate. Further, transmission of light in a display element can be controlled by using the transistor formed over the light-transmitting substrate. Alternatively, part of a film which forms the transistor can transmit light because film thickness of the transistor is thin. Accordingly, an aperture ratio can be improved.

Note that by using a catalyst (e.g., nickel) in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed over the same substrate.

Note that by using a catalyst (e.g., nickel) in the case of forming microcrystalline silicon, crystallinity can be further improved and a transistor having excellent electric characteristics can be formed. At this time, crystallinity can be improved by performing heat treatment without using a laser. Accordingly, a gate driver circuit (e.g., a scan line driver circuit) and part of a source driver circuit (e.g., an analog switch) can be formed over the same substrate. In addition, in the case of not using a laser for crystallization, crystallinity unevenness of silicon can be suppressed. Therefore, an image having high image quality can be displayed.

Note also that polycrystalline silicon and microcrystalline silicon can be formed without using a catalyst (e.g., nickel).

In addition, a transistor can be formed by using a semiconductor substrate, an SOI substrate, or the like. In that case, a MOS transistor, a junction transistor, a bipolar transistor, or the like can be used as a transistor described in this specification. Therefore, a transistor with few variations in characteristics, sizes, shapes, or the like, with high current supply capacity, and with a small size can be formed. By using such a transistor, power consumption of a circuit can be reduced or a circuit can be highly integrated.

In addition, a transistor including a compound semiconductor or a oxide semiconductor such as ZnO, a-InGaZnO, SiGe, GaAs, IZO, ITO (Indium Tin Oxide), or SnO, and a thin film transistor or the like obtained by thinning such a compound semiconductor or a oxide semiconductor can be used. Therefore, manufacturing temperature can be lowered and for example, such a transistor can be formed at room temperature. Accordingly, the transistor can be formed directly on a substrate having low heat resistance such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor or the like formed by using an inkjet method or a printing method can also be used. Accordingly, such a transistor can be formed at room temperature, can be formed at a low vacuum, or can be formed using a large substrate. In addition, since the transistor can be formed without using a mask (a reticle), layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

Further, a transistor or the like including an organic semiconductor or a carbon nanotube can be used. Accordingly, such a transistor can be formed using a substrate which can be bent. Therefore, the transistor can resist a shock.

Furthermore, various transistors can be used.

Moreover, a transistor can be formed using various types of substrates. The type of a substrate is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human being can be used as a substrate. In addition, the transistor may be formed using one substrate, and then, the transistor may be transferred to another substrate. A single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. By using such a substrate, a transistor with excellent properties or a transistor with low power consumption can be formed, a device with high durability or high heat resistance can be formed, or reduction in weight can be achieved.

A structure of a transistor can be various modes without limiting to a certain structure. For example, a multi-gate structure having two or more gate electrodes may be used. When the multi-gate structure is used, a structure where a plurality of transistors are connected in series is provided because a structure where channel regions are connected in series is provided. By using the multi-gate structure, off-current can be reduced or the withstand voltage of the transistor can be increased to improve reliability. Alternatively, by using the multi-gate structure, drain-source current does not fluctuate very much even if drain-source voltage fluctuates when the transistor operates in a saturation region, so that a flat slope of voltage-current characteristics can be obtained. By utilizing the flat slope of the voltage-current characteristics, an ideal current source circuit or an active load having a high resistance value can be realized. Accordingly, a differential circuit or a current mirror circuit having excellent properties can be realized. In addition, a structure where gate electrodes are formed above and below a channel may be used. By using the structure where gate electrodes are formed above and below the channel, a channel region is enlarged, so that the amount of current flowing therethrough can be increased or a depletion layer can be easily formed to decrease an S value. When the gate electrodes are formed above and below the channel, a structure where a plurality of transistors are connected in parallel is provided.

Further, a structure where a gate electrode is formed above a channel, a structure where a gate electrode is formed below a channel, a staggered structure, an inversely staggered structure, a structure where a channel region is divided into a plurality of regions, or a structure where channel regions are connected in parallel or in series can be employed. In addition, a source electrode or a drain electrode may overlap with a channel region (or part of it). By using the structure where the source electrode or the drain electrode may overlap with the channel region (or part of it), the case can be prevented in which electric charges are accumulated in part of the channel region, which would result in an unstable operation. Further, an LDD region may be provided. By providing the LDD region, off-current can be reduced or the withstand voltage of the transistor can be increased to improve reliability. Alternatively, drain-source current does not fluctuate very much even if drain-source voltage fluctuates when the transistor operates in the saturation region, so that a flat slope of voltage-current characteristics can be obtained.

Note that various types of transistors can be used for a transistor in this specification and the transistor can be formed using various types of substrates. Accordingly, all of circuits which are necessary to realize a predetermined function may be formed using the same substrate. For example, all of the circuits which are necessary to realize the predetermined function may be formed using a glass substrate, a plastic substrate, a single crystalline substrate, an SOI substrate, or any other substrate. When all of the circuits which are necessary to realize the predetermined function are formed using the same substrate, the number of component parts can be reduced to cut cost and the number of connections to circuit components can be reduced to improve reliability. Alternatively, part of the circuits which are necessary to realize the predetermined function may be formed using one substrate and another part of the circuits which are necessary to realize the predetermined function may be formed using another substrate. That is, not all of the circuits which are necessary to realize the predetermined function are required to be formed using the same substrate. For example, part of the circuits which are necessary to realize the predetermined function may be formed with transistors using a glass substrate and another part of the circuits which are necessary to realize the predetermined function may be formed using a single crystalline substrate, so that an IC chip formed by a transistor using the single crystalline substrate may be connected to the glass substrate by COG (Chip On Glass) and the IC chip may be provided over the glass substrate. Alternatively, the IC chip may be connected to the glass substrate by TAB (Tape Automated Bonding) or a printed wiring board. When part of the circuits are formed using the same substrate in this manner, the number of the component parts can be reduced to cut cost and the number of connections to the circuit components can be reduced to improve reliability. In addition, for example, by forming a portion with high driving voltage or a portion with high driving frequency, which consumes large power, using a single crystalline substrate and using an IC chip formed by the circuit instead of forming such a portion using the same substrate, increase in power consumption can be prevented.

Note also that one pixel corresponds to one element whose brightness can be controlled in this specification. Therefore, for example, one pixel corresponds to one color element and brightness is expressed with the one color element. Accordingly, in the case of a color display device having color elements of R (Red), G (Green), and B (Blue), a minimum unit of an image is formed of three pixels of an R pixel, a G pixel, and a B pixel. Note that the color elements are not limited to three colors, and color elements of more than three colors may be used or a color other than RGB may be added. For example, RGBW (W corresponds to white) may be used by adding white. In addition, RGB plus one or more colors of yellow, cyan, magenta emerald green, vermilion, and the like may be used. Further, a color similar to at least one of R, G, and B may be added to RGB. For example, R, G, B1, and B2 may be used. Although both B1 and B2 are blue, they have slightly different frequency. Similarly, R1, R2, G, and B may be used. By using such color elements, display which is closer to the real object can be performed or power consumption can be reduced. Alternatively, as another example, in the case of controlling brightness of one color element by using a plurality of regions, one region may correspond to one pixel. Therefore, for example, in the case of performing area ratio gray scale display or the case of including a subpixel, a plurality of regions which control brightness are provided in each color element and gray scales are expressed with the whole regions.

In this case, one region which controls brightness may correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. In that case, one color element includes one pixel. In the case where brightness is controlled in a plurality of regions in each color element, regions which contribute to display have different area dimensions depending on pixels in some cases. In addition, in the plurality of regions which control brightness in each color element, signals supplied to each of the plurality of regions may be slightly varied to widen a viewing angle. That is, potentials of pixel electrodes included in the plurality of regions provided in each color element may be different from each other. Accordingly, voltage applied to liquid crystal molecules are varied depending on the pixel electrodes. Therefore, the viewing angle can be widened.

Note that when it is explicitly described that "one pixel (for three colors)", it corresponds to the case where three pixels of R, G, and B are considered as one pixel. Meanwhile, when it is explicitly described that "one pixel (for one color)", it corresponds to the case where the plurality of regions are provided in each color element and collectively considered as one pixel.

Note also that in this document (the specification, the claim, the drawing, and the like), pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Therefore, in the case of performing full color display with three color elements (e.g., RGB), the following cases are included therein: the case where the pixels are arranged in stripes and the case where dots of the three color elements are arranged in a delta pattern. In addition, the case is also included therein in which dots of the three color elements are provided in Bayer arrangement. Note that the color elements are not limited to three colors, and color elements of more than three colors may be employed. RGBW (W corresponds to white), RGB plus one or more of yellow, cyan, magenta, and the like, or the like is given as an example. Further, the sizes of display regions may be different between respective dots of color elements. Thus, power consumption can be reduced and the life of a display element can be prolonged.

Note also that in this document (the specification, the claim, the drawing, and the like), an active matrix method in which an active element is included in a pixel or a passive matrix method in which an active element is not included in a pixel can be used.

In the active matrix method, as an active element (a non-linear element), not only a transistor but also various active elements (non-linear elements) can be used. For example, a MIM (Metal Insulator Metal), a TFD (Thin Film Diode), or the like can also be used. Since such an element has few number of manufacturing steps, manufacturing cost can be reduced or yield can be improved. Further, since size of the element is small, an aperture ratio can be improved, so that power consumption can be reduced or high luminance can be achieved.

As a method other than the active matrix method, the passive matrix method in which an active element (a non-linear element) is not used can also be used. Since an active element (a non-linear element) is not used, manufacturing steps is few, so that manufacturing cost can be reduced or the yield can be improved. Further, since an active element (a non-linear element) is not used, the aperture ratio can be improved, so that power consumption can be reduced or high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, and the like of the transistor, it is difficult to define which is a source or a drain. Therefore, in this specification, a region functioning as a source and a drain may not be called the source or the drain. In such a case, for example, one of the source and the drain may be described as a first terminal and the other thereof may be described as a second terminal. Alternatively, one of the source and the drain may be described as a first electrode and the other thereof may be described as a second electrode. Further alternatively, one of the source and the drain may be described as a source region and the other thereof may be called a drain region.

Note also that a transistor may be an element having at least three terminals of a base, an emitter, and a collector. In this case also, one of the emitter and the collector may be similarly called a first terminal and the other terminal may be called a second terminal.

A gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (Lightly Doped Drain) region, the source region, or the drain region with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

In addition, a portion (a region, a conductive film, a wiring, or the like) which is formed of the same material as a gate electrode, forms the same island as the gate electrode, and is connected to the gate electrode may also be called a gate electrode. Similarly, a portion (a region, a conductive film, a wiring, or the like) which is formed of the same material as a gate wiring, forms the same island as the gate wiring, and is connected to the gate wiring may also be called a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed of the same material as a gate electrode or a gate wiring, forms the same island as the gate electrode or the gate wiring, and is connected to the gate electrode or the gate wiring because of conditions in a manufacturing step. Thus, such a portion (a region, a conductive film, a wiring, or the like) may also be called either a gate electrode or a gate wiring.

In a multi-gate transistor, for example, a gate electrode is often connected to another gate electrode by using a conductive film which is formed of the same material as the gate electrode. Since such a portion (a region, a conductive film, a wiring, or the like) is a portion (a region, a conductive film, a wiring, or the like) for connecting the gate electrode to another gate electrode, it may be called a gate wiring, and it may also be called a gate electrode because a multi-gate transistor can be considered as one transistor. That is, a portion (a region, a conductive film, a wiring, or the like) which is formed of the same material as a gate electrode or a gate wiring, forms the same island as the gate electrode or the gate wiring, and is connected to the gate electrode or the gate wiring may be called either a gate electrode or a gate wiring. In addition, for example, part of a conductive film which connects the gate electrode and the gate wiring and is formed of a material which is different from that of the gate electrode or the gate wiring may also be called either a gate electrode or a gate wiring.

Note that a gate electrode corresponds to part of a portion (a region, a conductive film, a wiring, or the like) of a gate electrode or a portion (a region, a conductive film, a wiring, or the like) which is electrically connected to the gate electrode.

Note that when a gate electrode is called a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. As examples, a wiring for storage capacitance, a power supply line, a reference potential supply line, and the like can be given.

Note also that a source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Accordingly, a region including a small amount of p-type impurities or n-type impurities, namely, an LDD (Lightly Doped Drain) region is not included in the source region. A source electrode is part of a conductive layer formed of a material different from that of a source region, and electrically connected to the source region. However, there is the case where a source electrode and a source region are collectively called a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

In addition, a portion (a region, a conductive film, a wiring, or the like) which is formed of the same material as a source electrode, forms the same island as the source electrode, and is connected to the source electrode, or a portion (a region, a conductive film, a wiring, or the like) which connects a source electrode and another source electrode may also be called a source electrode. Further, a portion which overlaps with a source region may be called a source electrode. Similarly, a portion (a region, a conductive film, a wiring, or the like) which is formed of the same material as a source wiring, forms the same island as the source wiring, and is connected to the source wiring may also be called a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed of the same material as a source electrode or a source wiring, forms the same island as the source electrode or the source wiring, and is connected to the source electrode or the source wiring because of conditions in a manufacturing step. Thus, such a portion (a region, a conductive film, a wiring, or the like) may also be called either a source electrode or a source wiring.

In addition, for example, part of a conductive film which connects a source electrode and a source wiring and is formed of a material which is different from that of the source electrode or the source wiring may be called either a source electrode or a source wiring.

Note that a source terminal corresponds to part of a source region, a source electrode, or a portion (a region, a conductive film, a wiring, or the like) which is electrically connected to the source electrode.

Note that when a source electrode is called a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed of the same material of the source (the drain) of the transistor, or a wiring formed at the same time as the source (the drain) of the transistor in some cases. As examples, a wiring for storage capacitance, a power supply line, a reference potential supply line, and the like can be given.

Note also that the same can be said for a drain.

Note also that a semiconductor device corresponds to a device having a circuit including a semiconductor element (e.g., a transistor, a diode, or thyristor). The semiconductor device may also include all devices that can function by utilizing semiconductor characteristics.

Note also that a display element corresponds to an optical modulation element, a liquid crystal element, a light-emitting element, an EL element (an organic EL element, an inorganic EL element, or an EL element including both organic and inorganic materials), an electron emitter, an electrophoresis element, a discharging element, a light-reflective element, a light diffraction element, a digital micro device (DMD), or the like. Note that the present invention is not limited to this.

In addition, a display device corresponds to a device having a display element. Note that the display device may also corresponds to a display panel itself where a plurality of pixels including display elements are formed over the same substrate as a peripheral driver circuit for driving the pixels. In addition, the display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (FPC) to which an IC chip, a resistor, a capacitor, an inductor, a transistor, or the like is attached. Note also that the display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

Moreover, a lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

In addition, a light-emitting device corresponds to a device having a light-emitting element and the like.

Note that a reflective device corresponds to a device having a light-reflective element, a light diffraction element, light-reflective electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a semi-transmissive liquid crystal display, and the like.

Note also that a driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device.

Note also that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

In this document (the specification, the claim, the drawing, and the like), when it is explicitly described that "B is formed on A" or "B is formed over A", it does not necessarily mean that B is formed in direct contact with A. The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that B is formed above A, it does not necessarily mean that B is formed in direct contact with A, and another object may be interposed therebetween. Accordingly, for example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that B is formed in direct contact with A, it includes not the case where another object is interposed between A and B but the case where B is formed in direct contact with A.

Note that the same can be said when it is explicitly described that B is formed below or under A.

By using the structure disclosed in this specification, deterioration in characteristics of all transistors included in a shift register can be suppressed. Therefore, a malfunction of a semiconductor device such as a liquid crystal display device to which the shift register is applied can be suppressed.

BRIEF DESCRIPTION OF THE DRAWINGS

In the accompanying drawings:

FIG. 2 is a timing chart showing operations of the flip-flop shown in FIGS. 1A to 1C;

FIGS. 38A to 38C are diagrams each showing a structure of the protection diode shown in Embodiment Mode 6;

FIGS. 39A to 39C are diagrams each showing a structure of a display device shown in Embodiment Mode 7;

FIG. 45 is a timing chart showing operations of the flip-flop shown in FIG. 44;

FIG. 55 is a cross-sectional view showing peripheral components of a semiconductor device in accordance with the present invention;

FIGS. 79A to 79E are cross-sectional views of display elements of a semiconductor device in accordance with the present invention;

FIG. 82 is a view showing a structure of a semiconductor device in accordance with the present invention;

DETAILED DESCRIPTION OF THE INVENTION

Figure 1A:
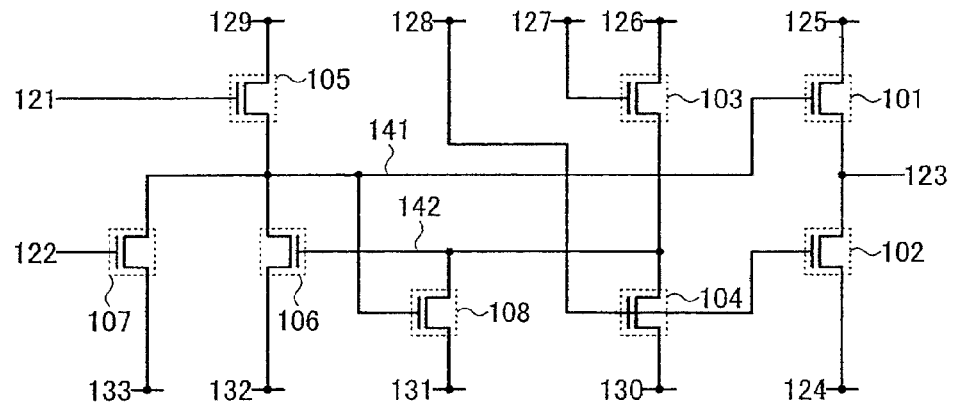
FIGS. 1A to 1C are diagrams each showing a structure of a flip-flop shown in Embodiment Mode 1.

Hereinafter, the present invention will be described by way of embodiment modes with reference to the drawings. However, the present invention can be implemented in various different ways and it will be easily understood by those skilled in the art that various changes and modifications are possible. Unless such changes and modifications depart from the spirit and the scope of the present invention, they should be construed as being included therein. Therefore, the present invention should not be construed as being limited to the description of the embodiment modes.

[Embodiment Mode 1]

In this embodiment mode, structures and driving methods of a flip-flop, a driver circuit including the flip-flop, and a display device including the driver circuit are described.

A basic structure of a flip-flop of this embodiment mode is described with reference to FIG. 1A. A flip-flop shown in FIG. 1A includes a first transistor 101, a second transistor 102, a third transistor 103, a fourth transistor 104, a fifth transistor 105, a sixth transistor 106, a seventh transistor 107, and an eighth transistor 108. In this embodiment mode, each of the first transistor 101, the second transistor 102, the third transistor 103, the fourth transistor 104, the fifth transistor 105, the sixth transistor 106, the seventh transistor 107, and the eighth transistor 108 is an N-channel transistor and is turned on when gate-source voltage (Vgs) exceeds the threshold voltage (Vth).

Note that in the flip-flop of this embodiment mode, the first transistor 101, the second transistor 102, the third transistor 103, the fourth transistor 104, the fifth transistor 105, the sixth transistor 106, the seventh transistor 107, and the eighth transistor 108 are all N-channel transistors. Therefore, since amorphous silicon can be used for a semiconductor layer of each transistor in the flip-flop of this embodiment mode, a manufacturing process can be simplified, and thus manufacturing cost can be reduced and yield can be improved. Note that even when polysilicon or single crystalline silicon is used for the semiconductor layer of each transistor, the manufacturing process can be simplified.

Connection relations of the flip-flop in FIG. 1A are described. A first electrode (one of a source electrode and a drain electrode) of the first transistor 101 is connected to a fifth wiring 125 and a second electrode (the other of the source electrode and the drain electrode) of the first transistor 101 is connected to a third wiring 123. A first electrode of the second transistor 102 is connected to a fourth wiring 124; a second electrode of the second transistor 102 is connected to the third wiring 123; and a gate electrode of the second transistor 102 is connected to an eighth wiring 128. A first electrode of the third transistor 103 is connected to a sixth wiring 126; a second electrode of the third transistor 103 is connected to a gate electrode of the sixth transistor 106; and a gate electrode of the third transistor 103 is connected to a seventh wiring 127. A first electrode of the fourth transistor 104 is connected to a tenth wiring 130; a second electrode of the fourth transistor 104 is connected to the gate electrode of the sixth transistor 106; and a gate electrode of the fourth transistor 104 is connected to the eighth wiring 128. A first electrode of the fifth transistor 105 is connected to a ninth wiring 129; a second electrode of the fifth transistor 105 is connected to a gate electrode of the first transistor 101; and a gate electrode of the fifth transistor 105 is connected to a first wiring 121. A first electrode of the sixth transistor 106 is connected to a twelfth wiring 132 and a second electrode of the sixth transistor 106 is connected to the gate electrode of the first transistor 101. A first electrode of the seventh transistor 107 is connected to a thirteenth wiring 133; a second electrode of the seventh transistor 107 is connected to the gate electrode of the first transistor 101; and a gate electrode of the seventh transistor 107 is connected to a second wiring 122. A first electrode of the eighth transistor 108 is connected to an eleventh wiring 131; a second electrode of the eighth transistor 108 is connected to the gate electrode of the sixth transistor 106; and a gate electrode of the eighth transistor 108 is connected to the gate electrode of the first transistor 101.

Note that a connection point of the gate electrode of the first transistor 101, the second electrode of the sixth transistor 106, the second electrode of the seventh transistor 107, and the gate electrode of the eighth transistor 108 is denoted by a node 141. Further, a connection point of the second electrode of the third transistor 103, the second electrode of the fourth transistor 104, the gate electrode of the sixth transistor 106, and the second electrode of the eighth transistor 108 is denoted by a node 142.

Note that the first wiring 121, the second wiring 122, the third wiring 123, the fifth wiring 125, the seventh wiring 127, and the eighth wiring 128 may be referred to as a first signal line, a second signal line, a third signal line, a fourth signal line, a fifth signal line, and a sixth signal line, respectively. Further, the fourth wiring 124, the sixth wiring 126, the ninth wiring 129, the tenth wiring 130, the eleventh wiring 131, the twelfth wiring 132, and the thirteenth wiring 133 may be referred to as a first power supply line, a second power supply line, a third power supply line, a fourth power supply line, a fifth power supply line, a sixth power supply line, and a seventh power supply line, respectively.

Next, operations of the flip-flop shown in FIG. 1A are described with reference to a timing chart in FIG. 2, and FIGS. 3A to 4B. Note that the timing chart in FIG. 2 is described by dividing the whole period into a set period, a selection period, a reset period, a first non-selection period, and a second non-selection period. Note also that the set period, the reset period, the first non-selection period, and the second non-selection period are collectively referred to as a non-selection period in some cases.

Note that a potential of V1 is supplied to the sixth wiring 126 and the ninth wiring 129, and a potential of V2 is supplied to the fourth wiring 124, the tenth wiring 130, the eleventh wiring 131, the twelfth wiring 132, and the thirteenth wiring 133. Here, V1>V2 is satisfied.

Note that a signal 221, a signal 225, a signal 228, a signal 227, and a signal 222 shown in FIG. 2 are input to the first wiring 121, the fifth wiring 125, the eighth wiring 128, the seventh wiring 127, and the second wiring 122, respectively. In addition, a signal 223 shown in FIG. 2 is output from the third wiring 123. Here, each of the signal 221, the signal 225, the signal 228, the signal 227, the signal 222, and the signal 223 is a digital signal in which a potential of an H-level signal is at V1 (hereinafter also referred to as an H level) and a potential of an L-level signal is at V2 (hereinafter also referred to as an L level). Further, the signal 221, the signal 225, the signal 228, the signal 227, the signal 222, and the signal 223 may be referred to as a start signal, a power clock signal (PCK), a first control clock signal (CCK1), a second control clock signal (CCK2), a reset signal, and an output signal, respectively.

Note that any signal, potential, or current may be input to each of the first wiring 121, the second wiring 122, the fourth wiring 124, the fifth wiring 125, the sixth wiring 126, the seventh wiring 127, the eighth wiring 128, the ninth wiring 129, the tenth wiring 130, the eleventh wiring 131, the twelfth wiring 132, and the thirteenth wiring 133.

Figure 3A:
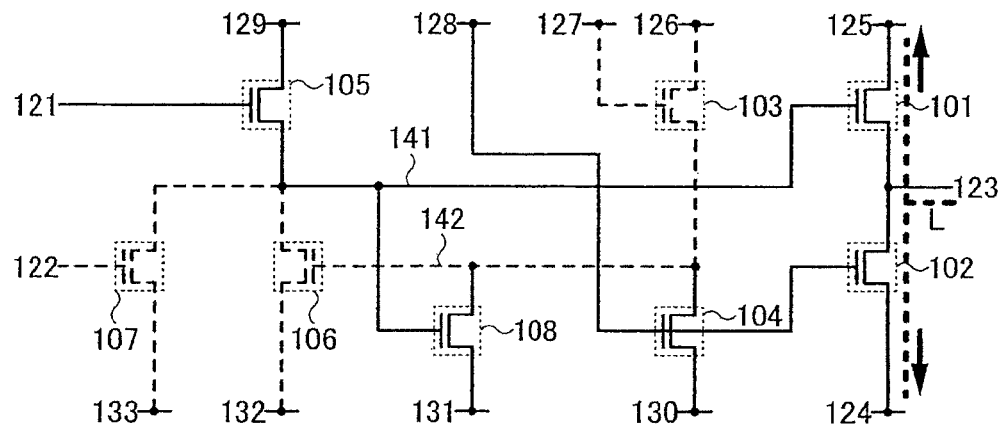
FIGS. 3A to 3C are diagrams each showing operations of the flip-flop shown in FIGS. 1A to 1C.

First, in the set period shown in period A of FIG. 2 and FIG. 3A, the signal 221 becomes an H level and the fifth transistor 105 is turned on; the seventh transistor 107 is turned off because the signal 222 is at an L level; the signal 228 becomes an H level and the second transistor 102 and the fourth transistor 104 are turned on; and the signal 227 becomes an L level and the third transistor 103 is turned off. A potential of the node 141 (a potential 241) at this time becomes V1−Vth105 (Vth105 corresponds to the threshold voltage of the fifth transistor 105) because the second electrode of the fifth transistor 105 corresponds to the source electrode and the potential of the node 141 (the potential 241) becomes a value obtained by subtracting the threshold voltage of the fifth transistor 105 from a potential of the ninth wiring 129. Thus, the first transistor 101 and the eighth transistor 108 are turned on and the fifth transistor 105 is turned off. A potential of the node 142 (a potential 242) at this time becomes V2 and the sixth transistor 106 is turned off. Since the third wiring 123 is connected to the fifth wiring 125 to which an L-level signal is input and the fourth wiring 124 to which V2 is supplied in the set period in this manner, a potential of the third wiring 123 becomes V2. Therefore, an L-level signal is output from the third wiring 123. Further, the node 141 enters into a floating state while being kept at V1−Vth105.

Figure 5A:
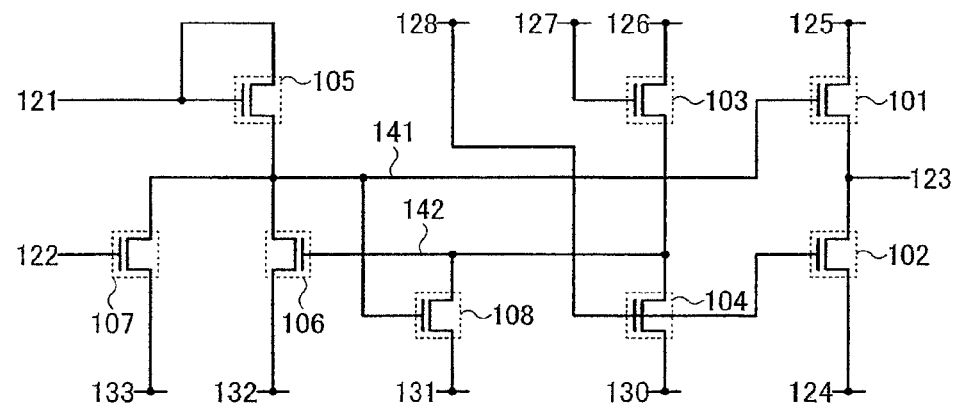
FIGS. 5A to 5C are diagrams each showing a structure of the flip-flop shown in Embodiment Mode 1.

Note that the flip-flop of this embodiment mode can perform operations which are similar to those in the above-described set period even when the first electrode of the fifth transistor 105 is connected to the first wiring 121 as shown in FIG. 5A. Since the ninth wiring 129 is not necessary in a flip-flop in FIG. 5A, yield can be improved. Further, in the flip-flop in FIG. 5A, a layout area can be reduced.

Figure 5B:
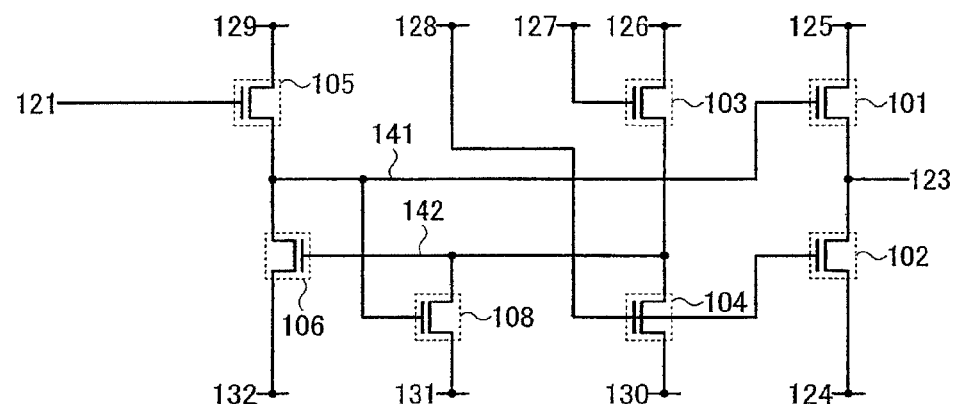
Figure 5C:
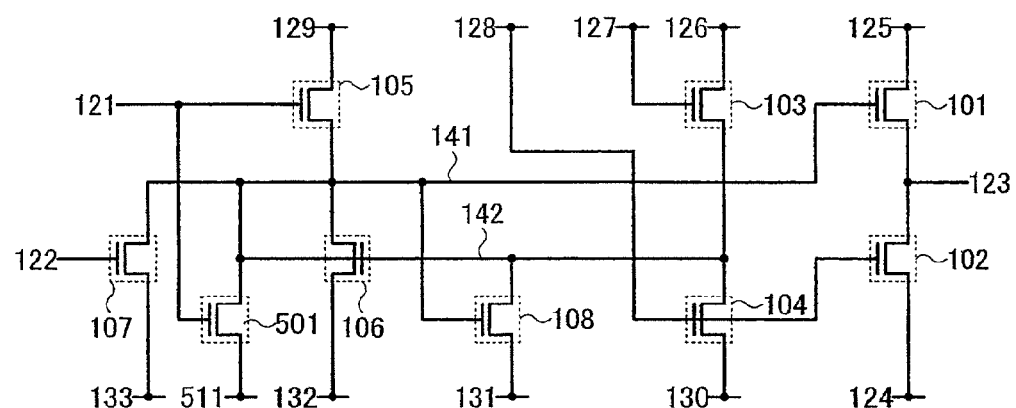

Note that in the flip-flop of this embodiment mode, a transistor 501 may be additionally provided as shown in FIG. 5C. A first electrode of the transistor 501 is connected to a wiring 511 to which V2 is supplied; a second electrode of the transistor 501 is connected to the node 141; and a gate electrode of the transistor 501 is connected to the first wiring 121. Since time at which the potential of the node 142 lowers can be shortened by the transistor 501 in a flip-flop in FIG. 5C, the sixth transistor 106 can be turned off quickly. Therefore, since time at which the potential of the node 141 becomes V1−Vth105 can be shortened in the flip-flop in FIG. 5C, high speed operation can be performed and the flip-flop in FIG. 5C can be applied to a larger display device or a higher-definition display device.

Figure 3B:
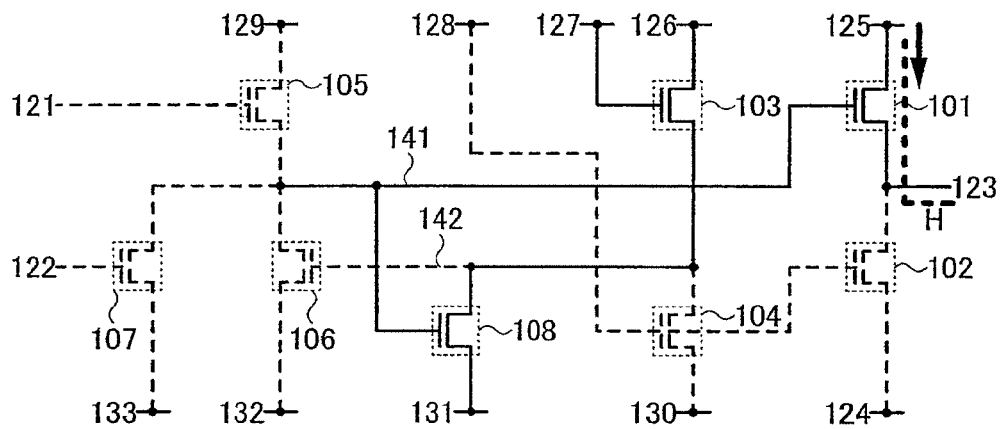

In the selection period shown in period B of FIG. 2 and FIG. 3B, the signal 221 becomes an L level and the fifth transistor 105 is turned off; the seventh transistor 107 remains off because the signal 222 remains at an L level; the signal 228 becomes an L level and the second transistor 102 and the fourth transistor 104 are turned off; and the signal 227 becomes an H level and the third transistor 103 is turned on. The node 141 at this time remains at V1−Vth105. Thus, the first transistor 101 and the eighth transistor 108 remain on. The potential of the node 142 at this time becomes V2+β (β corresponds to a given positive number) because a potential difference (V1−V2) between a potential of the eleventh wiring 131 (V2) and a potential of the sixth wiring 126 (V1) is voltage divided by the third transistor 103 and the eighth transistor 108. Further, β<Vth106 (the threshold voltage of the sixth transistor 106) is satisfied. Thus, the sixth transistor 106 remains off. Here, since an H-level signal is input to the fifth wiring 125, the potential of the third wiring 123 starts to rise. Then, the potential of the node 141 rises from V1−Vth105 by a bootstrap operation and becomes V1+Vth101+α (Vth 101 corresponds to the threshold voltage of the first transistor and α corresponds to a given positive number). Therefore, the potential of the third wiring 123 becomes V1 because it becomes a potential which is equal to that of the fifth wiring 125. Since the third wiring 123 is connected to the fifth wiring 125 to which the H-level signal is supplied in the selection period in this manner, the potential of the third wiring 123 becomes V1. Therefore, an H-level signal is output from the third wiring 123.

Figure 1B:
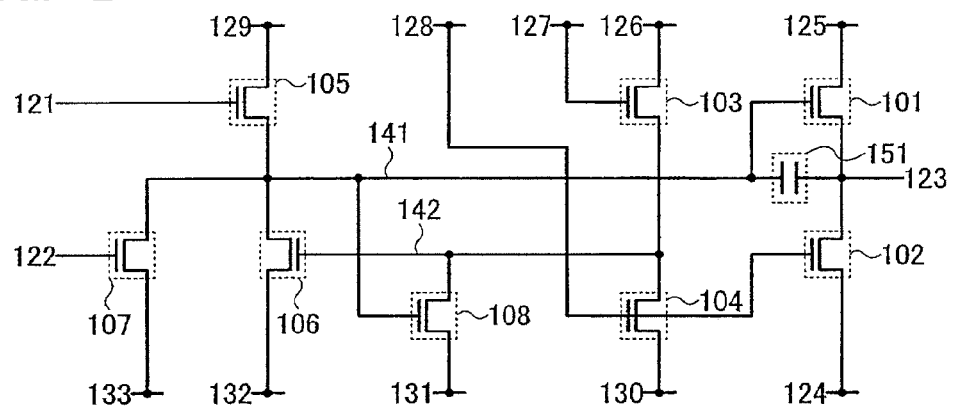

Note that this bootstrap operation is performed by capacitive coupling of parasitic capacitance between the gate electrode and the second electrode of the first transistor 101. Note also that the bootstrap operation can be stably performed by providing a capacitor 151 between the gate electrode and the second electrode of the first transistor 101 as shown in FIG. 1B, and the parasitic capacitance of the first transistor 101 can be reduced. Here, in the capacitor 151, a gate insulating film may be used as an insulating layer and a gate electrode layer and a wiring layer may be used as conductive layers; a gate insulating film may be used as the insulating layer and a gate electrode layer and a semiconductor layer to which an impurity is added may be used as the conductive layers; or an interlayer film (an insulating film) may be used as the insulating layer and a wiring layer and a light-transmitting electrode layer may be used as the conductive layers. Note also that when a gate electrode layer and a wiring layer are used as the conductive layers in the capacitor 151, it is preferable that the gate electrode layer be connected to the gate electrode of the first transistor 101 and the wiring layer be connected to the second electrode of the first transistor 101. When a gate electrode layer and a wiring layer are used as the conductive layers, it is more preferable that the gate electrode layer be directly connected to the gate electrode of the first transistor 101 and the wiring layer be directly connected to the second electrode of the first transistor 101. This is because increase in a layout area of the flip-flop due to provision of the capacitor 151 is suppressed.

Figure 1C:
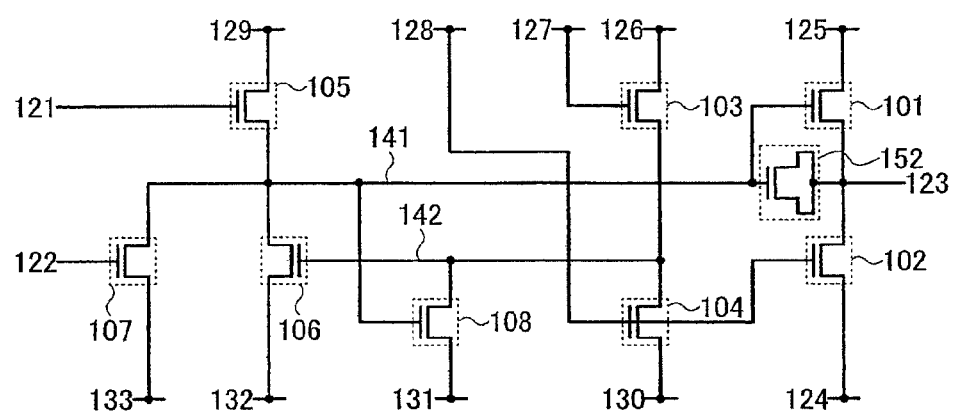

Further, as shown in FIG. 1C, a transistor 152 may be used as the capacitor 151. A gate electrode of the transistor 152 is connected to the node 141 and a first electrode and a second electrode of the transistor 152 are connected to the third wiring 123, so that the transistor 152 can function as a capacitor having a large capacitance component. Note that the transistor 152 can function as a capacitor even when one of the first electrode and the second electrode of the transistor 152 is in a floating state.

Note that it is necessary that the first transistor 101 supply an H-level signal to the third wiring 123. Therefore, in order to shorten fall time and rise time of the signal 223, it is preferable that the first transistor 101 have the largest value of W/L (a ratio of a channel width W to a channel length L) among the first transistor 101 to eighth transistor 108.

Further, since it is necessary that the fifth transistor 105 set the potential of the node 141 (the gate electrode of the first transistor 101) at V1−Vth105 in the set period, a value of W/L of the fifth transistor 105 is preferably, 1/2 to 1/5 times, more preferably, 1/3 to 1/4 times the value of W/L of the first transistor 101.

In order to set the potential of the node 142 at V24+β, it is preferable that a value of W/L (a ratio of a channel width W to a channel length L) of the eighth transistor 108 be at least ten times a value of W/L of the third transistor 103. Therefore, a transistor size (W×L) of the eighth transistor 108 is increased. Here, by setting the value of the channel length L of the third transistor 103 longer than the channel length L of the eighth transistor 108, preferably, two to three times the channel length L of the eighth transistor 108, the transistor size of the eighth transistor 108 can be decreased. Therefore, a layout area can be reduced.

Figure 3C:
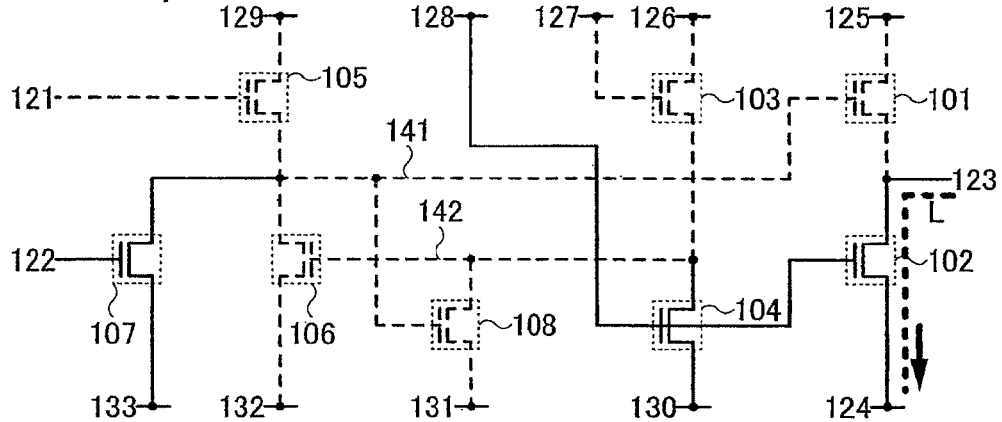

In the reset period shown in period C of FIG. 2 and FIG. 3C, the fifth transistor 105 remains off because the signal 221 remains at an L level; the signal 222 becomes an H level and the seventh transistor 107 is turned on; the signal 228 becomes an H level and the second transistor 102 and the fourth transistor 104 are turned on; and the signal 227 becomes an L level and the third transistor 103 is turned off. The potential of the node 141 at this time becomes V2 because a potential of the thirteenth wiring 133 is supplied through the seventh transistor 107. Thus, the first transistor 101 and the eighth transistor 108 are turned off. The potential of the node 142 at this time becomes V2 because the fourth transistor 104 is turned on. Thus, the sixth transistor 106 is turned off. Since the third wiring 123 is connected to the fourth wiring 124 to which V2 is supplied in the reset period in this manner, the potential of the third wiring 123 becomes V2. Therefore, an L-level signal is output from the third wiring 123.

Note that by delaying timing at which the seventh transistor 107 is turned on, the fall time of the signal 223 can be shortened. This is because an L-level signal which is input to the fifth wiring 125 can be supplied to the third wiring 123 through the first transistor 101 having a larger value of W/L.

Alternatively, by decreasing the value of W/L of the seventh transistor 107 and lengthening fall time which is necessary for the potential of the node 141 to become V2, the fall time of the signal 223 can also be shortened. In this case, the value of W/L of the seventh transistor 107 is preferably, 1/10 to 1/40 times, more preferably, 1/20 to 1/30 times the value W/L of the first transistor 101.

Note that operations which are similar to those in the above-described reset period can be performed even when the seventh transistor 107 is not provided as shown in FIG. 5B. Since the transistor and the wirings can be reduced in the flip-flop in FIG. 5B, a layout area can be reduced.

Figure 4A:
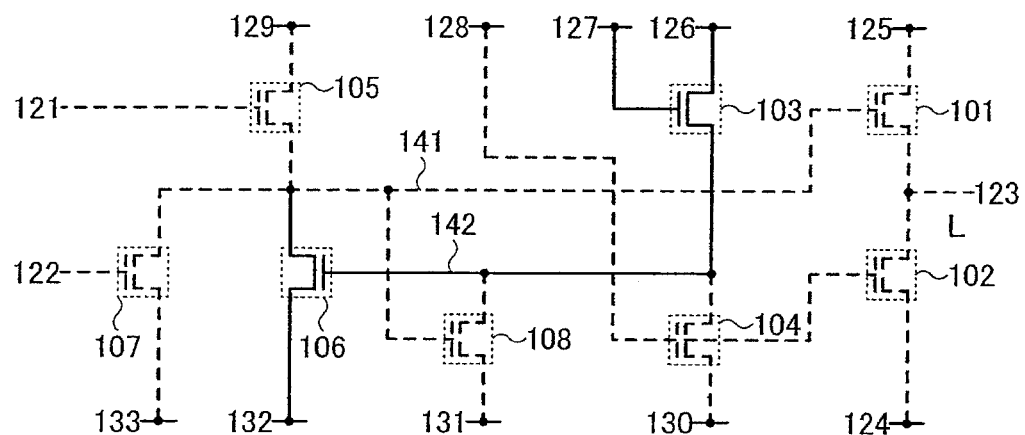
FIGS. 4A and 4B are diagrams each showing operations of the flip-flop shown in FIGS. 1A to 1C.

In the first non-selection period shown in period D of FIG. 2 and FIG. 4A, the fifth transistor 105 remains off because the signal 221 remains at an L level; the signal 222 becomes an L level and the seventh transistor 107 is turned off; the signal 228 becomes an L level and the second transistor 102 and the fourth transistor 104 are turned off; and the signal 227 becomes an H level and the third transistor 103 is turned on.

The potential of the node 142 at this time becomes V1−Vth103 (Vth103 corresponds to the threshold voltage of the third transistor 103) because the second electrode of the third transistor 103 corresponds to the source electrode and the potential of the node 142 becomes a value obtained by subtracting the threshold voltage of the third transistor 103 from a potential of the seventh wiring 127 (V1). Thus, the sixth transistor 106 is turned on. The potential of the node 141 at this time becomes V2 because the sixth transistor 106 is turned on. Thus, the first transistor 101 and the eighth transistor 108 remain off. In this manner, in the first non-selection period, the third wiring 123 enters into a floating state and remains at V2.

Note that each of the flip-flops of this embodiment mode can suppress a threshold voltage shift of the second transistor 102 by turning off the second transistor 102.

Note that a threshold voltage shift of the third transistor 103 can be suppressed by setting a potential of the signal 227 at V1 or less and lowering a potential of the gate electrode of the third transistor 103. Further, a threshold voltage shift of the fourth transistor 104 and the threshold voltage shift of the second transistor 102 can be suppressed by setting a potential of the signal 228 at V2 or less and applying reverse bias voltage to the fourth transistor 104 and the second transistor 102.

Figure 9A:
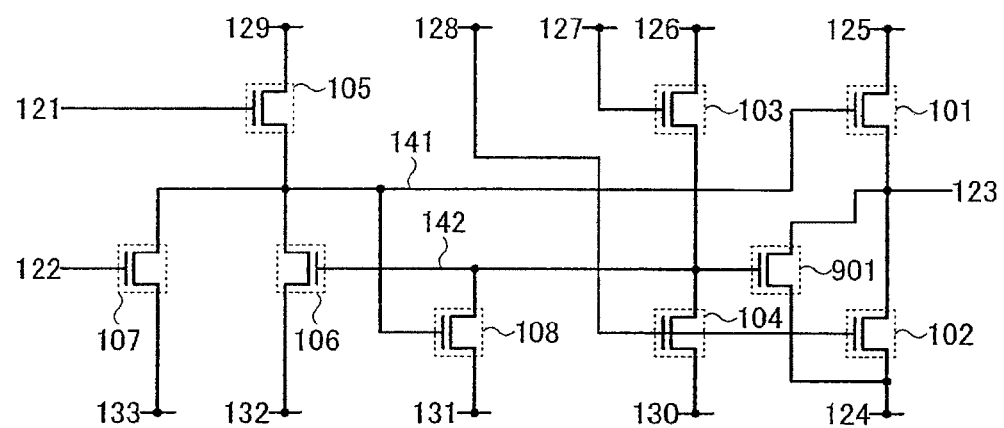
FIGS. 9A and 9B are diagrams each showing a structure of the flip-flop shown in Embodiment Mode 1.
Figure 9B:
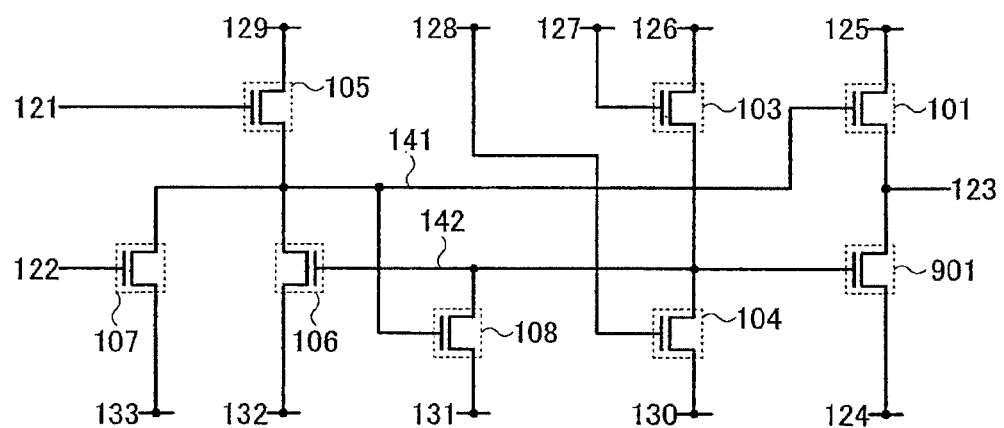

Note also that V2 can be supplied to the third wiring 123 by additionally providing a transistor 901 as shown in FIG. 9A. A first electrode of the transistor 901 is connected to the fourth wiring 124; a second electrode of the transistor 901 is connected to the third wiring 123; and a gate electrode of the transistor 901 is connected to the node 142. Therefore, on/off of the transistor 901 is controlled at the same timing as the sixth transistor 106. Accordingly, since the third wiring 123 does not enter into a floating state, a flip-flop in FIG. 9A can resist noise. Further, the transistor 901 can be provided instead of the second transistor 102 as shown in FIG. 9B.

Figure 4B:
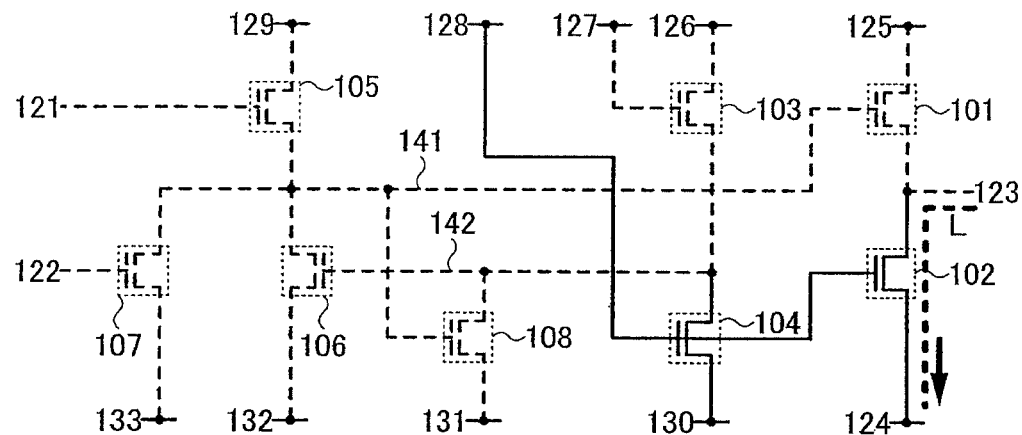

In the second non-selection period shown in period E of FIG. 2 and FIG. 4B, the fifth transistor 105 remains off because the signal 221 remains at an L level; the seventh transistor 107 remains off because the signal 222 remains at an L level; the signal 228 becomes an H level and the second transistor 102 and the fourth transistor 104 are turned on; and the signal 227 becomes an L level and the third transistor 103 is turned off. The potential of the node 142 at this time becomes V2 because the fourth transistor 104 is turned on. Thus, the sixth transistor 106 is turned off. The node 141 at this time remains at V2 because the node 141 enters into a floating state. Thus, the first transistor 101 and the eighth transistor 108 remain off. Since the third wiring 123 is connected to the fourth wiring 124 to which V2 is supplied in the second non-selection period in this manner, the potential of the third wiring 123 becomes V2. Therefore, an L-level signal is output from the third wiring 123.

Note that each of the flip-flops of this embodiment mode can suppress a threshold voltage shift of the sixth transistor 106 by turning off the sixth transistor 106.

Note that in each of the flip-flops of this embodiment mode, the potential of the third wiring 123 can be set at V2 in the second non-selection period even when the potential of the third wiring 123 fluctuates due to noise. Further, in each of the flip-flops of this embodiment mode, the potential of the node 141 can be set at V2 in the first non-selection period even when the potential of the node 141 fluctuates due to noise.

Note that the threshold voltage shift of the third transistor 103 can be suppressed by setting the potential of the signal 227 at V2 or less and applying reverse bias voltage to the third transistor 103. Further, the threshold voltage shift of the fourth transistor 104 and the threshold voltage shift of the second transistor 102 can be suppressed by setting the potential of the signal 228 at V1 or less and lowering a potential of the gate electrode of the fourth transistor 104 and a potential of the gate electrode of the second transistor 102.

As described above, since the threshold voltage shift of the second transistor 102 and the threshold voltage shift of the sixth transistor 106 can be suppressed in each of the flip-flops of this embodiment mode, the life can be prolonged. In addition, since threshold voltage shifts of all the transistors can be suppressed in each of the flip-flops of this embodiment mode, the life can be prolonged. Further, since each of the flip-flops of this embodiment mode can resist noise, reliability can be improved.

Here, functions of the first transistor 101 to the eighth transistor 108 are described. The first transistor 101 has a function of selecting timing for supplying the potential of the fifth wiring 125 to the third wiring 123 and raising the potential of the node 141 by the bootstrap operation and functions as a bootstrap transistor. The second transistor 102 has a function of selecting timing for supplying the potential of the fourth wiring 124 to the third wiring 123 and functions as a switching transistor. The third transistor 103 has a function of selecting timing for supplying the potential of the sixth wiring 126 to the node 142 and functions as a switching transistor. The fourth transistor 104 has a function of selecting timing for supplying a potential of the tenth wiring 130 to the node 142 and functions as a switching transistor. The fifth transistor 105 has a function of selecting timing for supplying the potential of the ninth wiring 129 to the node 141 and functions as a transistor for input. The sixth transistor 106 has a function of selecting timing for supplying a potential of the twelfth wiring 132 to the node 141 and functions as a switching transistor. The seventh transistor 107 has a function of selecting timing for supplying the potential of the thirteenth wiring 133 to the node 141 and functions as a switching transistor. The eighth transistor 108 has a function of selecting timing for supplying the potential of the eleventh wiring 131 to the node 142 and functions as a switching transistor.

Note that the first transistor 101 to the eighth transistor 108 are not limited to transistors as long as they have the above-described functions. For example, a diode, a CMOS analog switch, any logic circuit, or the like may be applied to each of the second transistor 102, the third transistor 103, the fourth transistor 104, the sixth transistor 106, the seventh transistor 107, and the eighth transistor 108 functioning as the switching transistor as long as it is an element having a switching function. Further, a PN junction diode, a diode-connected transistor, or the like may be applied to the fifth transistor 105 functioning as the transistor for input as long as it has a function of selecting timing at which the potential of the node 141 is raised to be turned off.

Note that arrangement, the number, and the like of the transistors are not limited to those of FIG. 1A as long as operations which are similar to those of FIG. 1A are performed. As is apparent from FIGS. 3A to 4B which show the operations of the flip-flop in FIG. 1A, in this embodiment mode, it is only necessary to have electrical continuity in the set period, the selection period, the reset period, the first non-selection period, and the second non-selection period, as shown by a solid line in each of FIGS. 3A to 4B. Thus, a transistor, another element (e.g., a resistor or a capacitor), a diode, a switch, any logic circuit, or the like may be additionally provided as long as a structure is employed in which a transistor or the like is provided so as to satisfy the above-described conditions and the structure can be operated.

Figure 10A:
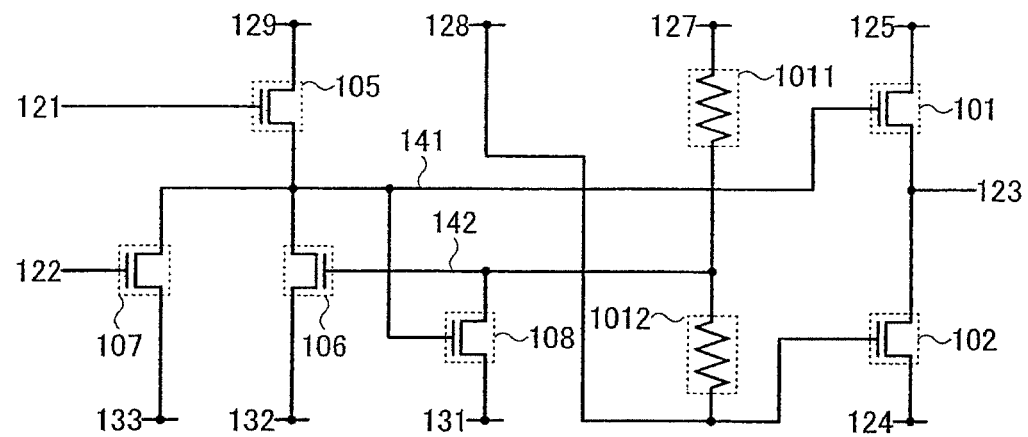
FIGS. 10A and 10B are diagrams each showing a structure of the flip-flop shown in Embodiment Mode 1.

For example, the potential of the node 142 is determined whether to turn on the third transistor 103 or turn on the fourth the fourth transistor 104. However, by connecting a resistor 1011 and a resistor 1012 between the seventh wiring 127 and the eighth wiring 128 as shown in FIG. 10A, operations which are similar to those of FIG. 1A can also be performed. Since the number of the transistors and the number of the wirings can be reduced in a flip-flop in FIG. 10A, reduction in a layout area, improvement in yield, and the like can be achieved.

Figure 10B:
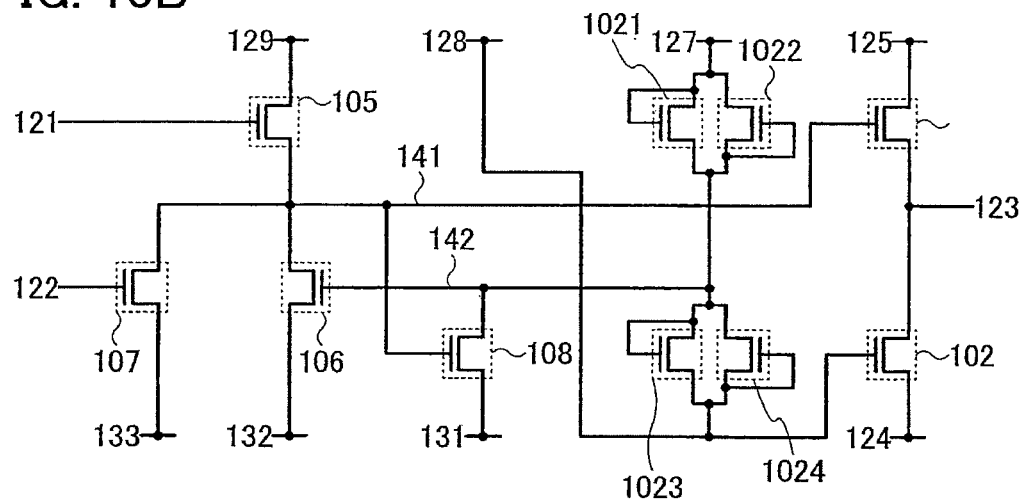

Further, as shown in FIG. 10B, instead of providing the resistor 1011, a diode-connected transistor 1021 and a diode-connected transistor 1022 may be provided between the seventh wiring 127 and the node 142, and instead of providing the resistor 1012, a diode-connected transistor 1023 and a diode-connected transistor 1024 may be provided between the eighth wiring 128 and the node 142. A first electrode of the transistor 1021, a gate electrode of the transistor 1021, and a first electrode of the transistor 1022 are connected to the seventh wiring 127. A first electrode of the transistor 1023, a first electrode of the transistor 1024, and a gate electrode of the transistor 1024 are connected to the eighth wiring 128. A second electrode of the transistor 1021, a second electrode of the transistor 1022, a gate electrode of the transistor 1022, a second electrode of the transistor 1023, a gate electrode of the transistor 1023, and a second electrode of the transistor 1024 are connected to the node 142. That is, two diodes are connected reversely and in parallel between the seventh wiring 127 and the node 142, and two diodes are connected reversely and in parallel between the eighth wiring 128 and the node 142.

Note that drive timing of the flip-flop of this embodiment mode is not limited to that of FIG. 2 as long as operations which are similar to those of FIGS. 1A to 1C are performed.

Figure 6:
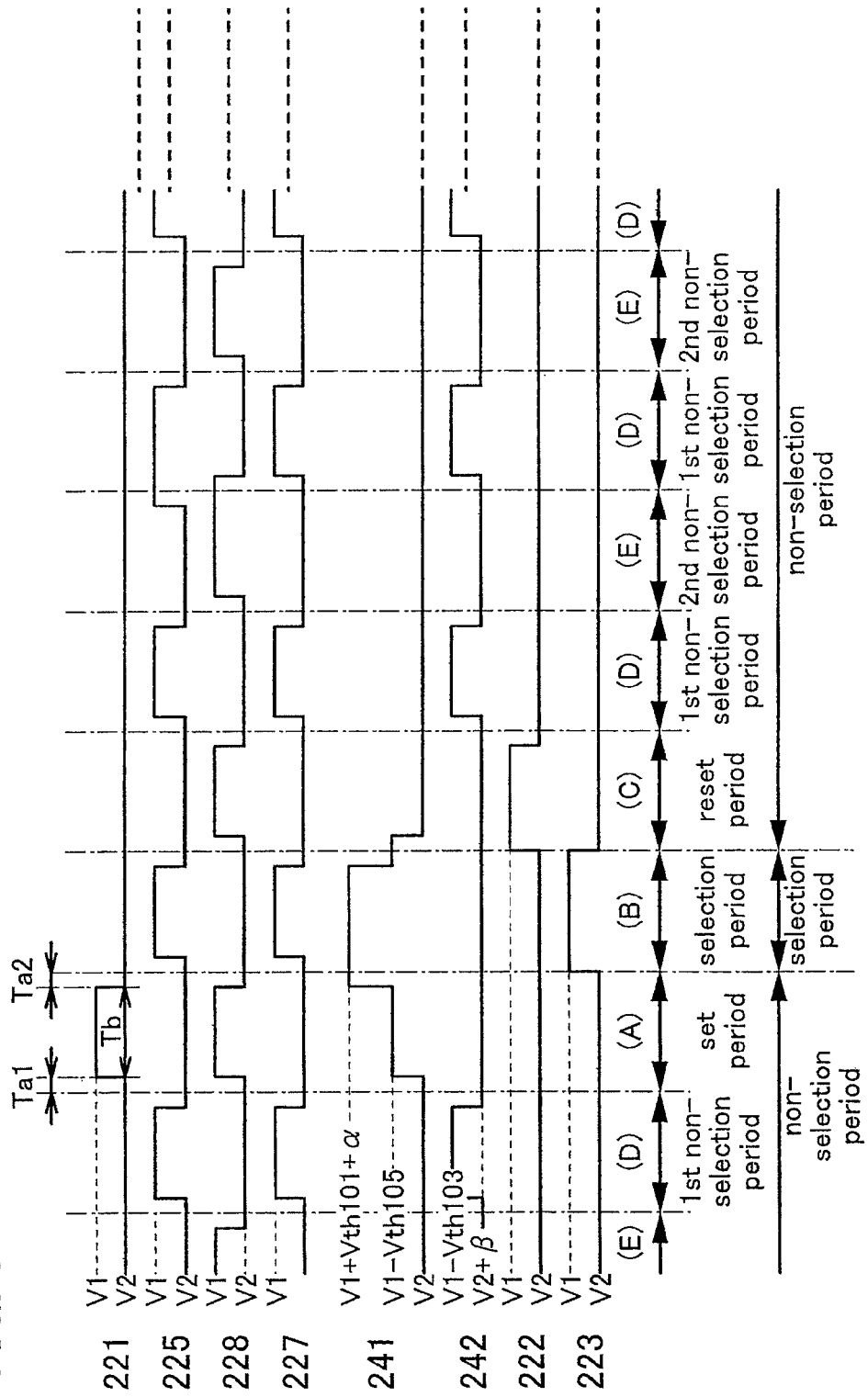
FIG. 6 is a timing chart showing operations of the flip-flop shown in Embodiment Mode 1.

For example, as shown in a timing chart shown in FIG. 6, a period for inputting an H-level signal to each of the first wiring 121, the second wiring 122, the fifth wiring 125, the seventh wiring 127, and the eighth wiring 128 may be shortened. In FIG. 6, timing at which a signal is switched from an L level to an H level is delayed for a period Ta1 and timing at which a signal is switched from an H level to an L level becomes early by a period Ta2, compared with the timing chart in FIG. 2. Therefore, instantaneous current of each wiring is made small in a flip-flop to which the timing chart in FIG. 6 is applied, so that power saving, suppression of a malfunction, improvement in a range of operating conditions, or/and the like can be achieved. Further, in the flip-flop which employs the timing chart in FIG. 6, fall time of a signal which is output from the third wiring 123 can be shortened in a reset period. This is because timing at which the potential of the node 141 becomes an L level is delayed for the period Ta1+the period Ta2, and thus an L-level signal which is input to the fifth wiring 125 is supplied to the third wiring 123 through the first transistor 101 having high current supply capacity (having a wide channel width). Note that portions which are common to those of the timing chart in FIG. 2 are denoted by common reference numerals and description thereof is omitted.

Note that a relation among the period Ta1, the period Ta2, and a period Tb preferably satisfies $((Ta1+Ta2)/(Ta1+Ta2+Tb))\times 100 < 10$ [%]. More preferably, the relation among the period Ta1, the period Ta2, and the period Tb satisfies $((Ta1+Ta2)/(Ta1+Ta2+Tb))\times 100 < 5$ [%]. In addition, it is preferable to set the period Ta1≈the period Ta2.

Figure 7A:
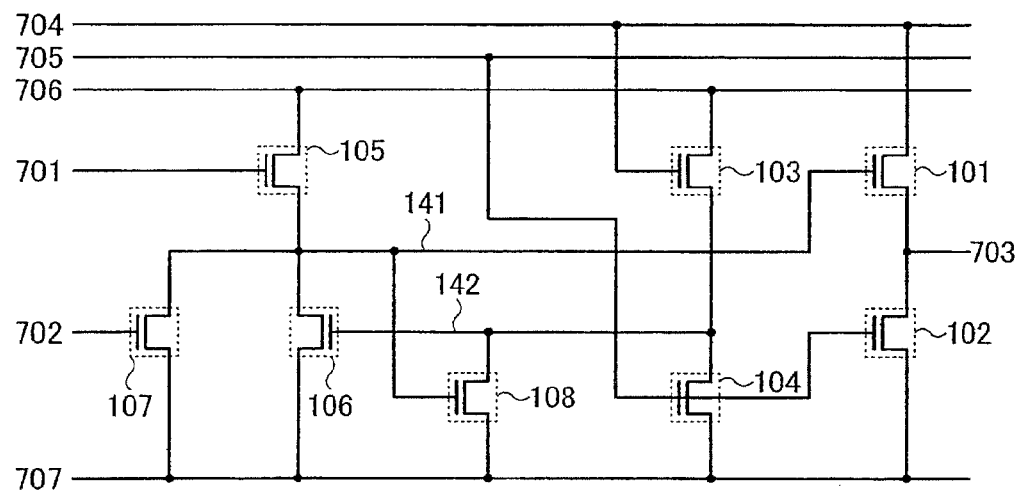
FIGS. 7A and 7B are diagrams each showing a structure of the flip-flop shown in Embodiment Mode 1.
Figure 7B:
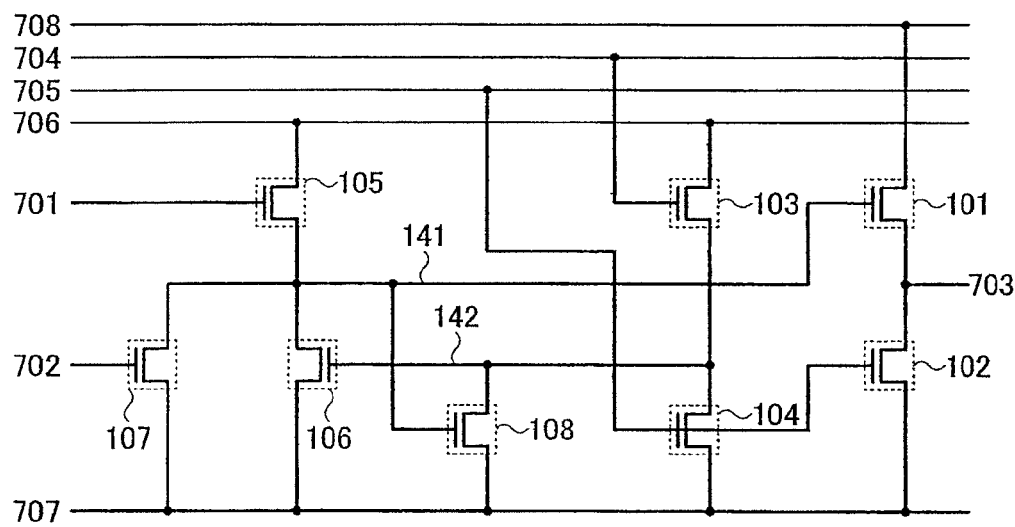
Figure 8A:
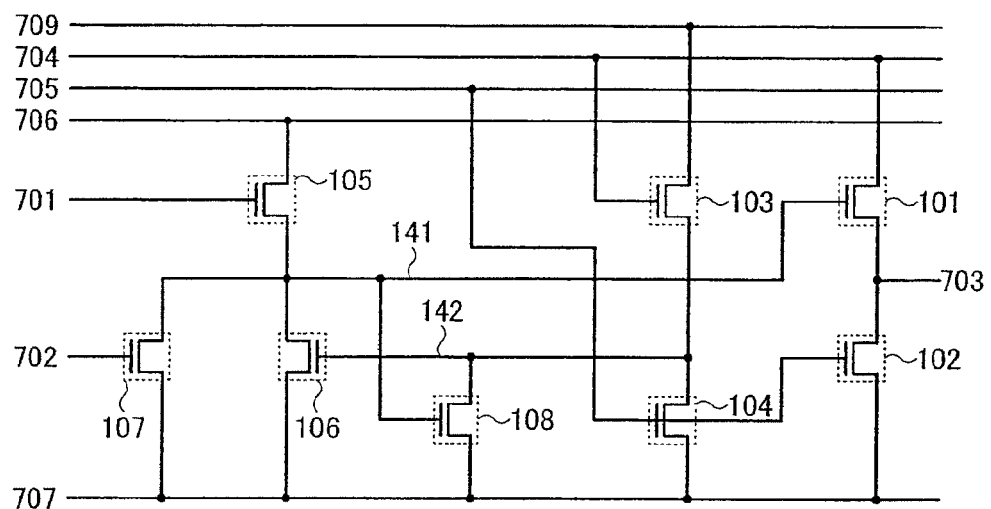
FIGS. 8A and 8B are diagrams each showing a structure of the flip-flop shown in Embodiment Mode 1.
Figure 8B:
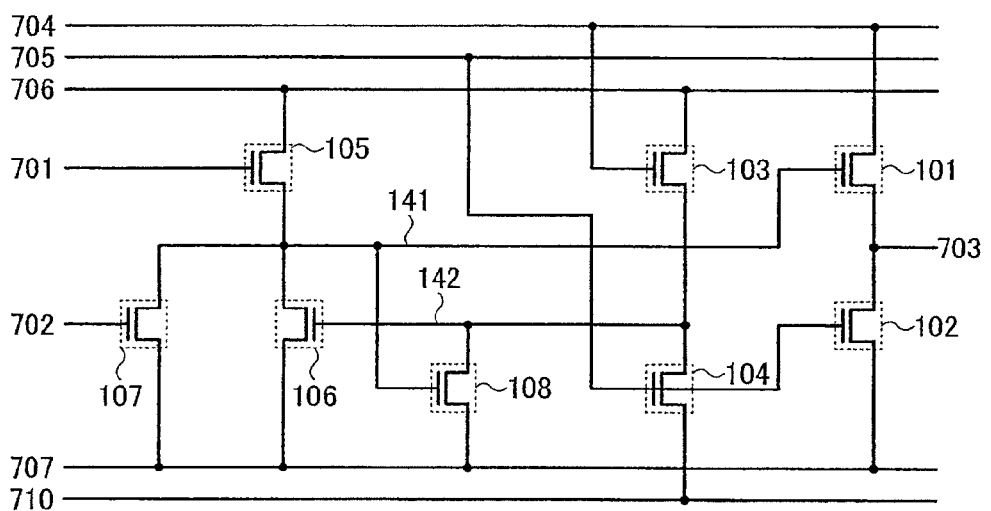

Note that the first wiring 121 to the thirteenth wiring 133 can be freely connected as long as operations which are similar to those of FIGS. 1A to 1C are performed. For example, as shown in FIG. 7A, the first electrode of the second transistor 102, the first electrode of the fourth transistor 104, the first electrode of the sixth transistor 106, the first electrode of the seventh transistor 107, and the first electrode of the eighth transistor 108 may be connected to a seventh wiring 707. In addition, the first electrode of the fifth transistor 105 and the first electrode of the third transistor 103 may be connected to a sixth wiring 706. Further, the gate electrode of the second transistor 102 and the gate electrode of the fourth transistor 104 may be connected to a fifth wiring 705. Furthermore, the first electrode of the first transistor 101 and the gate electrode of the third transistor 103 may be connected to a fourth wiring 704. Note that as shown in FIG. 7B, the first electrode of the first transistor 101 may be connected to an eighth wiring 708. In addition, as shown in FIG. 8A, the first electrode of the third transistor 103 may be connected to a ninth wiring 709. Further, as shown in FIG. 8B, the first electrode of the fourth transistor 104 may be connected to a tenth wiring 710. Note also that portions which are common to those of FIGS. 1A to 1C are denoted by common reference numerals and description thereof is omitted.

Since the number of the wirings can be reduced in a flip-flop in FIG. 7A, yield can be improved, a layout area can be reduced, reliability can be improved, or a range of operating conditions can be improved. In addition, since a potential which is applied to the third transistor 103 is lowered and a reverse bias voltage can be applied in a flip-flop in FIG. 7B, the threshold voltage shift of the third transistor 103 can be further suppressed. Further, since a potential which is supplied to the ninth wiring 709 can be lowered in a flip-flop in FIG. 8A, the threshold voltage shift of the sixth transistor 106 can be further suppressed. Furthermore, since current flowing through the third transistor 103 and the fourth transistor 104 can be set so as not to adversely affect the operations of other transistors, a range of operating conditions can be improved.

Figure 29:
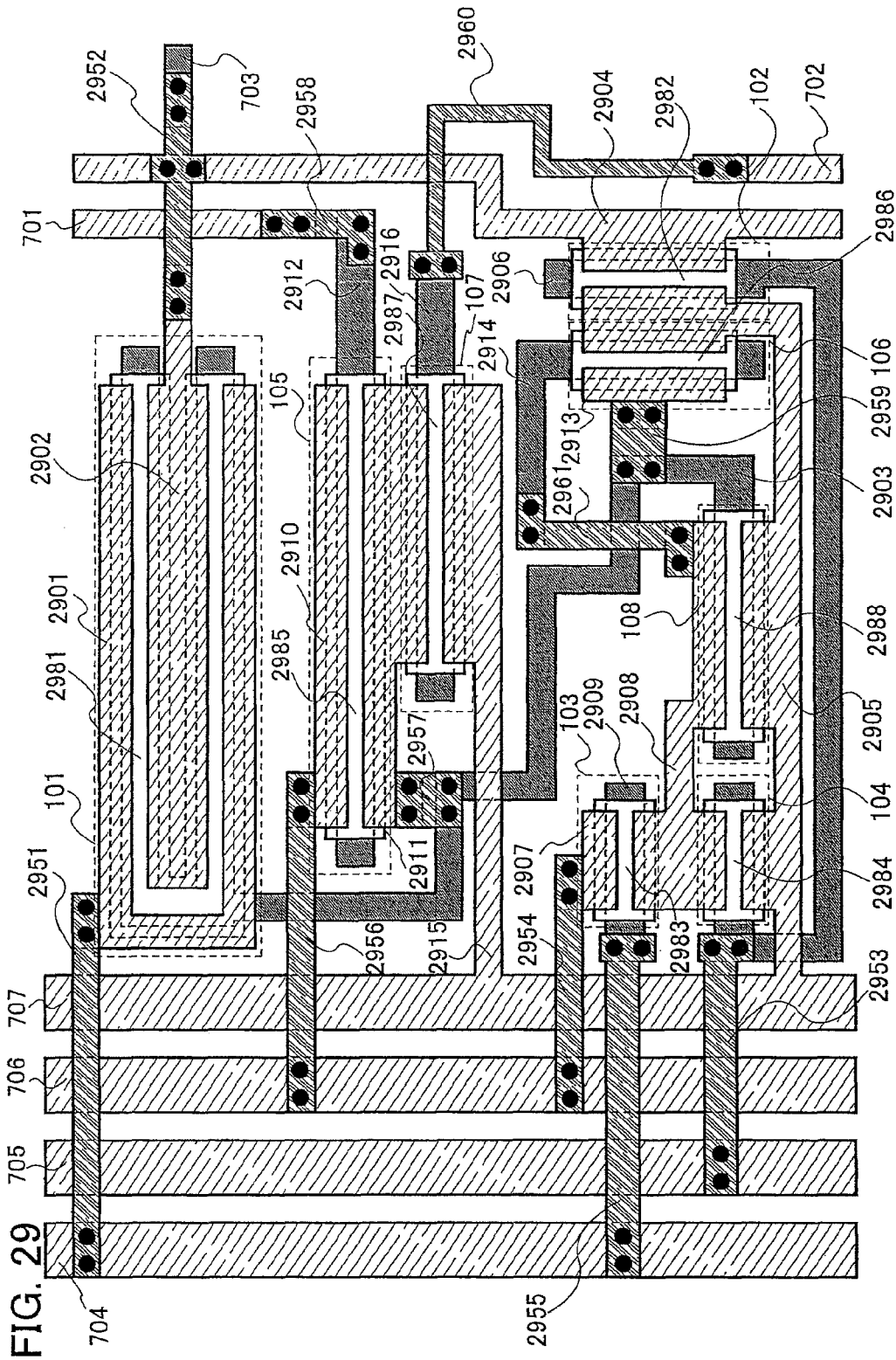
FIG. 29 is a top plan view of the flip-flop in FIG. 7A.
Figure 30A:
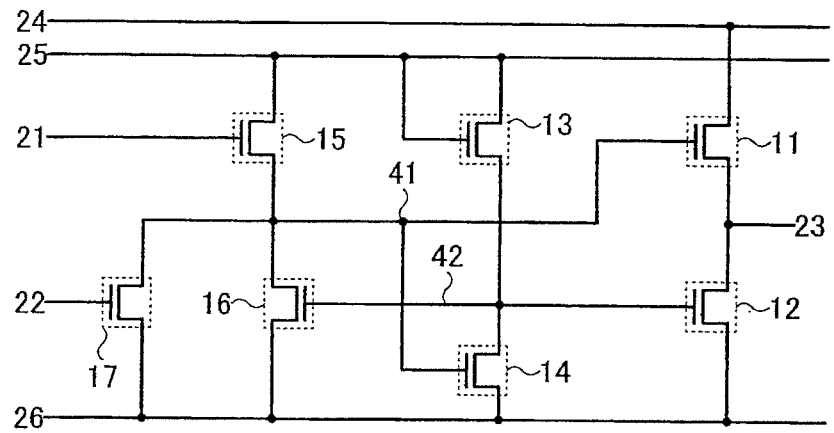
FIGS. 30A and 30B are diagrams each showing a structure of a conventional flip-flop.
Figure 30B:
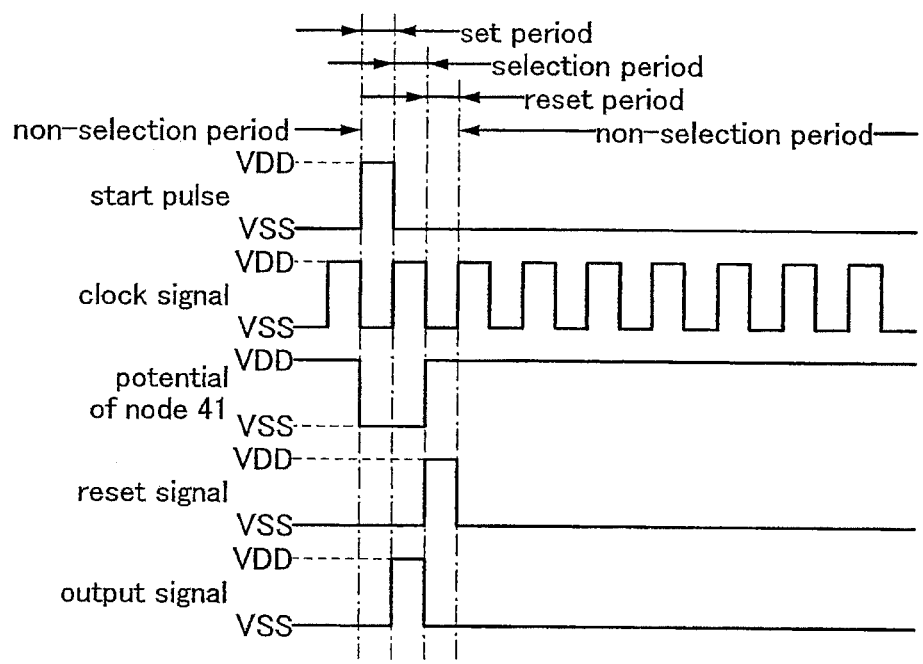

FIG. 29 shows an example of a top plan view of the flip-flop shown in FIG. 7A. A conductive layer 2901 has a portion functioning as the first electrode of the first transistor 101 and is connected to the fourth wiring 704 through a wiring 2951. A conductive layer 2902 has a function as the second electrode of the first transistor 101 and is connected to a third wiring 703 through a wiring 2952. A conductive layer 2903 has functions as the gate electrode of the first transistor 101 and the gate electrode of the eighth transistor 108. A conductive layer 2904 has a portion functioning as the second electrode of the second transistor 102 and is connected to the third wiring 703 through the wiring 2952. A conductive layer 2905 has functions as the first electrode of the second transistor 102, the first electrode of the fourth transistor 104, the first electrode of the sixth transistor 106, and the first electrode of the eighth transistor 108 and is connected to the seventh wiring 707. A conductive layer 2906 has functions as the gate electrode of the second transistor 102 and the gate electrode of the fourth transistor 104 and is connected to the fifth wiring 705 through a wiring 2953. A conductive layer 2907 has a function as the first electrode of the third transistor 103 and is connected to the sixth wiring 706 through a wiring 2954. A conductive layer 2908 has functions as the second electrode of the third transistor 103, the second electrode of the fourth transistor 104, and the second electrode of the eighth transistor 108. A conductive layer 2909 has a function as the gate electrode of the third transistor 103 and is connected to the fourth wiring 704 through a wiring 2955. A conductive layer has a function as the first electrode of the fifth transistor 105 and is connected to the sixth wiring 706 through a wiring 2956. A conductive layer 2911 has functions as the second electrode of the fifth transistor 105 and the second electrode of the seventh transistor 107 and is connected to the conductive layer 2903 through a wiring 2957. A conductive layer 2912 has a function as the gate electrode of the fifth transistor 105 and is connected to a first wiring 701 through a wiring 2958. A conductive layer 2913 has a function as the second electrode of the sixth transistor 106 and is connected to the conductive layer 2903 through a wiring 2959. A conductive layer 2914 has a function as the gate electrode of the sixth transistor 106 and is connected to the conductive layer 2908 through a wiring 2961. A conductive layer 2915 has a function as the second electrode of the seventh transistor 107 and is connected to the seventh wiring 707. A conductive layer 2916 has a function as the gate electrode of the seventh transistor 107 and is connected to a second wiring 702 through a wiring 2960.

Here, the wiring 2960 has a smaller wiring width than that of the wiring 2951, the wiring 2952, the wiring 2953, the wiring 2954, the wiring 2955, the wiring 2956, the wiring 2957, the wiring 2958, the wiring 2959, or the wiring 2961. Alternatively, the wiring 2960 has longer wiring length than that of the wiring 2951, the wiring 2952, the wiring 2953, the wiring 2954, the wiring 2955, the wiring 2956, the wiring 2957, the wiring 2958, the wiring 2959, or the wiring 2961. That is, a resistance value of the wiring 2960 is increased. Thus, timing at which a potential of the conductive layer 2916 becomes an H level can be delayed in the reset period. Therefore, since timing at which the seventh transistor 107 is turned on can be delayed in the reset period, a signal of the third wiring 703 can be quickly set at an L level. This is because timing at which the node 141 becomes an L level is delayed and an L-level signal is supplied to the third wiring 703 through the first transistor 101 in that delay period.

Note that the wiring 2951, the wiring 2952, the wiring 2953, the wiring 2954, the wiring 2955, the wiring 2956, the wiring 2957, the wiring 2958, the wiring 2959, the wiring 2960, and the wiring 2961 are similar to a pixel electrode (or referred to as a light-transmitting electrode or a reflective electrode) and are formed by using a similar material in a similar process.

Note that portions functioning as the gate electrode, the first electrode, and the second electrode of the first transistor 101 correspond to portions where the conductive layers having the gate electrode, the first electrode, and the second electrode of the first transistor 101 overlap with a semiconductor layer 2981. Portions functioning as the gate electrode, the first electrode, and the second electrode of the first transistor 102 correspond to portions where the conductive layers having the gate electrode, the first electrode, and the second electrode of the first transistor 102 overlap with a semiconductor layer 2982. Portions functioning as the gate electrode, the first electrode, and the second electrode of the first transistor 103 correspond to portions where the conductive layers having the gate electrode, the first electrode, and the second electrode of the first transistor 103 overlap with a semiconductor layer 2983. Portions functioning as the gate electrode, the first electrode, and the second electrode of the first transistor 104 correspond to portions where the conductive layers having the gate electrode, the first electrode, and the second electrode of the first transistor 104 overlap with a semiconductor layer 2984. Portions functioning as the gate electrode, the first electrode, and the second electrode of the first transistor 105 correspond to portions where the conductive layers having the gate electrode, the first electrode, and the second electrode of the first transistor 105 overlap with a semiconductor layer 2985. Portions functioning as the gate electrode, the first electrode, and the second electrode of the first transistor 106 correspond to portions where the conductive layers having the gate electrode, the first electrode, and the second electrode of the first transistor 106 overlap with a semiconductor layer 2986. Portions functioning as the gate electrode, the first electrode, and the second electrode of the first transistor 107 correspond to portions where the conductive layers having the gate electrode, the first electrode, and the second electrode of the first transistor 107 overlap with a semiconductor layer 2987. Portions functioning as the gate electrode, the first electrode, and the second electrode of the first transistor 108 correspond to portions where the conductive layers having the gate electrode, the first electrode, and the second electrode of the first transistor 108 overlap with a semiconductor layer 2988.

Next, a structure and a driving method of a shift register including the above-described flip-flop of this embodiment mode are described.

The structure of the shift register of this embodiment mode is described with reference to FIG. 11. The shift register in FIG. 11 includes n pieces of flip-flops (flip-flops 1101_1 to 1101_n).

Figure 11:
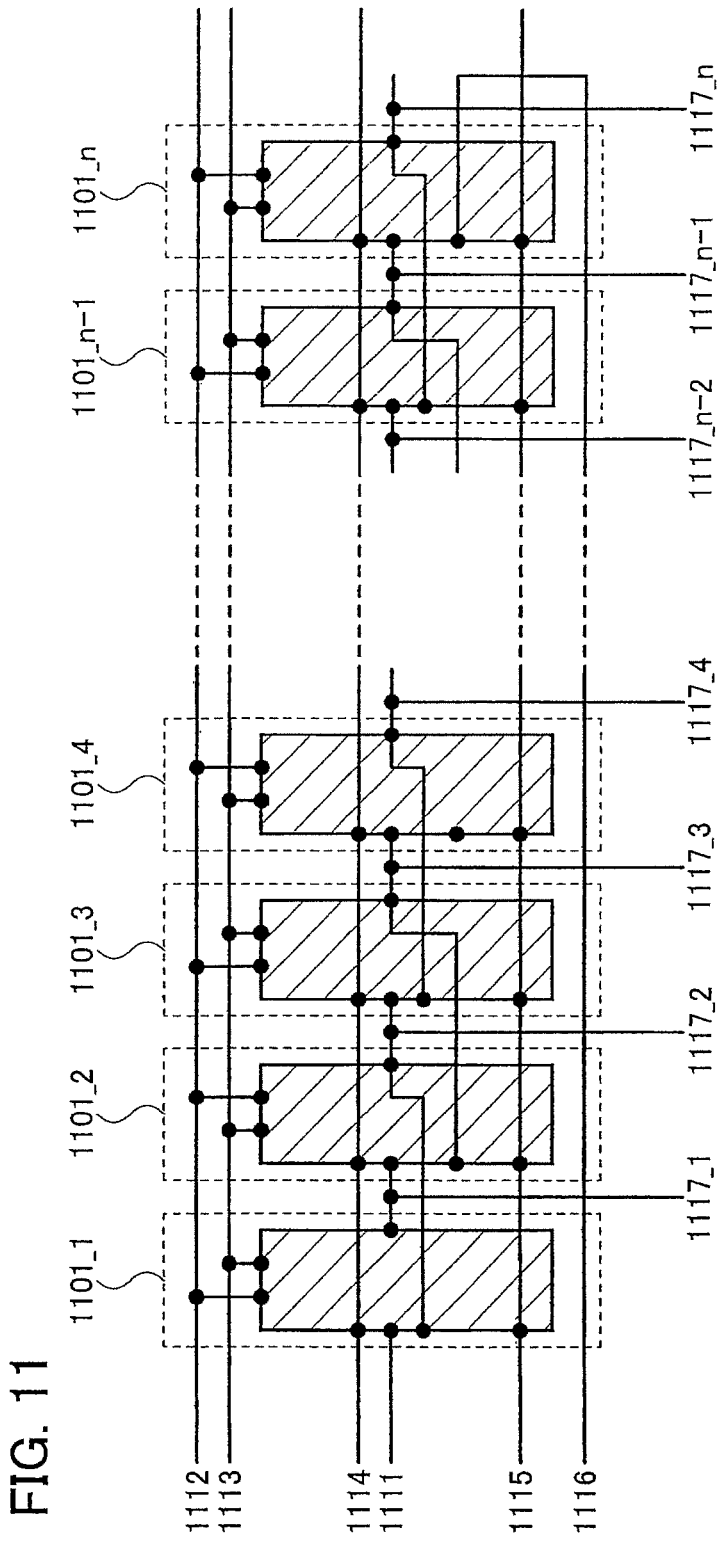
FIG. 11 is a diagram showing a structure of a shift register shown in Embodiment Mode 1.

Connection relations of the shift register in FIG. 11 are described. In a flip-flop 1101_i of an i-th stage (any one of the flip-flops 1101_1 to 1101_n) of the shift register in FIG. 11, the first wiring 121 shown in FIG. 1A is connected to a seventh wiring 1117_i−1; the second wiring 122 shown in FIG. 1A is connected to a seventh wiring 1117_i+1; the third wiring 123 shown in FIG. 1A is connected to a seventh wiring 1117_i; the fourth wiring 124, the tenth wiring 130, the eleventh wiring 131, the twelfth wiring 132, and the thirteenth wiring 133 shown in FIG. 1A are connected to a fifth wiring 1115; the fifth wiring 125 and the seventh wiring 127 shown in FIG. 1A are connected to a second wiring 1112 in a flip-flop of an odd-numbered stage; the fifth wiring 125 and the seventh wiring 127 shown in FIG. 1A are connected to a third wiring 1113 in a flip-flop of an even-numbered stage; the eighth wiring 128 shown in FIG. 1A is connected to the third wiring 1113 in a flip-flop of an odd-numbered stage; the eighth wiring 128 shown in FIG. 1A is connected to the second wiring 1112 in a flip-flop of an even-numbered stage; and the sixth wiring 126 and the ninth wiring 129 shown in FIG. 1A are connected to a fourth wiring 1114. Note that the first wiring 121 shown in FIG. 1A of the flip-flop 1101_1 of a first stage is connected to a first wiring 1111, and the second wiring 122 shown in FIG. 1A of the flip-flop 1101_n of an n-th stage is connected to a sixth wiring 1116.

Note that the first wiring 1111, the second wiring 1112, the third wiring 1113, and the sixth wiring 1116 may be referred to as a first signal line, a second signal line, a third signal line, and a fourth signal line, respectively. Further, the fourth wiring 1114 and the fifth wiring 1115 may be referred to as a first power supply line and a second power supply line, respectively.

Figure 12:
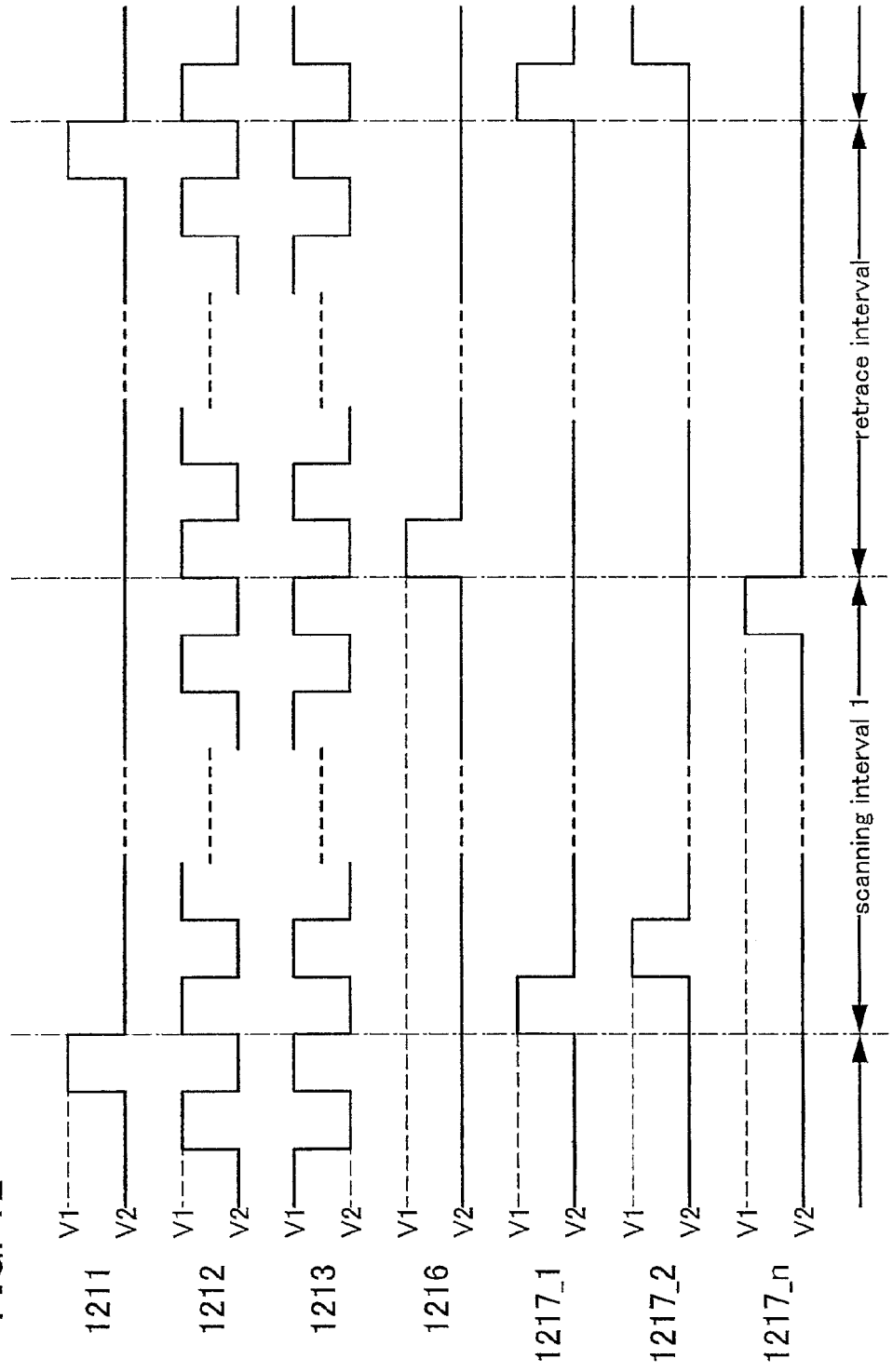
FIG. 12 is a timing chart showing operations of the shift register shown in FIG. 11.

Next, operations of the shift register shown in FIG. 11 are described with reference to a timing chart in FIG. 12 and a timing chart in FIG. 13. Here, the timing chart in FIG. 12 is divided into a scanning interval and a retrace interval. The scanning interval corresponds to an interval from time when output of a selection signal from the seventh wiring 1117_1 is started to time when output of a selection signal from a seventh wiring 1117_n is completed. The retrace interval corresponds to an interval from time when output of the selection signal from the seventh wiring 1117_n is completed to time when output of the selection signal from the seventh wiring 1117_1 is started.

Note that the potential of V1 is supplied to the fourth wiring 1114 and the potential of V2 is supplied to the fifth wiring 1115.

Note that a signal 1211, a signal 1212, a signal 1213, and a signal 1216 shown in FIG. 12 are input to the first wiring 1111, the second wiring 1112, the third wiring 1113, and the sixth wiring 1116, respectively. Here, each of the signal 1211, the signal 1212, the signal 1213, and the signal 1216 is a digital signal in which a potential of an H-level signal is at V1 (hereinafter also referred to as an H level) and a potential of an L-level signal is at V2 (hereinafter also referred to as an L level). Further, the signal 1211, the signal 1212, the signal 1213, and the signal 1216 may be referred to as a start signal, a first clock signal, a second clock signal (an inverted clock signal), and a reset signal, respectively.

Note that any signal, potential, or current may be input to each of the first wiring 1111 to the sixth wiring 1116.

A digital signal in which a potential of an H-level signal is at V1 (hereinafter also referred to as an H level) and a potential of an L-level signal is at V2 (hereinafter also referred to as an L level) is output from each of the seventh wirings 1117_1 to 1117_n. Note that since signals are output from the seventh wirings 1117_1 to 1117_n through a buffer 1401_1 to a buffer 1401_n, respectively, and an output signal of the shift register and a transfer signal of each flip-flop can be divided, a range of operating conditions can be widened.

Figure 14:
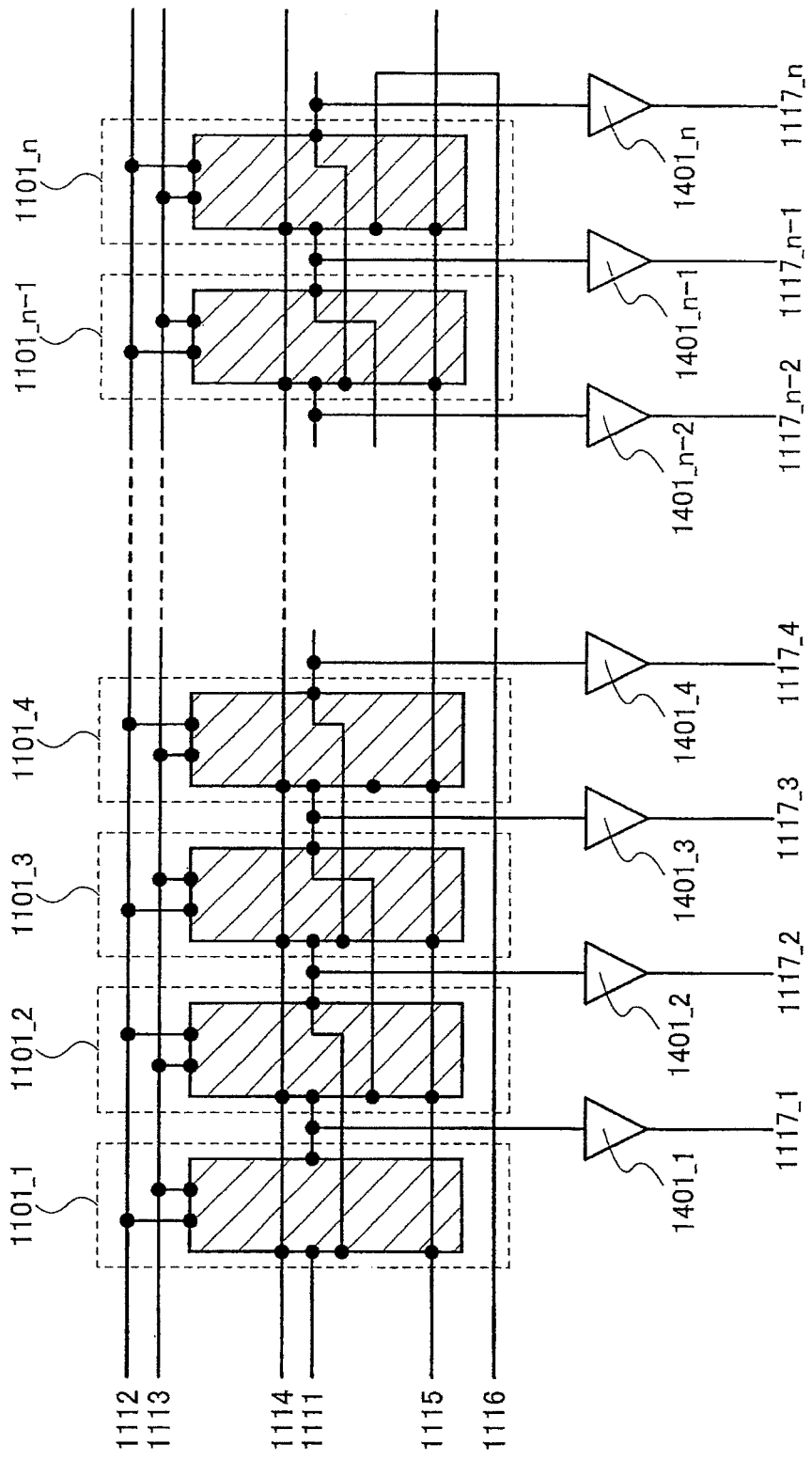
FIG. 14 is a diagram showing a structure of the shift register shown in Embodiment Mode 1.

Here, examples of the buffer 1401_1 to the buffer 1401_n which are included in a shift register shown in FIG. 14 are described with reference to FIGS. 15A and 15B. In a buffer 8000 shown in FIG. 15A, an inverter 8001a, an inverter 8001b, and an inverter 8001c are connected between a wiring 8011 and a wiring 8012, and thus an inverted signal of a signal which is input to the wiring 8011 is output from the wiring 8012. Note that the number of inverters which are connected between the wiring 8011 and the wiring 8012 is not limited, and for example, a signal having the same polarity as that of the signal which is input to the wiring 8011 is output from the second wiring 8012 when even numbers of inverters are connected between the wiring 8011 and the wiring 8012. In addition, as shown in a buffer 8100 in FIG. 15B, an inverter 8002a, an inverter 8002b, and an inverter 8002c which are connected in series and an inverter 8003a, an inverter 8003b, and an inverter 8003c which are provided in series may be connected in parallel. Since variation in characteristics of transistors can be averaged in the buffer 8100 in FIG. 15B, delay and dullness of the signal which is output from the wiring 8012 can be reduced. Further, the inverter 8002a and output of the inverter 8003a may be connected, and the inverter 8002b and output of the inverter 8003b may be connected.

Figure 15A:
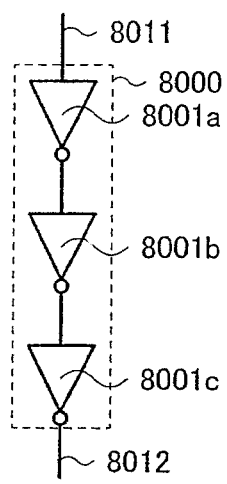
FIGS. 15A to 15D are diagrams each showing a structure of a buffer shown in FIG. 14.

Note that in FIG. 15A, it is preferable to satisfy W of a transistor included in the inverter 8001a<W of a transistor included in the inverter 8001b<W of a transistor included in the inverter 8001c. W of the transistor included in the inverter 8001a is small and drive capability (specifically, the value of W/L of the transistor in FIG. 1) of the flip-flop can be decreased, and thus a layout area in a shift register of the present invention can be reduced. Similarly, in FIG. 15B, it is preferable to satisfy W of a transistor included in the inverter 8002a<W of a transistor included in the inverter 8002b<W of a transistor included in the inverter 8002c. Similarly, in FIG. 15B, it is preferable to satisfy W of a transistor included in the inverter 8003a<W of a transistor included in the inverter 8003b<W of a transistor included in the inverter 8003c. Further, it is preferable to satisfy W of the transistor included in the inverter 8002a=W of the transistor included in the inverter 8003a, W of the transistor included in the inverter 8002b=W of the transistor included in the inverter 8003b, and W of the transistor included in the inverter 8002c=W of the transistor included in the inverter 8003c.

Figure 15B:
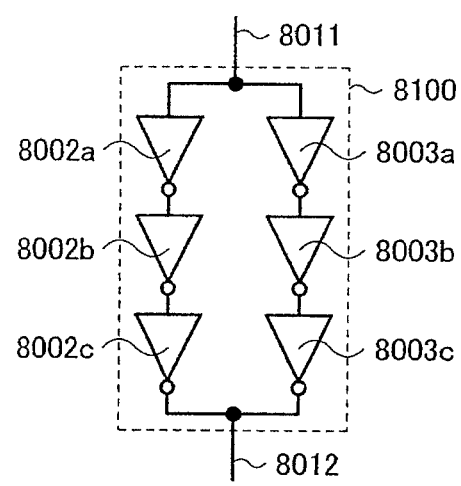
Figure 15C:
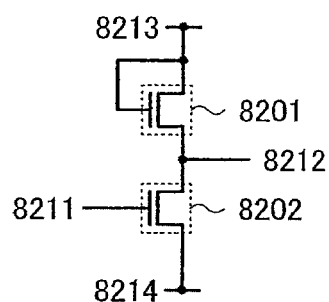

Note that the inverters shown in FIGS. 15A and 15B are not particularly limited as long as they can output inverted signals of input signals. For example, as shown in FIG. 15C, an inverter may be formed from a first transistor 8201 and a second transistor 8202. In addition, a signal is input to a first wiring 8211; a signal is output from a second wiring 8212; V1 is supplied to a third wiring 8213; and V2 is supplied to a fourth wiring 8214. In the inverter in FIG. 15C, when an H-level signal is input to the first wiring 8211, a potential in which V1–V2 is divided by the first transistor 8201 and the second transistor 8202 (W/L of the first transistor 8201<W/L of the second transistor 8202) is output from the second wiring 8212. Further, in the inverter in FIG. 15C, when an L-level signal is input to the first wiring 8211, V1–Vth 8201 (Vth 8201 corresponds to the threshold voltage of the first transistor 8201) is output from the second wiring 8212. Furthermore, the first transistor 8201 may be a PN junction diode or simply a resistor as long as it is an element having a resistance component.

Figure 15D:
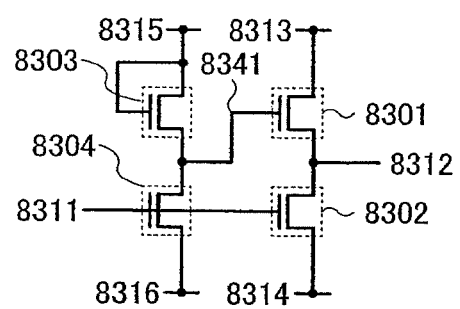

In addition, as shown in FIG. 15D, an inverter may be formed from a first transistor 8301, a second transistor 8302, a third transistor 8303, and a fourth transistor 8304. Further, a signal is input to a first wiring 8311; a signal is output from a second wiring 8312; V1 is supplied to a third wiring 8313 and a fifth wiring 8315; and V2 is supplied to a fourth wiring 8314 and a sixth wiring 8316. In the inverter in FIG. 15D, when an H-level signal is input to the first wiring 8311, V2 is output from the second wiring 8312. At this time, since a potential of a node 8341 is at an L level, the first transistor 8301 is turned off. Furthermore, in the inverter in FIG. 15D, when an L-level signal is input to the first wiring 8311, V1 is output from the second wiring 8312. At this time, when the potential of the node 8341 becomes V1–Vth8303 (Vth8303 corresponds to the threshold voltage of the third transistor 8303), the node 8341 enters into a floating state and the potential of the node 8341 becomes higher than V1+Vth8301 (Vth8301 corresponds to the threshold voltage of the first transistor 8301) by a bootstrap operation, so that the first transistor 8301 is turned on. Moreover, since the first transistor 8301 functions as a bootstrap transistor, a capacitor may be provided between a second electrode and a gate electrode of the first transistor 8301.

Figure 16A:
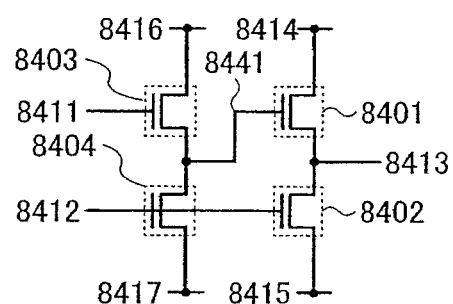
FIGS. 16A to 16C are diagrams each showing a structure of the buffer shown in FIG. 14.

In addition, as shown in FIG. 16A, an inverter may be formed from a first transistor 8401, a second transistor 8402, a third transistor 8403, and a fourth transistor 8404. The inverter in FIG. 16A is a two-input inverter and can perform a bootstrap operation. Further, a signal is input to a first wiring 8411; an inverted signal is input to a second wiring 8412; a signal is output from a third wiring 8413; V1 is supplied to a fourth wiring 8414 and a sixth wiring 8416; and V2 is supplied to a fifth wiring 8415 and a seventh wiring 8417. In the inverter in FIG. 16A, when an L-level signal is input to the first wiring 8411 and an H-level signal is input to the second wiring 8412, V2 is output from the third wiring 8413. At this time, since a potential of a node 8441 is at V2, the first transistor 8401 is turned off. Furthermore, in the inverter in FIG. 16A, when an H-level signal is input to the first wiring 8411 and an L-level signal is input to the second wiring 8412, V1 is output from the third wiring 8413. At this time, when the potential of the node 8441 becomes V1–Vth8403 (Vth8403 corresponds to the threshold voltage of the third transistor 8403), the node 8441 enters into a floating state and the potential of the node 8441 becomes higher than V1+Vth8401 (Vth8401 corresponds to the threshold voltage of the first transistor 8401) by a bootstrap operation, so that the first transistor 8401 is turned on. Moreover, since the first transistor 8401 functions as a bootstrap transistor, a capacitor may be provided between a second electrode and a gate electrode of the first transistor 8401. It is preferable that one of the first wiring 8411 and the second wiring 8412 be connected to the third wiring 123 shown in FIG. 1A and the other of the first wiring 8411 and the second wiring 8412 be connected to the node 142 shown in FIG. 1A.

Figure 16B:
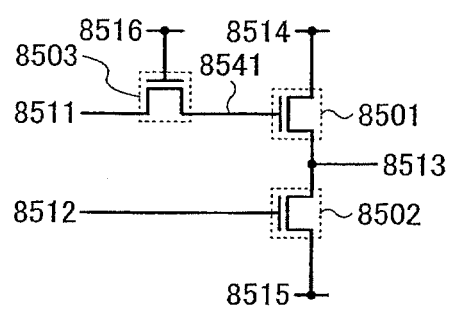

In addition, as shown in FIG. 16B, an inverter may be formed from a first transistor 8501, a second transistor 8502, and a third transistor 8503. The inverter in FIG. 16B is a two-input inverter and can perform a bootstrap operation. Further, a signal is input to a first wiring 8511; an inverted signal is input to a second wiring 8512; a signal is output from a third wiring 8513; V1 is supplied to a fourth wiring 8514 and a sixth wiring 8516; and V2 is supplied to a fifth wiring 8515. In the inverter in FIG. 16B, when an L-level signal is input to the first wiring 8511 and an H-level signal is input to the second wiring 8512, V2 is output from the third wiring 8513. At this time, since a potential of a node 8541 is at V2, the first transistor 8501 is turned off. Furthermore, in the inverter in FIG. 16B, when an H-level signal is input to the first wiring 8511 and an L-level signal is input to the second wiring 8512, V1 is output from the third wiring 8513. At this time, when the potential of the node 8541 becomes V1−Vth8503 (Vth8503 corresponds to the threshold voltage of the third transistor 8503), the node 8541 enters into a floating state and the potential of the node 8541 becomes higher than V1+Vth8501 (Vth8501 corresponds to the threshold voltage of the first transistor 8501) by a bootstrap operation, so that the first transistor 8501 is turned on. Moreover, since the first transistor 8501 functions as a bootstrap transistor, a capacitor may be provided between a second electrode and a gate electrode of the first transistor 8501. It is preferable that one of the first wiring 8511 and the second wiring 8512 be connected to the third wiring 123 shown in FIG. 1A and the other of the first wiring 8511 and the second wiring 8512 be connected to the node 142 shown in FIG. 1A.

Figure 16C:
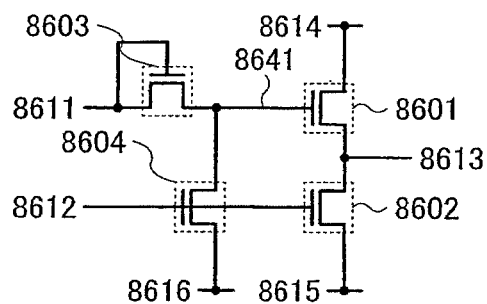

In addition, as shown in FIG. 16C, an inverter may be formed from a first transistor 8601, a second transistor 8602, a third transistor 8603, and a fourth transistor 8604. The inverter in FIG. 16C is a two-input inverter and can perform a bootstrap operation. Further, a signal is input to a first wiring 8611; an inverted signal is input to a second wiring 8612; a signal is output from a third wiring 8613; V1 is supplied to a fourth wiring 8614; and V2 is supplied to a fifth wiring 8615 and a sixth wiring 8616. In the inverter in FIG. 16C, when an L-level signal is input to the first wiring 8611 and an H-level signal is input to the second wiring 8612, V2 is output from the third wiring 8613. At this time, since a potential of a node 8641 is at V2, the first transistor 8601 is turned off. Furthermore, in the inverter in FIG. 16C, when an H-level signal is input to the first wiring 8611 and an L-level signal is input to the second wiring 8612, V1 is output from the third wiring 8613. At this time, when the potential of the node 8641 becomes V1−Vth8603 (Vth8603 corresponds to the threshold voltage of the third transistor 8603), the node 8641 enters into a floating state and the potential of the node 8641 becomes higher than V1+Vth8601 (Vth8601 corresponds to the threshold voltage of the first transistor 8601) by a bootstrap operation, so that the first transistor 8601 is turned on. Moreover, since the first transistor 8601 functions as a bootstrap transistor, a capacitor may be provided between a second electrode and a gate electrode of the first transistor 8601. It is preferable that one of the first wiring 8611 and the second wiring 8612 be connected to the third wiring 123 shown in FIG. 1A and the other of the first wiring 8611 and the second wiring 8612 be connected to the node 142 shown in FIG. 1A.

Note that a signal output from the seventh wiring 1117_i−1 is used as a start signal of the flip-flop 1101_i, and a signal output from the seventh wiring 1117_i+1 is used as a reset signal of the flip-flop 1101. A start signal of the flip-flop 1101_1 is input from the first wiring 1111, and a reset signal of the flip-flop 1101_n is input from the sixth wiring 1116. Note also that as the reset signal of the flip-flop 1101_n, a signal output from the seventh wiring 1117_1 or a signal output from the seventh wiring 1117_2 may be used. Alternatively, a dummy flip-flop may be additionally provided and an output signal of the dummy flip-flop may be used. Thus, the number of the wirings and the number of the signals can be reduced.

Figure 13:
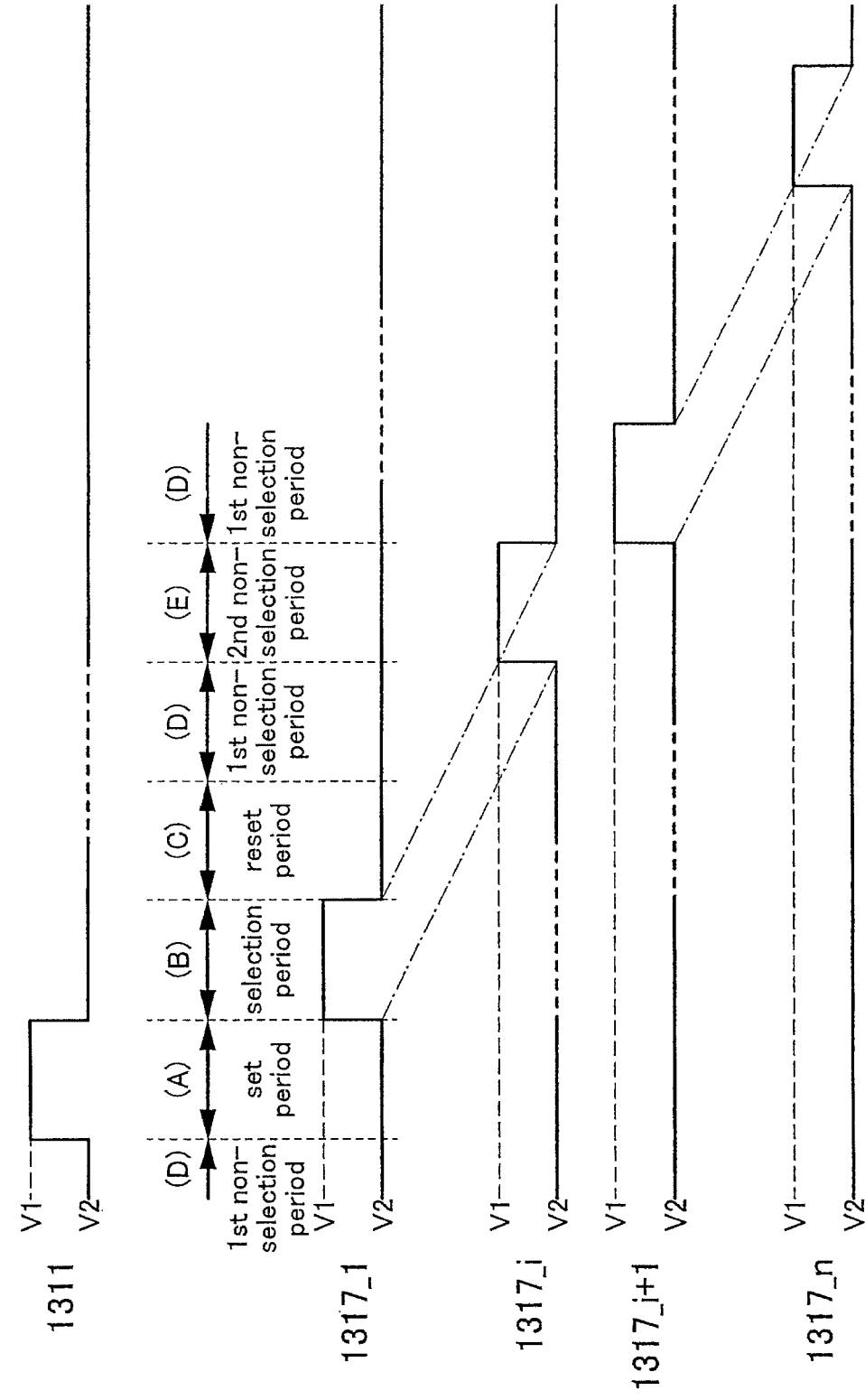
FIG. 13 is a timing chart showing operations of the shift register shown in FIG. 11.

As shown in FIG. 13, for example, when the flip-flop 1101_i enters the selection period, an H-level signal (a selection signal) is output from the seventh wiring 1117_i. At this time, the flip-flop 1101_i+1 enters the set period. After that, the flip-flop 1101_i enters the reset period and an L-level signal is output from the seventh wiring 1117_i. At this time, the flip-flop 1101_i+1 enters the selection period. After that, the flip-flop 1101_i enters the first non-selection period, and the seventh wiring 1117_i enters into a floating state and remains at V2. At this time, the flip-flop 1101_i+1 enters the reset period. After that, the flip-flop 1101_i enters the second non-selection period and an L-level signal is output from the seventh wiring 1117_i. At this time, the flip-flop 1101_i+1 enters the first non-selection period.

In the shift register in FIG. 11, the selection signal can be output sequentially from the seventh wiring 1117_1 to the seventh wiring 1117_n in this manner. That is, in the shift register in FIG. 11, the seventh wiring 1117_1 to the seventh wiring 1117_n can be scanned.

In addition, since the threshold voltage shift of each transistor can be suppressed in a shift register to which the flip-flop of this embodiment mode is applied, the life can be prolonged. In addition, since threshold voltage shifts of all the transistors can be suppressed in the flip-flop of this embodiment mode, the life can be prolonged. Further, in the shift register to which the flip-flop of this embodiment mode is applied, reliability can be improved. Furthermore, in the shift register to which the flip-flop of this embodiment mode is applied, a malfunction can be suppressed.

In addition, since the shift register to which the flip-flop of this embodiment mode is applied can operate at high speed, it can be applied to a higher-definition display device or a larger display device. Further, in the shift register to which the flip-flop of this embodiment mode is applied, a process can be simplified. Furthermore, in the shift register to which the flip-flop of this embodiment mode is applied, manufacturing cost can be reduced. Moreover, in the shift register to which the flip-flop of this embodiment mode is applied, yield can be improved.

Next, a structure and a driving method of a display device including the above-described shift register of this embodiment mode are described. Note that it is only necessary that the display device of this embodiment mode at least include the flip-flop of this embodiment mode.

The structure of the display device of this embodiment mode is described with reference to FIG. 17. The display device in FIG. 17 includes a signal line driver circuit 1701, a scan line driver circuit 1702, and a pixel portion 1704. The pixel portion 1704 includes a plurality of signal lines S1 to Sm extended from the signal line driver circuit 1701 in a column direction, a plurality of scan lines G1 to Gn extended from the scan line driver circuit 1702 in a row direction, and a plurality of pixels 1703 arranged in matrix in accordance with the signal lines S1 to Sm and the scan lines G1 to Gn. In addition, each of the pixels 1703 is connected to a signal line Sj (any one of the signal lines S1 to Sm) and a scan line Gi (any one of the scan lines G1 to Gn). Further, the scan line driver circuit 1702 may be referred to as a driver circuit.

Note that the shift register of this embodiment mode can be used as the scan line driver circuit 1702. Needless to say, the shift register of this embodiment mode may be used as the signal line driver circuit 1701.

Note that the scan lines G1 to Gn are connected to the seventh wirings 1117_1 to 1117_n.

Note also that each of the signal lines and the scan lines may be simply referred to as a wiring. In addition, each of the signal line driver circuit 1701 and the scan line driver circuit 1702 may be referred to as a driver circuit.

Each of the pixels 1703 at least includes a switching element, a capacitor, and a pixel electrode. Note that each of the pixels 1703 may include a plurality of switching elements or a plurality of capacitors. In addition, each of the pixels 1703 does not necessarily include a capacitor. Further, each of the pixels 1703 may further include a transistor which operates in a saturation region. Furthermore, each of the pixels 1703 may include a display element such as a liquid crystal element or an EL element. Here, a transistor or a PN junction diode can be used as a switching element. Note also that when a transistor is used as the switching element, it is preferable that the transistor operate in a linear region. In addition, when the scan line driver circuit 1702 is formed by using only N-channel transistors, it is preferable that an N-channel transistor be used as the switching element. Alternatively, when the scan line driver circuit 1702 is formed by using only P-channel transistors, it is preferable that a P-channel transistor be used as the switching element.

The scan line driver circuit 1702 and the pixel portion 1704 are formed over an insulating substrate 1705, and the signal line driver circuit 1701 is not formed over the insulating substrate 1705. The signal line driver circuit 1701 is formed using a single crystalline substrate, an SOI substrate, or an insulating substrate, which is different from the insulating substrate 1705. In addition, the signal line driver circuit 1701 is connected to the signal lines S1 to Sm through a printed circuit such as an FPC. Note that the signal line driver circuit 1701 may be formed over the insulating substrate 1705, or a circuit which forms part of the signal line driver circuit 1701 may be formed over the insulating substrate 1705.

Note that the above-described wirings and/or the electrodes can also be applied to other display devices, shift registers, and pixels.

The signal line driver circuit 1701 inputs voltage or current as a video signal to each of the signal lines S1 to Sm. Note that the video signal may be either a digital signal or an analog signal. In addition, a positive electrode and a negative electrode of the video signal may be inverted in each frame (i.e., frame inversion driving), may be inverted in each row (i.e., gate line inversion driving), may be inverted in each column (i.e., source line inversion driving), or may be inverted in each row and each column (i.e., dot inversion driving). Further, the video signal may be input to each of the signal lines S1 to Sm by dot sequential driving or line sequential driving. Furthermore, the signal line driver circuit 1701 may input not only the video signal but also constant voltage such as precharge voltage to each of the signal lines S1 to Sm. It is preferable that a constant voltage such as precharge voltage be input in each gate selection period or each frame.

Note that the scan line driver circuit 1702 inputs a signal to each of the scan line G1 to Gn and sequentially selects (hereinafter also referred to as scans) the scan lines G1 to Gn from a first row. Then, the scan line driver circuit 1702 selects a plurality of the pixels 1703 connected to the selected scan lines. Here, a period in which one scan line is selected is referred to as one gate selection period and a period in which one scan line is not selected is referred to as a non-selection period. In addition, the signal which is output to each scan line by the scan line driver circuit 1702 is referred to as a scan signal. Further, the maximum value of the scan signal is higher than the maximum value of the video signal or the maximum voltage of the signal line, and the minimum value of the scan signal is lower than the minimum value of the video signal or the minimum voltage of the signal line.

When the pixel 1703 is selected, a video signal is input to the pixel 1703 from the signal line driver circuit 1701 through the signal line Alternatively, when the pixel 1703 is not selected, the pixel 1703 holds a video signal (a potential in accordance with the video signal) which is input in the selection period.

Although not shown, a plurality of potentials and a plurality of signals are supplied to each of the signal line driver circuit 1701 and the scan line driver circuit 1702.

Figure 17:
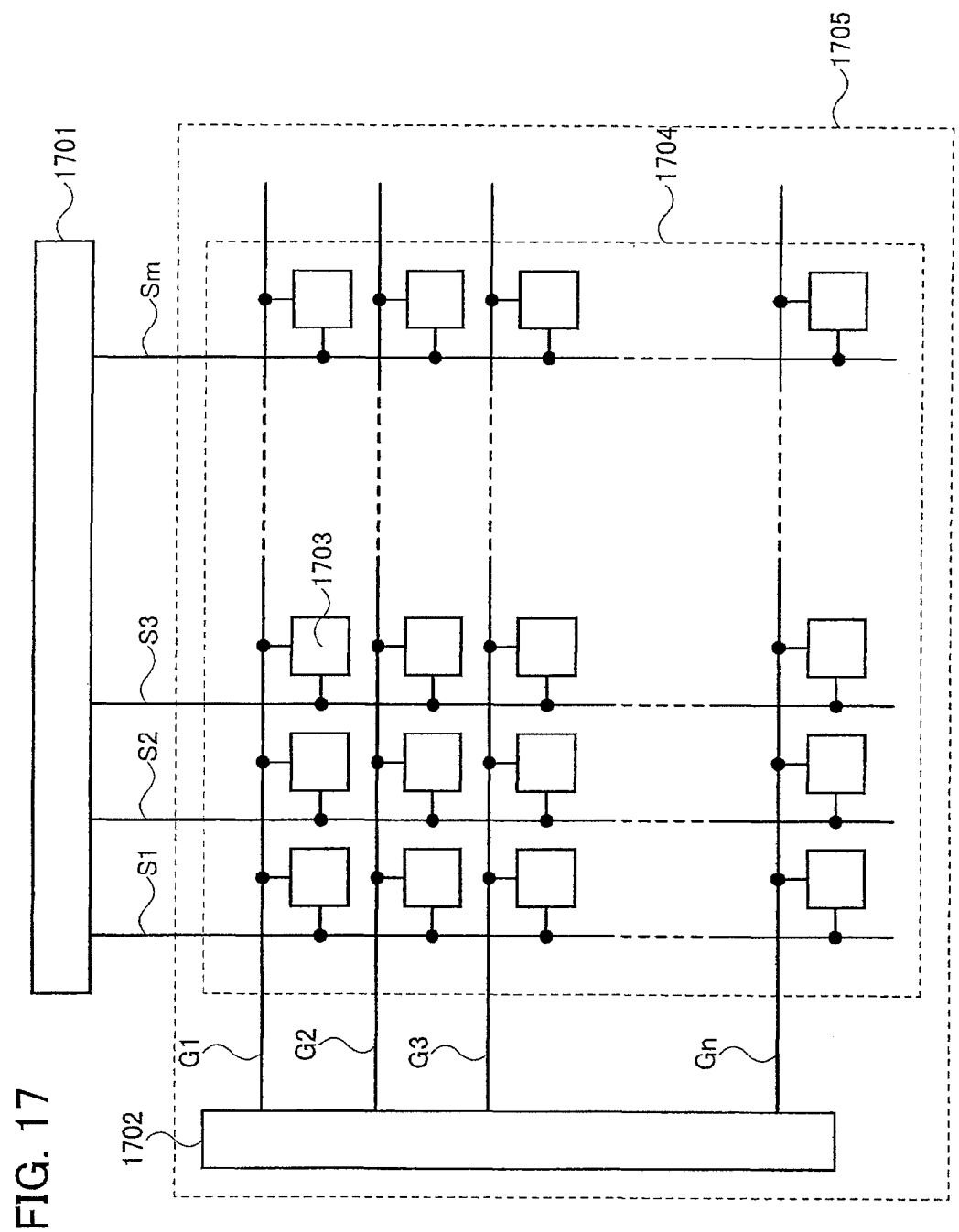
FIG. 17 is a diagram showing a structure of a display device shown in Embodiment Mode 1.
Figure 18:
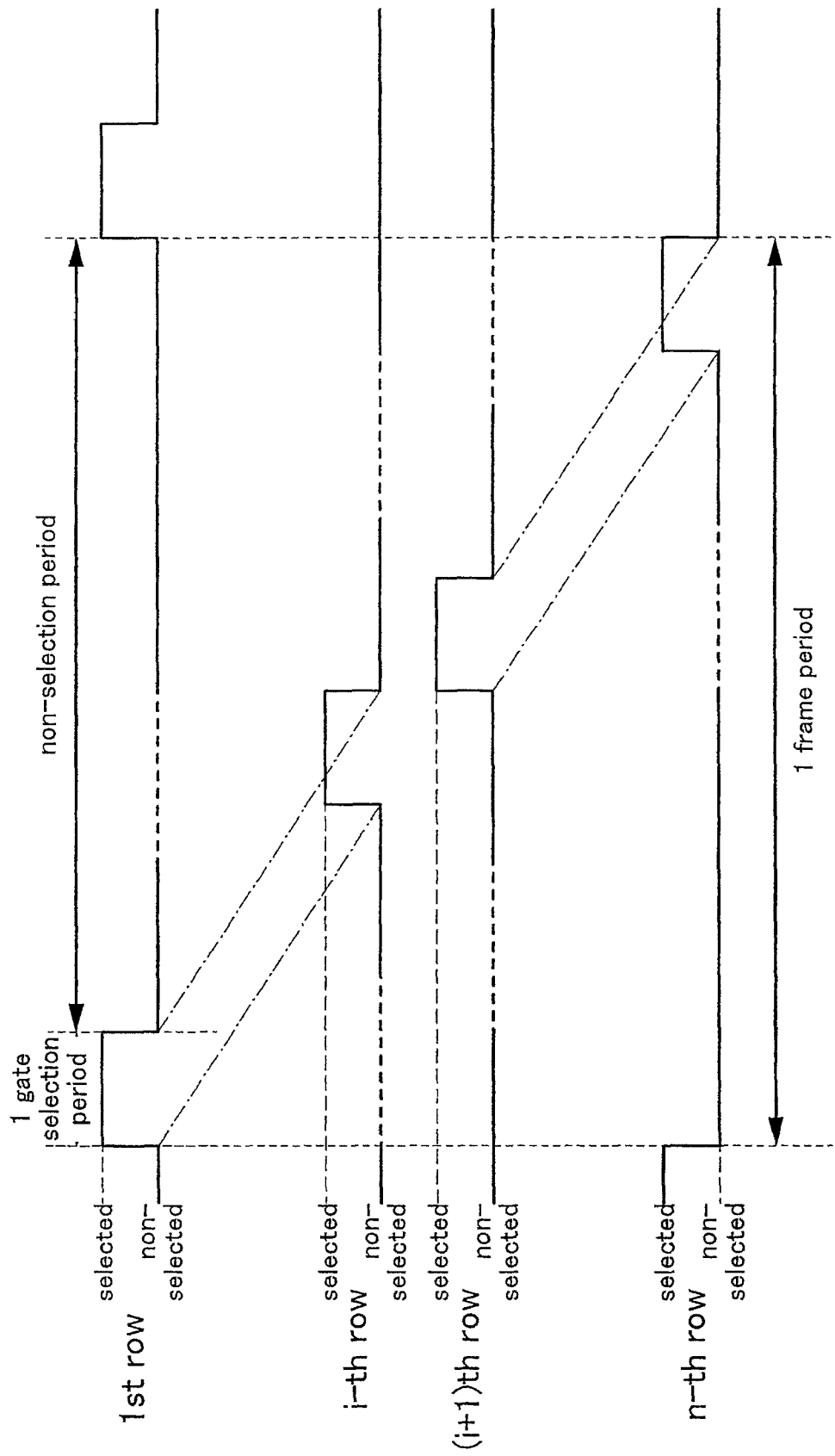
FIG. 18 is a timing chart showing writing operations of the display device shown in FIG. 17.

Next, operations of the display device shown in FIG. 17 are described with reference to a timing chart in FIG. 18. Note that FIG. 18 shows one frame period which corresponds to a period for displaying an image for one screen. Note that although one frame period is not particularly limited, it is preferable that one frame period be 1/60 second or less so that a person viewing an image does not perceive a flicker.

Note that the timing chart in FIG. 18 shows selection timing of each of the scan line G1 of a first row, the scan line Gi of an i-th row, the scan line Gi+1 of an (i+1)th row, and the scan line Gn of an n-th row.

In FIG. 18, for example, the scan line Gi of the i-th row is selected and a plurality of the pixels 1703 connected to the scan line Gi are selected. Then, a video signal is input to each of the plurality of the pixels 1703 connected to the scan line Gi and each of the plurality of the pixels 1703 connected to the scan line Gi holds a potential in accordance with the video signal. After that, the scan line Gi of the i-th row is not selected, the scan line Gi+1 of the (i+1)th row is selected, and a plurality of the pixels 1703 connected to the scan line Gi+1 are selected. Then, a video signal is input to each of the plurality of the pixels 1703 connected to the scan line Gi+1 and each of the plurality of the pixels 1703 connected to the scan line Gi+1 holds a potential in accordance with the video signal. The scan lines G1 to Gn are sequentially selected in one frame period in this manner, and the plurality of the pixels 1703 connected to each scan line are sequentially selected. Then, a video signal is input to each of the plurality of the pixels 1703 connected to each scan line and each of the plurality of the pixels 1703 connected to each scan line holds a potential in accordance with the video signal.

In addition, since a display device using the shift register of this embodiment mode as the scan line driver circuit 1702 can operate at high speed, the display device can be made larger or can be made higher definition. Further, in the display device of this embodiment mode, a process can be simplified. Furthermore, in the display device of this embodiment mode, manufacturing cost can be reduced. Moreover, in the display device of this embodiment mode, yield can be improved.

Note that in the display device in FIG. 17, since the signal line driver circuit 1701 which necessarily operates at high speed, and the scan line driver circuit 1702 and the pixel portion 1704 are formed over different substrates, amorphous silicon can be used for a semiconductor layer of a transistor included in the scan line driver circuit 1702 and a semiconductor layer of a transistor included in the pixel 1703. Therefore, in the display device in FIG. 17, the manufacturing process can be simplified. In addition, in the display device in FIG. 17, manufacturing cost can be reduced. Further, in the display device in FIG. 17, yield can be improved. Furthermore, the display device in FIG. 17 can be made larger. Alternatively, even when polysilicon or single crystalline silicon is used for the semiconductor layer of each transistor, the manufacturing process can be simplified.

When the signal line driver circuit 1701, and the scan line driver circuit 1702 and the pixel 1703 are formed over the same substrate, it is preferable that polysilicon or a single crystalline silicon be used for the semiconductor layer of the transistor included in the scan line driver circuit 1702 and the semiconductor layer of the transistor included in the pixel 1703.

Note that the number, arrangement, and the like of each driver circuit are not limited to those of FIG. 17 as long as a pixel is selected and a video signal can be written to the pixel as shown in FIG. 17.

Figure 19:
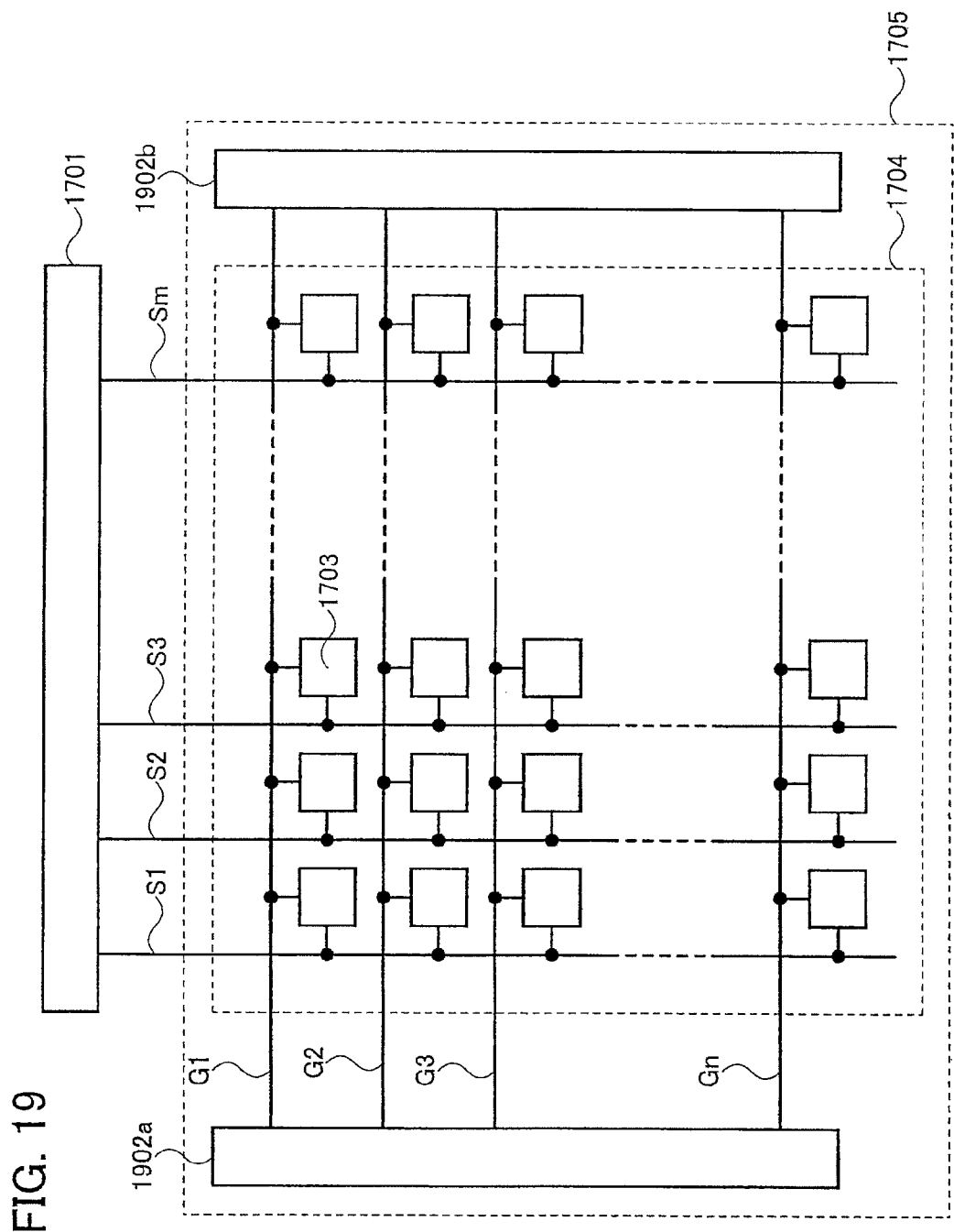
FIG. 19 is a diagram showing a structure of the display device shown in Embodiment Mode 1.

For example, as shown in FIG. 19, the scan lines G1 to Gn may be scanned with a first scan line driver circuit 1902a and a second scan line driver circuit 1902b. Each of the first scan line driver circuit 1902a and the second scan line driver circuit 1902b has a structure which is similar to that of the scan line driver circuit 1702 shown in FIG. 17; corresponding wirings are electrically connected with each other in the first scan line driver circuit 1902a and the second scan line driver circuit 1902b; the first scan line driver circuit 1902a and the second scan line driver circuit 1902b scan the scan lines G1 to Gn with the same timing. Further, the first scan line driver circuit 1902a and the second scan line driver circuit 1902b may be referred to as a first driver circuit and a second driver circuit, respectively.

Even when a defect occurs in one of the first scan line driver circuit 1902a and the second scan line driver circuit 1902b in a display device in FIG. 19, the scan lines G1 to Gn can be scanned with the other of the first scan line driver circuit 1902a and the second scan line driver circuit 1902b. Therefore, the display device in FIG. 19 can have redundancy. In addition, a load (wiring resistance and parasitic capacitance of the scan lines) of the first scan line driver circuit 1902a and a load of the second scan line driver circuit 1902b in the display device in FIG. 19 can be reduced approximately in half of those in the display device in FIG. 17. Therefore, delay and dullness of signals input to the scan lines G1 to Gn (output signals of the first scan line driver circuit 1902a and the second scan line driver circuit 1902b) can be reduced. Further, since the load of the first scan line driver circuit 1902a and the load of the second scan line driver circuit 1902b in the display device in FIG. 19 can be reduced, the scan lines G1 to Gn can be scanned at high speed. Furthermore, since the scan lines G1 to Gn can be scanned at high speed, a panel can be made larger or can be made higher definition. Note that portions which are common to those in FIG. 17 are denoted by common reference numerals and description thereof is omitted.

Figure 20:
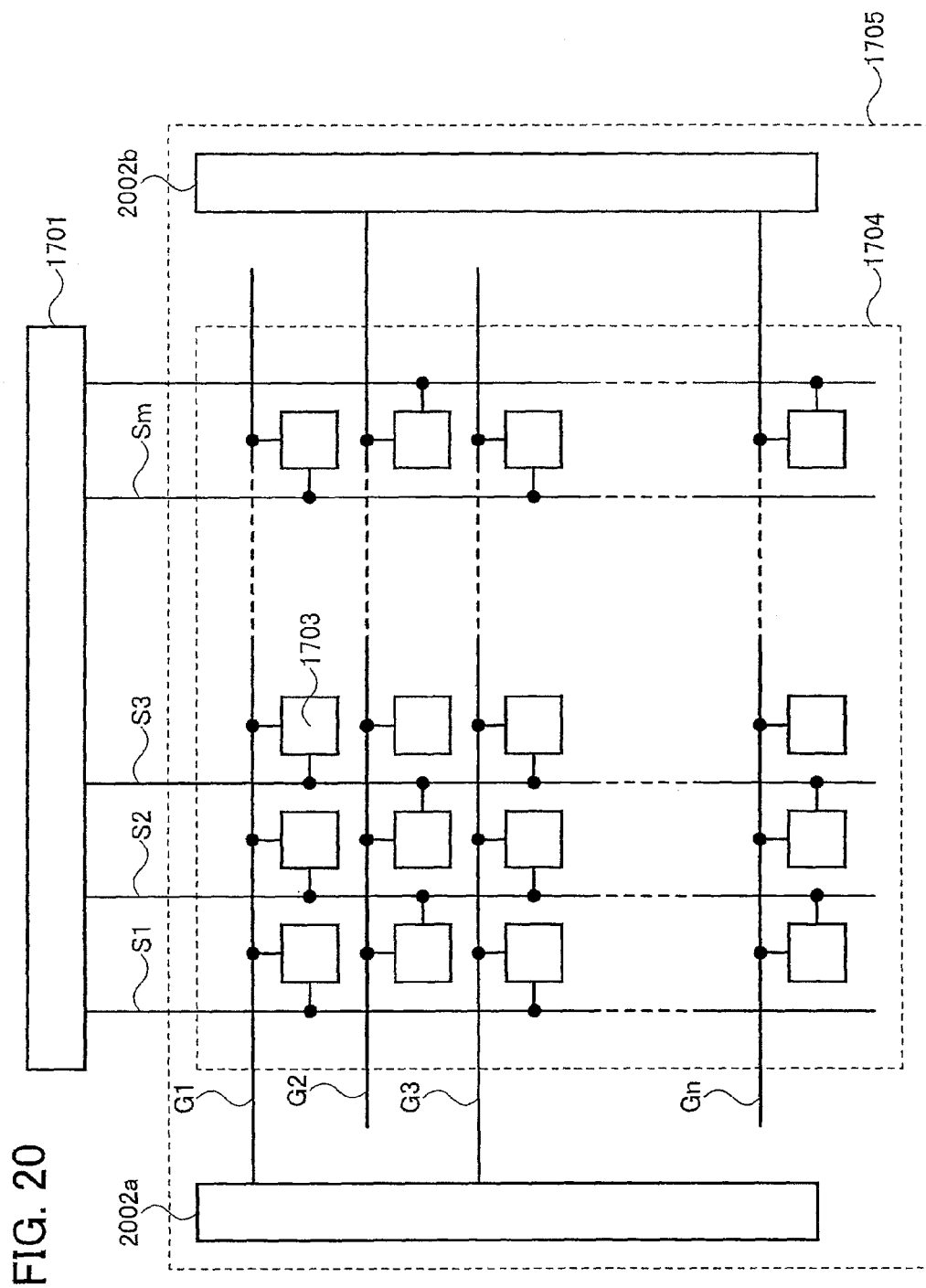
FIG. 20 is a diagram showing a structure of the display device shown in Embodiment Mode 1.

As another example, FIG. 20 shows a display device in which a video signal can be written to a pixel at high speed. In the display device in FIG. 20, a video signal is input to the pixels 1703 of odd-numbered rows from signal lines of odd-numbered columns, and a video signal is input to the pixels 1703 of even-numbered rows from signal lines of even-numbered columns. In addition, in the display device in FIG. 20, scan lines of odd-numbered stages among the scan lines G1 to Gn are scanned with a first scan line driver circuit 2002a, and scan lines of even-numbered stages among the scan lines G1 to Gn are scanned with a second scan line driver circuit 2002b. Further, a start signal input to the first scan line driver circuit 2002a is input later than a start signal input to the second scan line driver circuit 2002b for a 1/4 period of a clock signal.

Note that in the display device in FIG. 20, dot inversion driving can be performed just by inputting a positive video signal and a negative video signal to each signal line in each column in one frame period. In addition, in the display device in FIG. 20, frame inversion driving can be performed by inverting polarity of a video signal input to each signal line in each one frame period.

Figure 21:
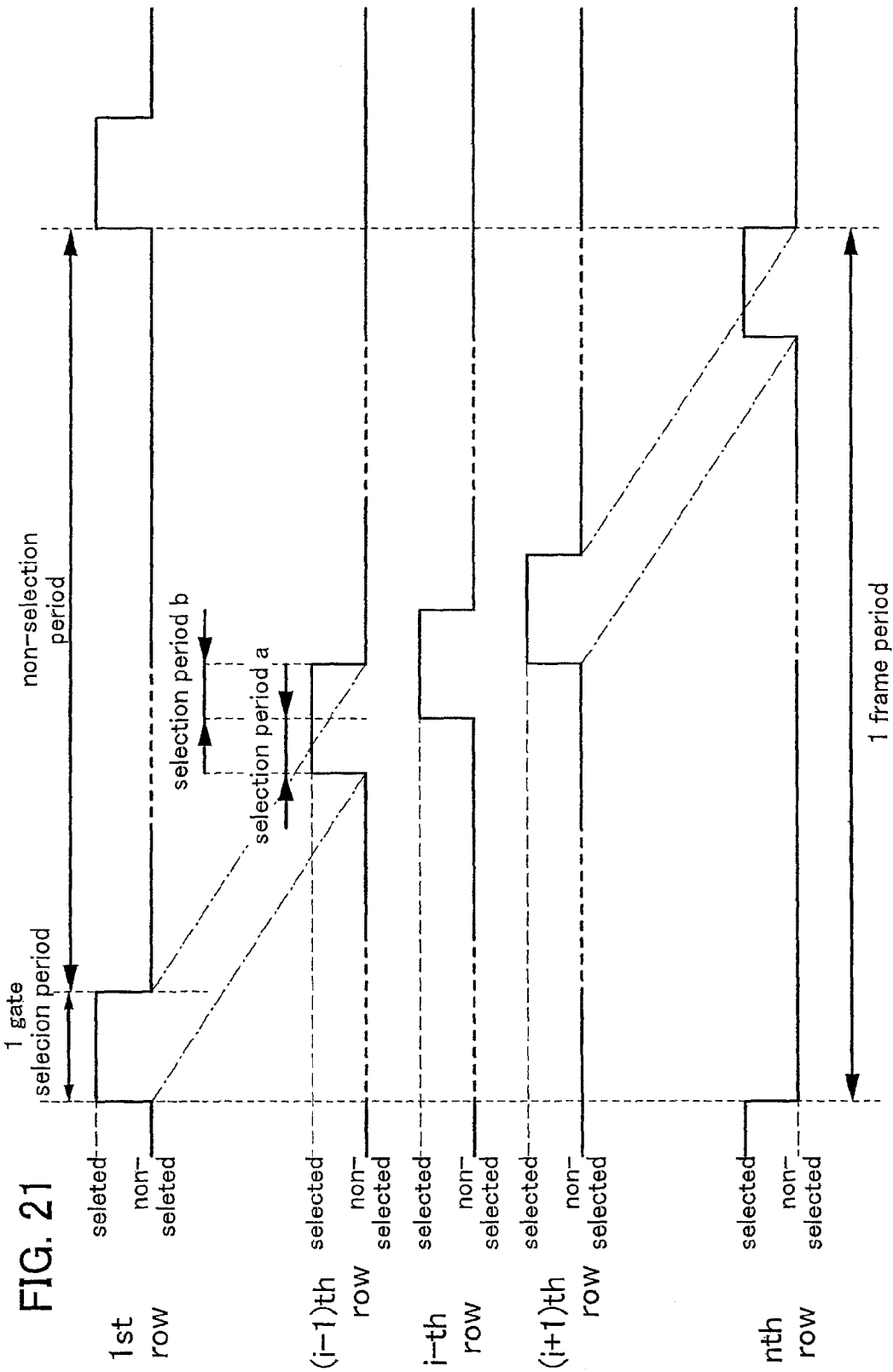
FIG. 21 is a timing chart showing writing operations of the display device shown in FIG. 20.

Operations of the display device in FIG. 20 are described with reference to a timing chart in FIG. 21. Note that the timing chart in FIG. 21 shows selection timing of each of the scan line G1 of first row, the scan line Gi−1 of an (i−1)th row, the scan line Gi of the i-th row, the scan line Gi+1 of the (i+1)th row, and the scan line Gn of the n-th row. In addition, in the timing chart in FIG. 21, one selection period is divided into a selection period a and a selection period b. Further, the timing chart in FIG. 21 shows the case where dot inversion driving and frame inversion driving are performed in the display device in FIG. 20.

In FIG. 21, for example, the selection period a of the scan line Gi of the i-th row overlaps with the selection period b of the scan line Gi−1 of the (i−1)th row, and the selection period b of the scan line Gi of the i-th row overlaps with the selection period a of the scan line Gi+1 of the (i+1)th row. Therefore, in the selection period a, a video signal which is similar to a video signal input to the pixel 1703 of the (i−1)th row and a (j+1)th column is input to the pixel 1703 of the i-th row and the j-th column. In addition, in the selection period b, a video signal which is similar to the video signal input to the pixel 1703 of the i-th row and the j-th column is input to the pixel 1703 of the (i+1)th row and the (j+1)th column. Note that the video signal input to each of the pixels 1703 in the selection period b is an original video signal, and the video signal input to each of the pixels 1703 in the selection period a is a precharge video signal of each of the pixels 1703. Therefore, after each of the pixels 1703 is precharged by the video signal input to the pixel 1703 of the (i−1)th row and (j+1)th column in the selection period a, the original video signal (of the i-th row and j-th column) is input to each of the pixels 1703 in the selection period b.

As described above, since the video signal can be written to each of the pixels 1703 at high speed, the display device in FIG. 20 can be easily made larger or can be easily made higher definition. In addition, since a video signal having the same polarity is input to each signal line in one frame period, there is not much charging and discharging of each signal line and low power consumption can be achieved. Further, since a load of an IC for inputting the video signal can be significantly reduced in the display device in FIG. 20, heat generation, power consumption, and the like of the IC can be reduced. Furthermore, since drive frequency of the first scan line driver circuit 2002a and the second scan line driver circuit 2002b can be reduced approximately in half in the display device in FIG. 20, power can be saved.

Note that in the display device of this embodiment mode, various driving methods can be performed depending on the structure and the driving method of the pixels 1703. For example, the scan lines may be scanned with the scan line driver circuits a plurality of times in one frame period.

Note that another wiring or the like may be added to each of the display devices in FIGS. 17, 19, and 20 depending on the structure of the pixels 1703. For example, a constant power supply line, a capacitor line, a scan line, or the like may be added. Note also that in the case of adding a scan line, a scan line driver circuit to which the shift register of this embodiment mode is applied may be added. As another example, a dummy scan line, a signal line, a power supply line, or a capacitor line may be provided to the pixel portion.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 2]

In this embodiment mode, structures and driving methods of a flip-flop which is different from those of Embodiment Mode 1, a driver circuit including the flip-flop, and a display device including the driver circuit are described. Note that portions which are similar to those of Embodiment Mode 1 are denoted by common reference numerals and detailed description of the portions which are the same and portions which have similar functions is omitted.

As a structure of the flip-flop of this embodiment mode, a structure which is similar to that of the flip-flop of Embodiment Mode 1 can be used. Note that drive timing of the flip-flop is different from that of Embodiment Mode 1. Thus, in this embodiment mode, description of the structure of the flip-flop is omitted.

Note that although the case is described in which the drive timing of this embodiment mode is applied to the flip-flop in FIG. 1A, the drive timing of this embodiment mode can be freely combined with each of the flip-flops in FIGS. 1B, 1C, 5A, 5B, 5C, 7A, 7B, 8A, 8B, 9A, 9B, 10A, and 10B. In addition, the drive timing of this embodiment mode can be freely combined with the drive timing described in Embodiment Mode 1.

Figure 22:
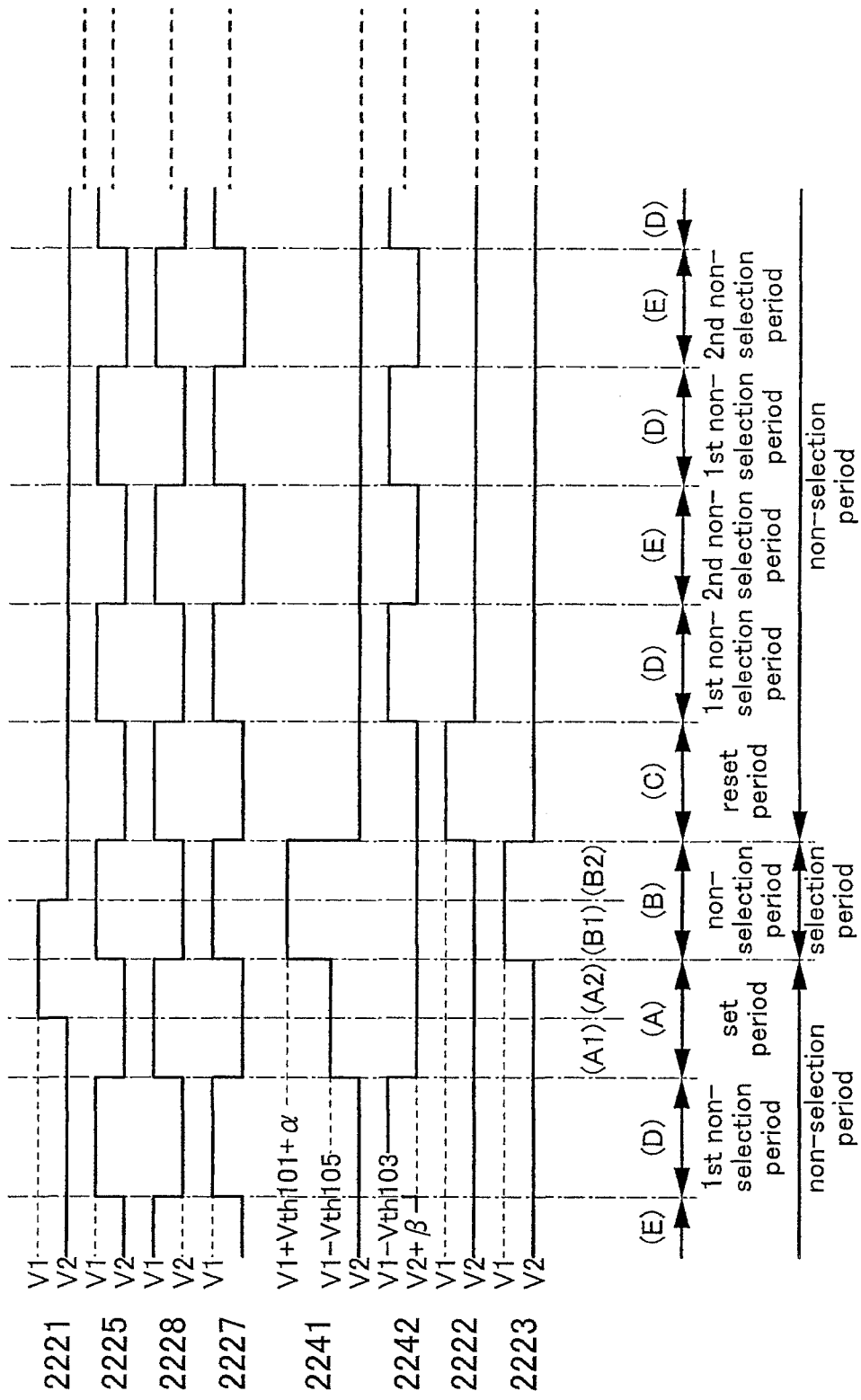
FIG. 22 is a timing chart showing operations of a flip-flop shown in Embodiment Mode 2.

Next, operations of the flip-flop of this embodiment mode are described with reference to the flip-flop in FIG. 1A and a timing chart in FIG. 22. Note that the timing chart in FIG. 22 is described by dividing the whole period into a set period, a selection period, a reset period, a first non-selection period, and a second non-selection period. Note also that the set period is divided into a first set period and a second set period, and the selection period is divided into a first selection period and a second selection period.

Note that a signal 2221, a signal 2225, a signal 2228, a signal 2227, and a signal 2222 shown in FIG. 22 are input to the first wiring 121, the fifth wiring 125, the eighth wiring 128, the seventh wiring 127, and the second wiring 122, respectively. In addition, a signal 2223 shown in FIG. 22 is output from the third wiring 123. Here, each of the signal 2221, the signal 2225, the signal 2228, the signal 2227, the signal 2222, and the signal 2223 is a digital signal in which a potential of an H-level signal is at V1 (hereinafter also referred to as an H level) and a potential of an L-level signal is at V2 (hereinafter also referred to as an L level). Further, the signal 2221, the signal 2225, the signal 2228, the signal 2227, the signal 2222, and the signal 2223 may be referred to as a start signal, a power clock signal (PCK), a first control clock signal (CCK1), a second control clock signal (CCK2), a reset signal, and an output signal, respectively.

The flip-flop of this embodiment mode basically performs operations which are similar to those of the flip-flop described in Embodiment Mode 1. Note that in the flip-flop of this embodiment mode, timing at which an H-level signal is input to the first wiring 121 is delayed for a 1/4 period of a clock signal, which is different from the flip-flop of Embodiment Mode 1.

In a first set period (A1), a second set period (A2), a reset period (C), a first non-selection period (D), and a second non-selection period (E) shown in FIG. 22, the flip-flop of this embodiment mode performs operations which are similar to those in the second non-selection period (E), the set period (A), the reset period (C), the first non-selection period (D), and the second non-selection period (E) shown in FIG. 2. Thus, description thereof is omitted.

Figure 23:
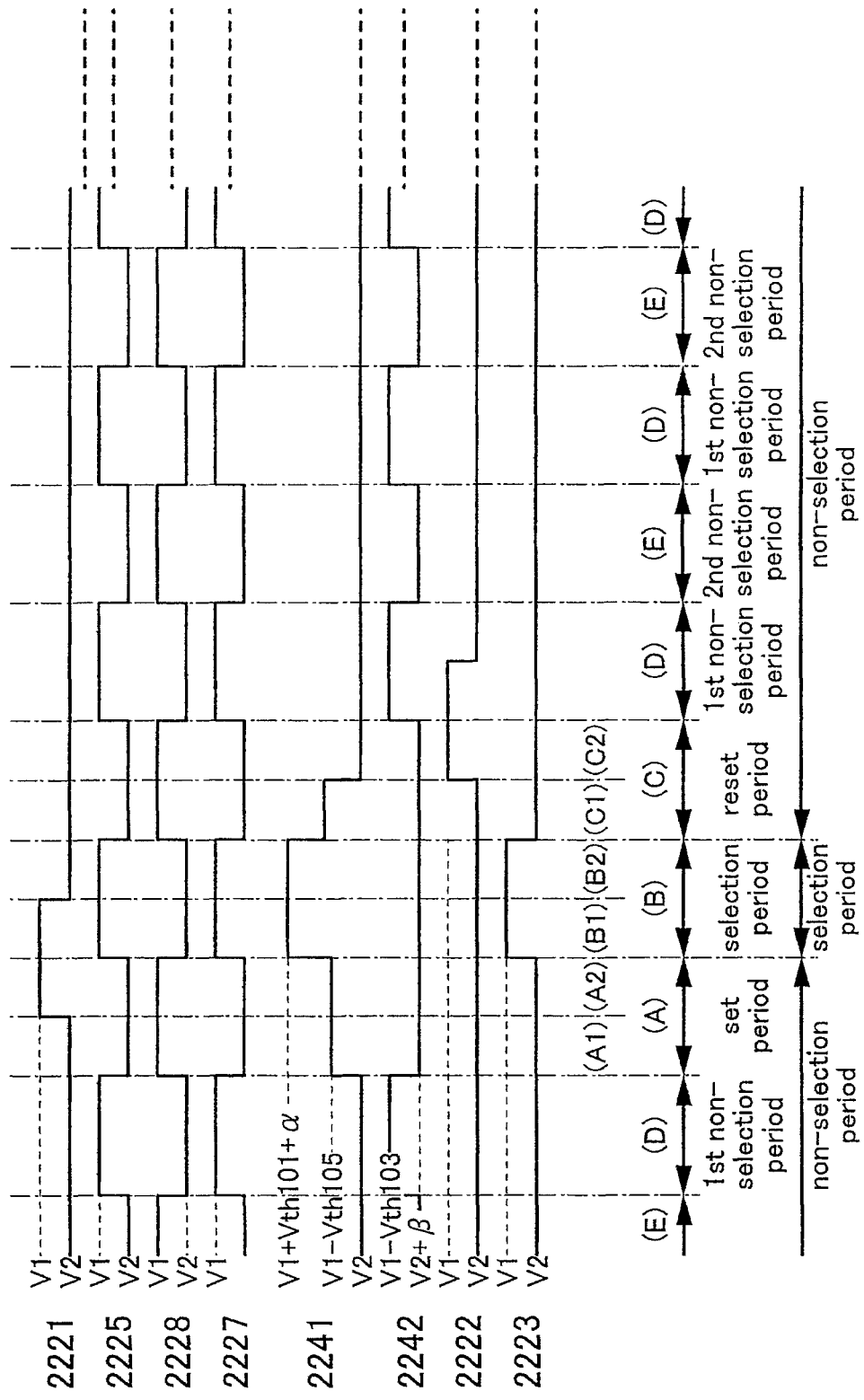
FIG. 23 is a timing chart showing operations of the flip-flop shown in Embodiment Mode 2.

Note that as shown in FIG. 23, by delaying timing for inputting an H-level signal to the second wiring 122 for a 1/4 period of a clock signal, fall time of an output signal can be significantly shortened. That is, in the flip-flop of this embodiment mode to which FIG. 23 is applied, an L-level signal is input to the fifth wiring in a first reset period shown in period C1 of FIG. 23 and a potential of the node 141 lowers to approximately V1+Vth101. Therefore, the first transistor 101 remains on and an L-level signal is output from the third wiring 123. Since an L-level signal is input to the third wiring 123 through the first transistor 101 having a larger value of W/L, time when a potential of the third wiring 123 becomes an L level from an H level can be significantly shortened. After that, in the flip-flop of this embodiment mode to which FIG. 23 is applied, the seventh transistor 107 is turned on in a second reset period shown in period C2 of FIG. 23 and the potential of the node 141 becomes V2. Since a potential of the node 142 at this time becomes V1-Vth103 and the third transistor 103 is turned on, an L-level signal is output from the third wiring 123.

In the flip-flop of this embodiment mode, advantageous effects which are similar to those of the flip-flop shown in Embodiment Mode 1 can be obtained.

Next, a structure and a driving method of a shift register including the above-described flip-flop of this embodiment mode are described.

The structure of the shift register of this embodiment mode is described with reference to FIG. 24. The shift register in FIG. 24 includes n pieces of flip-flops (flip-flops 2401_1 to 2401_n).

Figure 24:
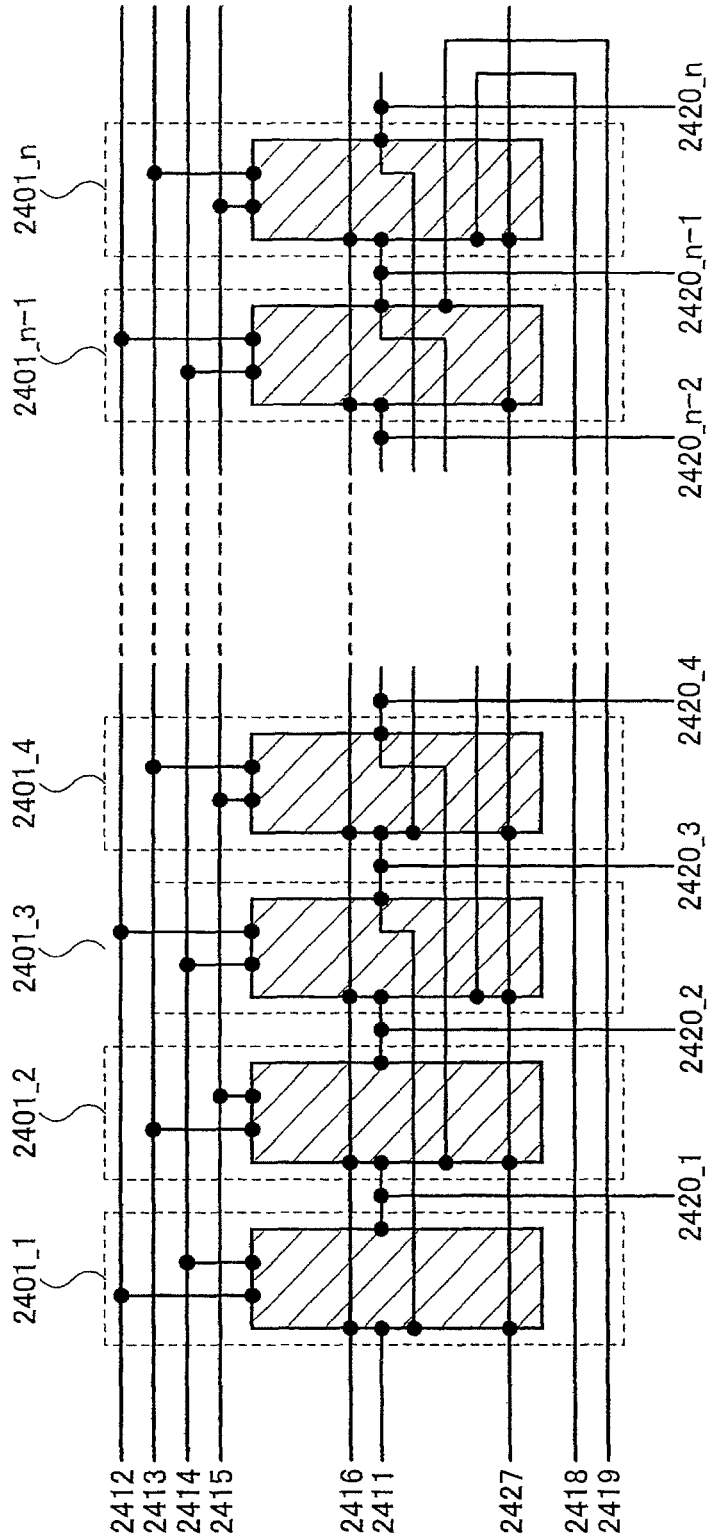
FIG. 24 is a diagram showing a structure of a shift register shown in Embodiment Mode 2.

Connection relations of the shift register in FIG. 24 are described. In a flip-flop 2401_i of an i-th stage (any one of the flip-flops 2401_1 to 2401_) of the shift register in FIG. 24, the first wiring 121 shown in FIG. 1A is connected to a tenth wiring 2420_i−1; the second wiring 122 shown in FIG. 1A is connected to a tenth wiring 2420_i+2; the third wiring 123 shown in FIG. 1A is connected to a tenth wiring 2420_i; the fourth wiring 124, the tenth wiring 130, the eleventh wiring 131, the twelfth wiring 132, and the thirteenth wiring 133 shown in FIG. 1A are connected to a seventh wiring 2417; the fifth wiring 125 and the seventh wiring 127 shown in FIG. 1A are connected to a second wiring 2412 in a flip-flop of a (4N−3)th stage (N corresponds to a natural number which is 1 or more); the fifth wiring 125 and the seventh wiring 127 shown in FIG. 1A are connected to a third wiring 2413 in a flip-flop of a (4N−2)th stage; the fifth wiring 125 and the seventh wiring 127 shown in FIG. 1A are connected to a fourth wiring 2414 in a flip-flop of a (4N−1)th stage; the fifth wiring 125 and the seventh wiring 127 shown in FIG. 1A are connected to a fifth wiring 2415 in a flip-flop of a 4N-th stage; the eighth wiring 128 shown in FIG. 1A is connected to the fourth wiring 2413 in the flip-flop of the (4N−3)th stage; the eighth wiring 128 shown in FIG. 1A is connected to the fifth wiring 2415 in the flip-flop of the (4N−2)th stage; the eighth wiring 128 shown in FIG. 1A is connected to the second wiring 2412 in the flip-flop of the (4N−1)th stage; the eighth wiring 128 shown in FIG. 1A is connected to the third wiring 2413 in the flip-flop of the 4N-th stage; and the sixth wiring 126 and the ninth wiring 129 shown in FIG. 1A are connected to a sixth wiring 2416. Note that the first wiring 121 shown in FIG. 1A of the flip-flop 2401_1 of a first stage is connected to a first wiring 2411; the second wiring 122 shown in FIG. 1A of the flip-flop 2401_n−1 of an (n−1)th stage is connected to a ninth wiring 2419; and the second wiring 122 shown in FIG. 1A of the flip-flop 2401_n of an n-th stage is connected to an eighth wiring 2418.

Note that when the timing chart in FIG. 23 is applied to the flip-flop of this embodiment mode, the second wiring 122 shown in FIG. 1A of the flip-flop 2401_i of the i-th stage is connected to a tenth wiring 2420_i+3. Therefore, the second wiring 122 shown in FIG. 1A of the flip-flop 2401_n−3 of an (n−3)th stage is connected to a wiring which is additionally provided.

Note also that the first wiring 2411, the second wiring 2412, the third wiring 2413, the fourth wiring 2414, the fifth wiring 2415, the eighth wiring 2418, and the ninth wiring 2419 may be referred to as a first signal line, a second signal line, a third signal line, a fourth signal line, a fifth signal line, a sixth signal line, and a seventh signal line, respectively. Further, the sixth wiring 2416 and the seventh wiring 2417 may be referred to as a first power supply line and a second power supply line, respectively.

Next, operations of the shift register shown in FIG. 24 are described with reference to a timing chart in FIG. 25 and a timing chart in FIG. 26. Here, the timing chart in FIG. 25 is divided into a scanning interval and a retrace interval.

Note that the potential of V1 is supplied to the fourth wiring 2414 and the potential of V2 is supplied to the fifth wiring 2415.

Figure 25:
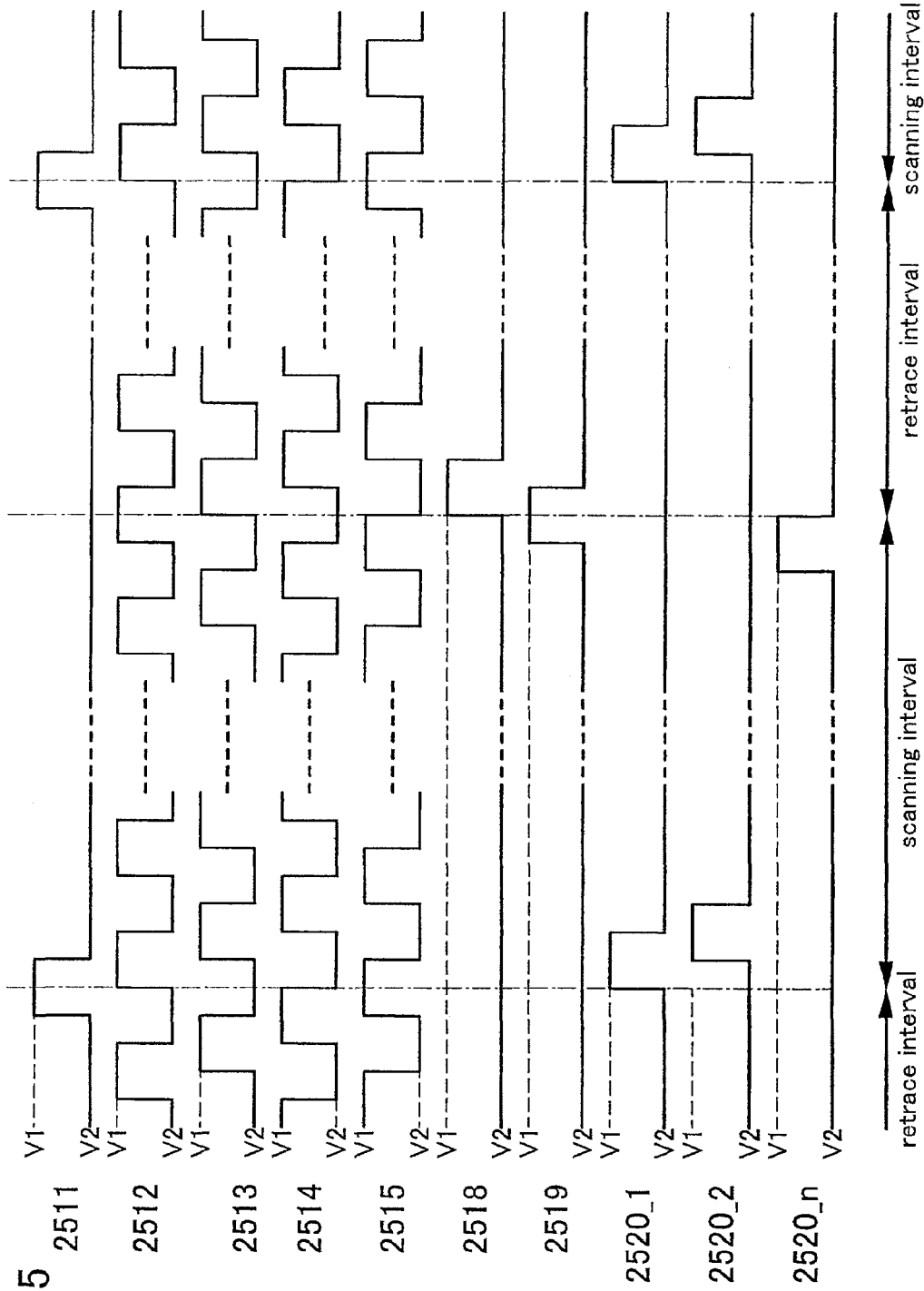
FIG. 25 is a timing chart showing operations of the shift register shown in FIG. 24.

Note that a signal 2511, a signal 2512, a signal 2513, a signal 2514, a signal 2515, a signal 2518, and a signal 2519 shown in FIG. 25 are input to the first wiring 2411, the second wiring 2412, the third wiring 2413, the fourth wiring 2414, the fifth wiring 2415, the eighth wiring 2418, and the ninth wiring 2419, respectively. Here, each of the signal 2511, the signal 2512, the signal 2513, the signal 2514, the signal 2515, the signal 2518, and the signal 2519 is a digital signal in which a potential of an H-level signal is at V1 (hereinafter also referred to as an H level) and a potential of an L-level signal is at V2 (hereinafter also referred to as an L level). Further, the signal 2511, the signal 2512, the signal 2513, the signal 2514, the signal 2515, the signal 2518, and the signal 2519 may be referred to as a start signal, a first clock signal, a second clock signal, a third clock signal, a fourth clock signal, a first reset signal, and a second reset signal, respectively.

Note that any signal, potential, or current may be input to each of the first wiring 2411 to the ninth wiring 2419.

A digital signal in which a potential of an H-level signal is at V1 (hereinafter also referred to as an H level) and a potential of an L-level signal is at V2 (hereinafter also referred to as an L level) is output from each of the tenth wirings 2420_1 to 2420_n. Note that by connecting a buffer to each of the tenth wirings 2420_1 to 2420_n similarly to Embodiment Mode 1, a range of operating conditions can be widened.

Note that a signal output from the tenth wiring 2420_i−1 is used as a start signal of the flip-flop 2401_i, and a signal output from the tenth wiring 2420_i+2 is used as a reset signal of the flip-flop 2401_i. Here, a start signal of the flip-flop 2401_1 is input from the first wiring 2411; a second reset signal of the flip-flop 2401_n−1 is input from the ninth wiring 2419; and a first reset signal of the flip-flop 2401_n is input from the eighth wiring 2418. Note also that a signal output from the tenth wiring 2420_1 may be used as the second reset signal of the flip-flop 2401_n−1, and a signal output from the tenth wiring 2420_2 may be used as the first reset signal of the flip-flop 2401_n. Alternatively, a signal output from the tenth wiring 2420_2 may be used as the second reset signal of the flip-flop 2401_n−1, and a signal output from the tenth wiring 2420_3 may be used as the first reset signal of the flip-flop 2401_n. Further alternatively, a first dummy flip-flop and a second dummy flip-flop may be additionally provided, and an output signal of the first dummy flip-flop and an output signal of the second dummy flip-flop may be used as the first reset signal and the second reset signal, respectively. Thus, the number of the wirings and the number of the signals can be reduced.

Figure 26:
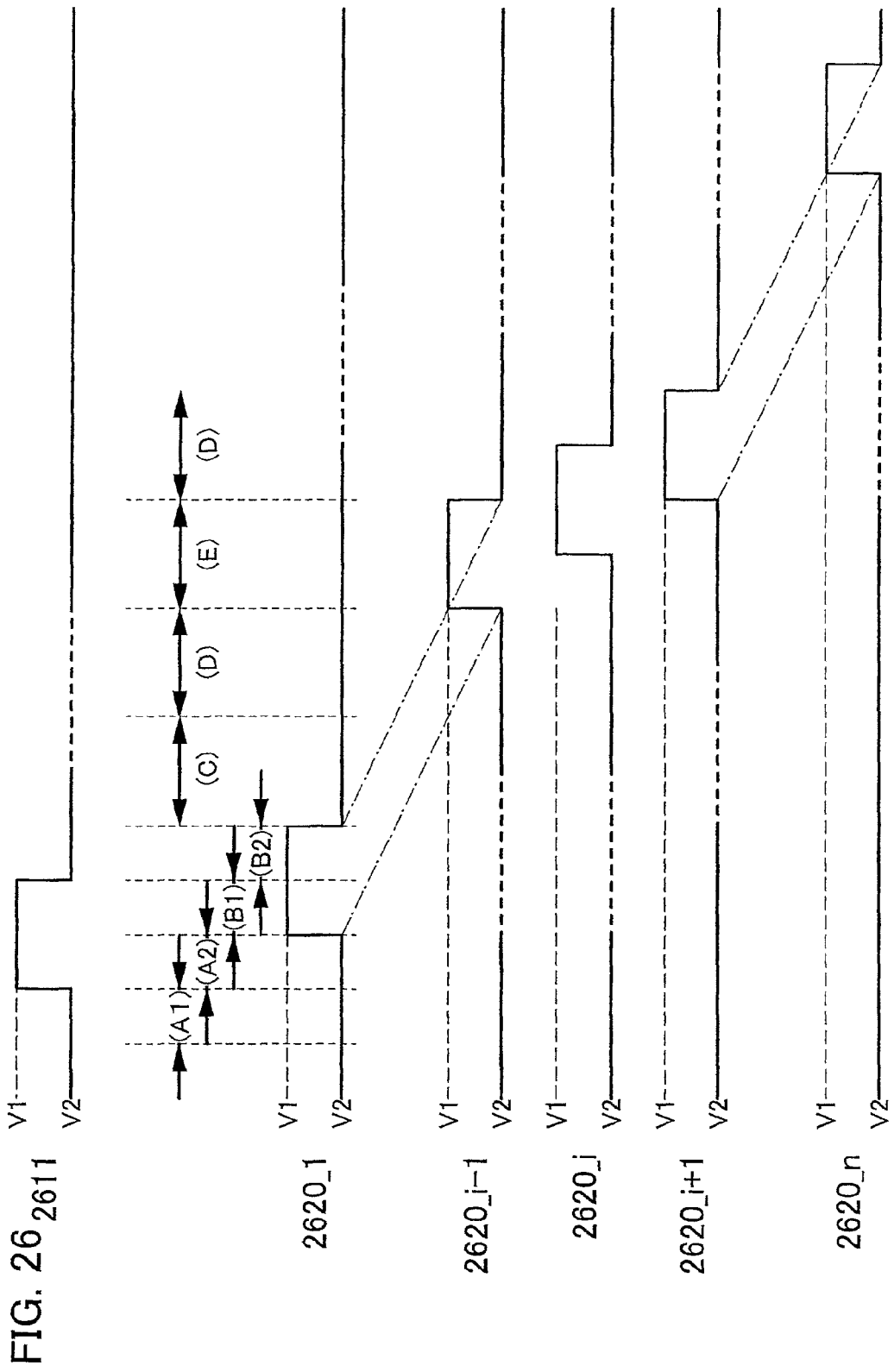
FIG. 26 is a timing chart showing operations of the shift register shown in FIG. 24.

As shown in FIG. 26, for example, when the flip-flop 2401_i enters the first selection period, an H-level signal (a selection signal) is output from the tenth wiring 2420_i. At this time, the flip-flop 2401_i+1 enters the second set period. After that, when the flip-flop 2401_i enters the second selection period, the tenth wiring 2420_i keeps outputting an H-level signal. At this time, the flip-flop 2401_41 enters the first selection period. After that, when the flip-flop 2401_i enters the reset period, an L-level signal is output from the tenth wiring 2420_i. At this time, the flip-flop 2401_i+1 enters the second selection period. After that, when the flip-flop 2401_i enters the first non-selection period, the tenth wiring 2420_i enters into a floating state and remains at V2. At this time, the flip-flop 2401_i+1 enters the reset period. After that, when the flip-flop 2401_i enters the second non-selection period, an L-level signal is output from the tenth wiring 2420_i. At this time, the flip-flop 2401_i+1 enters the second non-selection period.

In the shift register in FIG. 24, the selection signal can be output sequentially from the tenth wiring 2420_1 to the tenth wiring 2420_n in this manner. Further, since the second selection period of the flip-flop 2401_i and the first selection period of the flip-flop 2401_i+1 are the same period, the selection signal can be output from the tenth wiring 2420_i and the tenth wiring 2420_i+1 in the same period.

As described above, the shift register of this embodiment mode can be applied to a higher-definition display device or a large display device. Further, in the shift register of this embodiment mode, advantageous effects which are similar to those of the shift register shown in Embodiment Mode 1 can be obtained.

Next, a structure and a driving method of a display device including the above-described shift register of this embodiment mode are described. Note that it is only necessary that the display device of this embodiment mode at least include the flip-flop of this embodiment mode.

The structure of the display device of this embodiment mode is described with reference to FIG. 27. In the display device in FIG. 27, the scan lines G1 to Gn are scanned with a scan line driver circuit 2702. In addition, a video signal is input to the pixels 1703 of odd-numbered rows from signal lines of odd-numbered columns, and a video signal is input to the pixels 1703 of even-numbered rows from signal lines of even-numbered columns. Note that portions which are common to those in FIG. 17 are denoted by common reference numerals and description thereof is omitted.

Figure 27:
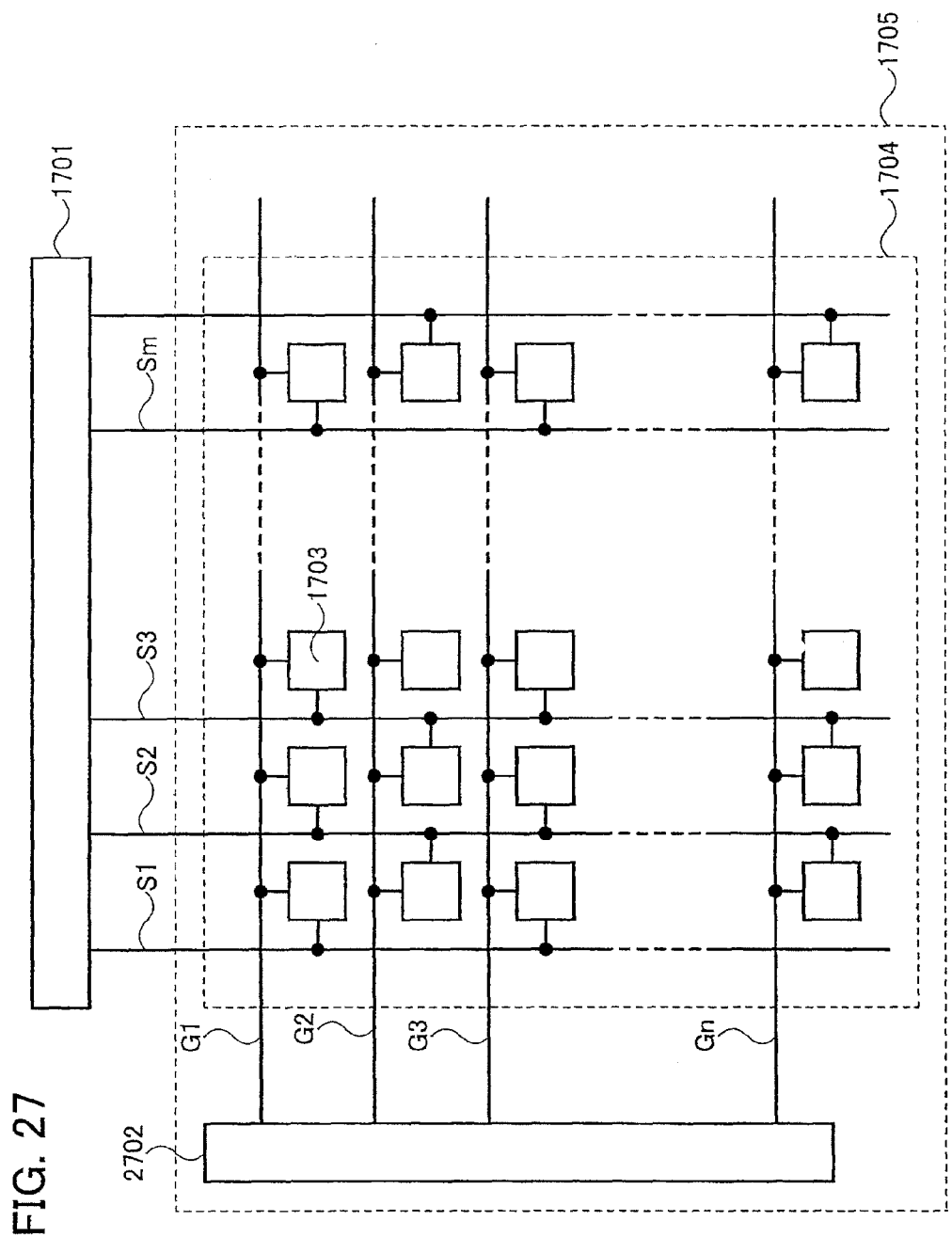
FIG. 27 is a diagram showing a structure of a display device shown in Embodiment Mode 2.

Note that by applying the shift register of this embodiment mode to the scan line driver circuit 2702 in the display device in FIG. 27, operations which are similar to those of the display device in FIG. 20 can be performed by one scan line driver circuit. Therefore, advantageous effects which are similar to those of the display device in FIG. 20 can be obtained.

Figure 28:
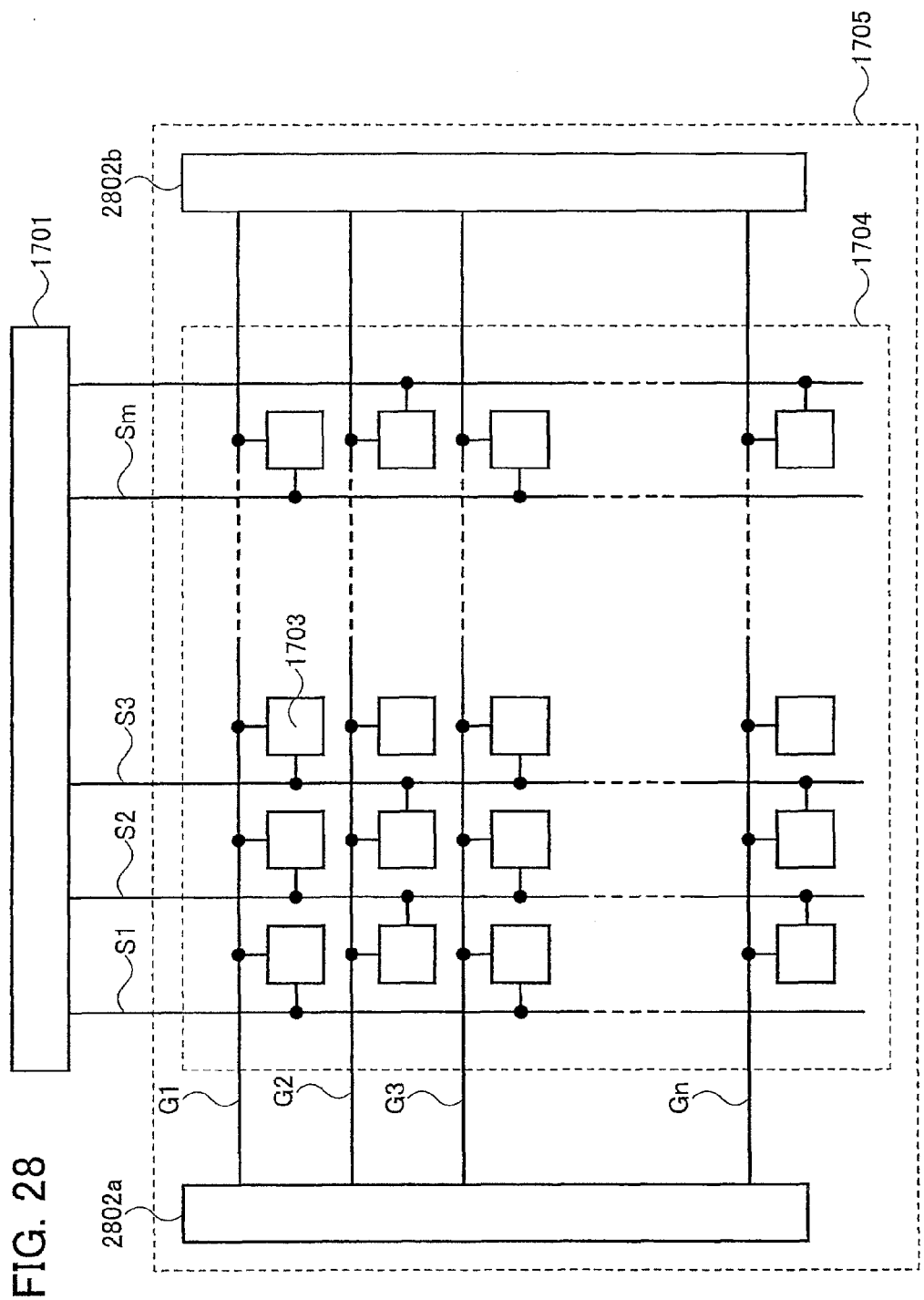
FIG. 28 is a diagram showing a structure of the display device shown in Embodiment Mode 2.

Note also that similarly to the display device in FIG. 19, the scan lines G1 to Gn may be scanned with a first scan line driver circuit 2802a and a second scan line driver circuit 2802b. Therefore, advantageous effects which are similar to those of the display device in FIG. 19 can be obtained. A structure of that case is shown in FIG. 28.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 3]

In this embodiment mode, structures and driving methods of a flip-flop which is different from those of Embodiment Modes 1 and 2, a driver circuit including the flip-flop, and a display device including the driver circuit are described. In the flip-flop of this embodiment mode, an output signal of the flip-flop and a transfer signal of the flip-flop are output from different wirings by different transistors. Note that portions which are similar to those of Embodiment Modes 1 and 2 are denoted by common reference numerals and detailed description of the portions which are the same and portions which have similar functions is omitted.

A basic structure of the flip-flop of this embodiment mode is described with reference to FIG. 40. A flip-flop shown in FIG. 40 is similar to the flip-flop in FIG. 1A to which a ninth transistor 109 and a tenth transistor 110 are added.

Figure 40:
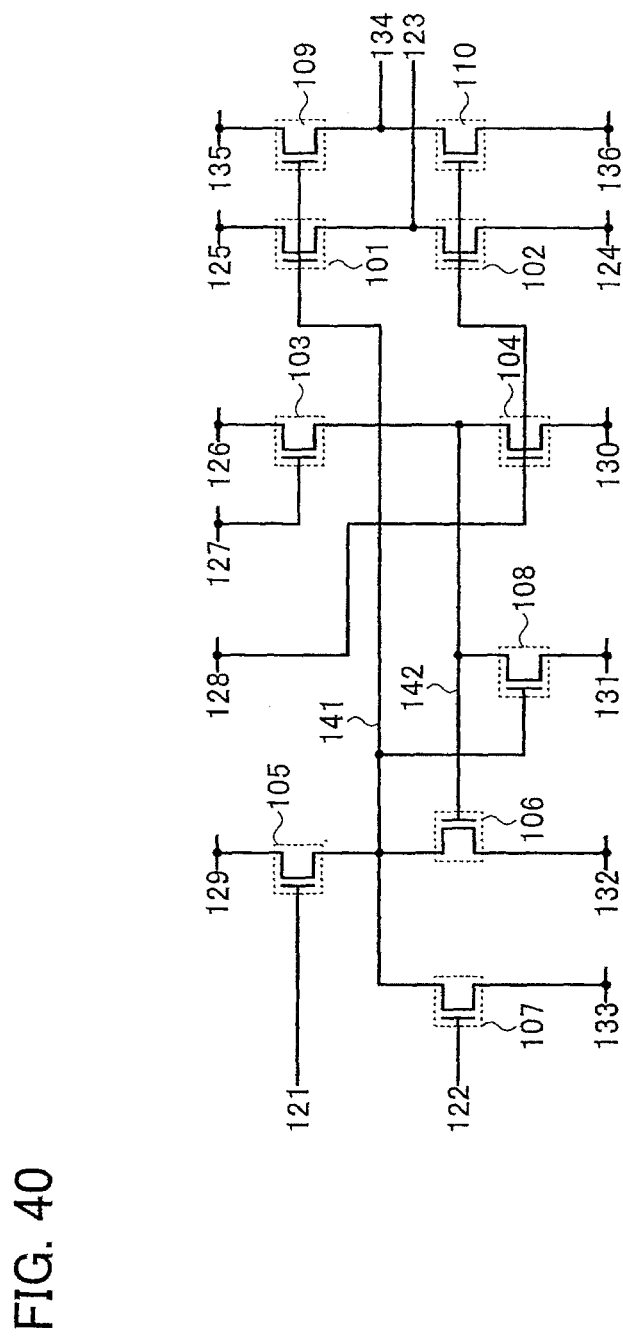
FIG. 40 is a diagram showing a structure of a flip-flop shown in Embodiment Mode 3.

Connection relations of the flip-flop in FIG. 40 are described. A first electrode of the ninth transistor 109 is connected to a fifteenth wiring 135; a second electrode of the ninth transistor 109 is connected to a fourteenth wiring 134; and a gate electrode of the ninth transistor 109 is connected to the node 141. A first electrode of the tenth transistor 110 is connected to a sixteenth wiring 136; a second electrode of the tenth transistor 110 is connected to the fourteenth wiring 134; and a gate electrode of the tenth transistor 110 is connected to the eighth wiring 128. Other connection relations are similar to those of FIG. 1A.

Note that the fifteenth wiring 135 and the sixteenth wiring 136 may be referred to as an eighth signal line and an eighth power supply line, respectively.

Figure 41:
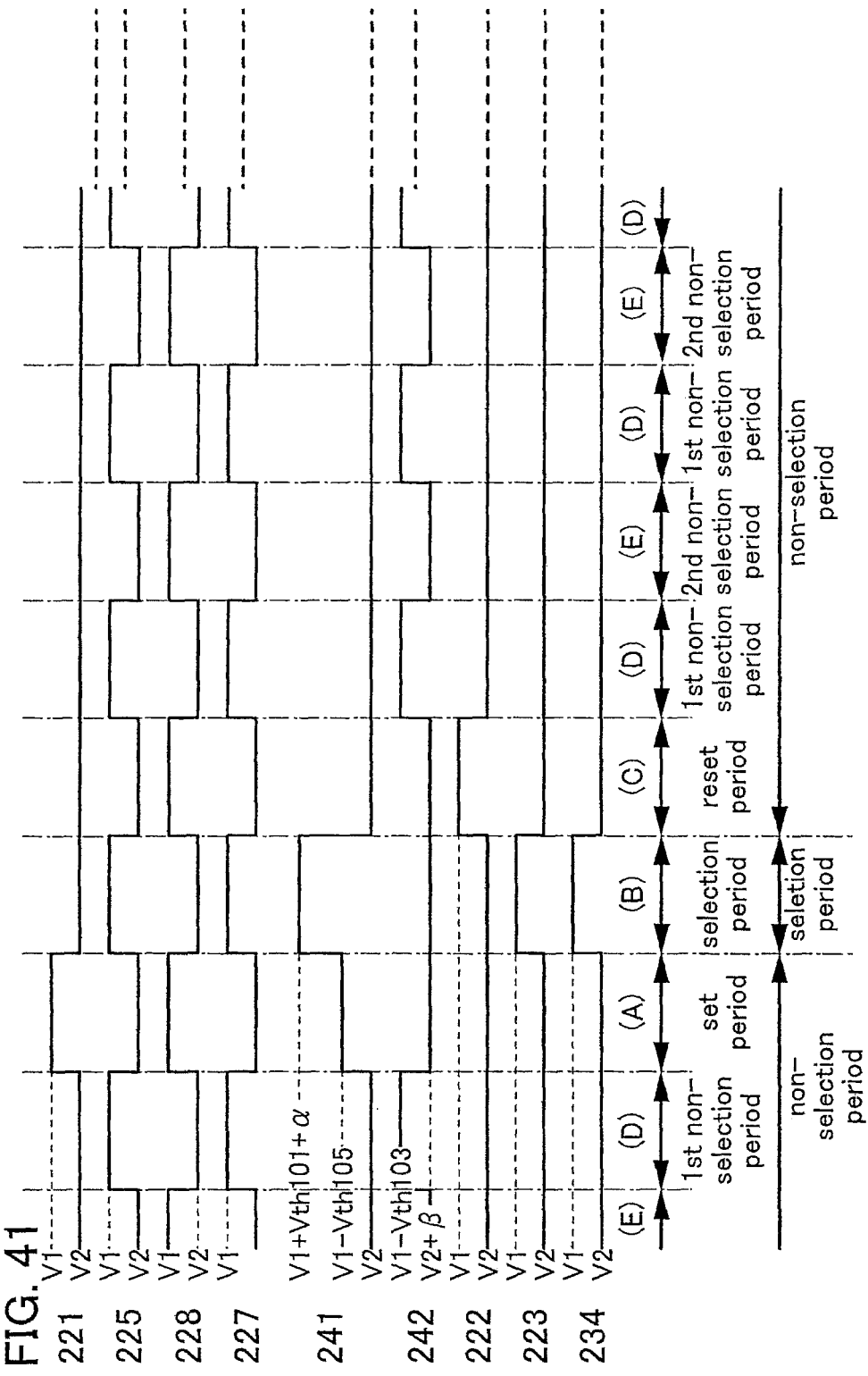
FIG. 41 is a timing chart showing operations of the flip-flop shown in FIG. 40.

Next, operations of the flip-flop shown in FIG. 40 are described with reference to a timing chart shown in FIG. 41. Note that the timing chart in FIG. 41 is described by dividing the whole period into a set period, a selection period, a reset period, a first non-selection period, and a second non-selection period. Note also that the set period, the reset period, the first non-selection period, and the second non-selection period are collectively referred to as a non-selection period in some cases.

Note that the signal 223 and a signal 234 are output from the third wiring 123 and the fourteenth wiring 134, respectively. The signal 234 is an output signal of the flip-flop and the signal 223 is a transfer signal of the flip-flop. Note also that the signal 223 may be the output signal of the flip-flop and the signal 234 may be the transfer signal of the flip-flop.

Therefore, when the signal 234 is used as the output signal of the flip-flop and the signal 223 is used as the transfer signal of the flip-flop, it is preferable that the ninth transistor 109 have the largest value of W/L among the first transistor 101 to the tenth transistor 110. Note that when the signal 223 is used as the output signal of the flip-flop and the signal 234 is used as the transfer signal of the flip-flop, it is preferable that the first transistor 101 have the largest value of W/L among the first transistor 101 to the tenth transistor 110.

As described above, the output signal of the flip-flop and the transfer signal of the flip-flop are output from different wirings by different transistors in this embodiment mode. That is, in the flip-flop in FIG. 40, a signal is output from the third wiring 123 by the first transistor 101 and the second transistor 102, and a signal is output from the fourteenth wiring 134 by the ninth transistor 109 and the tenth transistor 110. Further, since the ninth transistor 109 and the tenth transistor 110 are connected similarly to the first transistor 101 and the second transistor 102, a signal output from the fourteenth wiring 134 (the signal 234) has a waveform which is almost the same as that of a signal output from the third wiring 123 (the signal 223).

Note that since it is only necessary that the first transistor 101 can supply a charge to the gate electrode of the fifth transistor 105 of the next stage, the value of W/L of the first transistor 101 is preferably less than or equal to twice, more preferably, less than or equal to the value of W/L of the fifth transistor 105.

Note also that the ninth transistor 109 and the tenth transistor 110 have functions which are similar to those of the first transistor 101 and the second transistor 102, respectively. Further, the ninth transistor 109 and the tenth transistor 110 may be referred to as a buffer portion.

As described above, the flip-flop in FIG. 40 can prevent a malfunction even when a large load is connected to the fourteenth wiring 134 and delay, dullness, or the like occurs in the signal 234. This is because the flip-flop in FIG. 40 is not adversely affected by delay, dullness, or the like of the output signal by outputting the output signal of the flip-flop and the transfer signal of the flip-flop from different wirings by different transistors.

Further, in the flip-flop of this embodiment mode, advantageous effects which are similar to those of the flip-flops described in Embodiment Modes 1 and 2 can be obtained.

Note that the flip-flop of this embodiment mode can be freely combined with each of the flip-flops in FIGS. 1B, 1C, 5A, 5B, 5C, 7A, 7B, 8A, 8B, 9A, 9B, 10A, and 10B. In addition, the flip-flop of this embodiment mode can be freely combined with the drive timings described in Embodiment Modes 1 and 2.

Next, a structure and a driving method of a shift register including the above-described flip-flop of this embodiment mode are described.

The structure of the shift register of this embodiment mode is described with reference to FIG. 42. The shift register in FIG. 42 includes n pieces of flip-flops (flip-flops 4201_1 to 4201_n).

The flip-flops 4201_1 to 4201_n, a first wiring 4211, a second wiring 4212, a third wiring 4213, a fourth wiring 4214, a fifth wiring 4215, and a sixth wiring 4216 correspond to the flip-flops 1101_1 to 1101_n, the first wiring 1111, the second wiring 1112, the third wiring 1113, the fourth wiring 1114, the fifth wiring 1115, the sixth wiring 1116, respectively, and a similar signal or similar power supply voltage is input thereto. In addition, seventh wirings 4217_1 to 4217_n and eighth wirings 4218_1 to 4218_n correspond to the seventh wirings 1117_1 to 1117_n in FIG. 11.

Figure 42:
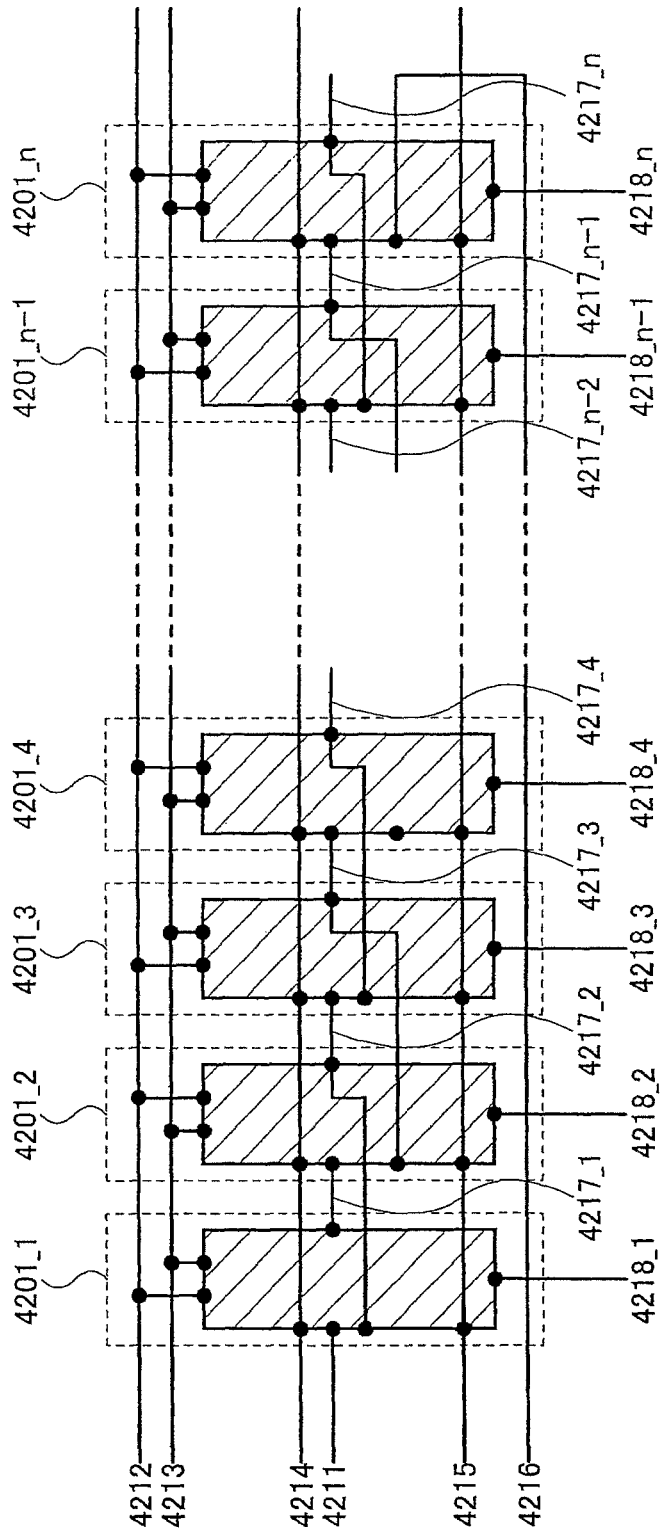
FIG. 42 is a diagram showing a structure of a shift register shown in Embodiment Mode 3.
Figure 43:
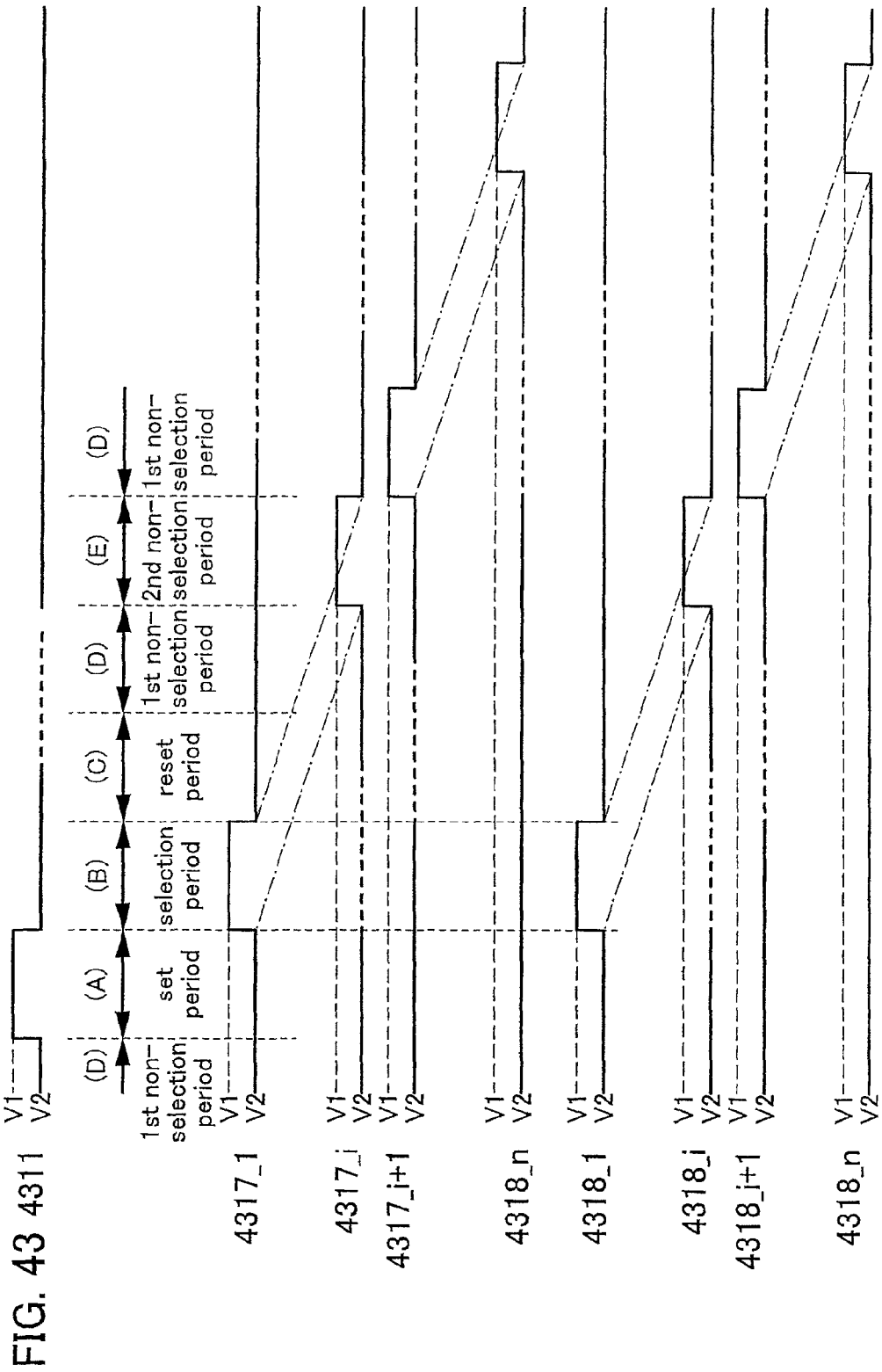
FIG. 43 is a timing chart showing operations of the shift register shown in FIG. 42.

Next, operations of the shift register shown in FIG. 42 are described with reference to a timing chart in FIG. 43.

The operations of the shift register shown in FIG. 42 are different from those of the shift register shown in FIG. 11 in that an output signal and a transfer signal are output to different wirings. Specifically, the output signal is output to each of the eighth wirings 4218_1 to 4218_n, and the transfer signal is output to each of the seventh wirings 4217_1 to 4217_n.

Even when a large load (e.g., a resistor or a capacitor) is connected to each of the eighth wirings 4218_1 to 4218_n, the shift register in FIG. 42 can operate without being adversely affected by the load. In addition, the shift register in FIG. 42 can continue to operate normally even when a short circuit occurs between any one of the eighth wirings 4218_1 to 4218_n and a power supply line or a signal line. Therefore, in the shift register in FIG. 42, a range of operating conditions can be improved. Further, in the shift register in FIG. 42, reliability can be improved. Furthermore, in the shift register in FIG. 42, yield can be improved. This is because the transfer signal of each flip-flop and the output signal of each flip-flop are divided in the shift register in FIG. 42.

Further, in a shift register to which the flip-flop of this embodiment mode is applied, advantageous effects which are similar to those of the shift registers described in Embodiment Modes 1 and 2 can be obtained.

As a display device of this embodiment mode, any of the display devices in FIGS. 17, 19, 20, 27, and 28 can be used. Therefore, in the display device of this embodiment mode, advantageous effects which are similar to those of the display devices described in Embodiment Modes 1 and 2 can be obtained.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 4]

In this embodiment mode, the case is described in which a P-channel transistor is employed as a transistor included in a flip-flop of this specification. Further, structures and driving methods of a driver circuit including the flip-flop and a display device including the driver circuit are described.

In the flip-flop of this embodiment mode, the case is described in which the transistor included in the flip-flop in FIG. 1A is a P-channel transistor. Therefore, in a flip-flop in FIG. 44, advantageous effects which are similar to those of FIG. 1A can be obtained. Note that a P-channel transistor can be employed as the transistor included in the flip-flop shown in FIG. 1B, 1C, 5A, 5B, 5C, 7A, 7B, 8A, 8B, 9A, 9B, 10A, 10B, or 40. Note also that the flip-flop of this embodiment mode can be freely combined with the description of Embodiment Modes 1 to 3.

A basic structure of the flip-flop of this embodiment mode is described with reference to FIG. 44. A flip-flop shown in FIG. 44 includes a first transistor 4401, a second transistor 4402, a third transistor 4403, a fourth transistor 4404, a fifth transistor 4405, a sixth transistor 4406, a seventh transistor 4407, and an eighth transistor 4408. In addition, the first transistor 4401 to the eighth transistor 4408 correspond to the first transistor 101 to the eighth transistor 108 in FIGS. 1A to 1C, respectively. Note that each of the first transistor 4401 to the eighth transistor 4408 is a P-channel transistor and is turned on when the absolute value of gate-source voltage (|Vgs|) exceeds the absolute value of the threshold voltage (|Vth|) (when Vgs becomes lower than Vth).

Note that in the flip-flop of this embodiment mode, each of the first transistor 4401 to the eighth transistor 4408 is a P-channel transistor. Therefore, in the flip-flop of this embodiment mode, a manufacturing process can be simplified. In addition, in the flip-flop of this embodiment mode, manufacturing cost can be reduced. Further, in the flip-flop of this embodiment mode, yield can be improved.

Figure 44:
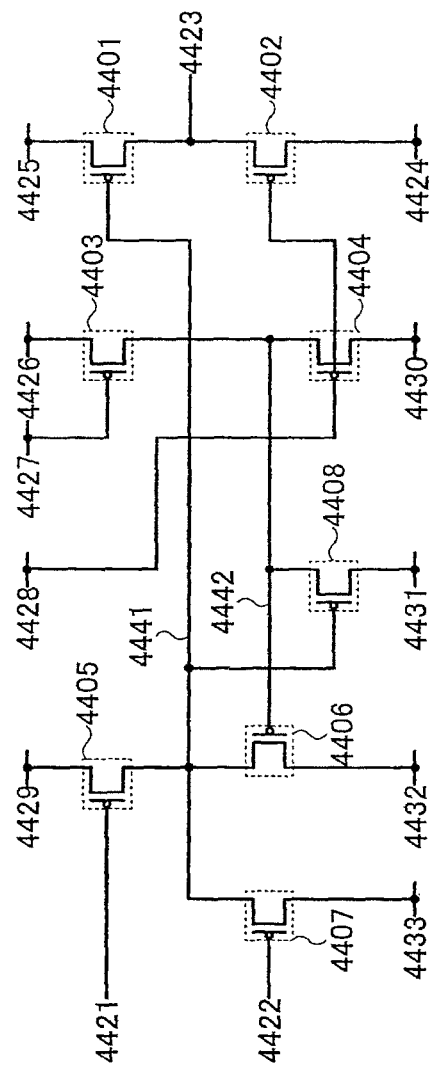
FIG. 44 is a diagram showing a structure of a flip-flop shown in Embodiment Mode 4.

Connection relations of the flip-flop in FIG. 44 are omitted because they are similar to those of FIG. 1A.

A first wiring 4421, a second wiring 4422, a third wiring 4423, a fourth wiring 4424, a fifth wiring 4425, a sixth wiring 4426, a seventh wiring 4427, an eighth wiring 4428, a ninth wiring 4429, a tenth wiring 4430, an eleventh wiring 4431, a twelfth wiring 4432, a thirteenth wiring 4433, a node 4441, and a node 4442 correspond to the first wiring 121, the second wiring 122, the third wiring 123, the fourth wiring 124, the fifth wiring 125, the sixth wiring 126, the seventh wiring 127, the eighth wiring 128, the ninth wiring 129, the tenth wiring 130, the eleventh wiring 131, the twelfth wiring 132, the thirteenth wiring 133, the node 141, and the node 142 in FIGS. 1A to 1C, respectively.

Next, operations of the flip-flops shown in FIG. 44 are described with reference to a timing chart in FIG. 45. Note that the timing chart in FIG. 45 is described by dividing the whole period into a set period, a selection period, a reset period, a first non-selection period, and a second non-selection period. Note also that the set period, the reset period, the first non-selection period, and the second non-selection period are collectively referred to as a non-selection period in some cases.

The timing chart in FIG. 45 is similar to the timing chart in FIG. 2 in which an H level and an L level are inverted. That is, an H level and an L level of an input signal and an output signal are just inverted in the flip-flop in FIG. 44 compared with the flip-flops in FIGS. 1A to 1C. Note that a signal 4521, a signal 4525, a signal 4528, a signal 4527, a potential 4541, a potential 4542, a signal 4522, and a signal 4523 correspond to the signal 221, the signal 225, the signal 228, the signal 227, the potential 241, the potential 242, the signal 222, and the signal 223 in FIG. 2, respectively.

Note that as for power supply voltage supplied to the flip-flop in FIG. 44, V1 and V2 are inverted compared with the flip-flops in FIGS. 1A to 1C.

First, operations of the flip-flop in the set period shown in period A of FIG. 45 are described. A potential of the node 4441 (the potential 4541) becomes V2+|Vth4405| (Vth4405 corresponds to the threshold voltage of the fifth transistor 4405). Then, the node 4441 enters into a floating state while being kept at V2+|Vth4405|. At this time, a potential of the node 4442 becomes V1. Note that since the first transistor 4401 and the second transistor 4402 are on, an H-level signal is output from the third wiring 4423.

Operations of the flip-flop in the selection period shown in period B of FIG. 45 are described. The potential of the node 4441 becomes V2−|Vth4401|−γ (Vth4401 corresponds to the threshold voltage of the first transistor 4401 and y corresponds to a given positive number) by a bootstrap operation. Thus, since the first transistor 4401 is turned on, an L-level signal (V2) is output from the third wiring 4423. At this time, the potential of the node 4442 becomes V1−θ (θ corresponds to a given positive number). In addition, θ<|Vth4406| (Vth4406 corresponds to the threshold voltage of the sixth transistor 4406) is satisfied. Thus, the sixth transistor 4406 remains off.

Operations of the flip-flop in the reset period shown in period C of FIG. 45 are described. Since the seventh transistor 4407 is turned on, the potential of the node 4441 becomes V1. Thus, the first transistor 4401 is turned off. At this time, since the second transistor 4402 is turned on, an H-level signal is output from the third wiring 4423.

Operations of the flip-flop in the first non-selection period shown in period D of FIG. 45 are described. The potential of the node 4442 becomes V2+|Vth4403| (Vth4403 corresponds to the threshold voltage of the third transistor 4403). Thus, the sixth transistor 4406 is turned on and remains at V1. At this time, the second transistor 4402 is turned off. Thus, since the third wiring 4423 enters into a floating state, the third wiring 4423 remains at V1.

Operations of the flip-flop in the second non-selection period shown in period E of FIG. 45 are described. Since the potential of the node 4442 becomes V1−θ, the sixth transistor 4406 is turned off. Thus, since the node 4441 enters into a floating state, the node 4441 remains at V1. At this time, since the second transistor 4402 is turned on, an H-level signal (V1) is output from the third wiring 4423.

Note that in the shift register of this embodiment mode, the flip-flop of this embodiment mode can be freely combined with the shift registers described in Embodiment Modes 1 to 3. For example, in the shift register of this embodiment mode, the flip-flop of this embodiment mode can be freely combined with the shift registers in FIGS. 11, 14, 24, and 42. Note that in the shift register of this embodiment mode, an H level and an L level are inverted compared with the shift registers described in Embodiment Modes 1 to 3.

Note that in a display device of this embodiment mode, the shift register of this embodiment mode can be freely combined with the display devices described in Embodiment Modes 1 to 3. For example, the display device of this embodiment mode can be freely combined with the display devices in FIGS. 17, 19, 20, 27, and 28. Note that in the display device of this embodiment mode, an H level and an L level are inverted compared with the display devices described in Embodiment Modes 1 to 3.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 5]

In this embodiment mode, a signal line driver circuit included in each of the display devices shown in Embodiment Modes 1 to 4 is described.

Figure 31:
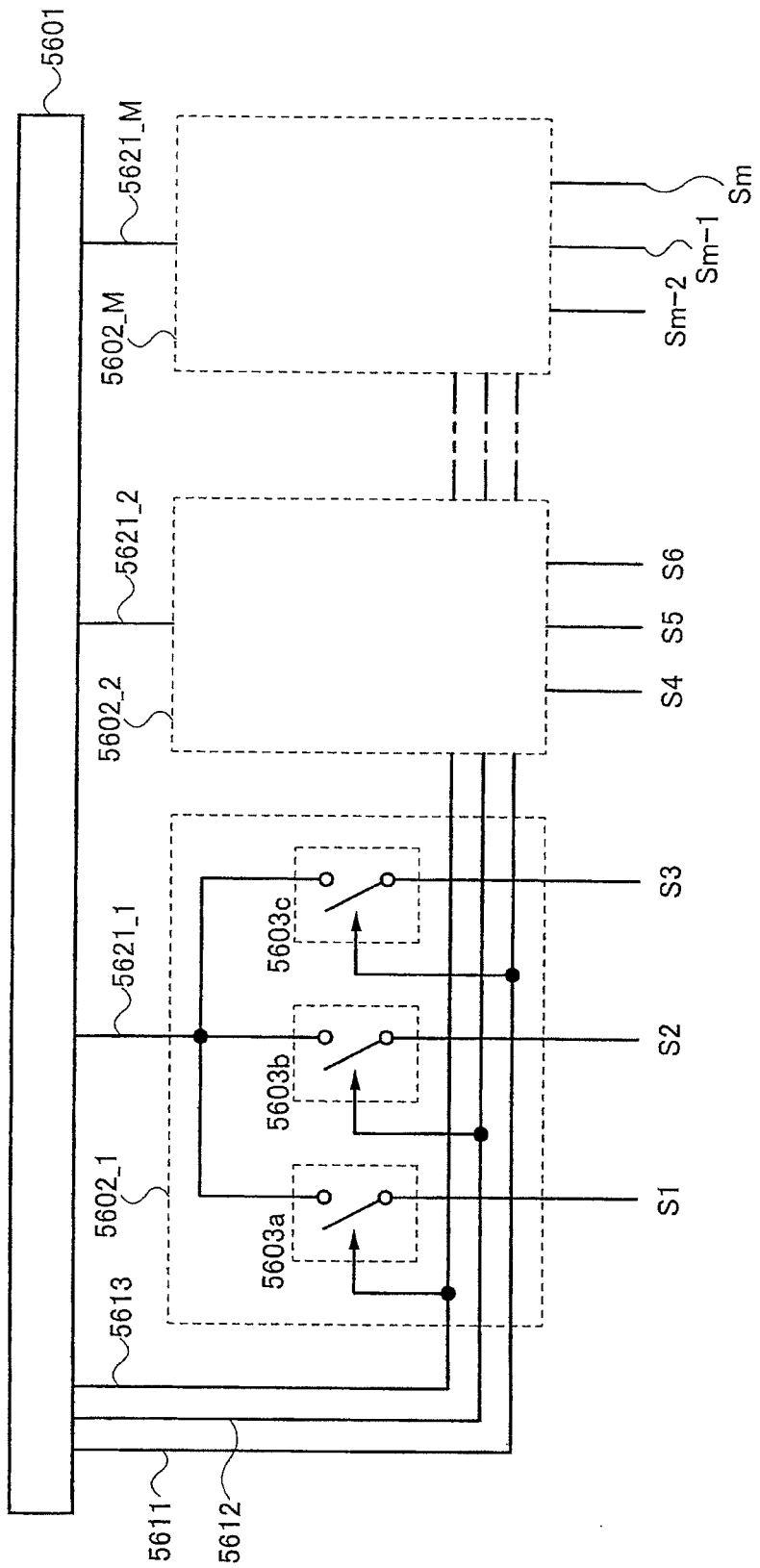
FIG. 31 is a diagram showing a structure of a signal line driver circuit shown in Embodiment Mode 5.

A signal line driver circuit in FIG. 31 is described. The signal line driver circuit shown in FIG. 31 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first switch 5603a, a second switch 5603b, and a third switch 5603c.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, the third wiring 5613, and the wirings 5621_1 to 5621_M corresponding to the switch groups 5602_1 to 5602_M, respectively. Each of the wirings 5621_1 to 5621_M is connected to three signal lines through the first switch 5603a, the second switch 5603b, and the third switch 5603c. For example, the wiring 5621_J of the J-th column (one of the wirings 5621_1 to 5621_M) is connected to a signal line Sj−1, a signal line Sj, and a signal line Sj+1 through the first switch 5603a, the second switch 5603b, and the third switch 5603c.

A signal is input to each of the first wiring 5611, the second wiring 5612, and the third wiring 5613.

Note that the driver IC 5601 is preferably formed using a single crystalline substrate or a glass substrate using a polycrystalline semiconductor. The switch groups 5602 5602_1 to 5602_M are preferably formed over the same substrate as each pixel portion shown in Embodiment Mode 1. Therefore, the driver IC 5601 and the switch groups 5602 5602_1 to 5602_M are preferably connected through an FPC or the like.

Figure 32:
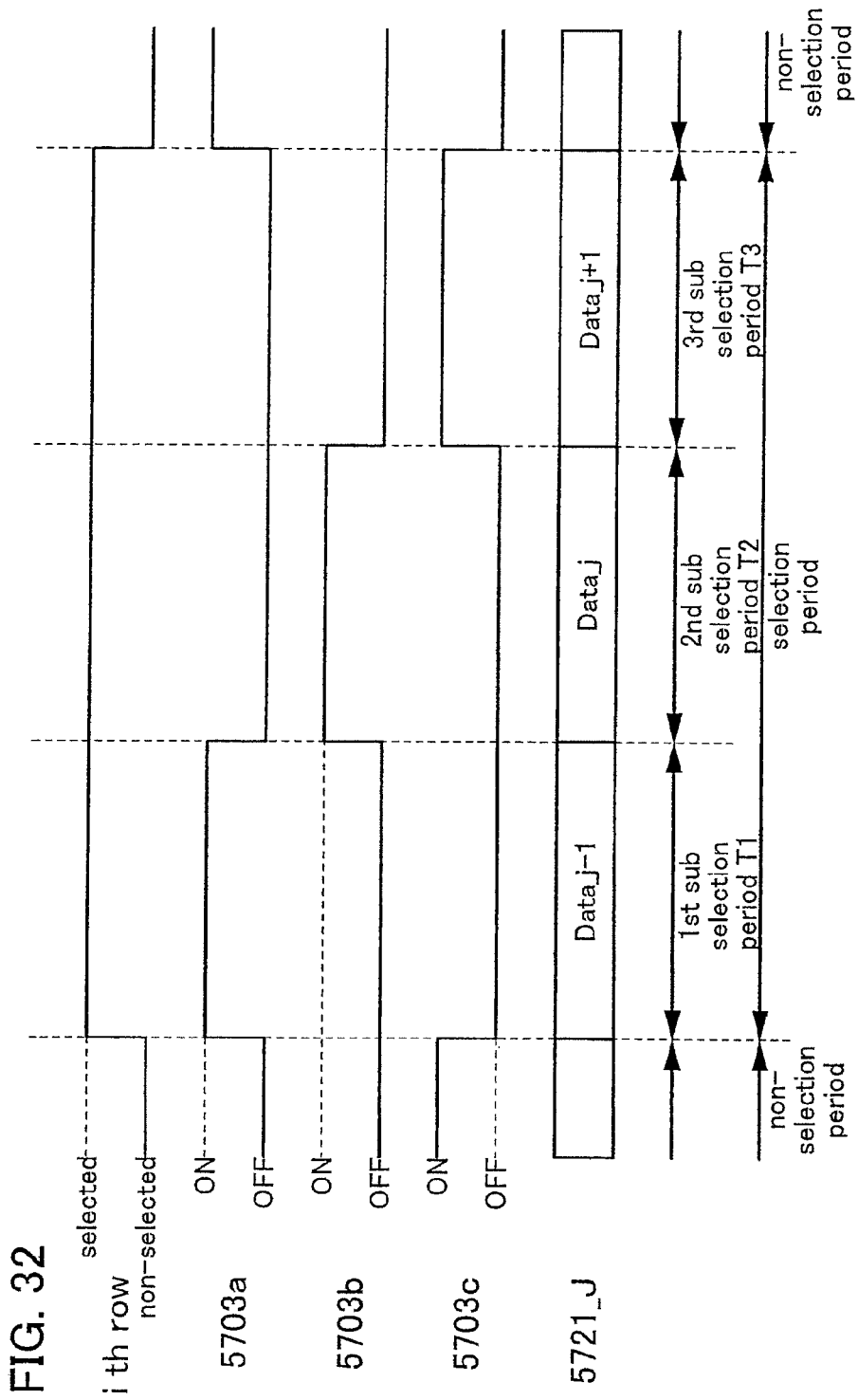
FIG. 32 is a timing chart showing operations of the signal line driver circuit shown in FIG. 31.

Next, operations of the signal line driver circuit shown in FIG. 31 are described with reference to a timing chart in FIG. 32. The timing chart in FIG. 32 shows the case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 31 operates similarly to FIG. 32 even when a scan line of another row is selected.

Note that the timing chart in FIG. 32 shows the case where the wiring 5621_J in the J-th column is connected to the signal line Sj−1, the signal line Sj, and the signal line Sj+1 through the first switch 5603a, the second switch 5603b, and the third switch 5603c.

The timing chart in FIG. 32 shows timing at which the scan line Gi of the i-th row is selected, timing 5703a of on/off of the first switch 5603a, timing 5703b of on/off of the second switch 5603b, timing 5703c of on/off of the third switch 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Dataj−1, Dataj, and Dataj+1.

As shown in FIG. 32, in the first sub-selection period T1, the first switch 5603a is turned on, and the second switch 5603b and the third switch 5603c are turned off. At this time, Dataj−1 input to the wiring 5621_J is input to the signal line Sj−1 through the first switch 5603a. In the second sub-selection period T2, the second switch 5603b is turned on, and the first switch 5603a and the third switch 5603c are turned off. At this time, Dataj input to the wiring 5621_J is input to the signal line Sj through the second switch 5603b. In the third sub-selection period T3, the third switch 5603c is turned on, and the first switch 5603a and the second switch 5603b are turned off. At this time, Dataj+1 input to the wiring 5621_J is input to the signal line Sj+1 through the third switch 5603c.

As described above, in the signal line driver circuit in FIG. 31, by dividing one gate selection period into three, video signals can be input to three signal lines from one wiring 5621 in one gate selection period. Therefore, in the signal line driver circuit in FIG. 31, the number of connections of the substrate provided with the driver IC 5601 and the substrate provided with the pixel portion can be approximately ⅓ of the number of signal lines. The number of connections is reduced to approximately ⅓ of the number of the signal lines, so that reliability, yield, and the like of the signal line driver circuit in FIG. 31 can be improved.

By applying the signal line driver circuit of this embodiment mode to each of the display devices shown in Embodiment Modes 1 to 4, the number of connections of the substrate provided with the pixel portion and an external substrate can be further reduced. Therefore, reliability of the display device of the present invention can be improved. In addition, yield of the display device of the present invention can be improved.

Next, the case where N-channel transistors are used for the first switch 5603a, the second switch 5603b, and the third switch 5603c is described with reference to FIG. 33. Note that portions which are similar to those of FIG. 31 are denoted by common reference numerals and detailed description of the portions which are the same and portions which have similar functions is omitted.

A first transistor 5903a corresponds to the first switch 5603a. A second transistor 5903b corresponds to the second switch 5603b. A third transistor 5903c corresponds to the third switch 5603c.

For example, in the case of the switch group 5602_J, a first electrode of the first transistor 5903a is connected to the wiring 56213; a second electrode of the first transistor 5903a is connected to the signal line Sj−1; and a gate electrode of the first transistor 5903a is connected to the first wiring 5611. A first electrode of the second transistor 5903b is connected to the wiring 5621_J; a second electrode of the second transistor 5903b is connected to the signal line Sj; and a gate electrode of the second transistor 5903b is connected to the second wiring 5612. A first electrode of the third transistor 5903c is connected to the wiring 5621_J; a second electrode of the third transistor 5903c is connected to the signal line Sj+1; and a gate electrode of the third transistor 5903c is connected to the third wiring 5613.

Note that each of the first transistor 5903a, the second transistor 5903b, and the third transistor 5903c functions as a switching transistor. Further, each of the first transistor 5903a, the second transistor 5903b, and the third transistor 5903c is turned on when a signal input to each gate electrode is at an H level, and is turned off when a signal input to each gate electrode is at an L level.

When N-channel transistors are used for the first switch 5603a, the second switch 5603b, and the third switch 5603c, amorphous silicon can be used for a semiconductor layer of each transistor. Therefore, a manufacturing process can be simplified, and thus manufacturing cost can be reduced and yield can be improved. Further, a semiconductor device such as a large display panel can be formed. Even when polysilicon or single crystalline silicon is used for the semiconductor layer of each transistor, the manufacturing process can be simplified.

Figure 33:
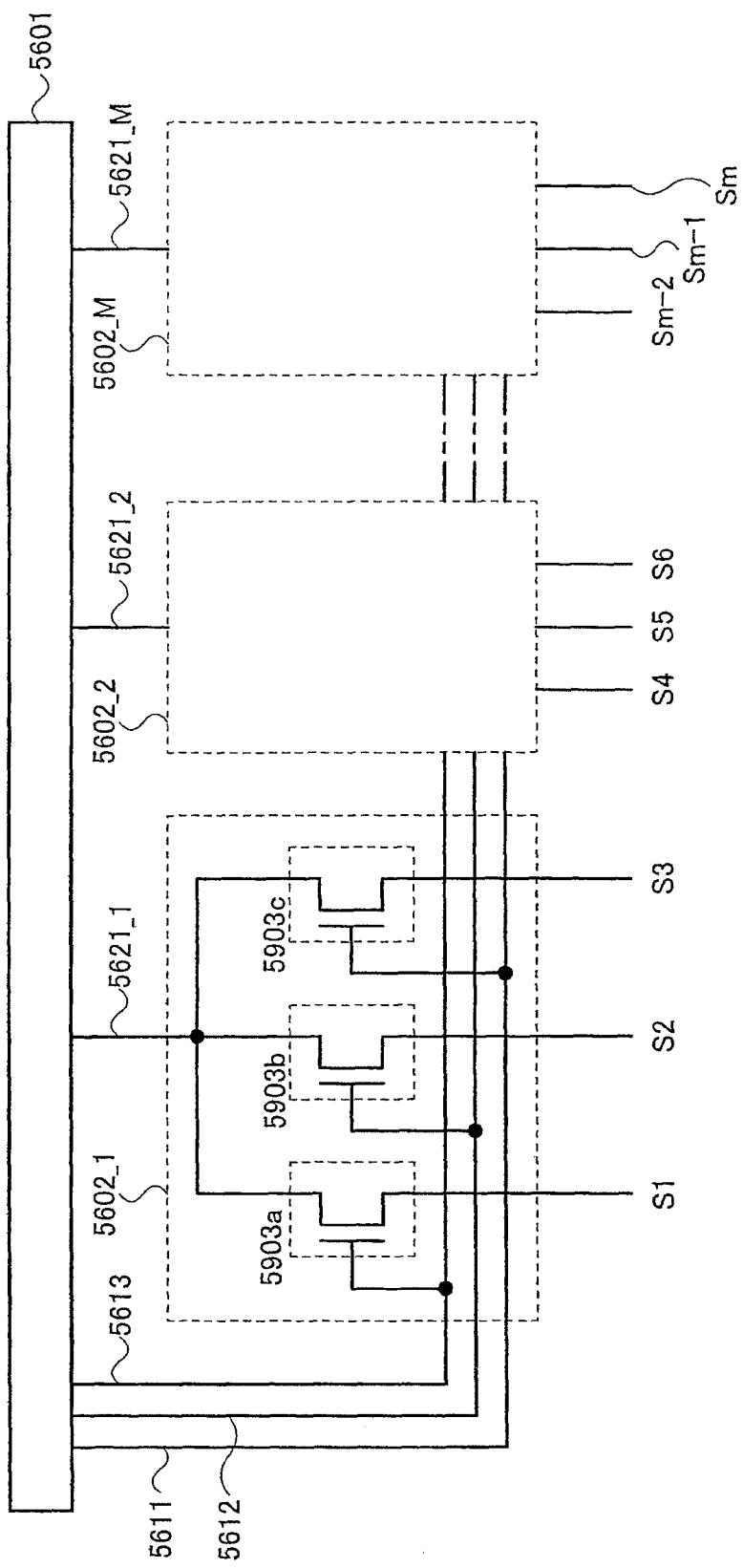
FIG. 33 is a diagram showing a structure of the signal line driver circuit shown in Embodiment Mode 5.

In the signal line driver circuit in FIG. 33, N-channel transistors are used for the first transistor 5903a, the second transistor 5903b, and the third transistor 5903c; however, P-channel transistors may be used for the first transistor 5903a, the second transistor 5903b, and the third transistor 5903c. In this case, each transistor is turned on when a signal input to the gate electrode is at an L level, and is turned off when a signal input to the gate electrode is at an H level.

Note that arrangement, the number, a driving method, and the like of the switches are not limited as long as one gate selection period is divided into a plurality of sub-selection periods and video signals are input to a plurality of signal lines from one wiring in each of the plurality of sub-selection periods as shown in FIG. 31.

For example, when video signals are input to three or more signal lines from one wiring in each of three or more sub-selection periods, it is only necessary to add a switch and a wiring for controlling the switch. Note that when one selection period is divided into four or more sub-selection periods, one sub-selection period becomes short. Therefore, one selection period is preferably divided into two or three sub-selection periods.

Figure 34:
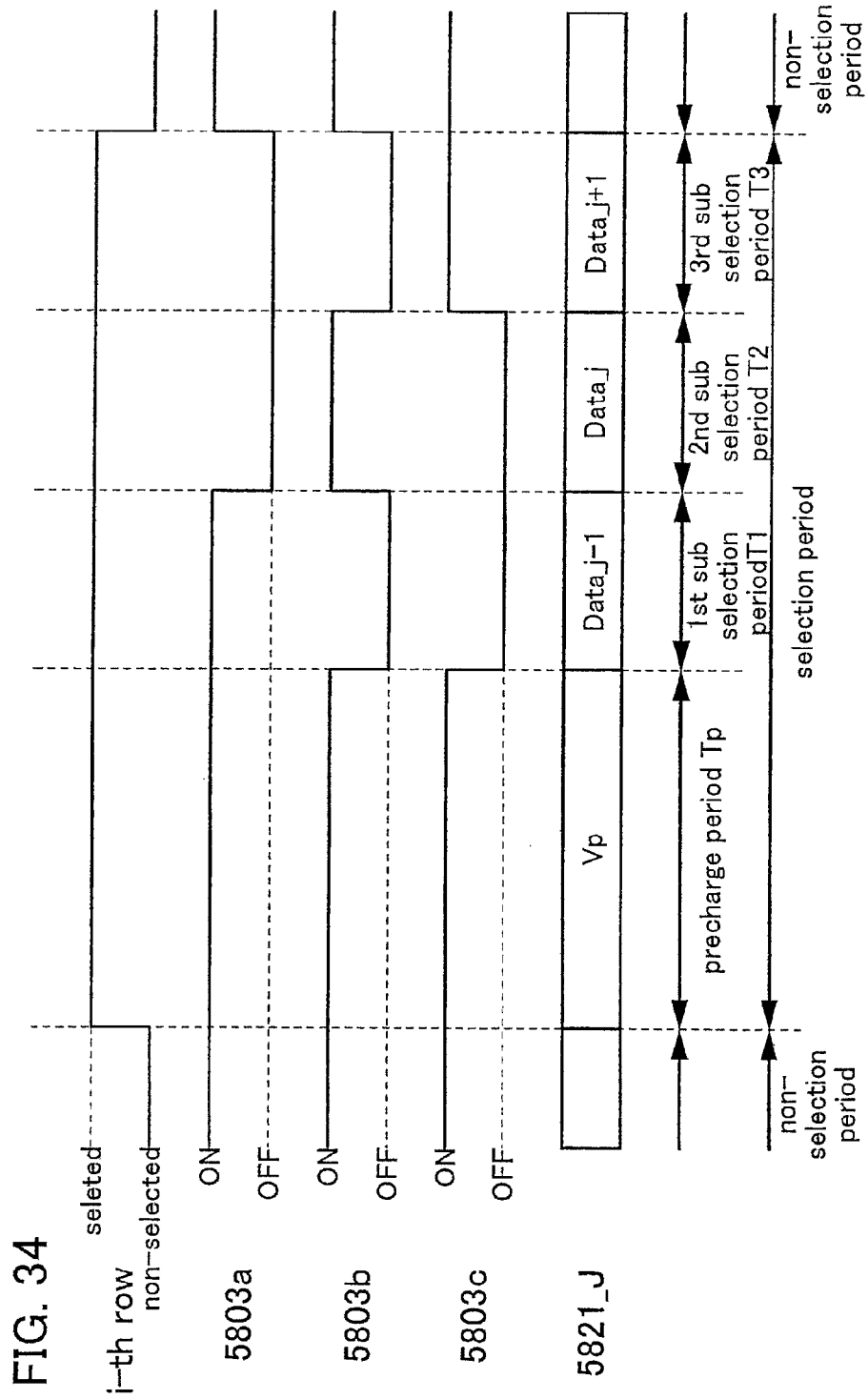
FIG. 34 is a timing chart showing operations of the signal line driver circuit shown in FIG. 33.

As another example, one selection period may be divided into a precharge period Tp, the first sub-selection period T1, the second sub-selection period T2, and the third sub-selection period T3 as shown in a timing chart in FIG. 34. The timing chart in FIG. 34 shows timing at which the scan line Gi of the i-th row is selected, timing 5803a of on/off of the first switch 5603*a*, timing 5803*b* of on/off of the second switch 5603*b*, timing 5803*c* of on/off of the third switch 5603*c*, and a signal 5821\_J input to the wiring 5621\_J of the J-th column. As shown in FIG. 34, the first switch 5603*a*, the second switch 5603*b*, and the third switch 5603*c* are tuned on in the precharge period Tp. At this time, precharge voltage Vp input to the wiring 5621\_J is input to each of the signal line Sj−1, the signal line Sj, and the signal line Sj+1 through the first switch 5603*a*, the second switch 5603*b*, and the third switch 5603*c*. In the first sub-selection period T1, the first switch 5603*a* is turned on, and the second switch 5603*b* and the third switch 5603*c* are turned off. At this time, Dataj−1 input to the wiring 5621\_J is input to the signal line Sj−1 through the first switch 5603*a*. In the second sub-selection period T2, the second switch 5603*b* is turned on, and the first switch 5603*a* and the third switch 5603*c* are turned off. At this time, Dataj input to the wiring 5621\_J is input to the signal line Sj through the second switch 5603*b*. In the third sub-selection period T3, the third switch 5603*c* is turned on, and the first switch 5603*a* and the second switch 5603*b* are turned off. At this time, Dataj+1 input to the wiring 5621\_J is input to the signal line Sj+1 through the third switch 5603*c*.

As described above, in the signal line driver circuit in FIG. 31 to which the timing chart in FIG. 34 is applied, the video signal can be written to the pixel at high speed because the signal line can be precharged by providing a precharge selection period before a sub-selection period. Note that portions which are similar to those of FIG. 32 are denoted by common reference numerals and detailed description of the portions which are the same and portions which have similar functions is omitted.

Figure 35:
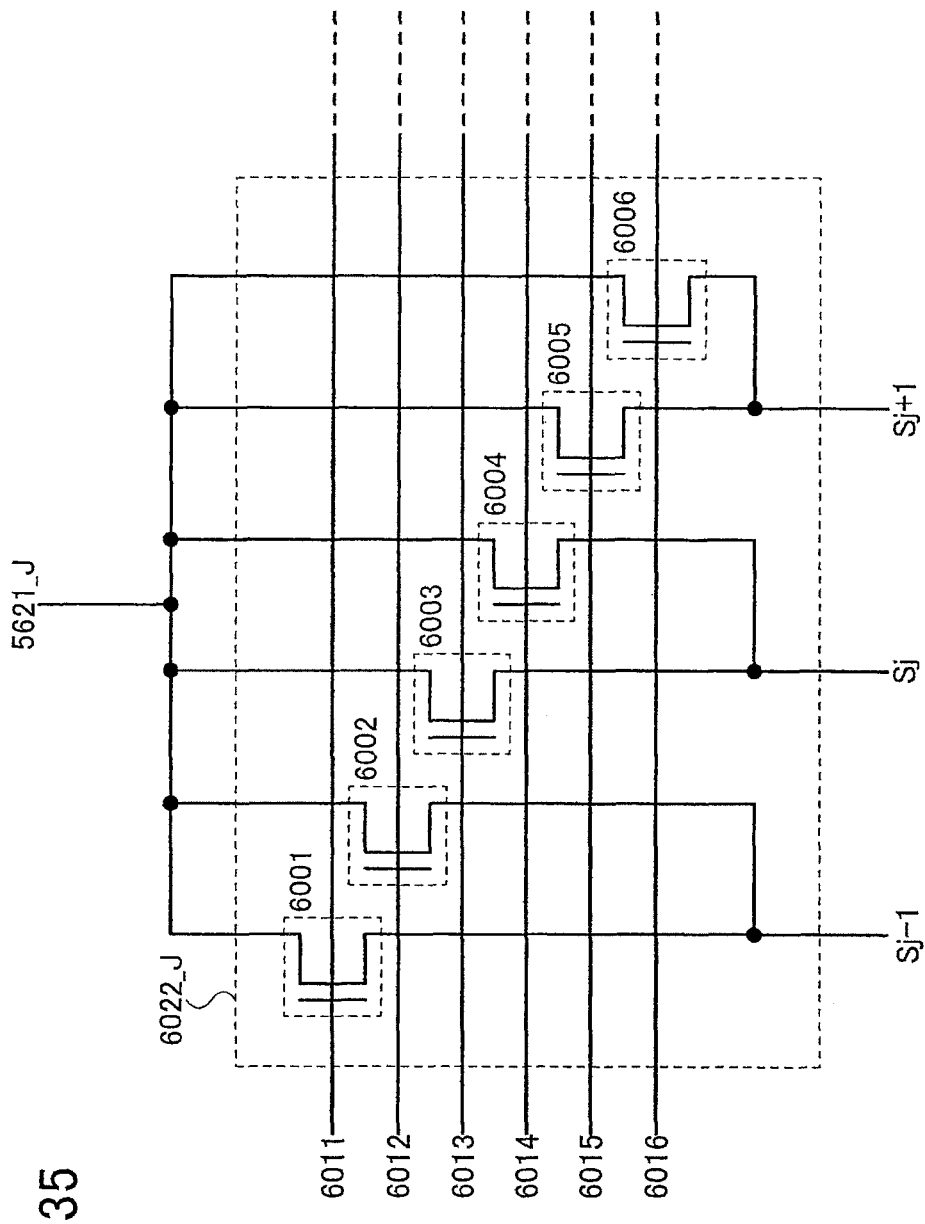
FIG. 35 is a diagram showing a structure of the signal line driver circuit shown in Embodiment Mode 5.

As shown in FIG. 31, one gate selection period can be divided into a plurality of sub-selection periods and video signals can be input to a plurality of signal lines from one wiring in each of the plurality of sub-selection periods also in FIG. 35. Note that FIG. 35 shows only a switch group 6022\_J of the 7-th column in a signal line driver circuit. The switch group 6022\_J includes a first transistor 6001, a second transistor 6002, a third transistor 6003, a fourth transistor 6004, a fifth transistor 6005, and a sixth transistor 6006. The first transistor 6001, the second transistor 6002, the third transistor 6003, the fourth transistor 6004, the fifth transistor 6005, and the sixth transistor 6006 are N-channel transistors. The switch group 6022\_J is connected to a first wiring 6011, a second wiring 6012, a third wiring 6013, a fourth wiring 6014, a fifth wiring 6015, a sixth wiring 6016, the wiring 5621\_7, the signal line Sj−1, the signal line Sj, and the signal line Sj+1.

A first electrode of the first transistor 6001 is connected to the wiring 5621\_J; a second electrode of the first transistor 6001 is connected to the signal line Sj−1; and a gate electrode of the first transistor 6001 is connected to the first wiring 6011. A first electrode of the second transistor 6002 is connected to the wiring 5621\_J; a second electrode of the second transistor 6002 is connected to the signal line Sj−1; and a gate electrode of the second transistor 6002 is connected to the second wiring 6012. A first electrode of the third transistor 6003 is connected to the wiring 5621\_J; a second electrode of the third transistor 6003 is connected to the signal line Sj; and a gate electrode of the third transistor 6003 is connected to the third wiring 6013. A first electrode of the fourth transistor 6004 is connected to the wiring 5621\_J; a second electrode of the fourth transistor 6004 is connected to the signal line Sj; and a gate electrode of the fourth transistor 6004 is connected to the fourth wiring 6014. A first electrode of the fifth transistor 6005 is connected to the wiring 5621\_J; a second electrode of the fifth transistor 6005 is connected to the signal line Sj+1; and a gate electrode of the fifth transistor 6005 is connected to the fifth wiring 6015. A first electrode of the sixth transistor 6006 is connected to the wiring 5621\_J; a second electrode of the sixth transistor 6006 is connected to the signal line Sj+1; and a gate electrode of the sixth transistor 6006 is connected to the sixth wiring 6016.

Note that each of the first transistor 6001, the second transistor 6002, the third transistor 6003, the fourth transistor 6004, the fifth transistor 6005, and the sixth transistor 6006 functions as a switching transistor. Further, each of first transistor 6001, the second transistor 6002, the third transistor 6003, the fourth transistor 6004, the fifth transistor 6005, and the sixth transistor 6006 is turned on when a signal input to each gate electrode is at an H level, and is turned off when a signal input to each gate electrode is at an L level.

Note that the first wiring 6011 and the second wiring 6012 correspond to a first wiring 5913 in FIG. 33. The third wiring 6013 and the fourth wiring 6014 correspond to a second wiring 5912 in FIG. 33. The fifth wiring 6015 and the sixth wiring 6016 correspond to a third wiring 5911 in FIG. 33. The first transistor 6001 and the second transistor 6002 correspond to the first transistor 5903*a* in FIG. 33. The third transistor 6003 and the fourth transistor 6004 correspond to the second transistor 5903*b* in FIG. 33. The fifth transistor 6005 and the sixth transistor 6006 correspond to the third transistor 5903*c* in FIG. 33.

In FIG. 35, in the first sub-selection period T1 shown in FIG. 32, one of the first transistor 6001 and the second transistor 6002 is turned on. In the second sub-selection period T2, one of the third transistor 6003 and the fourth transistor 6004 is turned on. In the third sub-selection period T3, one of the fifth transistor 6005 and the sixth transistor 6006 is turned on. Further, in the precharge period Tp shown in FIG. 34, either the first transistor 6001, the third transistor 6003, and the fifth transistor 6005; or the second transistor 6002, the fourth transistor 6004, and the sixth transistor 6006 are turned on.

Therefore, in FIG. 35, since on time of each transistor can be shortened, deterioration in characteristics of the transistor can be suppressed. This is because in the first sub-selection period T1 shown in FIG. 32, for example, the video signal can be input to the signal line Sj−1 when one of the first transistor 6001 and the second transistor 6002 is turned on. Note that in the first sub-selection period T1 shown in FIG. 32, for example, when both the first transistor 6001 and the second transistor 6002 are turned on at the same time, the video signal can be input to the signal line Sj−1 at high speed.

Note that although two transistors are connected in parallel between the wiring 5621 and the signal line in FIG. 35, the present invention is not limited to this, and three or more transistors may be connected in parallel between the wiring 5621 and the signal line. Thus, deterioration in characteristics of each transistor can be further suppressed.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 6]

In this embodiment mode, a structure for preventing a defect due to electrostatic discharge in the display device shown in Embodiment Modes 1 to 4 is described.

Note that electrostatic discharge corresponds to instant discharge through an input/output terminal of a semiconductor device when positive or negative charges stored in the human body or the object touch the semiconductor device, and damage caused by supplying large current flowing within the semiconductor device.

Figure 36A:
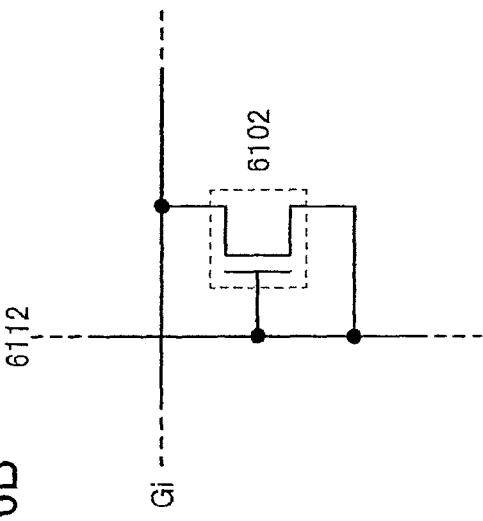
FIGS. 36A to 36C are diagrams each showing a structure of a protection diode shown in Embodiment Mode 6.

FIG. 36A shows a structure for preventing electrostatic discharge caused in a scan line by a protective diode. FIG. 36A shows a structure where the protective diode is provided between a wiring 6111 and the scan line. Although not shown, a plurality of pixels are connected to the scan line Gi of the i-th row. Note that a transistor 6101 is used as the protective diode. Although the transistor 6101 is an N-channel transistor, a P-channel transistor may be used, and polarity of the transistor 6101 may be the same as that of a transistor included in a scan line driver circuit or a pixel.

Note that although one protective diode is arranged here, a plurality of protective diodes may be arranged in series, in parallel, or in serial-parallel.

A first electrode of the transistor 6101 is connected to the scan line Gi of the i-th row; a second electrode of the transistor 6101 is connected to the wiring 6111; and a gate electrode of the transistor 6101 is connected to the scan line Gi of the i-th row.

Operations of FIG. 36A are described. A certain potential is input to the wiring 6111, which is lower than an L level of a signal input to the scan line Gi of the i-th row. When positive or negative charge is not discharged to the scan line Gi of the i-th row, a potential of the scan line Gi of the i-th row is at an H level or an L level, so that the transistor 6101 is off. On the other hand, when negative charge is discharged to the scan line Gi of the i-th row, the potential of the scan line Gi of the i-th row lowers instantaneously. At this time, when the potential of the scan line Gi of the i-th row is lower than a value obtained by subtracting the threshold voltage of the transistor 6101 from a potential of the wiring 6111, the transistor 6101 is turned on and current flows to the wiring 6111 through the transistor 6101. Therefore, the structure shown in FIG. 36A can prevent large current from flowing to the pixel, so that electrostatic discharge of the pixel can be prevented.

Figure 36B:
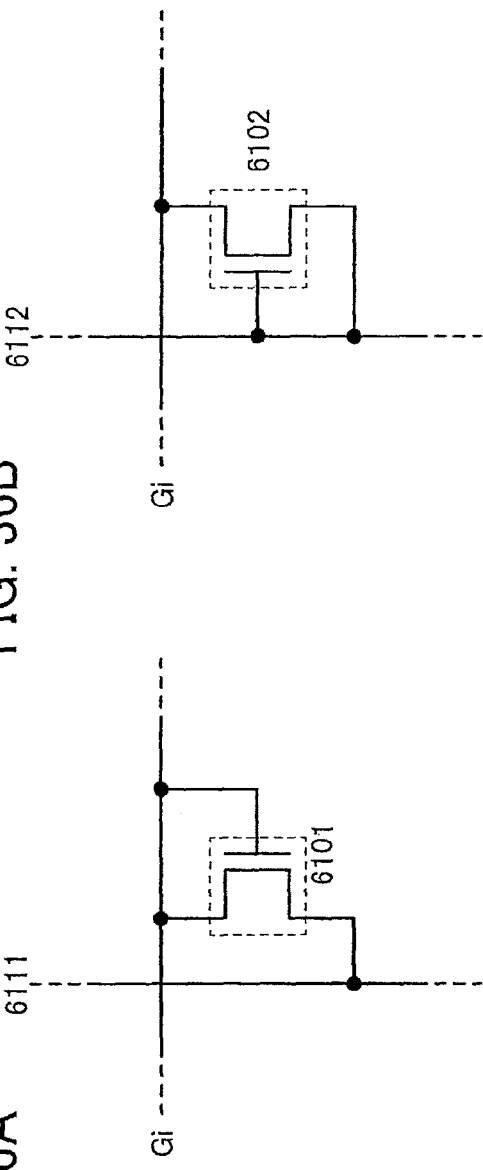

FIG. 36B shows a structure for preventing electrostatic discharge when positive charge is discharged to the scan line Gi of the i-th row. A transistor 6102 functioning as a protective diode is provided between the scan line and a wiring 6112. Note that although one protective diode is arranged here, a plurality of protective diodes may be arranged in series, in parallel, or in serial-parallel. Although the transistor 6102 is an N-channel transistor, a P-channel transistor may be used, and polarity of the transistor 6102 may be the same as that of the transistor included in the scan line driver circuit or the pixel. A first electrode of the transistor 6102 is connected to the scan line Gi of the i-th row; a second electrode of the transistor 6102 is connected to the wiring 6112; and a gate electrode of the transistor 6102 is connected to the wiring 6112. Note that a potential higher than an H level of the signal input to the scan line Gi of the i-th row is input to the wiring 6112. Therefore, when charge is not discharged to the scan line Gi of the i-th row, the transistor 6102 is off. On the other hand, when positive charge is discharged to the scan line Gi of the i-th row, the potential of the scan line Gi of the i-th row rises instantaneously. At this time, when the potential of the scan line Gi of the i-th row is higher than the sum of a potential of the wiring 6112 and the threshold voltage of the transistor 6102, the transistor 6102 is turned on and current flows to the wiring 6112 through the transistor 6102. Therefore, the structure shown in FIG. 36B can prevent large current from flowing to the pixel, so that electrostatic discharge of the pixel can be prevented.

Figure 36C:
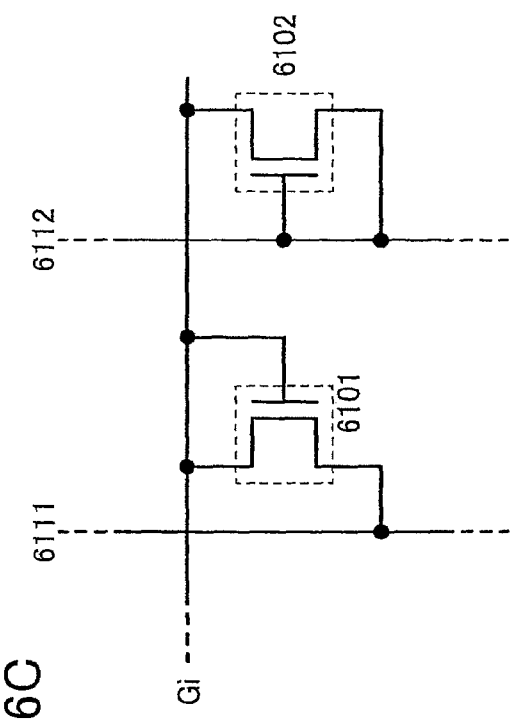

As shown in FIG. 36C, with a structure which combines FIGS. 36A and 36B, electrostatic discharge of the pixel can be prevented when positive or negative charge is discharged to the scan line Gi of the i-th row. Note that portions which are similar to those of FIGS. 36A and 36B are denoted by common reference numerals, and detailed description of the portions which are the same and portions which have similar functions is omitted.

Figure 37B:
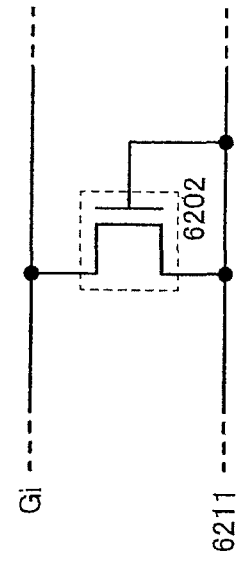
FIGS. 37A and 37B are diagrams each showing a structure of the protection diode shown in Embodiment Mode 6.
Figure 37A:
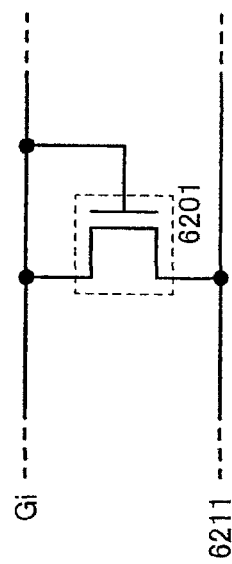

FIG. 37A shows a structure where a transistor 6201 functioning as a protective diode is connected between a scan line and a storage capacitor line. Note that although one protective diode is arranged here, a plurality of protective diodes may be arranged in series, in parallel, or in serial-parallel. Although the transistor 6201 is an N-channel transistor, a P-channel transistor may be used, and polarity of the transistor 6201 may be the same as that of the transistor included in the scan line driver circuit or the pixel. A wiring 6211 functions as a storage capacitor line. A first electrode of the transistor 6201 is connected to the scan line Gi of the i-th row; a second electrode of the transistor 6201 is connected to the wiring 6211; and a gate electrode of the transistor 6201 is connected to the scan line Gi of the i-th row. Note that a potential lower than an L level of the signal input to the scan line Gi of the i-th row is input to the wiring 6211. Therefore, when charge is not discharged to the scan line Gi of the i-th row, the transistor 6210 is off. On the other hand, when negative charge is discharged to the scan line Gi of the i-th row, the potential of the scan line Gi of the i-th row lowers instantaneously. At this time, when the potential of the scan line Gi of the i-th row is lower than a value obtained by subtracting the threshold voltage of the transistor 6201 from a potential of the wiring 6211, the transistor 6201 is turned on and current flows to the wiring 6211 through the transistor 6201. Therefore, the structure shown in FIG. 37A can prevent large current from flowing to the pixel, so that electrostatic discharge of the pixel can be prevented. Further, since the storage capacitor line is utilized as a wiring for discharging charge in the structure shown in FIG. 37A, it is not necessary to add a wiring.

FIG. 37B shows a structure for preventing electrostatic discharge when positive charge is discharged to the scan line Gi of the i-th row. Here, a potential higher than an H level of the signal input to the scan line Gi of the i-th row is input to the wiring 6211. Therefore, when charge is not discharged to the scan line Gi of the i-th row, the transistor 6202 is off. On the other hand, when positive charge is discharged to the scan line Gi of the i-th row, the potential of the scan line Gi of the i-th row rises instantaneously. At this time, when the potential of the scan line Gi of the i-th row is higher than the sum of a potential of the wiring 6211 and the threshold voltage of the transistor 6202, the transistor 6202 is turned on and current flows to the wiring 6211 through the transistor 6202. Therefore, the structure shown in FIG. 37B can prevent large current from flowing to the pixel, so that electrostatic discharge of the pixel can be prevented. Further, since the storage capacitor line is utilized as a wiring for discharging charge in the structure shown in FIG. 37B, it is not necessary to add a wiring. Note that portions which are similar to those of FIG. 37A are denoted by common reference numerals, and detailed description of the portions which are the same and portions which have similar functions is omitted.

Next, FIG. 38A shows a structure for preventing electrostatic discharge caused in a signal line by a protective diode. FIG. 38A shows a structure where the protective diode is provided between a wiring 6411 and the signal line. Although not shown, a plurality of pixels are connected to the signal line Sj of the j-th column. A transistor 6401 is used as the protective diode. Note that although the transistor 6401 is an N-channel transistor, a P-channel transistor may be used, and polarity of the transistor 6401 may be the same as that of a transistor included in a signal line driver circuit or the pixel.

Note that although one protective diode is arranged here, a plurality of protective diodes may be arranged in series, in parallel, or in serial-parallel.

A first electrode of the transistor 6401 is connected to the signal line Sj of the j-th column; a second electrode of the transistor 6401 is connected to the wiring 6411; and a gate electrode of the transistor 6401 is connected to the signal line Sj of the j-th column.

Operations of FIG. 38A are described. A certain potential is input to the wiring 6411, which is lower than the smallest value of a video signal input to the signal line Sj of the j-th column. When positive or negative charge is not discharged to the signal line Sj of the j-th column, a potential of the signal line Sj of the j-th column is the same as the video signal, so that the transistor 6401 is off. On the other hand, when negative charge is discharged to the signal line Sj of the j-th column, the potential of the signal line Sj of the j-th column lowers instantaneously. At this time, when the potential of the signal line Sj of the j-th column is lower than a value obtained by subtracting the threshold voltage of the transistor 6401 from a potential of the wiring 6411, the transistor 6401 is turned on and current flows to the wiring 6411 through the transistor 6401. Therefore, the structure shown in FIG. 38A can prevent large current from flowing to the pixel, so that electrostatic discharge of the pixel can be prevented.

FIG. 38B shows a structure for preventing electrostatic discharge when positive charge is discharged to the signal line Sj of the j-th column. A transistor 6402 functioning as a protective diode is provided between the signal line and a wiring 6412. Note that although one protective diode is arranged here, a plurality of protective diodes may be arranged in series, in parallel, or in serial-parallel. Although the transistor 6402 is an N-channel transistor, a P-channel transistor may be used, and polarity of the transistor 6402 may be the same as that of the transistor included in the signal line driver circuit or the pixel. A first electrode of the transistor 6402 is connected to the signal line Sj of the j-th column; a second electrode of the transistor 6402 is connected to the wiring 6412; and a gate electrode of the transistor 6402 is connected to the wiring 6412. Note that a potential higher than the largest value of a video signal input to the signal line Sj of the j-th column is input to the wiring 6412. Therefore, when charge is not discharged to the signal line Sj of the j-th column, the transistor 6402 is off. On the other hand, when positive charge is discharged to the signal line Sj of the j-th column, the potential of the signal line Sj of the j-th column rises instantaneously. At this time, when the potential of the signal line Sj of the j-th column is higher than the sum of a potential of the wiring 6412 and the threshold voltage of the transistor 6402, the transistor 6402 is turned on and current flows to the wiring 6412 through the transistor 6402. Therefore, the structure shown in FIG. 38B can prevent large current from flowing to the pixel, so that electrostatic discharge of the pixel can be prevented.

As shown in FIG. 38C, with a structure which combines FIGS. 38A and 3813, electrostatic discharge of the pixel can be prevented when positive or negative charge is discharged to the signal line Sj of the j-th column. Note that portions which are similar to those of FIGS. 38A and 38B are denoted by common reference numerals, and detailed description of the portions which are the same and portions which have similar functions is omitted.

In this embodiment mode, the structures for preventing electrostatic discharge of the pixel connected to the scan line and the signal line are described. However, the structures of this embodiment mode are not only used for preventing electrostatic discharge of the pixel connected to the scan line and the signal line. For example, when this embodiment mode is used for the wiring to which a signal or a potential is input, connected to the scan line driver circuit and the signal line driver circuit shown in Embodiment Modes 1 to 4, electrostatic discharge of the scan line driver circuit and the signal line driver circuit can be prevented.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 7]

In this embodiment mode, another structure of a display device which can be applied to each of the display devices shown in Embodiment Modes 1 to 4 is described.

FIG. 39A shows a structure where a diode-connected transistor is provided between a scan line and another scan line. FIG. 39A shows a structure where a diode-connected transistor 6301a is provided between the scan line Gi−1 of the (i−1)th row and the scan line Gi of the i-th row, and a diode-connected transistor 6301b is provided between the scan line Gi of the i-th row and the scan line Gi+1 of the (i+1)th row. Note that although the transistors 6301a and 6301b are N-channel transistors, P-channel transistors may be used, and polarity of the transistors 6301a and 6301b may be the same as that of a transistor included in a scan line driver circuit or a pixel.

Note that in FIG. 39A, the scan line Gi−1 of the (i−1)th row, the scan line Gi of the i-th row, and the scan line Gi+1 of the (i+1)th row are typically shown, and a diode-connected transistor is similarly provided between other scan lines.

A first electrode of the transistor 6301a is connected to the scan line Gi of the i-th row; a second electrode of the transistor 6301a is connected to the scan line Gi−1 of the (i−1)th row; and a gate electrode of the transistor 6301a is connected to the scan line Gi−1 of the (i−1)th row. A first electrode of the transistor 6301b is connected to the scan line Gi+1 of (i+1)th row; a second electrode of the transistor 6301b is connected to the scan line Gi of the i-th row; and a gate electrode of the transistor 6301b is connected to the scan line Gi of the i-th row.

Operations of FIG. 39A are described. In each of the scan line driver circuits shown in Embodiment Modes 1 to 4, the scan line Gi−1 of the (i−1)th row, the scan line Gi of the i-th row, and the scan line Gi+1 of the (i+1)th row remain at an L level in the non-selection period. Therefore, the transistors 6301a and 6301b are off. However, when the potential of the scan line Gi of the i-th row is raised due to noise or the like, for example, a pixel is selected by the scan line Gi of the i-th row and a wrong video signal is written to the pixel. Accordingly, by providing the diode-connected transistor between the scan lines as shown in FIG. 39A, writing of a wrong video signal to the pixel can be prevented. This is because when the potential of the scan line Gi of the i-th row rises to equal to or higher than the sum of a potential of the scan line Gi−1 of the (i−1)th row and the threshold voltage of the transistor 6301a, the transistor 6301a is turned on and the potential of the scan line Gi of i-th row lowers. Therefore, the pixel is not selected by the scan line Gi of i-th row.

The structure of FIG. 39A is particularly advantageous when a scan line driver circuit and a pixel portion are formed over the same substrate. This is because in the scan line driver circuit including only N-channel transistors or only P-channel transistors, a scan line is sometimes enters into a floating state and noise easily occurs in the scan line.

FIG. 39B shows a structure where a direction of a diode-connected transistor provided between the scan lines is reversed to that in FIG. 39A. Note that although transistors 6302a and 6302b are N-channel transistors, P-channel transistors may be used, and polarity of the transistors 6302a and 6302b may be the same as that of the transistor included in the scan line driver circuit or the pixel. In FIG. 39B, a first electrode of the transistor 6302a is connected to the scan line Gi of the i-th row; a second electrode of the transistor 6302a is connected to the scan line Gi−1 of the (i−1)th row; and a gate electrode of the transistor 6302a is connected to the scan line Gi of the i-th row. A first electrode of the transistor 6302b is connected to the scan line Gi+1 of (i+1)th row; a second electrode of the transistor 6302b is connected to the scan line Gi of the i-th row; and a gate electrode of the transistor 6302b is connected to the scan line Gi+1 of (i+1)th row. In FIG. 39B, similarly to FIG. 38A, when the potential of the scan line Gi of the i-th row rises to equal to or higher than the sum of the potential of the scan line Gi+1 of (i+1)th row and the threshold voltage of the transistor 6302b, the transistor 6302b is turned on and the potential of the scan line Gi of the i-th row lowers. Therefore, the pixel is not selected by the scan line Gi of the i-th row, and writing of a wrong video signal to the pixel can be prevented.

As shown in FIG. 39C, with a structure which combines FIGS. 39A and 39B, even when the potential of the scan line Gi of the i-th row rises, the transistors 6301a and 6301b are tuned on and the potential of the scan line Gi of the i-th row lowers. Note that in FIG. 39C, since current flows through two transistors, larger noise can be removed. Note that portions which are similar to those of FIGS. 39A and 39B are denoted by common reference numerals, and detailed description of the portions which are the same and portions which have similar functions is omitted.

Note that as shown in FIGS. 37A and 37B, when a diode-connected transistor is provided between the scan line and the storage capacitor line, advantageous effects which are similar to those of FIGS. 39A to 39C can be obtained.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 8]

In this embodiment mode, a structure and a manufacturing method of a transistor are described.

Figure 46A:
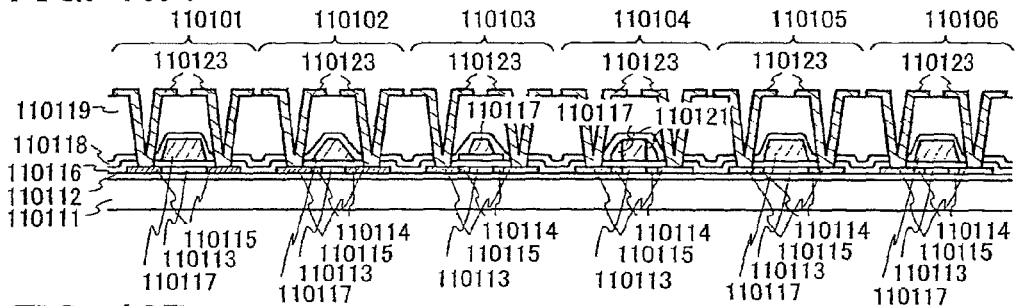
FIGS. 46A to 46G are cross-sectional views showing a process for forming a semiconductor device in accordance with the present invention.
Figure 46B:
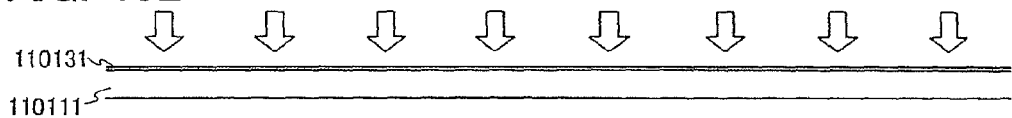
Figure 46C:
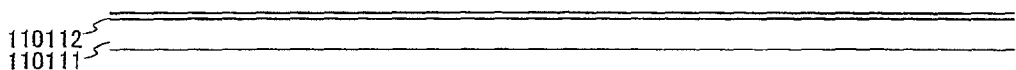
Figure 46D:
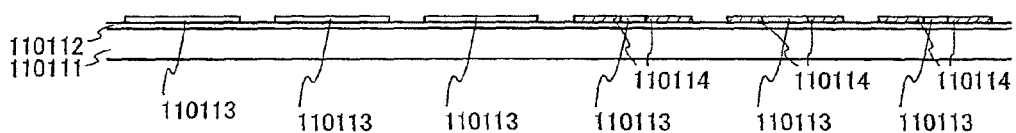
Figure 46E:
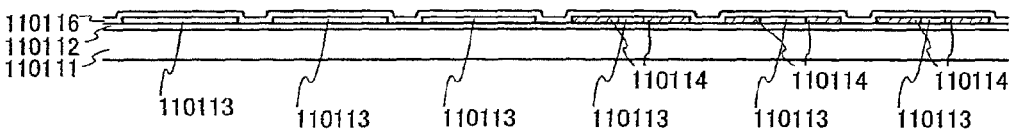
Figure 46F:
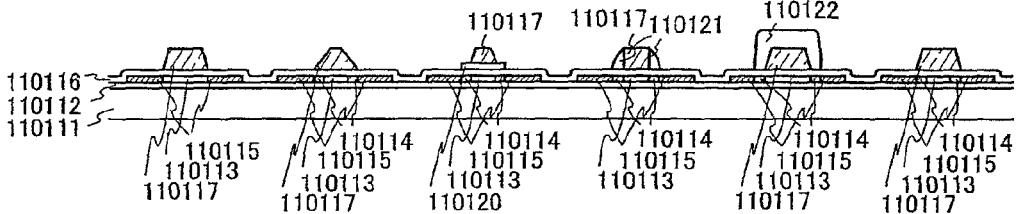
Figure 46G:
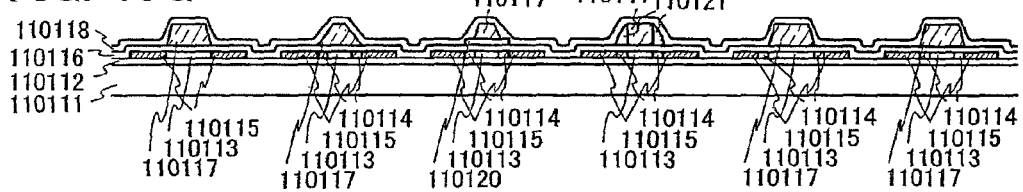

FIGS. 46A to 46G are cross-sectional views showing examples of a structure and a manufacturing method of a transistor. FIG. 46A is a cross-sectional view showing a structural example of the transistor. FIGS. 46B to 46G are cross-sectional views showing an example of a manufacturing method of the transistor.

The structure and the manufacturing method of the transistor are not limited to those shown in FIGS. 46A to 46G and various structures and manufacturing methods can be employed.

A structural example of a transistor is described with reference to FIG. 46A. FIG. 46A is a cross-sectional view of a plurality of transistors having different structures. In FIG. 46A, although the plurality of the transistors having different structures are arranged, this arrangement is made for describing the structures of the transistors, and it is not necessary to arrange the transistors actually as shown in FIG. 46A, and the transistors can be arranged as necessary.

Then, layers which form a transistor are each described.

A substrate 110111 can be a glass substrate such as a barium borosilicate glass, an alumino borosilicate glass, a quartz substrate, a ceramic substrate, or a metal substrate including stainless steel, for example. Besides these, a substrate formed of a synthetic resin having flexibility such as acrylic or plastic represented by polyethylene terephthalate (PET), polyethylene naphthalate (PEN), and polyethersulfone (PES) can be also used. By using such a flexible substrate, a semiconductor device which can be bent can be formed. Since a flexible substrate has no restrictions on an area and a shape of a substrate to be used, a rectangular substrate with a side of one meter or more is used as the substrate 110111, for example, so that productivity can be significantly improved. Such a merit is greatly advantageous over the case of using a circular silicon substrate.

An insulating film 110112 functions as a base film. The insulating film 110112 is provided to prevent alkali metal such as Na or alkaline earth metal from the substrate 110111 from adversely affecting characteristics of a semiconductor element. The insulating film 110112 can have a single-layer structure or a stacked-layer structure of an insulating film including oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y). For example, when the insulating film 110112 is provided to have a two-layer structure, it is preferable that a silicon nitride oxide film be used as a first insulating film and a silicon oxynitride film be used as a second insulating film. When the insulating film 110112 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 110113, 110114, and 110115 can be formed using an amorphous semiconductor, a microcrystalline semiconductor or a semi-amorphous semiconductor (SAS). Alternatively, a polycrystalline semiconductor film may be used. SAS is a semiconductor having an intermediate structure between amorphous and crystalline (including single crystalline and polycrystalline) structures and having a third state which is stable in free energy. Moreover, SAS includes a crystalline region with a short range order and lattice distortion. A crystalline region of 0.5 to 20 nm can be observed at least in part of an SAS film. When silicon is contained as a main component, Raman spectrum shifts to a wave number side lower than 520 cm$^{-1}$. The diffraction peaks of (111) and (220) which are thought to be derived from a silicon crystalline lattice are observed by X-ray diffraction. SAS contains hydrogen or halogen of at least 1 atomic % or more to terminate dangling bonds. SAS is formed by glow discharge decomposition (plasma CVD) of a material gas. As the material gas, $Si_2H_6$, $SiH_2Cl_2$, $SiHCl_3$, $SiCl_4$, $SiF_4$, or the like can be used in addition to $SiH_4$. Further, $GeF_4$ may be mixed. Alternatively, the material gas may be diluted with $H_2$, or $H_2$ and one or more kinds of rare gas elements selected from He, Ar, Kr, and Ne. A dilution ratio may be in the range of 2 to 1000 times, pressure may be in the range of approximately 0.1 to 133 Pa, a power supply frequency may be 1 to 120 MHz and preferably 13 to 60 MHz, and a substrate heating temperature may be 300° C. or tower. A concentration of impurities in atmospheric components such as oxygen, nitrogen, and carbon is preferably $1\times10^{20}$ cm$^{-1}$ or less as impurity elements in the film. In particular, an oxygen concentration is $5\times10^{19}$/cm$^3$ or less, and preferably $1\times10^{19}$/cm$^3$ or less. Here, an amorphous silicon film is formed using a material including silicon (Si) as its main component (e.g., $Si_xGe_{1-x}$) by a known method (e.g., a sputtering method, an LPCVD method, or a plasma CVD method). Then, the amorphous silicon film is crystallized by a known crystallization method such as a laser crystallization method, a thermal crystallization method using RTA or an annealing furnace, or a thermal crystallization method using a metal element which promotes crystallization.

An insulating film 110116 can have a single-layer structure or a stacked-layer structure of an insulating film(s) including oxygen or nitrogen, such as silicon oxide (SiOx), silicon nitride ($SiN_x$), silicon oxynitride ($SiO_xN_y$, x>y), or silicon nitride oxide ($SiN_xO_y$, x>y).

A gate electrode 110117 can have a single-layer structure of a conductive film Or a stacked-layer structure of two or three conductive films. As a material for the gate electrode 110117, a conductive film can be used. For example, a film of an element such as tantalum (Ta), titanium (Ti), molybdenum (Mo), tungsten (W), chromium (Cr), or silicon (Si); a nitride film including the element (typically, a tantalum nitride film, a tungsten nitride film, or a titanium nitride film); an alloy film in which the elements are combined (typically, a Mo—W alloy or a Mo—Ta alloy); a silicide film including the element (typically, a tungsten silicide film or a titanium silicide film); and the like can be used. Note that the above-described film of such an element, nitride film, alloy film, silicide film, and the like can have a single-layer structure or a stacked-layer structure.

An insulating film 110118 can have a single-layer structure or a stacked-layer structure of an insulating film including oxygen or nitrogen, such as silicon oxide (SiOx), silicon nitride ($SiN_x$), silicon oxynitride ($SiO_xN_y$, x>y), or silicon nitride oxide ($SiN_xO_y$, x>y); or a film including carbon, such as a DLC (Diamond Like Carbon), by a sputtering method or a plasma CVD method.

An insulating film 110119 can have a single-layer structure or a stacked-layer structure of a siloxane resin; an insulating film including oxygen or nitrogen, such as silicon oxide (SiOx), silicon nitride ($SiN_x$), silicon oxynitride ($SiO_xN_y$, x>y), or silicon nitride oxide ($SiN_xO_y$, x>y); or a film including carbon, such as a DLC (Diamond-Like Carbon); an organic material such as epoxy, polyimide, polyamide, polyvinyl phenol, benzocyclobutene, or acrylic. Note that the siloxane resin corresponds to a resin having Si—O—Si bonds. Siloxane includes a skeleton structure of a bond of silicon (Si) and oxygen (O). As a substituent, an organic group including at least hydrogen (e.g., as an alkyl group or aromatic hydrocarbon) is used. Alternatively, a fluoro group, or a fluoro group and an organic group including at least hydrogen can be used as a substituent. Note that the insulating film 110119 can be provided to cover the gate electrode 110117 directly without provision of the insulating film 110118.

As a conductive film 110123, a film of an element such as Al, Ni, C, W, Mo, Ti, Pt, Cu, Ta, Au, or Mn, a nitride film including the element, an alloy film in which the elements are combined, a silicide film including the element, or the like can be used. For example, as an alloy including some of such elements, an Al alloy including C and Ti, an Al alloy including Ni, an Al alloy including C and Ni, an Al alloy including C and Mn, or the like can be used. In the case of a stacked-layer structure, for example, a structure can be such that Al is interposed between Mo, Ti, or the like, so that resistance of Al to heat and chemical reaction can be improved.

Next, characteristics of each structure is described with reference to the cross-sectional view of the plurality of transistors each having a different structure in FIG. 46A.

A transistor 110101 is a single drain transistor. Since it can be formed by a simple method, it is advantageous in low manufacturing cost and high yield. Note the taper angel is equal to or larger than 45° to smaller than 95°, more preferably, equal to or larger than 60° to smaller than 95°. Alternatively, the taper angle may be smaller than 45°. Here, the semiconductor layers 110113 and 110115 each have different concentration of impurities, and the semiconductor layer 110113 is used as a channel region and the semiconductor layers 110115 are used as a source region and a drain region. By controlling the amount of impurities in this manner, resistivity of the semiconductor layer can be controlled. Further, an electrical connection state between the semiconductor layer and the conductive film 110123 can be closer to ohmic contact. Note that as a method of separately forming the semiconductor layers each including different amount of impurities, a method where impurities are added to the semiconductor layer using the gate electrode 110117 as a mask can be used.

A transistor 110102 denotes a transistor in which the gate electrode 110117 has a certain tapered angle or more. Since it can be formed by a simple method, it is advantageous in low manufacturing cost and high yield. Here, the semiconductor layers 110111, 110114, and 10115 each have different concentration of impurities. The semiconductor layer 110113 is used as a channel region, the semiconductor layers 110114 as lightly doped drain (LDD) regions, and the semiconductor layers 110115 as a source region and a drain region. By controlling the amount of impurities in this manner, resistivity of the semiconductor layer can be controlled. Further, an electrical connection state between the semiconductor layer and the conductive film 110123 can be closer to ohmic contact. Moreover, since the transistor includes the LDD region, high electric field is hardly applied to the transistor, so that deterioration of the element due to hot carriers can be suppressed. Note that as a method of separately forming the semiconductor layers each including different amount of impurities, a method where impurities are added to the semiconductor layer using the gate electrode 110117 as a mask can be used. In the transistor 110102, since the gate electrode 110117 has a certain tapered angle or more, gradient of the concentration of impurities added to the semiconductor layer through the gate electrode 110117 can be provided, and the LDD region can be easily formed. Note the taper angel is equal to or larger than 45° to smaller than 95°, more preferably, equal to or larger than 60° to smaller than 95°. Alternatively, the taper angle may be smaller than 45°.

A transistor 110103 denotes a transistor in which the gate electrode 110117 includes at least two layers and a lower gate electrode is longer than an upper gate electrode. In this specification, the shape of the upper gate electrode and the lower gate electrode is referred to as a hat shape. When the gate electrode 110117 has such a hat shape, an LDD region can be formed without addition of a photomask. Note that a structure where the LDD region overlaps with the gate electrode 110117, like the transistor 110103, is particularly called a GOLD (Gate Overlapped LDD) structure. As a method of forming the gate electrode 110117 with such a hat shape, the following method may be used.

First, when the gate electrode 110117 is patterned, the lower and upper gate electrodes are etched by dry etching so that side surfaces thereof are inclined (tapered). Then, the inclination of the upper gate electrode is processed to be almost perpendicular by anisotropic etching. Thus, the gate electrode is formed such that the cross section is hat-shaped. Then, doping of impurity elements is conducted twice, so that the semiconductor layer 110113 used as a channel region, the semiconductor layers 110114 used as LDD regions, and the semiconductor layers 110115 used as a source electrode and a drain electrode are formed.

Note that a portion of the LDD region, which overlaps with the gate electrode 110117, is referred to as an Lov region, and a portion of the LDD region, which does not overlap with the gate electrode 110117, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is highly effective in preventing deterioration in the on-current value by relieving the electric field in the vicinity of the drain, whereas it is not very effective in suppressing the off-current value. Thus, it is preferable to form a transistor having a structure corresponding to characteristics required for each of the various circuits. For example, when the semiconductor device is used for a display device, a transistor having an Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

A transistor 110104 denotes a transistor including a sidewall 110121 in contact with a side surface of the gate electrode 110117. When the transistor includes the sidewall 110121, a region overlapping with the sidewall 110121 can be formed as an LDD region.

A transistor 110105 denotes a transistor in which an LDD (Loff) region is formed by doping the semiconductor layer with an impurity element, using a mask 110122. Thus, the LDD region can surely be formed, and an off-current value of the transistor can be reduced.

A transistor 110106 denotes a transistor in which an LDD (Lov) region is formed by doping in the semiconductor layer with use of a mask. Thus, the LDD region can surely be formed, and deterioration in an on-current value can be prevented by relieving the electric field in the vicinity of the drain of the transistor.

Next, an example of a manufacturing method of a transistor is described with reference to FIGS. 46B to 46G.

Note that a structure and a manufacturing method of a transistor are not limited to those in FIGS. 46A to 46G, and various structures and manufacturing methods can be used.

In this embodiment mode, a surface of the substrate 110111, the insulating film 110112, the semiconductor layer 110113, the semiconductor layer 110114, the semiconductor layer 110115, the insulating film 110116, the insulating film 110118, or the insulating film 110119 is oxidized or nitrided by plasma treatment, so that the semiconductor layer or the insulating film can be oxidized or nitrided. By oxidizing or nitriding the semiconductor layer or the insulating film by plasma treatment in such a manner, a surface of the semiconductor layer or the insulating film is modified, and the insulating film can be formed to be denser than an insulating film formed by a CVD method or a sputtering method; thus, a defect such as a pinhole can be suppressed, and characteristics and the like of the semiconductor device can be improved.

Note that silicon oxide ($SiO_x$) or silicon nitride ($SiN_x$) can be used for the sidewall 110121. As a method of forming the sidewall 110121 on the side surface of the gate electrode 110117, a method in which the gate electrode 110117 is formed, then, a silicon oxide ($SiO_x$) film or a silicon nitride ($SiN_x$) film is formed, and then, the silicon oxide ($SiO_x$) film or the silicon nitride ($SiN_x$) film is etched by anisotropic etching can be used, for example. Thus, the silicon oxide ($SiO_x$) film or the silicon nitride ($SiN_x$) film remains only on the side surface of the gate electrode 110117, so that the sidewall 110121 can be formed on the side surface of the gate electrode 110117.

Figure 50:
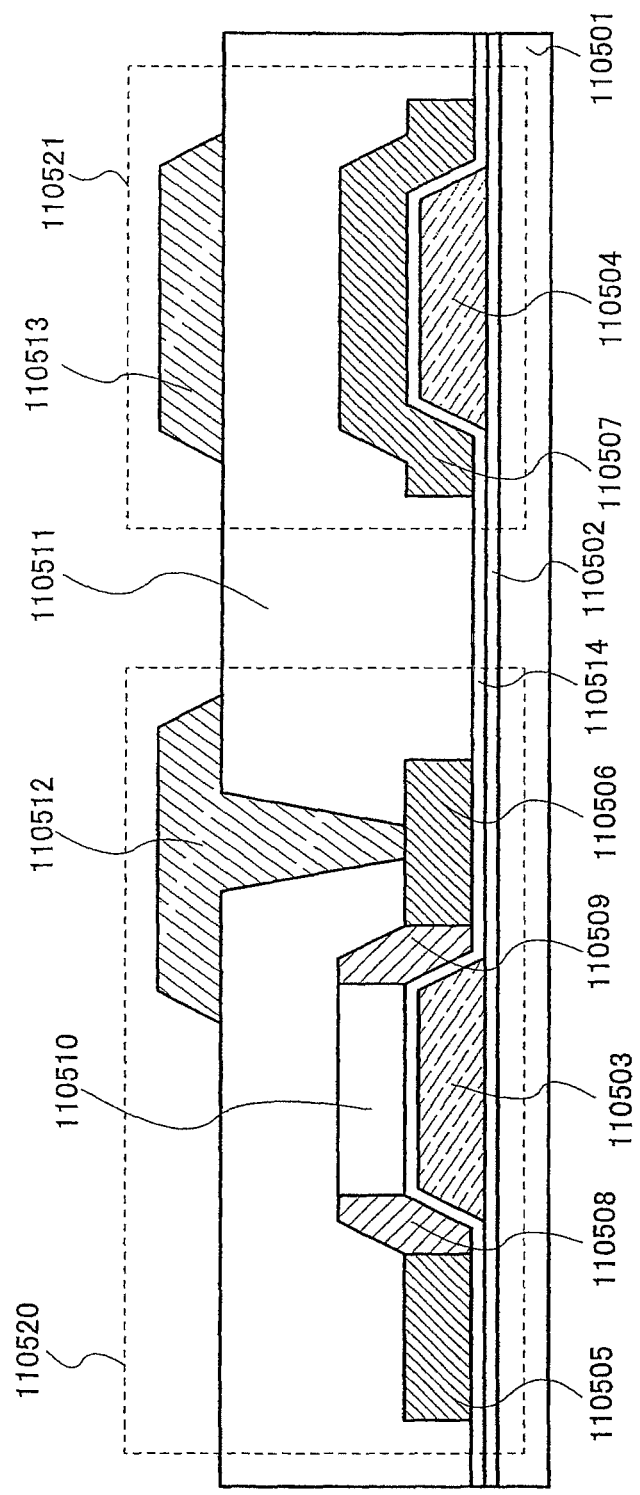
FIG. 50 is a cross-sectional view showing a structure of a semiconductor device in accordance with the present invention.

FIG. 50 shows cross-sectional structures of a bottom gate transistor and a capacitor.

A first insulating film (an insulating film 110502) is formed entirely over a substrate 110501. However, the first insulating film (the insulating film 110502) may not be formed in some cases without being limited to this structure. The first insulating film can prevent impurities from the substrate from adversely affecting a semiconductor layer and changing a property of a transistor. That is, the first insulating film functions as a base film. Therefore, a highly reliable transistor can be manufactured. As the first insulating film, a single layer or a stacked layer of a silicon oxide film, a silicon nitride film, or a silicon oxynitride film ($SiO_xN_y$) can be used.

A first conductive layer (a conductive layer 110503 and a conductive layer 110504) is formed over the first insulating film. The conductive layer 110503 includes a portion of a gate electrode of the transistor 110520. The conductive layer 110504 includes a portion of a first electrode of a capacitor 110521. As the first conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

A second insulating film (an insulating film 110514) is formed to cover at least the first conductive layer. The second insulating film serves also as a gate insulating film. As the second insulating film, a single layer or a stacked layer of a silicon oxide film, a silicon nitride film, or a silicon oxynitride film ($SiO_xN_y$) can be used.

As the second insulating film which is in contact with the semiconductor layer, a silicon oxide film is preferably used. This is because the trap levels at the interface between the semiconductor layer and the second insulating film can be reduced.

When the second insulating film is in contact with Mo, a silicon oxide film is preferably used as the second insulating film in contact with Mo. This is because the silicon oxide film does not oxidize Mo.

A semiconductor layer is formed in a portion over the second insulating film which overlaps with the first conductive layer by a photolithography method, an inkjet method, a printing method or the like. A portion of the semiconductor layer extends to a portion in which the second insulating film and the first conductive layer are not overlapped and which is over the second insulating film. The semiconductor layer includes a channel region (a channel region 110510), LDD regions (an LDD region 110508 and an LDD region 110509), and impurity regions (an impurity region 110505, an impurity region 110506, and an impurity region 110507). The channel region 110510 functions as a channel region of the transistor 110520. The LDD regions 110508 and 110509 function as LDD regions of the transistor 110520. Note that the LDD regions 110508 and 110509 are not necessarily formed. The impurity region 110505 includes one of a source electrode and a drain electrode of the transistor 110520. The impurity region 110506 includes the other of a source electrode and a drain electrode of the transistor 110520. The impurity region 110507 includes a second electrode of the capacitor 110521.

A third insulating film (an insulating film 110511) is formed entirely. A contact hole is selectively formed in part of the third insulating film. The insulating film 110511 has a function of an interlayer insulating film. As the third insulating film, an inorganic material (e.g., silicon oxide (SiOx), silicon nitride, or silicon oxynitride), an organic compound material having a low dielectric constant (e.g., a photosensitive or nonphotosensitive organic resin material), or the like can be used. Alternatively, a material including siloxane may be used. Siloxane is a material in which a skeleton structure is formed by a bond of silicon (Si) and oxygen (O). As a substituent, an organic group including at least hydrogen (e.g., an alkyl group or aromatic hydrocarbon) is used. Alternatively, a fluoro group can be used as the substituent. Further alternatively, the organic group including at least hydrogen and the fluoro group may be used as the substituent.

A second conductive layer (a conductive layer 110512 and a conductive layer 110513) is formed over the third insulating film. The conductive layer 110512 is connected to the other of the source electrode and the drain electrode of the transistor 110520 through the contact hole formed in the third insulating film. Therefore, the conductive layer 110512 includes the other of the source electrode and the drain electrode of the transistor 110520. When the conductive layer 110513 is electrically connected to the conductive layer 110504, the conductive layer 11513 includes a portion of a first electrode of the capacitor 110521. Alternatively, when the conductive layer 110513 is electrically connected to the impurity region 110507, the conductive layer 110513 includes a portion of a second electrode of the capacitor 110521. Alternatively, when the conductive layer 110513 is connected to the conductive layer 110504 and the impurity region 110507, another capacitor is formed other than the capacitor 110521. In this capacitor, the conductive layer 110513, the impurity region 110507 and the insulating layer 110511 are used as a first electrode, a second electrode and an insulating layer, respectively. Note that as the second conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

In steps after forming the second conductive layer, various insulating films or various conductive films may be formed.

Next, structure of a transistor using amorphous silicon (a-Si) or microcrystal silicon as a semiconductor layer of the transistor and a capacitor are described.

Figure 47:
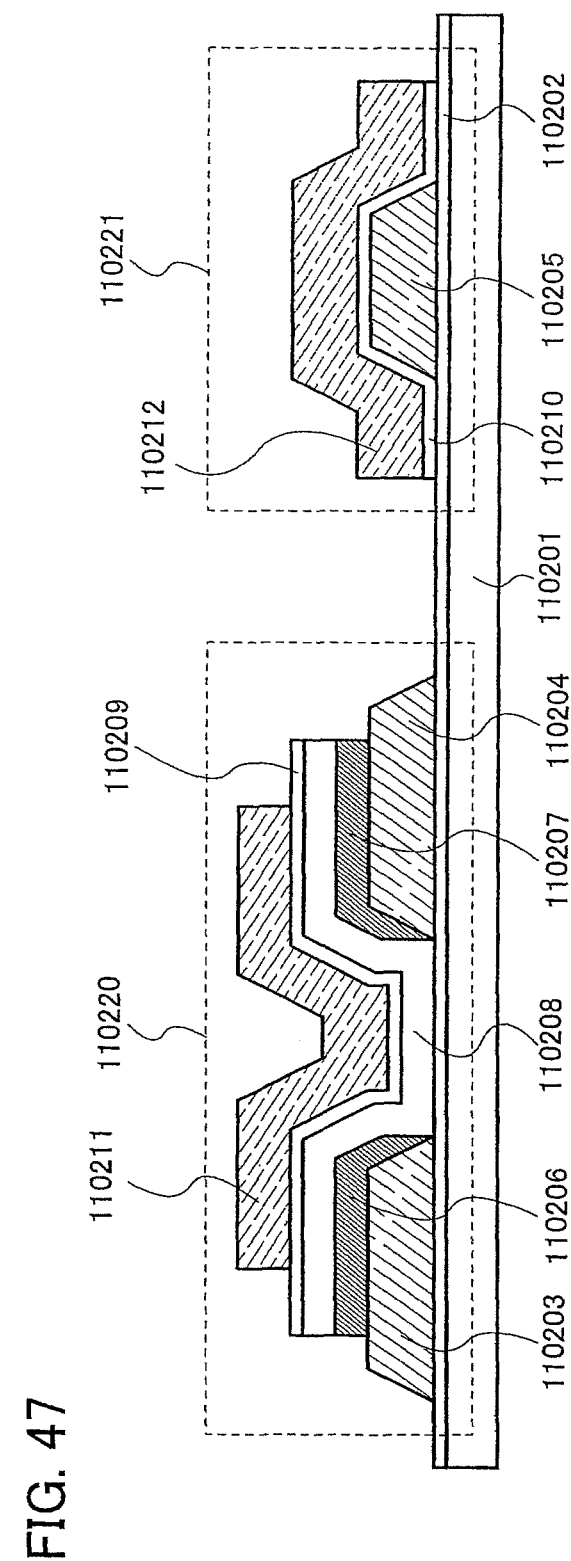
FIG. 47 is a cross-sectional view showing a structure of a semiconductor device in accordance with the present invention.

FIG. 47 shows cross-sectional structures of a top gate transistor and a capacitor.

A first insulating film (an insulating film 110202) is formed entirely over a substrate 110201. The first insulating film can prevent impurities from the substrate from adversely affecting a semiconductor layer and changing a property of a transistor. That is, the first insulating film functions as a base film. Therefore, a highly reliable transistor can be manufactured. As the first insulating film, a single layer or a stacked layer of a silicon oxide film, a silicon nitride film, or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, yield can be increased.

A first conductive layer (a conductive layer 110203, a conductive layer 110204, and a conductive layer 110205) is formed over the first insulating film. The conductive layer 110203 includes a portion of one of a source electrode and a drain electrode of a transistor 110220. The conductive layer 110204 includes a portion of the other of a source electrode and a drain electrode of the transistor 110220. The conductive layer 110205 includes a portion of a first electrode of a capacitor 110221. As the first conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

Over the conductive layer 110203 and the conductive layer 110204, a first semiconductor layer (a semiconductor layer 110206 and a semiconductor layer 110207) is formed. The semiconductor layer 110206 includes a portion of one of a source electrode and a drain electrode. The semiconductor layer 110207 includes a portion of the other of the source electrode and the drain electrode. As the first semiconductor layer, silicon including phosphorus or the like can be used.

A second semiconductor layer (a semiconductor layer 110208) is formed between the conductive layer 110203 and the conductive layer 110204, and over the first insulating film. A part of the semiconductor layer 110208 extends to a portion over the conductive layer 110203 and the conductive layer 110204. The semiconductor layer 110208 includes a portion of a channel region of the transistor 110220. As the second semiconductor layer, a semiconductor layer having non-crystallinity such as amorphous silicon (a-Si:H), or a semiconductor layer such as microcrystal (μ-Si:H) can be used.

A second insulating film (an insulating film 110209 and an insulating film 110210) is formed to cover at least the semiconductor layer 110208 and the conductive layer 110205. The second insulating film serves also as a gate insulating film. As the second insulating film, a single layer or a stacked layer of a silicon oxide film, a silicon nitride film, or a silicon oxynitride film ($SiO_xN_y$) can be used.

As the second insulating film which is in contact with the second semiconductor layer, a silicon oxide film is preferably used. This is because the trap levels at the interface between the second semiconductor layer and the second insulating film can be reduced.

When the second insulating film is in contact with Mo, a silicon oxide film is preferably used as the second insulating film in contact with Mo. This is because the silicon oxide film does not oxidize Mo.

A second conductive layer (a conductive layer 110211 and a conductive layer 110212) is formed over the second insulating film. The conductive layer 110211 includes a portion of a gate electrode of the transistor 110220. The conductive layer 110212 includes a portion of a second electrode or a wiring of a capacitor 110221. As the second conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

In steps after forming the second conductive layer, various insulating films or various conductive films may be formed.

Figure 48:
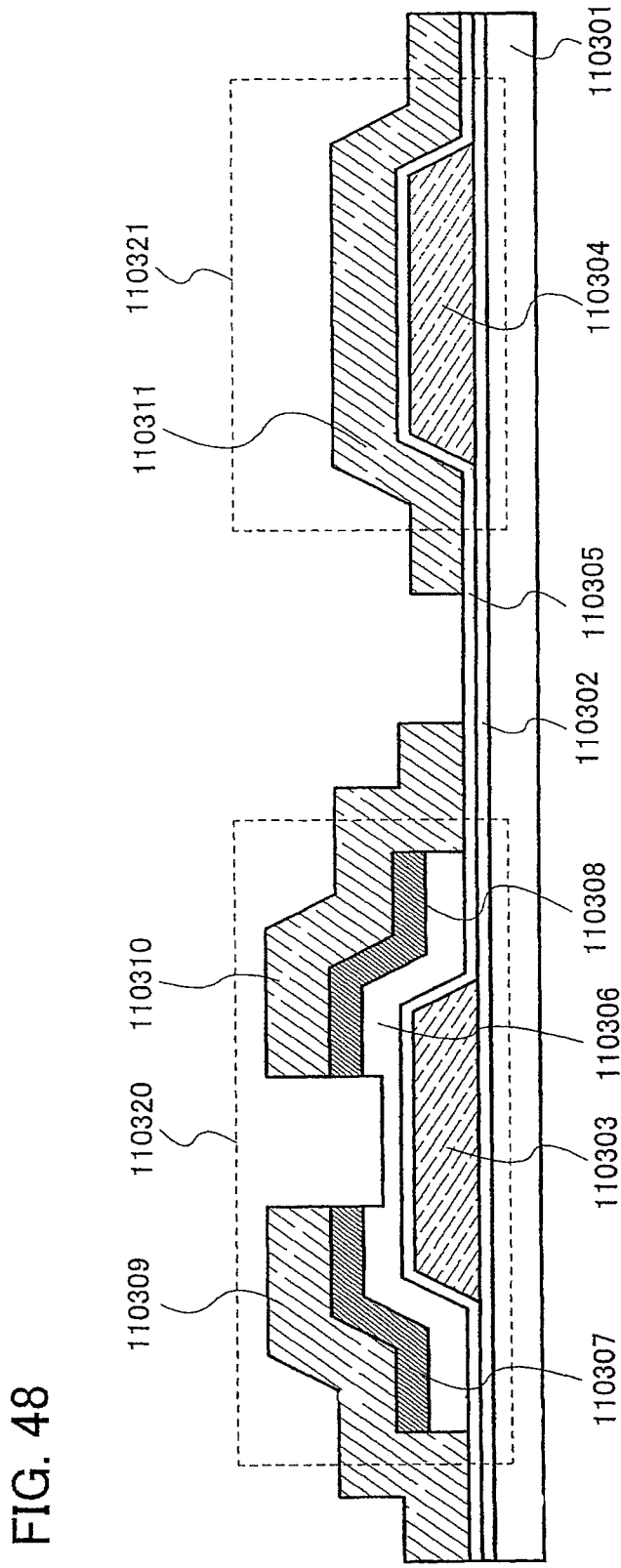
FIG. 48 is a cross-sectional view showing a structure of a semiconductor device in accordance with the present invention.

FIG. 48 shows cross-sectional structures of an inversely staggered (bottom gate) transistor and a capacitor. In particular, the transistor illustrated in FIG. 48 is a channel-etched type transistor.

A first insulating film (an insulating film 110302) is formed entirely over a substrate 110301. The first insulating film can prevent impurities from the substrate from adversely affecting a semiconductor layer and changing a property of the transistor. That is, the first insulating film functions as a base film. Therefore, a highly reliable transistor can be manufactured. As the first insulating film, a single layer or a stacked layer of a silicon oxide film, a silicon nitride film, or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, yield can be increased.

A first conductive layer (a conductive layer 110303 and a conductive layer 110304) is formed over the first insulating film. The conductive layer 110303 includes a portion of a gate electrode of the transistor 110320. The conductive layer 110304 includes a portion of a first electrode of a capacitor 110321. As the first conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

A second insulating film (an insulating film 110305) is formed so as to cover at least the first conductive layer. The second insulating film serves also as a gate insulating film. As the second insulating film, a single layer or a stacked layer of a silicon oxide film, a silicon nitride film, or a silicon oxynitride film ($SiO_xN_y$) can be used.

As the second insulating film which is in contact with the semiconductor layer, a silicon oxide film is preferably used. This is because the trap levels at the interface between the semiconductor layer and the second insulating film can be reduced.

When the second insulating film is in contact with Mo, a silicon oxide film is preferably used as the second insulating film in contact with Mo. This is because the silicon oxide film does not oxidize Mo.

A first semiconductor layer (a semiconductor layer 110306) is formed in a portion over the second insulating film which overlaps with the first conductive layer by a photolithography method, an inkjet method, a printing method or the like. A portion of the semiconductor layer 110306 extends to a portion in which the second insulating film and the first conductive layer are not overlapped. The semiconductor layer 110306 includes a portion of a channel region of the transistor 110320. As the semiconductor layer 110306, a semiconductor layer having non-crystallinity such as amorphous silicon (a-Si:H), or a semiconductor layer such as microcrystal (μ-Si:H) can be used.

In a portion over the first semiconductor layer, a second semiconductor layer (a semiconductor layer 110307 and a semiconductor layer 110308) is formed. The semiconductor layer 110307 includes a portion of one of a source electrode and a drain electrode. The semiconductor layer 110308 includes a portion of the other of the source electrode and the drain electrode. As the second semiconductor layer, silicon including phosphorus or the like can be used.

A second conductive layer (a conductive layer 110309, a conductive layer 110310, and a conductive layer 110311) is formed over the second semiconductor layer and the second insulating film. The conductive layer 110309 includes a portion of one of a source electrode and a drain electrode of the transistor 110320. The conductive layer 110310 includes the other of the source electrode and the drain electrode of the transistor 110320. The conductive layer 110311 includes a portion of a second electrode of the capacitor 110321. Note that as the second conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

In steps after forming the second conductive layer, various insulating films or various conductive films may be formed.

A process of forming a channel-etched type transistor is described as an example. The first semiconductor layer and the second semiconductor layer can be formed using the same mask. Specifically, the first semiconductor layer and the second semiconductor layer are formed sequentially. The first semiconductor layer and the second semiconductor layer are formed using the same mask.

A process of forming a channel-etched type transistor is described as another example. Without using a new mask, a channel region of a transistor is formed. Specifically, after forming the second conductive layer, a part of the second semiconductor layer is removed using the second conductive layer as a mask. Alternatively, a portion of the second semiconductor layer is removed by using the same mask as the second conductive layer. The first semiconductor layer below the removed second semiconductor layer becomes a channel region of the transistor.

Figure 49:
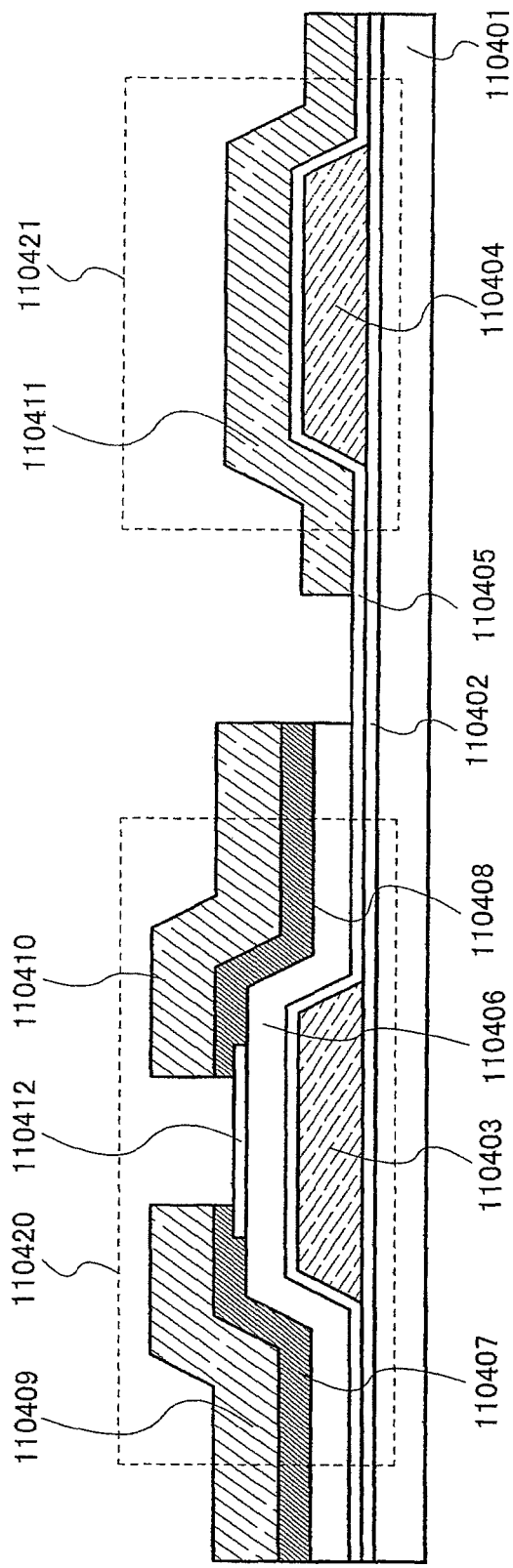
FIG. 49 is a cross-sectional view showing a structure of a semiconductor device in accordance with the present invention.

FIG. 49 illustrates cross-sectional structures of an inversely staggered (a bottom gate) transistor and a capacitor. In particular, the transistor illustrated in FIG. 49 is a channel protection (a channel stop) type transistor.

A first insulating film (an insulating film 110402) is formed entirely over a substrate 110401. The first insulating film can prevent impurities from the substrate from adversely affecting a semiconductor layer and changing a property of a transistor. That is, the first insulating film functions as a base film. Therefore, a highly reliable transistor can be manufactured. As the first insulating film, a single layer or a stacked layer of a silicon oxide film, a silicon nitride film, or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, yield can be increased.

A first conductive layer (a conductive layer 110403 and a conductive layer 110404) is formed over the first insulating film. The conductive layer 110403 includes a portion of a gate electrode of a transistor 110420. The conductive layer 110404 includes a portion of a first electrode of a capacitor 110421. As the first conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

A second insulating film (an insulating film 110405) is formed so as to cover at least the first conductive layer. The second insulating film serves also as a gate insulating film. As the second insulating film, a single layer or a stacked layer of a silicon oxide film, a silicon nitride film, or a silicon oxynitride film ($SiO_xN_y$) can be used.

As the second insulating film which is in contact with the semiconductor layer, a silicon oxide film is preferably used. This is because the trap levels at the interface between the semiconductor layer and the second insulating film can be reduced.

When the second insulating film is in contact with Mo, a silicon oxide film is preferably used as the second insulating film in contact with Mo. This is because the silicon oxide film does not oxidize Mo.

A first semiconductor layer (a semiconductor layer 110406) is formed in a portion over the second insulating film which overlaps with the first conductive layer, by a photolithography method, an inkjet method, a printing method or the like. A portion of the semiconductor layer 110406 extends to a portion in which the second insulating film and the first conductive layer are not overlapped. The semiconductor layer 110406 includes a portion of a channel region of the transistor r110420. As the semiconductor layer 110406, a semiconductor layer having non-crystallinity such as amorphous silicon (a-Si:H), or a semiconductor layer such as microcrystal (μ-Si:H) can be used, for example.

A third insulating film (an insulating film 110412) is formed in a portion over the first semiconductor layer. The insulating film 110412 has a function of preventing the channel region of the transistor 110420 from being etched. That is, the insulating film 110412 functions as a channel protection film (a channel stop film). As the third insulating film, a single layer or a stacked layer of a silicon oxide film, a silicon nitride film, or a silicon oxynitride film ($SiO_xN_y$) can be used.

In a portion over the first semiconductor layer and a portion over the third insulating film, a second semiconductor layer (a semiconductor layer 110407 and a semiconductor layer 110408) is formed. The semiconductor layer 110407 includes a portion of one of a source electrode and a drain electrode. The semiconductor layer 110408 includes a portion of the other of the source electrode and the drain electrode. As the second semiconductor layer, silicon including phosphorus or the like can be used.

A second conductive layer (a conductive layer 110409, a conductive layer 110410, and a conductive layer 110411) is formed over the second semiconductor layer. The conductive layer 110409 includes a portion of one of a source electrode and a drain electrode of the transistor 110420. The conductive layer 110410 includes the other of the source electrode and the drain electrode of the transistor 110420. The conductive layer 110411 includes a portion of a second electrode of the capacitor 110421. Note that as the second conductive layer, Ti, Mo, Ta, Cr, W, Al, Nd, Cu, Ag, Au, Pt, Nb, Si, Zn, Fe, Ba, or Ge, or an alloy of these elements can be used. Further, a stacked layer including any of these (including an alloy thereof) can be used.

In steps after forming the second conductive layer, various insulating films or various conductive films may be formed.

The structures and manufacturing methods of such transistors have been described above. Such wirings, electrodes, conductive layers, conductive films, terminals, bias or plugs are formed to have one or more elements selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material including one or more of the elements in the group (for example, indium tin oxide (ITO), indium zinc oxide (IZO), indium tin oxide to which silicon oxide is added (ITSO), zinc oxide (ZnO), tin oxide (Son), Cadmium tin oxide (CTO), aluminum neodymium (Al—Nd), magnesium silver (Mg—Ag), molybdenum-niobium (Mo—Nb) or the like); a substance in which these compounds are combined; or the like. Alternatively, such wirings, electrodes, conductive layers, conductive films, terminals are preferably formed to have a substance including such compounds, a compound of silicon and one or more of the elements selected from the group (silicide) (e.g., aluminum silicon, molybdenum silicon, nickel silicide); or a compound of nitrogen and one or more of the elements selected from the group (e.g., titanium nitride, tantalum nitride, molybdenum nitride).

Note that silicon (Si) may include an n-type impurity (e.g., phosphorus) or a p-type impurity (e.g., boron). The impurity contained in silicon can increase the conductivity or enables the same performance as normal conductors. Thus, such silicon can be utilized easily as wirings or electrodes.

Silicon can be any of various types of silicon such as single crystalline silicon, polycrystal silicon, or microcrystal silicon. Alternatively, silicon having no crystallinity such as amorphous silicon can be used. By using single crystalline silicon or polycrystal silicon, resistance of a wiring, an electrode, a conductive layer, a conductive film, or a terminal can be reduced. By using amorphous silicon or micro crystalline silicon, a wiring or the like can be formed by a simple process.

In addition, aluminum or silver has high conductivity, and thus can reduce a signal delay. Since aluminum or silver can be easily etched, aluminum or silver can be easily patterned and processed minutely.

Further, copper has also high conductivity, and thus can reduce a signal delay. In using copper, a stacked structure is preferably employed since copper increases the adhesion.

Molybdenum and titanium are also preferable materials. This is because even if molybdenum or titanium is in contact with an oxide of a semiconductor (e.g., ITO or IZO) or silicon, molybdenum or titanium does not cause defects. Further, molybdenum or titanium is easily etched and has high-heat resistance.

Tungsten is preferable since tungsten has high-heat resistance.

Neodymium is also preferable, since neodymium has an advantage of high heat resistance. In particular, an alloy of neodymium and aluminum is used to increase heat-resistance, thereby almost preventing hillocks of aluminum.

Moreover, silicon is preferable since silicon can be formed at the same time as a semiconductor layer included in a transistor, and has high-heat resistance.

Since ITO, IZO, ITSO, zinc oxide (ZnO), silicon (Si), tin oxide (SnO), and cadmium tin oxide (CTO) have light-transmitting properties, they can be used as a portion which light should pass through. For example, ITO, IZO, ITSO, zinc oxide (ZnO), silicon (Si), tin oxide (SnO), or cadmium tin oxide (CTO) can be used for a pixel electrode or a common electrode.

IZO is preferable since IZO is easily etched and processed. In etching IZO, almost no residues of IZO are left. Thus, when a pixel electrode is formed using IZO, defects (such as short-circuiting or orientation disorder) of a liquid crystal element or a light-emitting element can be reduced.

Such wirings, electrodes, conductive layers, conductive films, terminals, via holes, or plugs may have a single-layer structure or a multilayer structure. By adopting a single-layer structure, a manufacturing process of such wirings, electrodes, conductive layers, conductive films, or terminals can be simplified; the number of days for a process can be reduced; and cost can be reduced. Alternatively, by employing a multilayer structure, an advantage of each material is taken and a disadvantage thereof is reduced so that a wiring or an electrode with high performance can be formed. For example, a low-resistant material (e.g., aluminum) is included in a multilayer structure, thereby reducing the resistance of such wirings. As another example, when a low heat-resistant material is interposed between high heat-resistant materials to form a stacked-layer structure, heat resistance of wirings or electrodes can be increased, utilizing advantages of such low heat-resistance materials. For example, a layer including aluminum is preferably interposed between layers including molybdenum, titanium, or neodymium as a stacked structure.

If wirings or electrodes are in direct contact with each other, an adverse effect is caused to each other in some cases. For example, one of a wiring and an electrode is mixed into another of the wirings or electrodes and changes the property, and thus, a desired function cannot be obtained. As another example, in forming a high-resistant portion, there is a problem in that it cannot be formed normally. In such a base, a reactive material is preferably sandwiched by or covered with a non-reactive material in a stacked structure. For example, when ITO is connected to aluminum, an alloy of titanium, molybdenum, and neodymium is preferably disposed between the ITO and the aluminum. As another example, when silicon is connected to aluminum, an alloy of titanium, molybdenum, and neodymium is preferably disposed between the silicon and the aluminum.

Note that the term "wiring" indicates a portion including a conductor. The shape of such a wiring may be linear; but not limited to, such a wiring may be short. Therefore, electrodes are included in such wirings.

Note that a carbon nanotube may be used for wirings, electrodes, conductive layers, conductive films, terminals, via holes, or plugs. Since the carbon nanotube has a light-transmitting property, it can be used for a portion which light should pass thorough. For example, the carbon nanotube can be used for a pixel electrode and/or a common electrode.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 9]

In this embodiment mode, a structure of a display device is described.

Figure 53A:
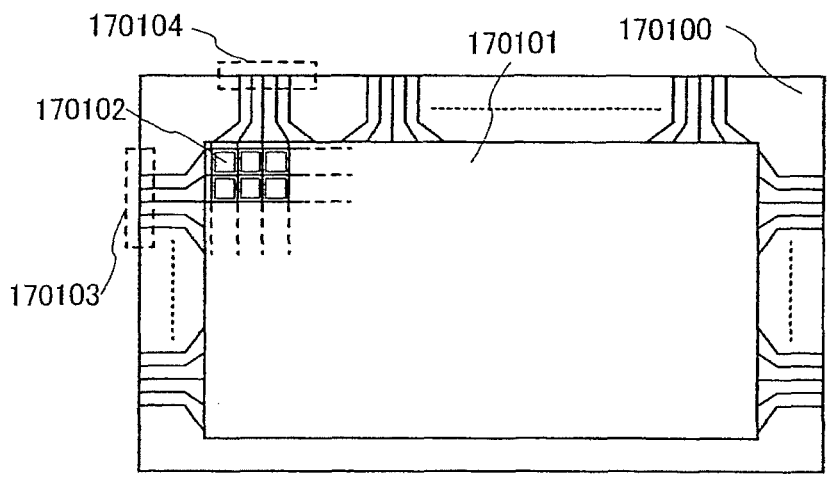
FIGS. 53A to 53C are diagrams each showing a structure of a display device of a semiconductor device in accordance with the present invention.

A structure of a display device is described with reference to FIG. 53A. FIG. 53A is a top plan view of the display device.

A pixel portion 170101, a scan line side input terminal 170103, and a signal line side input terminal 170104 are formed over a substrate 170100, scan lines extend in a row direction from the scan line side input terminal 170103, and signal lines extend in a column direction from the signal line side input terminal 170104 over the substrate 170100. Pixels are arranged in matrix and each pixel 170102 is arranged at an intersection of the scan line and the signal line in the pixel portion 170101.

The case in which signals are input from an external driver circuit has been described above. However, the present invention is not limited to this, and an IC chip can be mounted on the display device.

Figure 54A:
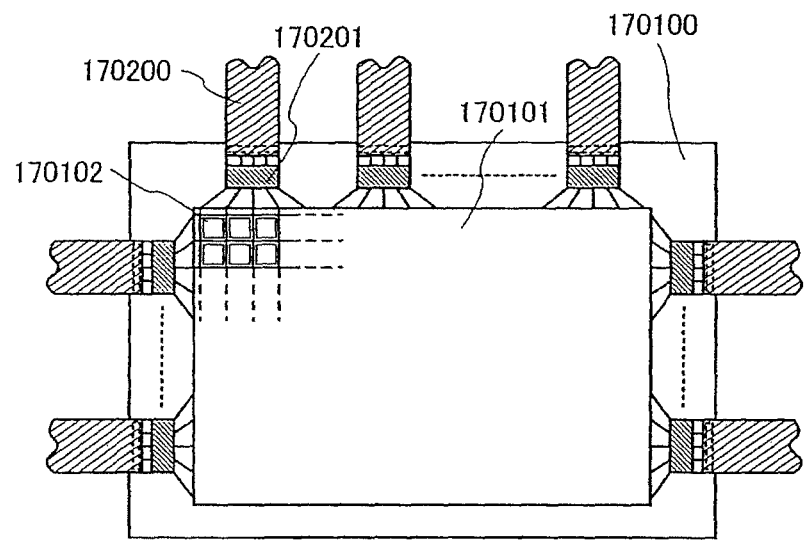
FIGS. 54A and 54B are diagrams each showing a structure of a peripheral circuit of a semiconductor device in accordance with the present invention.

For example, as shown in FIG. 54A, an IC chip 170201 can be mounted on a substrate 170100 by a COG (Chip On Glass) method. In this case, inspection can be conducted before mounting the IC chip 170201 on the substrate 170100 to increase yield of the display device. Further, reliability can also increase. In addition, portions which are common to those in FIG. 53A are denoted by common reference numerals and description thereof is omitted.

Figure 54B:
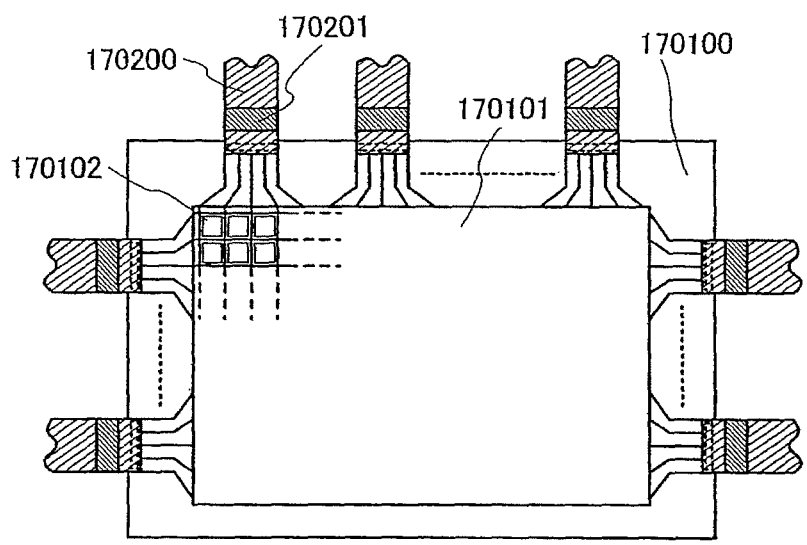

As another example, as shown in FIG. 54B, the IC chip 170201 can be mounted on an FPC (Flexible Printed Circuit) 170200 by a TAB (Tape Automated Bonding) method. In this case, inspection can be conducted before mounting the IC chip 170201 on the FPC 170200 to increase yield of the display device. Further, reliability can also increase. In addition, portions which are common to those in FIG. 53A are denoted by common reference numerals and description thereof is omitted.

As well as the IC chip can be mounted on the substrate 170100, a driver circuit can be mounted on the substrate 170100.

Figure 53B:
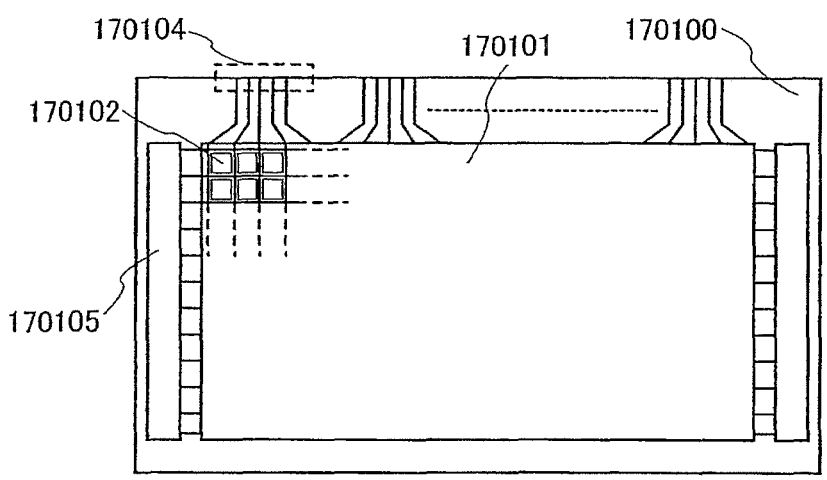

For example, as shown in FIG. 53B, a scan line driver circuit 170105 can be formed on the substrate 170100. In this case, the number of component parts can be reduced to decrease manufacturing cost. The number of connection points between component parts can be reduced to improve reliability. Since driving frequency of the scan line driver circuit 170105 is low, the scan line driver circuit 170105 can be easily formed using amorphous silicon or microcrystal silicon as a semiconductor layer of a transistor. In addition, an IC chip for outputting a signal to the signal line may be mounted on the substrate 170100 by a COG method. Alternatively, an FPC to which an IC chip for outputting a signal to a signal line is mounted by a TAB method may be arranged on the substrate 170100. In addition, an IC chip for controlling the scan line driver circuit 170105 may be mounted on the substrate 170100 by a COG method. Alternatively, an FPC to which an IC chip for controlling the scan line driver circuit 170105 is mounted by a TAB method may be disposed on the substrate 170100. In addition, portions which are common to those in FIG. 53A are denoted by common reference numerals and description thereof is omitted.

Figure 53C:
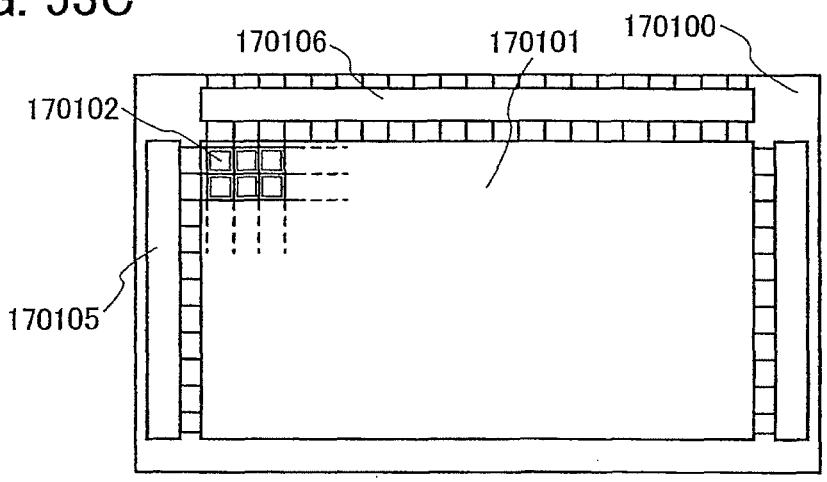

As another example, as shown in FIG. 53C, the scan line driver circuit 170105 and the signal line driver circuit 170106 are formed over the substrate 170100. Thus, the number of component parts can be reduced to decrease manufacturing cost. The number of connection points between component parts can be reduced to improve reliability. In addition, the IC chip for controlling the scan line driver circuit 170105 may be mounted on the substrate 170100 by a COG method. Alternatively, the FPC to which an IC chip for controlling the scan line driver circuit 170105 is mounted by a TAB method may be arranged on the substrate 170100. An IC chip for controlling the signal line driver circuit 170106 may be mounted on the substrate 170100 by a COG method. Alternatively, an IC chip for controlling the signal line driver circuit 170106 may be mounted on the substrate 170100 by a TAB method. In addition, portions which are common to those in FIG. 53A are denoted by common reference numerals and description thereof is omitted.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 10]

In this embodiment mode, a method for driving a display device is described. In particular, a method for driving a liquid crystal display device is described.

A liquid crystal display panel which can be used for the liquid crystal display device described in this embodiment mode has a structure in which a liquid crystal material is sandwiched between two substrates. An electrode for controlling an electric field applied to the liquid crystal material is provided in each of the two substrates. A liquid crystal material corresponds to a material the optical and electrical properties of which is changed by an electric field applied from outside. Therefore, a liquid crystal panel corresponds to a device in which desired optical and electrical properties can be obtained by controlling voltage applied to the liquid crystal material using the electrode included in each of the two substrates. In addition, a large number of electrodes are arranged in a planar manner, each of the electrodes corresponds to a pixel, and voltages applied to the pixels are individually controlled. Therefore, a liquid crystal display panel which can display a clear image can be obtained.

Here, response time of the liquid crystal material with respect to change in an electric field depends on a gap between the two substrates (a cell gap) and a type or the like of the liquid crystal material, and is generally several milli-seconds to several ten milli-seconds. Further, in the case where the amount of change in the electric field is small, the response time of the liquid crystal material is further lengthened. This characteristic causes a defect in image display such as an after image, a phenomenon in which traces can be seen, or decrease in contrast when the liquid crystal panel displays a moving image. In particular, when a half tone is changed into another half tone (change in the electric field is small), a degree of the above-described defect becomes noticeable.

Meanwhile, as a particular problem of a liquid crystal panel using an active matrix method, fluctuation in writing voltage due to constant electric charge driving is given. Constant electric charge driving in this embodiment mode is described below.

A pixel circuit using an active matrix method includes a switch which controls writing and a capacitor which holds an electric charge. A method for driving the pixel circuit using the active matrix method corresponds to a method in which predetermined voltage is written in a pixel circuit with a switch in an on state, and immediately after that, an electric charge in the pixel circuit is held (a hold state) with the switch in an off state. At the time of hold state, exchange of the electric charge between inside and outside of the pixel circuit is not performed (a constant electric charge). Usually, a period in which the switch is in an off state is approximately several hundreds of times (the number of scan lines) longer than a period in which the switch is in an on state. Therefore, it may be considered that the switch of the pixel circuit be almost always in an off state. As described above, constant electric charge driving in this embodiment mode corresponds to a driving method in which a pixel circuit is in a hold state in almost all periods in driving a liquid crystal panel.

Next, electrical properties of the liquid crystal material are described. A dielectric constant as well as optical properties of the liquid crystal material are changed when an electric field applied from outside is changed. That is, when it is considered that each pixel of the liquid crystal panel be a capacitor (a liquid crystal element) sandwiched between two electrodes, the capacitor corresponds to a capacitor, capacitance of which is changed in accordance with applied voltage. This phenomenon is called dynamic capacitance.

When a capacitor, capacitance of which is changed in accordance with applied voltage in this manner is driven by constant electric charge driving, the following problem occurs. When capacitance of a liquid crystal element is changed in a hold state in which an electric charge is not moved, applied voltage is also changed. This is not difficult to understand from the fact that the amount of electric charges is constant in a relational expression of (the amount of electric charges)=(capacitance)×(applied voltage).

Because of the above-described reasons, voltage at the time of a hold state is changed from voltage at the time of writing because constant electric charge driving is performed in a liquid crystal panel using an active matrix method. Accordingly, change in transmittivity of the liquid crystal element is different from change in transmittivity of a liquid crystal element in a driving method which does not take a hold state.

Figure 51A:
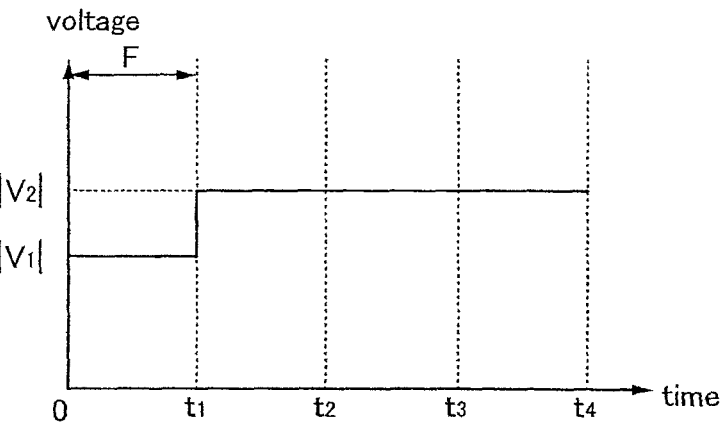
FIGS. 51A to 51C are graphs each showing a method for driving a semiconductor device in accordance with the present invention.
Figure 51B:
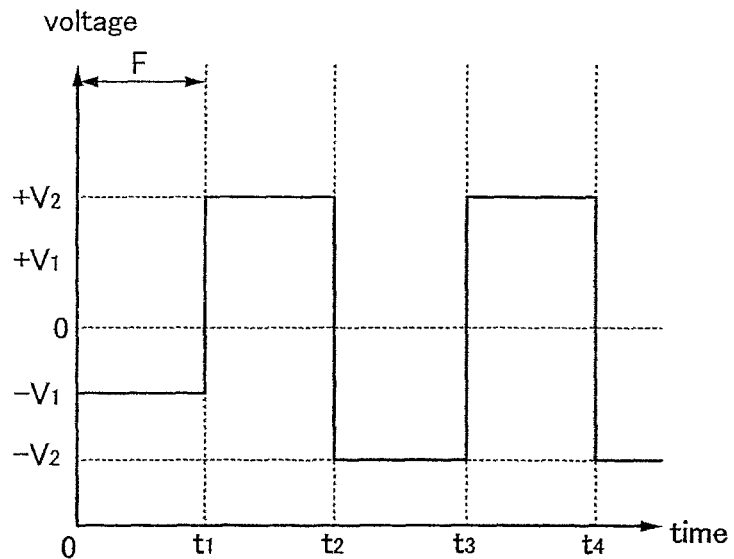
Figure 51C:
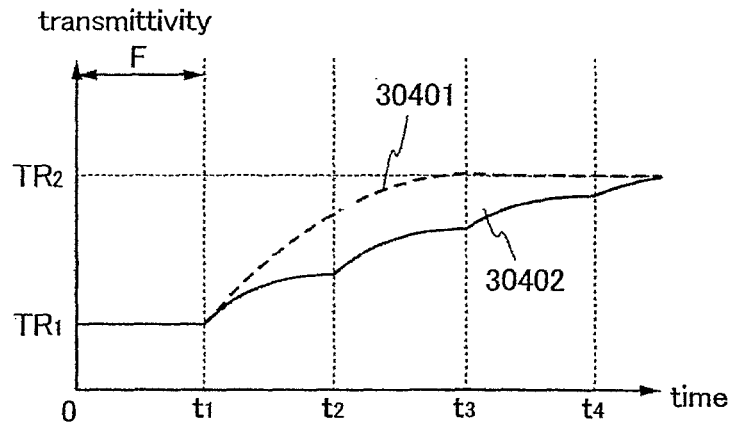

FIGS. 51A to 51C show this state. FIG. 51A shows an example of controlling voltage written in a pixel circuit in the case where time is represented by a horizontal axis and the transmittivity of the liquid crystal element is represented by a vertical axis. FIG. 51B shows an example of controlling voltage written in the pixel circuit in the case where time is represented by a horizontal axis and the voltage is represented by a vertical axis. FIG. 51C shows time change in transmittivity of the liquid crystal element in the case where the voltage shown in FIG. 51A or 51B is written in the pixel circuit when time is represented by a horizontal axis and the absolute value of the voltage is represented by a vertical axis. In each of FIGS. 51A to 51C, a period F shows a period for rewriting the voltage and time for rewriting the voltage is described as $t_1$, $t_2$, $t_3$, and $t_4$.

Here, writing voltage corresponding to image data input to the liquid crystal display device corresponds to $|V_1|$ in rewriting at the time of 0 and corresponds to $|V_2|$ in rewriting at the time of $t_1$, $t_2$, $t_3$, and $t_4$ (see FIG. 51A).

Note that polarity of the writing voltage corresponding to image data input to the liquid crystal display device may be switched periodically (inversion driving: see FIG. 51B). Since direct voltage can be prevented from being applied to a liquid crystal as much as possible by using this method, burn-in or the like caused by deterioration of the liquid crystal element can be prevented. Note also that a period of switching the polarity (an inversion period) may be the same as a period of rewriting voltage. In this case, generation of a flicker caused by inversion driving can be reduced because the inversion period is short. Further, the inversion period may be a period which is integral times of the period of rewriting voltage. In this case, power consumption can be reduced because the inversion period is long and frequency of writing voltage can be decreased by changing the polarity.

FIG. 51C shows time change in transmittivity of the liquid crystal element in the case where voltage as shown in FIG. 51A or 51B is applied to the liquid crystal element. Here, the voltage $|V_1|$ is applied to the liquid crystal element and transmittivity of the liquid crystal element after time passes sufficiently corresponds to $TR_1$. Similarly, the voltage $|V_2|$ is applied to the liquid crystal element and transmittivity of the liquid crystal element after time passes sufficiently corresponds to $TR_2$. When the voltage applied to the liquid crystal element is changed from $|V_1|$ to $|V_2|$ at the time of $t_1$, transmittivity of the liquid crystal element does not immediately become $TR_2$ as shown by a dashed line 30401 but slowly changes. For example, when the period of rewriting voltage is the same as a frame period of an image signal of 60 Hz (16.7 milli-seconds), time for several frames is necessary until transmittivity is changed to $TR_2$.

Note that smooth time change in transmittivity as shown in the dashed line 30401 corresponds to time change in transmittivity when the voltage $|V_2|$ is accurately applied to the liquid crystal element. In an actual liquid crystal panel, for example, a liquid crystal panel using an active matrix method, transmittivity of the liquid crystal does not have time change as shown by the dashed line 30401 but has gradual time change as shown by a solid line 30402 because voltage at the time of a hold state is changed from voltage at the time of writing due to constant electric charge driving. This is because the voltage is changed due to constant electric charge driving, so that it is impossible to reach intended voltage only by one writing. Accordingly, the response time of transmittivity of the liquid crystal element becomes further longer than original response time (the dashed line 30401) in appearance, so that a defect in image display such as an after image, a phenomenon in which traces can be seen, or decrease in contrast occurs.

Figure 52A:
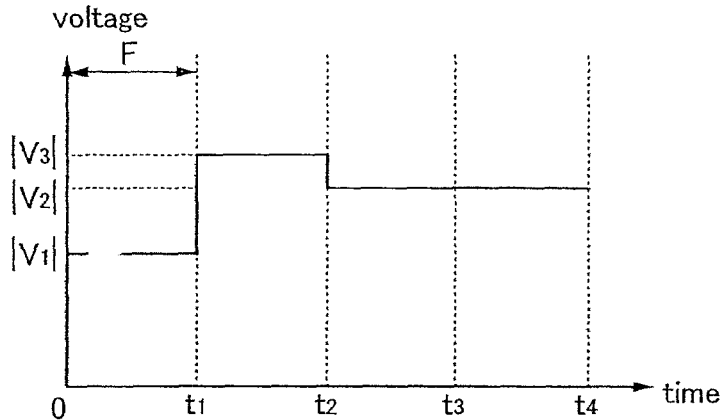
FIGS. 52A to 52C are graphs each showing a method for driving a semiconductor device in accordance with the present invention.
Figure 52B:
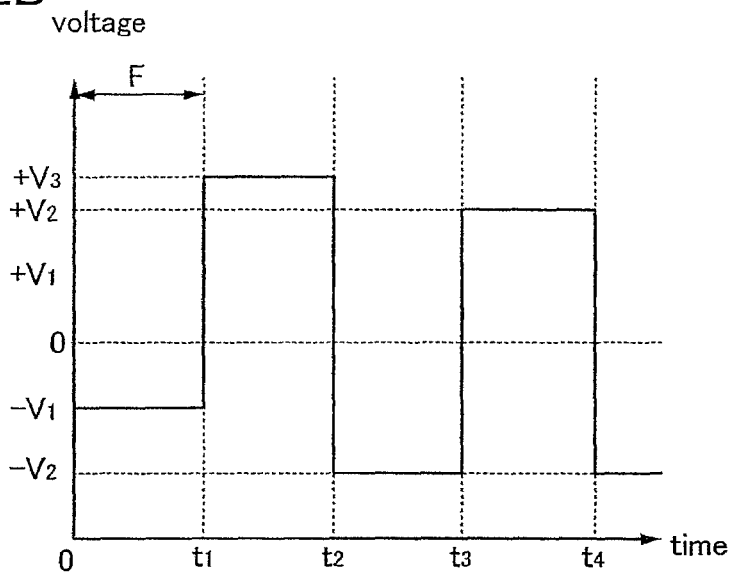
Figure 52C:
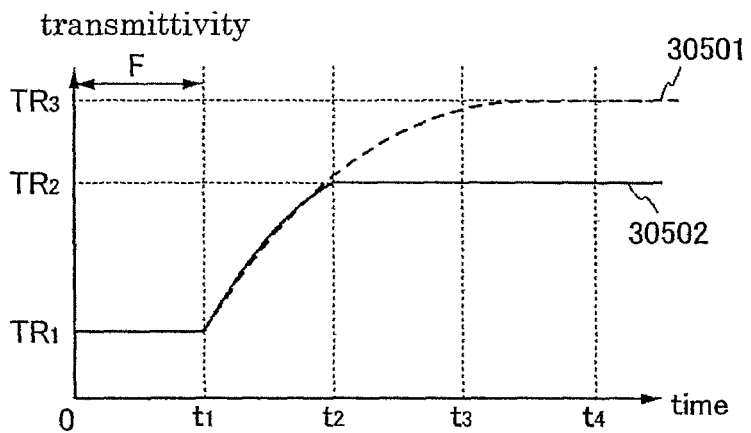

By using overdriving, it is possible to solve a phenomenon in which the response time in appearance becomes further longer because of shortage of writing by dynamic capacitance and constant electric charge driving as well as length of the original response time of the liquid crystal element. FIGS. 52A to 52C show this state. FIG. 52A shows an example of controlling voltage written in a pixel circuit in the case where time is represented by a horizontal axis and the absolute value of the voltage is represented by a vertical axis. FIG. 52B shows an example of controlling voltage written in the pixel circuit in the case where time is represented by a horizontal axis and the voltage is represented by a vertical axis. FIG. 52C shows time change in transmittivity of the liquid crystal element in the case where the voltage shown in FIG. 52A or 52B is written in the pixel circuit when time is represented by a horizontal axis and the absolute value of the voltage is represented by a vertical axis. In each of FIGS. 52A to 52C, a period F shows a period for rewriting the voltage and time for rewriting the voltage is described as $t_1$, $t_2$, $t_3$, and $t_4$.

Here, writing voltage corresponding to image data input to the liquid crystal display device corresponds to $|V_1|$ in rewriting at the time of 0, corresponds to $|V_3|$ in rewriting at the time of $t_1$, and corresponds to $|V_3|$ in writing at the time of $t_2$, $t_3$, and $t_4$ (see FIG. 52A).

Note that polarity of the writing voltage corresponding to image data input to the liquid crystal display device may be switched periodically (inversion driving: see FIG. 52B). Since direct voltage can be prevented from being applied to a liquid crystal as much as possible by using this method, burn-in or the like caused by deterioration of the liquid crystal element can be prevented. Note also that a period of switching the polarity (an inversion period) may be the same as a period of rewriting voltage. In this case, generation of a flicker caused by inversion driving can be reduced because the inversion period is short. Further, the inversion period may be a period which is integral times of the period of rewriting voltage. In this case, power consumption can be reduced because the inversion period is long and frequency of writing voltage can be decreased by changing the polarity.

FIG. 52C shows time change in transmittivity of the liquid crystal element in the case where voltage as shown in FIG. 52A or 52B is applied to the liquid crystal element. Here, the voltage $|V_1|$ is applied to the liquid crystal element and transmittivity of the liquid crystal element after time passes sufficiently corresponds to $TR_1$. Similarly, the voltage $|V_2|$ is applied to the liquid crystal element and transmittivity of the liquid crystal element after time passes sufficiently corresponds to $TR_2$. Similarly, the voltage $|V_3|$ is applied to the liquid crystal element and transmittivity of the liquid crystal element after time passes sufficiently corresponds to $TR_3$. When the voltage applied to the liquid crystal element is changed from $|V_1|$ to $|V_3|$ at the time of $t_1$, transmittivity of the liquid crystal element is tried to be changed to $TR_3$ for several frames as shown by a dashed line 30501. However, application of the voltage $|V_3|$ is terminated at the time $t_2$ and the voltage $|V_2|$ is applied after the time $t_2$. Therefore, transmittivity of the liquid crystal element does not become as shown by the dashed line 30501 but becomes as shown by a solid line 30502. Here, it is preferable that a value of the voltage $|V_3|$ be set so that transmittivity is approximately $TR_2$ at the time of $t_2$. Here, the voltage $|V_3|$ is also referred to as overdriving voltage.

That is, the response time of the liquid crystal element can be controlled to some extent by changing $|V_3|$ which is the overdriving voltage. This is because the response time of the liquid crystal element is changed by strength of an electric field. Specifically, the response time of the liquid crystal element becomes shorter as the electric field is strong, and the response time of the liquid crystal element becomes longer as the electric field is weak.

Note that it is preferable that $|V_3|$ which is the overdriving voltage be changed in accordance with the amount of change in the voltage, i.e., the voltage $|V_1|$ and the voltage $|V_2|$ which supply intended transmittivity $TR_1$ and $TR_2$. This is because appropriate response time can be always obtained by changing $|V_3|$ which is the overdriving voltage in accordance with change in the response time of the liquid crystal element even when the response time of the liquid crystal element is changed by the amount of change in the voltage.

Note also that it is preferable that $|V_3|$ which is the overdriving voltage be changed by a mode of the liquid crystal element such as a TN mode, a VA mode, an IPS mode, or an OCB mode. This is because appropriate response time can be always obtained by changing $|V_3|$ which is the overdriving voltage in accordance with change in the response time of the liquid crystal element even when the response time of the liquid crystal element is changed by the mode of the liquid crystal element.

Note also that the voltage rewriting period F may be the same as a frame period of an input signal. In this case, a liquid crystal display device with low manufacturing cost can be obtained because a peripheral driver circuit of the liquid crystal display device can be simplified.

Note also that the voltage rewriting period F may be shorter than the frame period of the input signal. For example, the voltage rewriting period F may be one half the frame period of the input signal, one third the frame period of the input signal, or one third or less the frame period of the input signal. It is effective to combine this method with a countermeasure against deterioration in quality of a moving image caused by hold driving of the liquid crystal display device such as black data insertion driving, backlight blinking, backlight scanning, or intermediate image insertion driving by motion compensation. That is, since required response time of the liquid crystal element is short in the countermeasure against deterioration in quality of a moving image caused by hold driving of the liquid crystal display device, the response time of the liquid crystal element can be relatively shortened easily by using overdriving described in this embodiment mode. Although the response time of the liquid crystal element can be essentially shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method such as overdriving.

Note also that the voltage rewriting period F may be longer than the frame period of the input signal. For example, the voltage rewriting period F may be twice the frame period of the input signal, three times the frame period of the input signal, or three times or more the frame period of the input signal. It is effective to combine this method with a unit (a circuit) which determines whether voltage is not rewritten for a long period or not. That is, when the voltage is not rewritten for a long period, an operation of the circuit can be stopped during a period where no voltage is rewritten without performing a rewriting operation itself of the voltage. Therefore, a liquid crystal display device with low power consumption can be obtained.

Next, a specific method for changing $|V_3|$ which is the overdriving voltage in accordance with the voltage $|V_1|$ and the voltage $|V_2|$ which supply intended transmittivity $TR_1$ and $TR_2$ is described.

Since an overdriving circuit corresponds to a circuit for appropriately controlling $|V_3|$ which is the overdriving voltage in accordance with the voltage $|V_1|$ and the voltage $|V_2|$ which supply intended transmittivity $TR_1$ and $TR_2$, signals input to the overdriving circuit are a signal which is related to the voltage $|V_1|$ which supplies intended transmittivity $TR_1$ and a signal which is related to the voltage $|V_2|$ which supplies intended transmittivity $TR_2$, and a signal output from the overdriving circuit is a signal which is related to $|V_3|$ which is the overdriving voltage. Here, each of these signals may have an analog voltage value such as the voltage applied to the liquid crystal element (e.g., $|V_1|$, $|V_2|$, or $|V_3|$) or may be a digital signal for supplying the voltage applied to the liquid crystal element. Here, the signal which is related to the overdriving circuit is described as a digital signal.

Figure 88A:
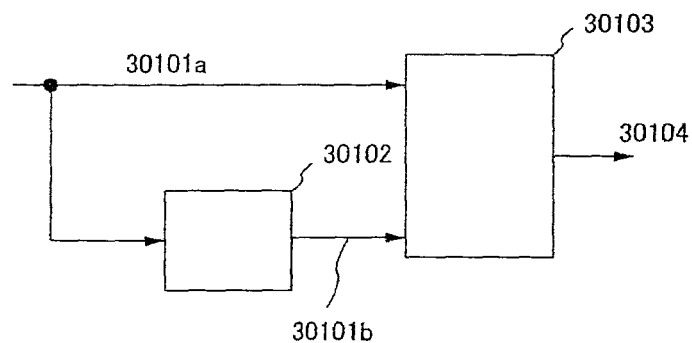
FIGS. 88A to 88E are diagrams each showing a method for driving a semiconductor device in accordance with the present invention.

First, a general structure of the overdriving circuit is described with reference to FIG. 88A. Here, input image signals 30101*a* and 30101*b* are used as signals for controlling the overdriving voltage. As a result of processing these signals, an output image signal 30104 is to be output as a signal which supplies the overdriving voltage.

Here, since the voltage $|V_1|$ and the voltage $|V_2|$ which supply intended transmittivity $TR_1$ and $TR_2$ are image signals in adjacent frames, it is preferable that the input image signals 30101*a* and 30101*b* be similarly image signals in adjacent frames. In order to obtain such signals, the input image signal 30101*a* is input to a delay circuit 30102 in FIG. 88A and a signal which is consequently output can be used as the input image signal 30101*b*. For example, a memory can be given as the delay circuit 30102. That is, the input image signal 30101*a* is stored in the memory in order to delay the input image signal 30101*a* for one frame; a signal stored in the previous frame is taken out from the memory as the input image signal 30101*b* at the same time; and the input image signal 30101*a* and the input image signal 30101*b* are simultaneously input to a correction circuit 30103. Therefore, the image signals in adjacent frames can be handled. By inputting the image signals in adjacent frames to the correction circuit 30103, the output image signal 30104 can be obtained. Note that when a memory is used as the delay circuit 30102, a memory having capacity for storing an image signal for one frame in order to delay the input image signal 30101*a* for one frame (i.e., a frame memory) can be obtained. Thus, the memory can have a function as a delay circuit without causing excess and deficiency of memory capacity.

Next, the delay circuit 30102 formed mainly for reducing memory capacity is described. Since memory capacity can be reduced by using such a circuit as the delay circuit 30102, manufacturing cost can be reduced.

Figure 88B:
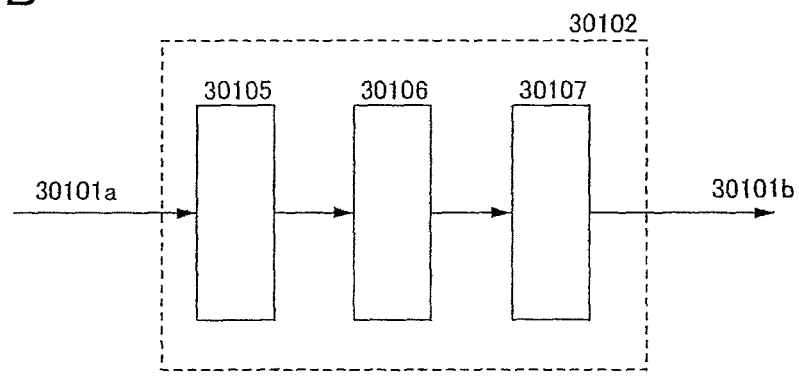

Specifically, a delay circuit as shown in FIG. 88B can be used as the delay circuit 30102 having such characteristics. The delay circuit shown in FIG. 88B includes an encoder 30105, a memory 30106, and a decoder 30107.

Operations of the delay circuit 30102 shown in FIG. 88B are as follows. First, compression treatment is performed by the encoder 30105 before the input image signal 30101*a* is stored in the memory 30106. Thus, size of data to be stored in the memory 30106 can be reduced. Accordingly, since memory capacity can be reduced, manufacturing cost can also be reduced. Then, a compressed image signal is transferred to the decoder 30107 and extension treatment is performed here. Thus, the previous signal which is compressed by the encoder 30105 can be restored. Here, compression and extension treatment which is performed by the encoder 30105 and the decoder 30107 may be reversible treatment. Thus, since the image signal does not deteriorate even after compression and extension treatment is performed, memory capacity can be reduced without causing deterioration of quality of an image, which is finally displayed on a device. Further, compression and extension treatment which is performed by the encoder 30105 and the decoder 30107 may be non-reversible treatment. Thus, since size of data of the compressed image signal can be extremely made small, memory capacity can be significantly reduced.

Note that as a method for reducing memory capacity, various methods can be used as well as the above-described method. A method in which color information included in an image signal is reduced (e.g., tone reduction from 2.6 hundred thousand colors to 65 thousand colors is performed) or the amount of data is reduced (e.g., resolution is made small) without performing image compression by an encoder, or the like can be used.

Figure 88C:
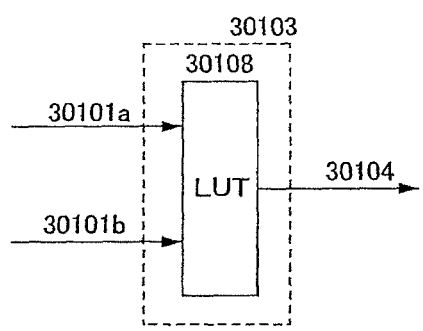

Next, specific examples of the correction circuit 30103 are described with reference to FIGS. 88C to 88E. The correction circuit 30103 corresponds to a circuit for outputting an output image signal having a certain value from two input image signals. Here, when relation between the two input image signals and the output image signal is non-linear and it is difficult to calculate the relation by simple operation, a look up table (an LUT) may be used as the correction circuit 30103. Since the relation between the two input image signals and the output image signal is calculated in advance by measurement in an LUT, the output image signal corresponding to the two input image signals can be calculated only by seeing the LUT (see FIG. 88C). By using a LUT 30108 as the correction circuit 30103, the correction circuit 30103 can be realized without performing complicated circuit design or the like.

Here, since the LUT 30108 is one of memories, it is preferable to reduce memory capacity as much as possible in order to reduce manufacturing cost. As an example of the correction circuit 30103 for realizing reduction in memory capacity, a circuit shown in FIG. 88D can be given. The correction circuit 30103 shown in FIG. 88D includes an LUT 30109 and an adder 30110. Data of difference between the input image signal 30101a and the output image signal 30104 to be output is stored in the LUT 30109. That is, corresponding difference data from the input image signal 30101a and the input image signal 30101b is taken out from the LUT 30109 and taken out difference data and the input image signal 30101a are added by the adder 30110, so that the output image signal 30104 can be obtained. Note that when data stored in the LUT 30109 is difference data, memory capacity of the LUT 30109 can be reduced. This is because data size of difference data is smaller than data size of the output image signal 30104 itself, so that memory capacity necessary for the LUT 30109 can be made small.

In addition, when the output image signal can be calculated by simple operation such as four arithmetic operations of the two input image signals, the correction circuit 30103 can be realized by combination of simple circuits such as an adder, a subtracter, and a multiplier. Accordingly, it is not necessary to use a LUT, so that manufacturing cost can be significantly reduced. As such a circuit, a circuit shown in FIG. 88E can be given. The correction circuit 30103 shown in FIG. 88E includes a subtracter 30111, a multiplier 30112, and an adder 30113. First, difference between the input image signal 30101a and the input image signal 30101b is calculated by the subtracter 30111. After that, a differential value is multiplied by an appropriate coefficient by using the multiplier 30112. Then, by adding the differential value multiplied by appropriate coefficient to the input image signal 30101a by the adder 30113, the output image signal 30104 can be obtained. By using such a circuit, it is not necessary to use the LUT. Therefore, manufacturing cost can be significantly reduced.

Figure 88E:
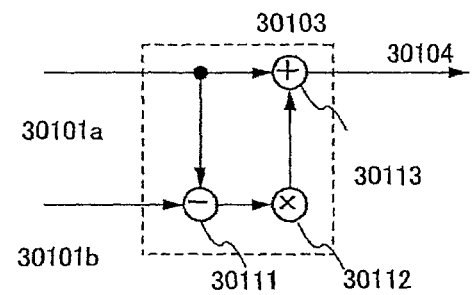
Figure 88D:
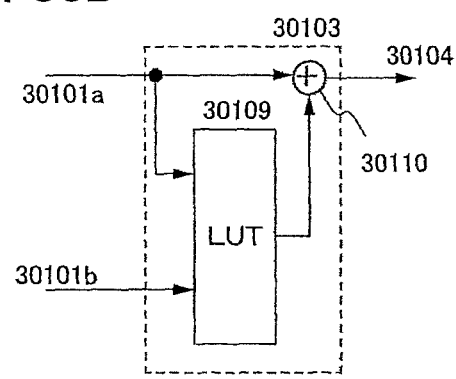

Note that by using the correction circuit 30103 shown in FIG. 88E under a certain condition, output of the inappropriate output image signal 30104 can be prevented. The condition is as follows. The output image signal 30104 applying the overdriving voltage and a differential value between the input image signals 30101a and 30101b have linearity. In addition, the differential value corresponds to a coefficient multiplied by inclination of this linearity by using the multiplier 30112. That is, it is preferable that the correction circuit 30103 shown in FIG. 88E be used for a liquid crystal element having such properties. As a liquid crystal element having such properties, an IPS-mode liquid crystal element in which response time has low dependency on a gray scale can be given. For example, by using the correction circuit 30103 shown in FIG. 88E for an IPS-mode liquid crystal element in this manner, manufacturing cost can be significantly reduced and an overdriving circuit which can prevent output of the inappropriate output image signal 30104 can be obtained.

Operations which are similar to those of the circuit shown in FIGS. 88A to 88E may be realized by software processing. As for the memory used for the delay circuit, another memory included in the liquid crystal display device, a memory included in a device which transfers an image displayed on the liquid crystal display device (e.g., a video card or the like included in a personal computer or a device similar to the personal computer) can be used. Thus, intensity of overdriving, availability, or the like can be selected in accordance with user's preference in addition to reduction in manufacturing cost.

Figure 89A:
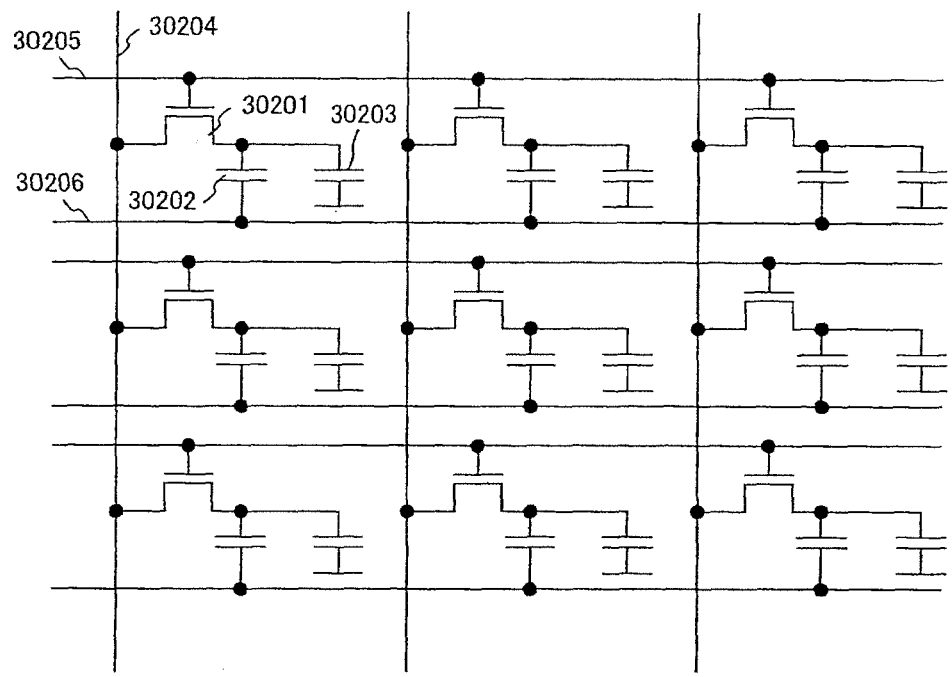
FIGS. 89A and 89B are diagrams each showing a method for driving a semiconductor device in accordance with the present invention.

Driving which controls a potential of a common line is described with reference to FIGS. 89A and 89B. FIG. 89A is a diagram showing a plurality of pixel circuits in which one common line is provided with respect to one scan line in a display device using a display element which has capacitive properties like a liquid crystal element. Each of the pixel circuits shown in FIG. 89A includes a transistor 30201, an auxiliary capacitor 30202, a display element 30203, a video signal line 30204, a scan line 30205, and a common line 30206.

A gate electrode of the transistor 30201 is electrically connected to the scan line 30205; one of a source electrode and a drain electrode of the transistor 30201 is electrically connected to the video signal line 30204; and the other of the source electrode and the drain electrode of the transistor 30201 is electrically connected to one of electrodes of the auxiliary capacitor 30202 and one of electrodes of the display element 30203. In addition, the other of the electrodes of the auxiliary capacitor 30202 is electrically connected to the common line 30206.

First, in each of pixels selected by the scan line 30205, voltage corresponding to an image signal is applied to the display element 30203 and the auxiliary capacitor 30202 through the video signal line 30204 because the transistor 30201 is turned on. At this time, when the image signal is a signal which makes all of pixels connected to the common line 30206 display a minimum gray scale or when the image signal is a signal which makes all of the pixels connected to the common line 30206 display a maximum gray scale, it is not necessary that the image signal be written in each of the pixels through the video signal line 30204. Voltage applied to the display element 30203 can be changed by changing a potential of the common line 30206 instead of writing the image signal through the video signal line 30204.

Figure 89B:
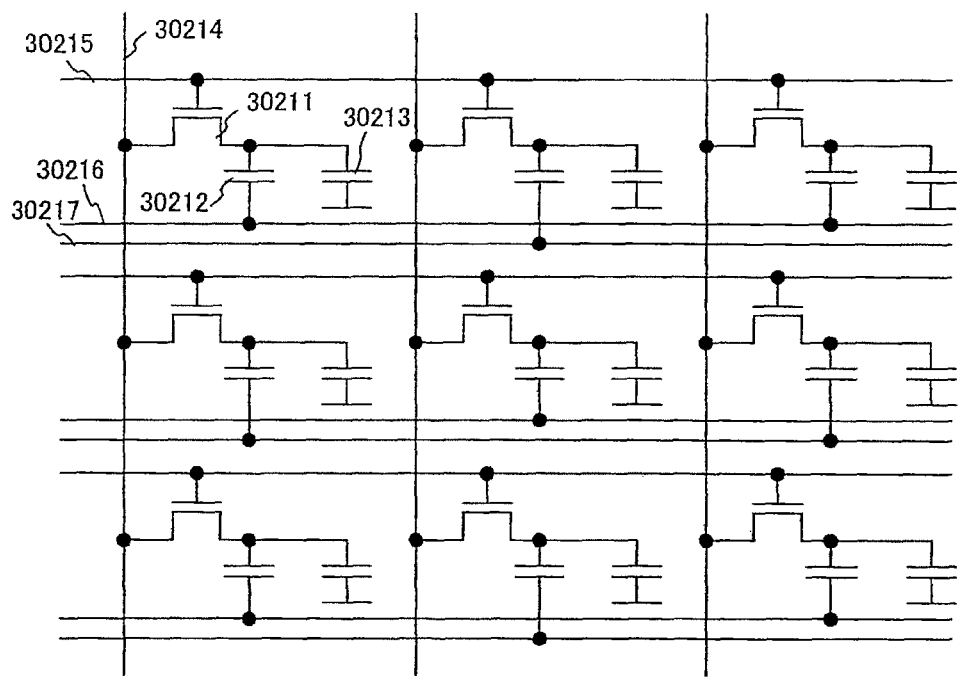

Next, FIG. 89B is a diagram showing a plurality of pixel circuits in which two common lines are provided with respect to one scan line in a display device using a display element which has capacitive properties like a liquid crystal element. Each of the pixel circuits shown in FIG. 89B includes a transistor 30211, an auxiliary capacitor 30212, a display element 30213, a video signal line 30214, a scan line 30215, a first common line 30216, and a second common line 30217.

A gate electrode of the transistor 30211 is electrically connected to the scan line 30215; one of a source electrode and a drain electrode of the transistor 30211 is electrically connected to the video signal line 30214; and the other of the source electrode and the drain electrode of the transistor 30211 is electrically connected to one of electrodes of the auxiliary capacitor 30212 and one of electrodes of the display element 30213. In addition, the other of the electrodes of the auxiliary capacitor 30212 is electrically connected to the first common line 30216. Further, in a pixel which is adjacent to the pixel, the other of the electrodes of the auxiliary capacitor 30212 is electrically connected to the second common line 30217.

In the pixel circuits shown in FIG. 89B, the number of pixels which are electrically connected to one common line is small. Therefore, by changing a potential of the first common line 30216 or the second common line 30217 instead of writing an image signal through the video signal line 30214, frequency of changing voltage applied to the display element 30213 is significantly increased. In addition, source inversion driving or dot inversion driving can be performed. By performing source inversion driving or dot inversion driving, reliability of the element can be improved and a flicker can be suppressed.

Figure 90A:
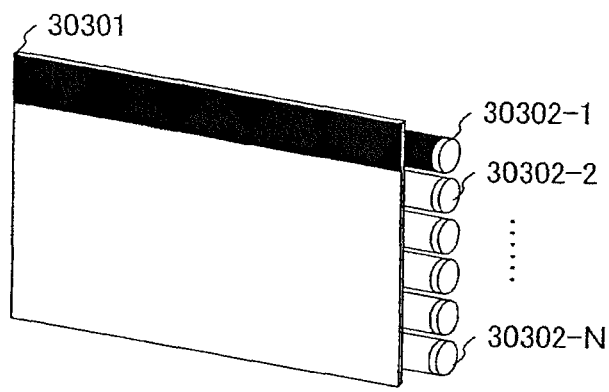
FIGS. 90A to 90C are views and a graph each showing a method for driving a semiconductor device in accordance with the present invention.

A scanning backlight is described with reference to FIGS. 90A to 90C. FIG. 90A is a view showing a scanning backlight in which cold cathode fluorescent lamps are arranged. The scanning backlight shown in FIG. 90A includes a diffusion plate 30301 and N pieces of cold cathode fluorescent lamps 30302-1 to 30302-N. The N pieces of the cold cathode fluorescent lamps 30302-1 to 30302-N are arranged on the back side of the diffusion plate 30301, so that the N pieces of the cold cathode fluorescent lamps 30302-1 to 30302-N can be scanned while luminance thereof is changed.

Change in luminance of each of the cold cathode fluorescent lamps in scanning is described with reference to FIG. 90C. First, luminance of the cold cathode fluorescent lamp 30302-1 is changed for a certain period. After that, luminance of the cold cathode fluorescent lamp 30302-2 which is provided adjacent to the cold cathode fluorescent lamp 30302-1 is changed for the same period. In this manner, luminance is changed sequentially from the cold cathode fluorescent lamp 30302-1 to the cold cathode fluorescent lamp 30302-N. Although luminance which is changed for a certain period is set to be lower than original luminance in FIG. 90C, it may also be higher than original luminance. In addition, although scanning is performed from the cold cathode fluorescent lamps 30302-1 to 30302-N, scanning may also be performed from the cold cathode fluorescent lamps 30302-N to 30302-1, which is in a reversed order.

Figure 90B:
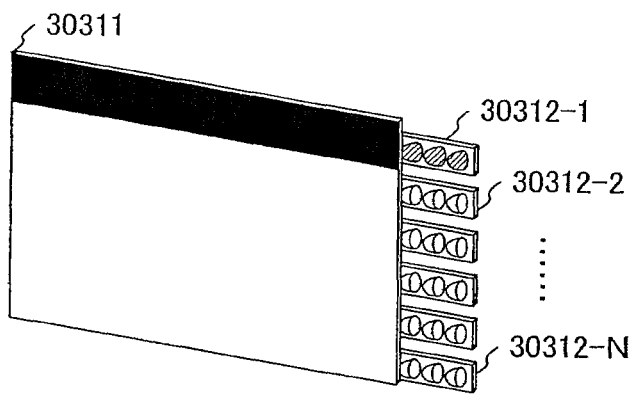
Figure 90C:
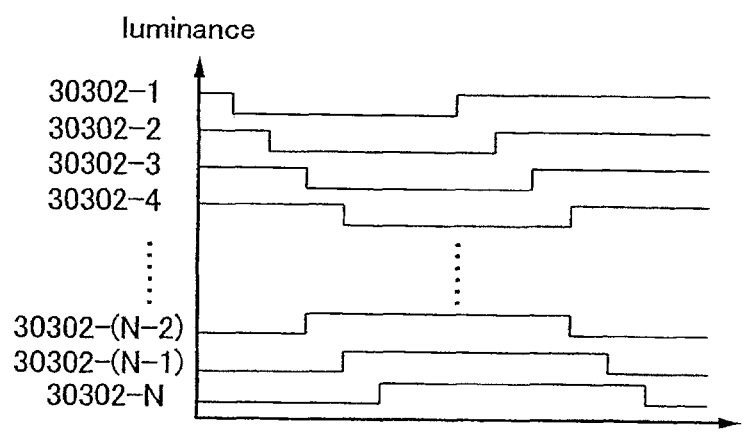

By performing driving as in FIGS. 90A to 90C, average luminance of the backlight can be decreased. Therefore, power consumption of the backlight, which mainly takes up power consumption of the liquid crystal display device, can be reduced.

Note that an LED may be used as a light source of the scanning backlight. The scanning backlight in that case is as shown in FIG. 90B. The scanning backlight shown in FIG. 90B includes a diffusion plate 30311 and light sources 30312-1 to 30312-N, in each of which LEDs are arranged. When the LED is used as the light source of the scanning backlight, there is an advantage in that the backlight can be thin and lightweight. In addition, there is also an advantage that a color reproduction area can be widened. Further, since the LEDs which are arranged in each of the light sources 30312-1 to 30312-N can be similarly scanned, a dot scanning backlight can also be obtained. By using the dot scanning backlight, image quality of a moving image can be further improved.

Note that when the LED is used as the light source of the backlight, driving can be performed by changing luminance as shown in FIG. 90C.

Figure 91A:
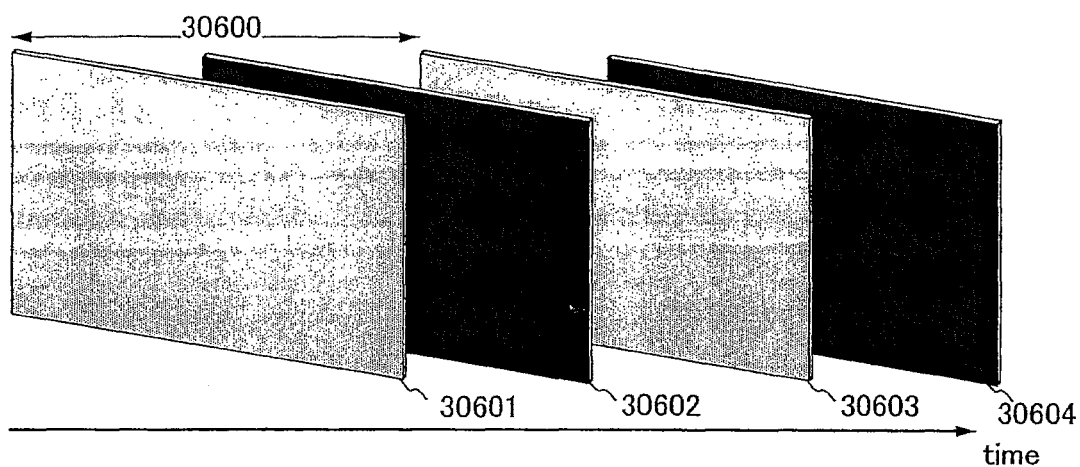
FIGS. 91A and 91B are views each showing a method for driving a semiconductor device in accordance with the present invention.

Next, high frequency driving is described with reference to FIGS. 91A and 91B. FIG. 91A is a view in which one image and one intermediate image are displayed in one frame period 30600. A reference numeral 30601 denotes an image of the frame; a reference numeral 30602 denotes an intermediate image of the frame; a reference numeral 30603 denotes an image of the next frame; and a reference numeral 30604 denotes an intermediate image of the next frame.

Note that the intermediate image 30602 of the frame may be an image which is made based on an image signal of the frame and an image signal of the next frame. Alternatively, the intermediate image 30602 of the frame may be an image which is made from the image 30601 of the frame. Further alternatively, the intermediate image 30602 of the frame may be a black image. Thus, image quality of a moving image of a hold-type display device can be improved. In the case where one image and one intermediate image are displayed in the one frame period 30600, there is an advantage in that consistency with a frame rate of the image signal can be easily obtained and an image processing circuit does not become complicated.

Figure 91B:
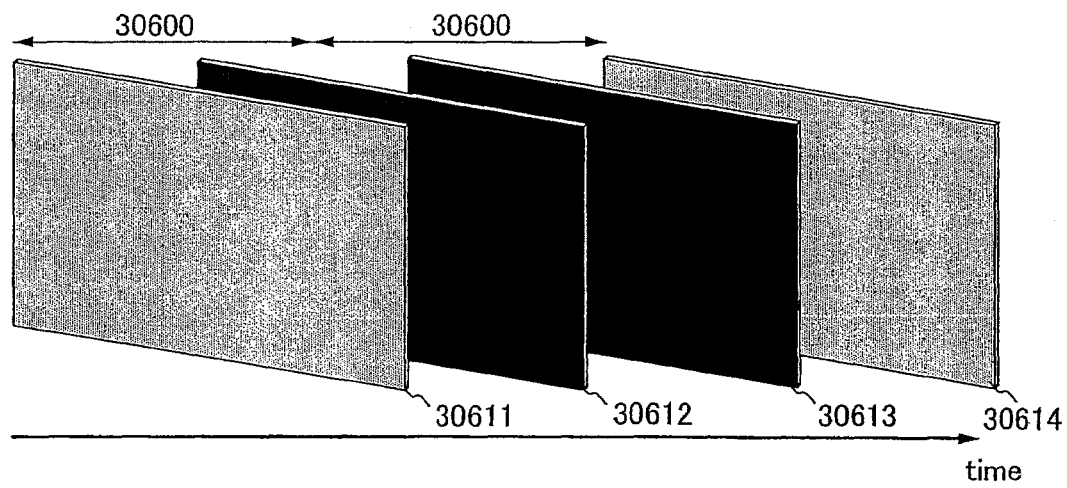

FIG. 91B is a view in which one image and two intermediate images are displayed in a period having two successive one frame periods 30600 (i.e., two frame periods). A reference numeral 30611 denotes an image of the frame; a reference numeral 30612 denotes an intermediate image of the frame; a reference numeral 30613 denotes an intermediate image of the next frame; and a reference numeral 30614 denotes an image of a frame after next.

Note that each of the intermediate image 30612 of the frame and the intermediate image 30613 of the next frame may be an image which is made based on an image signal of the frame, an image signal of the next frame, and an image signal of the frame after next. Alternatively, each of the intermediate image 30612 of the frame and the intermediate image 30613 of the next frame may be a black image. In the case where one image and two intermediate images are displayed in the two frame periods, there is an advantage in that operating frequency of a peripheral driver circuit is made not so high and image quality of a moving image can be effectively improved.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 11]

In this embodiment mode, a peripheral portion of a liquid crystal panel is described.

FIG. 55 shows an example of a liquid crystal display device including a so-called edge-light type backlight unit 20101 and a liquid crystal panel 20107. An edge-light type corresponds to a type in which a light source is provided at an end of a backlight unit and fluorescence of the light source is emitted from the entire light-emitting surface. The edge-light type backlight unit 20101 is thin and can save power.

The backlight unit 20101 includes a diffusion plate 20102, a light guide plate 20103, a reflection plate 20104, a lamp reflector 20105, and a light source 20106.

The light source 20106 has a function of emitting light as necessary. For example, as the light source 20106, a cold cathode fluorescent lamp, a hot cathode fluorescent lamp, a light-emitting diode, an inorganic EL element, an organic EL element, or the like can be used.

FIGS. 56A to 56D are views each showing a detailed structure of the edge-light type backlight unit. Note that description of a diffusion plate, a light guide plate, a reflection plate, and the like is omitted.

Figure 56A:
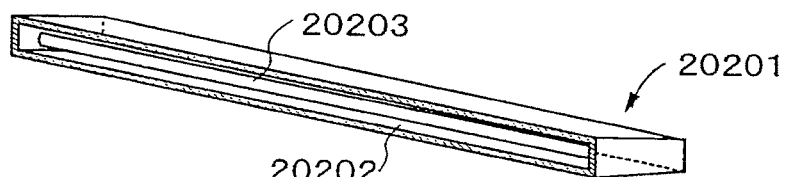
FIGS. 56A to 56D are views each showing peripheral components of a semiconductor device in accordance with the present invention.

A backlight unit 20201 shown in FIG. 56A has a structure in which a cold cathode fluorescent lamp 20203 is used as a light source. In addition, a lamp reflector 20202 is provided to efficiently reflect light from the cold cathode fluorescent lamp 20203. Such a structure is often used for a large display device because luminance from the cold cathode fluorescent lamp 20203 is high.

Figure 56B:
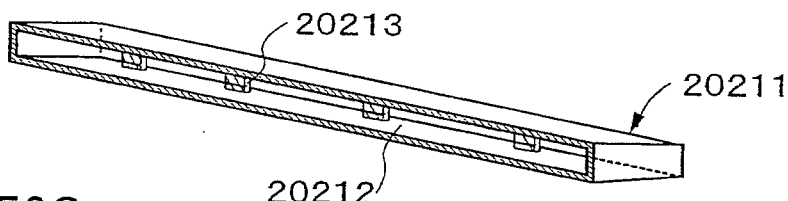

A backlight unit 20211 shown in FIG. 56B has a structure in which light-emitting diodes (LEDs) 20213 are used as light sources. For example, the light-emitting diodes (LEDs) 20213 which emit white light are provided at a predetermined interval. In addition, a lamp reflector 20212 is provided to efficiently reflect light from the light-emitting diodes (LEDs) 20213.

Figure 56C:
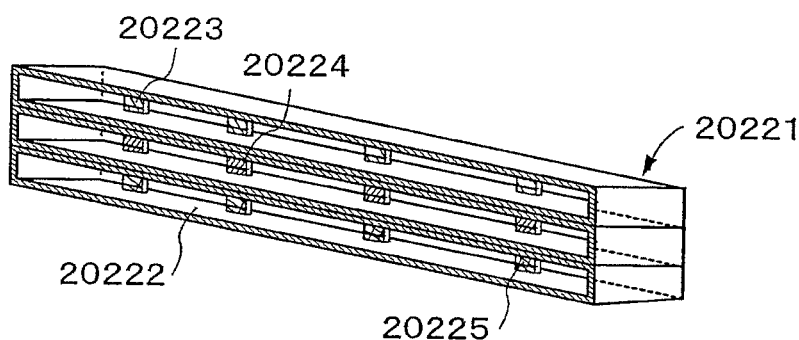

A backlight unit 20221 shown in FIG. 56C has a structure in which light-emitting diodes (LEDs) 20223, light-emitting diodes (LEDs) 20224, and light-emitting diodes (LEDs) 20225 of R, G, and B are used as light sources. The light-emitting diodes (LEDs) 20223, the light-emitting diodes (LEDs) 20224, and the light-emitting diodes (LEDs) 20225 of R, G, and B are each provided at a predetermined interval. By using the light-emitting diodes (LEDs) 20223, the light-emitting diodes (LEDs) 20224, and the light-emitting diodes (LEDs) 20225 of R, G, and B, color reproductivity can be improved. In addition, a lamp reflector 20222 is provided to efficiently reflect light from the light-emitting diodes.

Figure 56D:
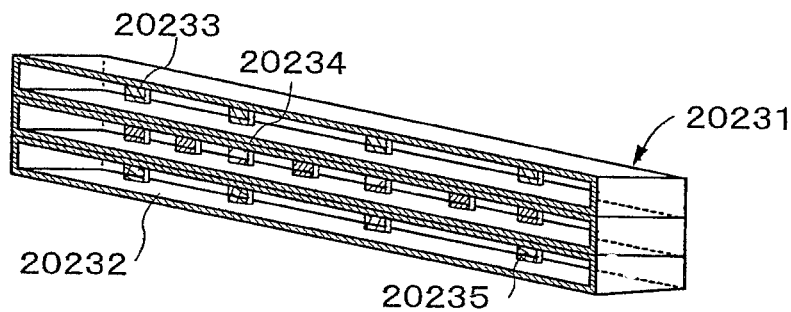

A backlight unit 20231 shown in FIG. 56D has a structure in which light-emitting diodes (LEDs) 20233, light-emitting diodes (LEDs) 20234, and light-emitting diodes (LEDs) 20235 of R, G, and B are used as light sources. For example, among the light-emitting diodes (LEDs) 20233, the light-emitting diodes (LEDs) 20234, and the light-emitting diodes (LEDs) 20235 of R, G, and B, the light-emitting diodes of a color with low emission intensity (e.g., green) are provided more than other light-emitting diodes. By using the light-emitting diodes (LEDs) 20233, the light-emitting diodes (LEDs) 20234, and the light-emitting diodes (LEDs) 20235 of R, G and B, color reproductivity can be improved. In addition, a lamp reflector 20232 is provided to efficiently reflect light from the light-emitting diodes.

Figure 59:
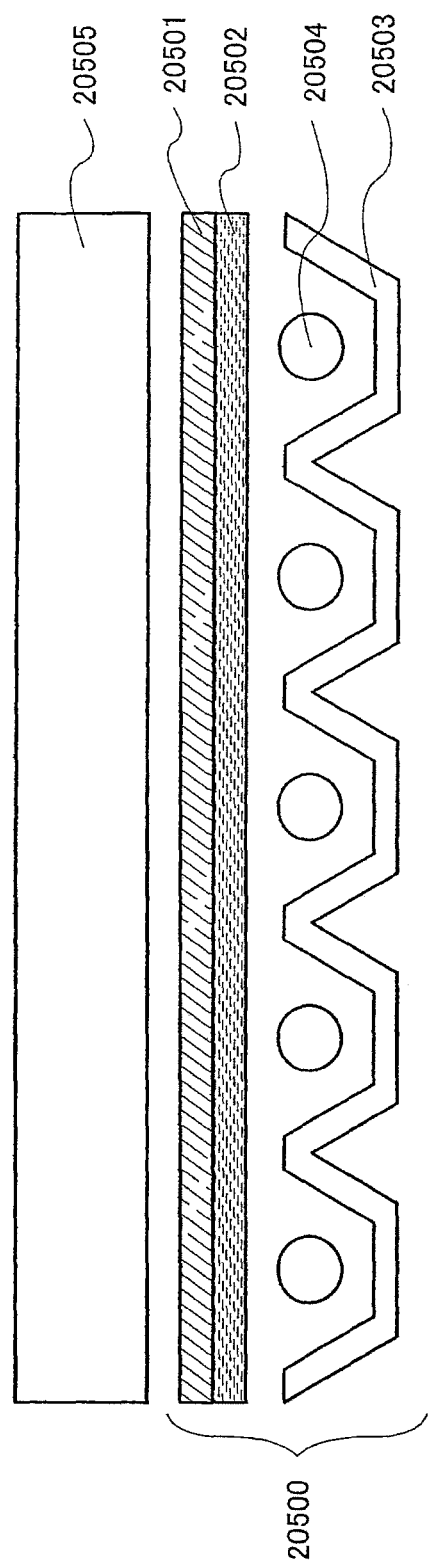
FIG. 59 is a cross-sectional view showing peripheral components of a semiconductor device in accordance with the present invention.

FIG. 59 shows an example of a liquid crystal display device including a so-called direct-type backlight unit and a liquid crystal panel. A direct type corresponds to a type in which a light source is provided directly under a light-emitting surface and fluorescence of the light source is emitted from the entire light-emitting surface. The direct-type backlight unit can efficiently utilize the amount of emitted light.

A backlight unit 20500 includes a diffusion plate 20501, a light-shielding plate 20502, a lamp reflector 20503, a light source 20504, and a liquid crystal panel 20505.

The light source 20504 has a function of emitting light as necessary. For example, as the light source 20504, a cold cathode fluorescent lamp, a hot cathode fluorescent lamp, a light-emitting diode, an inorganic EL element, an organic EL element, or the like can be used.

Figure 57:
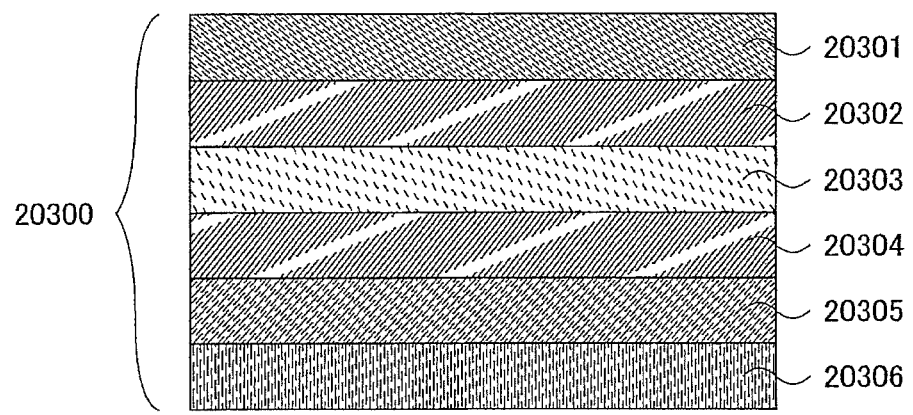
FIG. 57 is a cross-sectional view showing peripheral components of a semiconductor device in accordance with the present invention.

FIG. 57 is a view showing an example of a structure of a polarizing plate (also referred to as a polarizing film).

A polarizing film 20300 includes a protective film 20301, a substrate film 20302, a PVA polarizing film 20303, a substrate film 20304, an adhesive layer 20305, and a mold release film 20306.

When the PVA polarizing film 20303 is sandwiched by films to be base materials (the substrate film 20302 and the substrate film 20304) from both sides, reliability can be improved. Note that the PVA polarizing film 20303 may be sandwiched by triacetylcellulose (TAC) films with high light-transmitting properties and high durability. Note also that each of the substrate films and the TAC films function as protective films of polarizer included in the PVA polarizing film 20303.

The adhesive layer 20305 which is to be attached to a glass substrate of the liquid crystal panel is attached to one of the substrate films (the substrate film 20304). Note that the adhesive layer 20305 is formed by applying an adhesive to one of the substrate films (the substrate film 20304). The mold release film 20306 (a separate film) is provided to the adhesive layer 20305.

The protective film 20301 is provided to the other one of the substrates films (the substrate film 20302).

A hard coating scattering layer (an anti-glare layer) may be provided on a surface of the polarizing film 20300. Since the surface of the hard coating scattering layer has minute unevenness formed by AG treatment and has an anti-glare function which scatters external light, reflection of external light in the liquid crystal panel and surface reflection can be prevented.

Note also that a treatment in which plurality of optical thin film layers having different refractive indexes are layered (also referred to as anti-reflection treatment or AR treatment) may be performed on the surface of the polarizing film 20300. The plurality of layered optical thin film layers having different refractive indexes can reduce reflectivity on the surface by an interference effect of light.

Figure 58A:
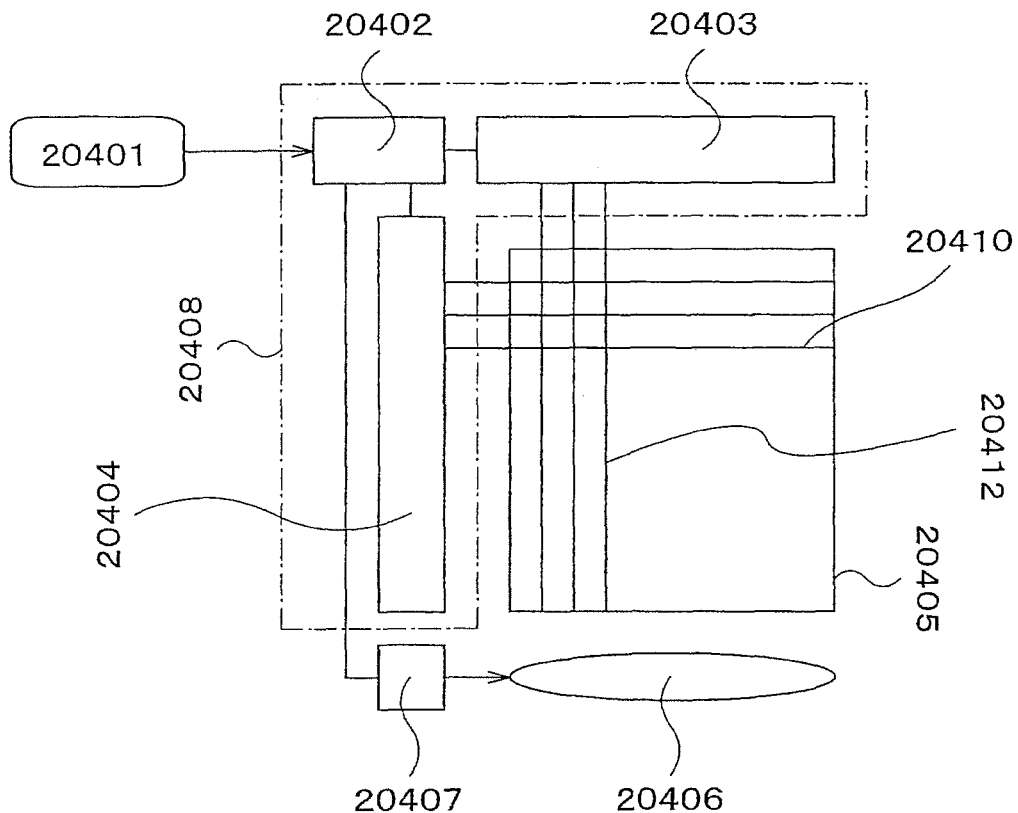
FIGS. 58A to 58C are diagrams each showing a structure of a peripheral circuit of a semiconductor device in accordance with the present invention.
Figure 58B:
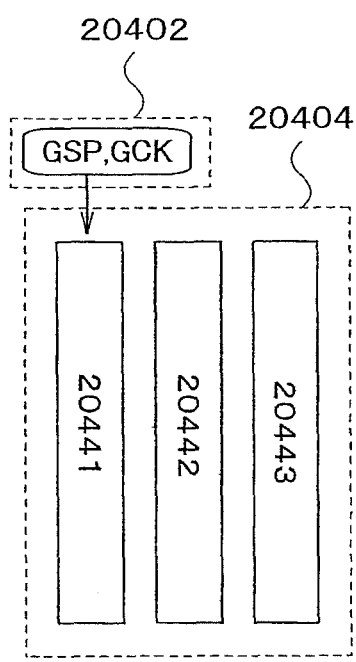
Figure 58C:
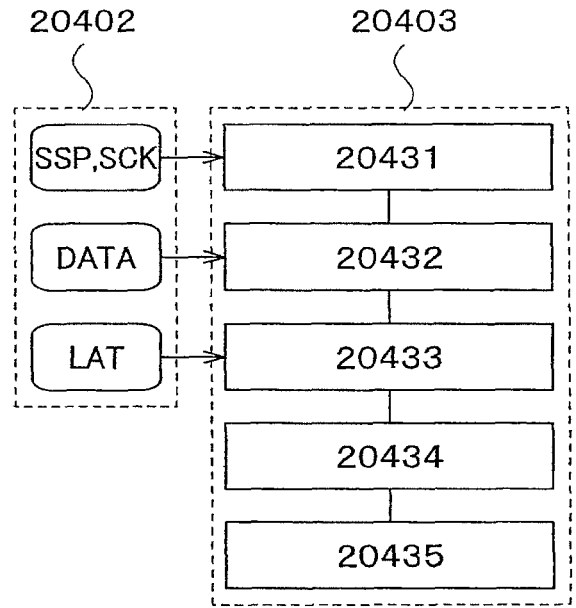

FIGS. 58A to 58C are diagrams each showing an example of a system block of the liquid crystal display device.

In a pixel portion 20405, signal lines 20412 which are extended from a signal line driver circuit 20403 are provided. In the pixel portion 20405, scan lines 20410 which are extended from a scan line driver circuit 20404 are also provided. In addition, a plurality of pixels are arranged in matrix in cross regions of the signal lines 20412 and the scan lines 20410. Note that each of the plurality of pixels includes a switching element. Therefore, voltage for controlling inclination of liquid crystal molecules can be separately input to each of the plurality of pixels. A structure in which a switching element is provided in each cross region in this manner is referred to as an active matrix type. Note also that the present invention is not limited to such an active matrix type and a structure of a passive matrix type may be used. Since the passive matrix type does not have a switching element in each pixel, a process is simple.

A driver circuit portion 20408 includes a control circuit 20402, the signal line driver circuit 20403, and the scan line driver circuit 20404. An image signal 20401 is input to the control circuit 20402. The signal line driver circuit 20403 and the scan line driver circuit 20404 are controlled by the control circuit 20402 in accordance with this image signal 20401. Therefore, the control circuit 20402 inputs a control signal to each of the signal line driver circuit 20403 and the scan line driver circuit 20404. Then, in accordance with this control signal, the signal line driver circuit 20403 inputs a video signal to each of the signal lines 20412 and the scan line driver circuit 20404 inputs a scan signal to each of the scan lines 20410. Then, the switching element included in the pixel is selected in accordance with the scan signal and the video signal is input to a pixel electrode of the pixel.

Note that the control circuit 20402 also controls a power source 20407 in accordance with the image signal 20401. The power source 20407 includes a unit for supplying power to a lighting unit 20406. As the lighting unit 20406, an edge-light type backlight unit or a direct-type backlight unit can be used. Note also that a front light may be used as the lighting unit 20406. A front light corresponds to a plate-like lighting unit including a luminous body and a light conducting body, which is attached to the front surface side of a pixel portion and illuminates the whole area. By using such a lighting unit, the pixel portion can be uniformly illuminated at low power consumption.

As shown in FIG. 58B, the scan line driver circuit 20404 includes a shift register 20441, a level shifter 20442, and a circuit functioning as a buffer 20443. A signal such as a gate start pulse (GSP) or a gate clock signal (GCK) is input to the shift register 20441.

As shown in FIG. 58C, the signal line driver circuit 20403 includes a shift register 20431, a first latch 20432, a second latch 20433, a level shifter 20434, and a circuit functioning as a buffer 20435. The circuit functioning as the buffer 20435 corresponds to a circuit which has a function of amplifying a weak signal and includes an operational amplifier or the like. A signal such as a start pulse (SSP) is input to the level shifter 20434 and data (DATA) such as a video signal is input to the first latch 20432. A latch (LAT) signal can be temporally held in the second latch 20433 and is simultaneously input to the pixel portion 20405. This is referred to as line sequential driving. Therefore, when a pixel is used in which not line sequential driving but dot sequential driving is performed, the second latch can be omitted.

Note that in this embodiment mode, various types of liquid crystal panels can be used as the liquid crystal panel. For example, a structure in which a liquid crystal layer is sealed between two substrates can be used as the liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, a counter electrode, an alignment film, or the like is provided on the other one of the substrates. Note that a polarizing plate or a retardation plate may be provided on the surface opposite to a top surface of the other one of the substrates. Note also that the color filter and the black matrix may be formed over the top surface of the one of the substrates. Note also that three-dimensional display can be performed by providing a slit (a grid) on the top surface side of the one of the substrates or the surface opposite to the top surface side of the one of the substrates.

Note also that each of the polarizing plate, the retardation plate, and the prism sheet can be provided between the two substrates. Alternatively, each of the polarizing plate, the retardation plate, and the prism sheet can be integrated with one of the two substrates.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 12]

In this embodiment mode, a pixel structure and an operation of a pixel which can be applied to a liquid crystal display device are described.

Note that in this embodiment mode, as an operation mode of a liquid crystal element, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Figure 60A:
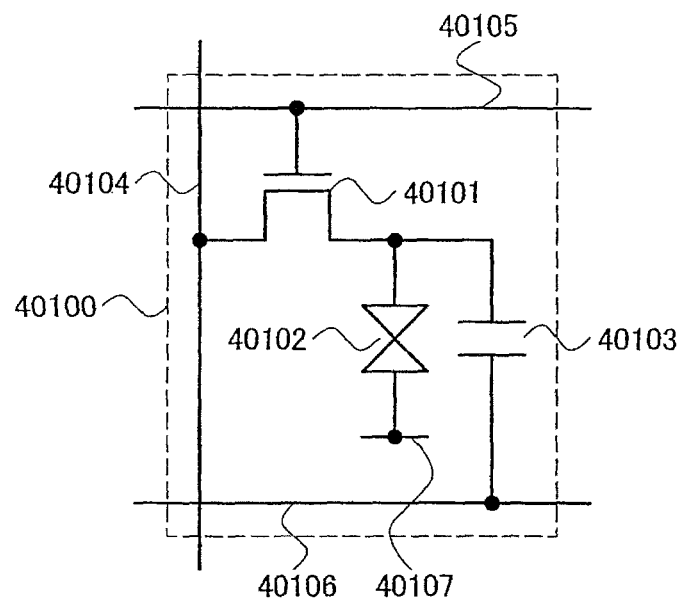
FIGS. 60A and 60B are diagrams each showing a structure of a panel circuit of a semiconductor device in accordance with the present invention.

FIG. 60A is a diagram showing an example of a pixel structure which can be applied to the liquid crystal display device.

A pixel 40100 includes a transistor 40101, a liquid crystal element 40102, and a capacitor 40103. A gate of the transistor 40101 is connected to a wiring 40105. A first electrode of the transistor 40101 is connected to a wiring 40104. A second electrode of the transistor 40101 is connected to a first electrode of the liquid crystal element 40102 and a first electrode of the capacitor 40103. A second electrode of the liquid crystal element 40102 corresponds to a counter electrode 40107. A second electrode of the capacitor 40103 is connected to a wiring 40106.

The wiring 40104 functions as a signal line. The wiring 40105 functions as a scan line. The wiring 40106 functions as a capacitor line. The transistor 40101 functions as a switch. The capacitor 40103 functions as a storage capacitor.

It is only necessary that the transistor 40101 function as a switch, and the transistor 40101 may be a P-channel transistor or an N-channel transistor.

Figure 60B:
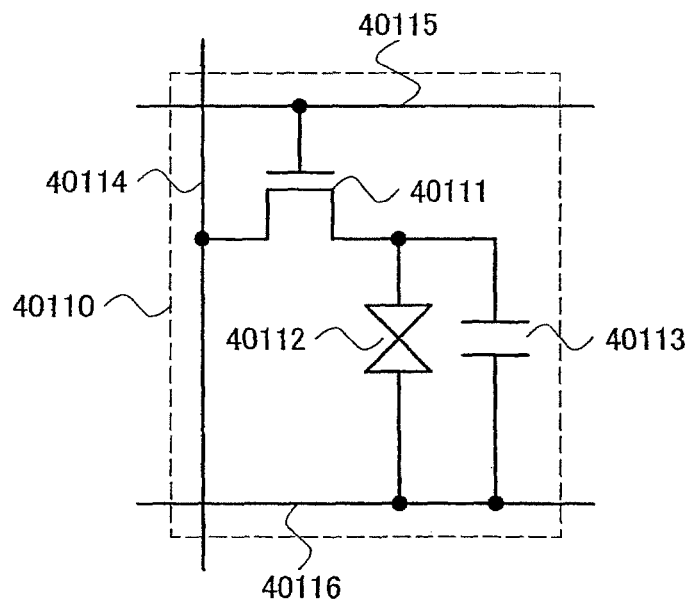

FIG. 60B is a diagram showing an example of a pixel structure which can be applied to the liquid crystal display device. In particular, FIG. 60B is a diagram showing an example of a pixel structure which can be applied to a liquid crystal display device suitable for a lateral electric field mode (including an IPS mode and an FFS mode).

A pixel 40110 includes a transistor 40111, a liquid crystal element 40112, and a capacitor 40113. A gate of the transistor 40111 is connected to a wiring 40115. A first electrode of the transistor 40111 is connected to a wiring 40114. A second electrode of the transistor 40111 is connected to a first electrode of the liquid crystal element 40112 and a first electrode of the capacitor 40113. A second electrode of the liquid crystal element 40112 is connected to a wiring 40116. A second electrode of the capacitor 40103 is connected to the wiring 40116.

The wiring 40114 functions as a signal line. The wiring 40115 functions as a scan line. The wiring 40116 functions as a capacitor line. The transistor 40111 functions as a switch. The capacitor 40113 functions as a storage capacitor.

It is only necessary that the transistor 40111 function as a switch, and the transistor 40111 may be a P-channel transistor or an N-channel transistor.

Figure 61:
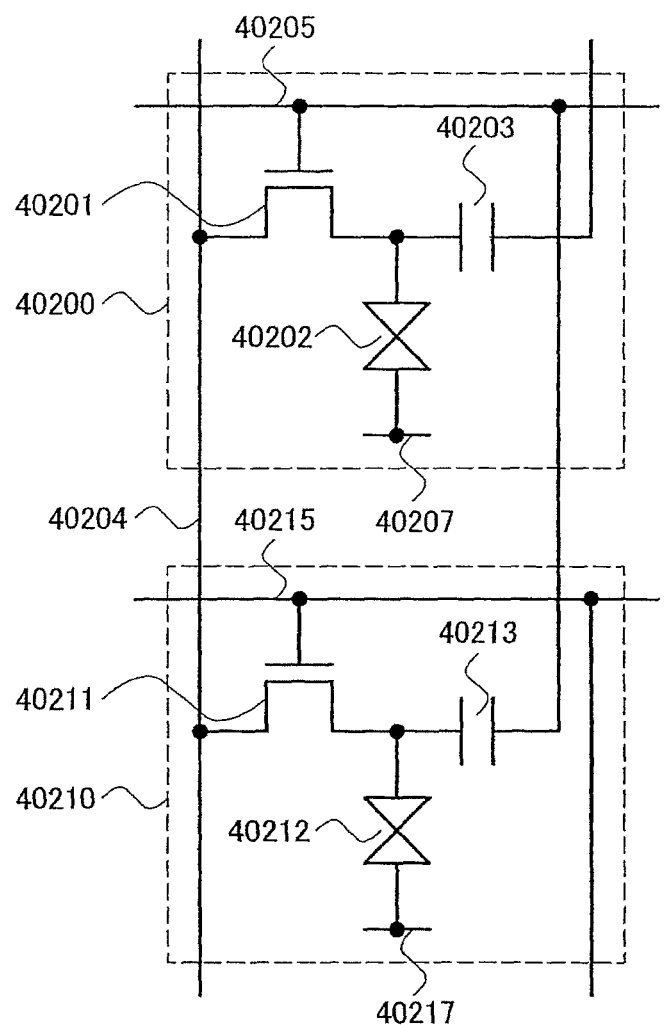
FIG. 61 is a diagram showing a structure of a panel circuit of a semiconductor device in accordance with the present invention.

FIG. 61 is a diagram showing an example of a pixel structure which can be applied to the liquid crystal display device. In particular, FIG. 61 is a diagram showing an example of a pixel structure in which an aperture ratio of a pixel can be increased by reducing the number of wirings.

FIG. 61 shows two pixels which are provided in the same column direction (a pixel 40200 and a pixel 40210). For example, when the pixel 40200 is provided in an N-th row, the pixel 40210 is provided in an (N+1)th row.

The pixel 40200 includes a transistor 40201, a liquid crystal element 40202, and a capacitor 40203. A gate of the transistor 40201 is connected to a wiring 40205. A first electrode of the transistor 40201 is connected to a wiring 40204. A second electrode of the transistor 40201 is connected to a first electrode of the liquid crystal element 40202 and a first electrode of the capacitor 40203. A second electrode of the liquid crystal element 40202 corresponds to a counter electrode 40207. A second electrode of the capacitor 40203 is connected to a wiring which is the same as a wiring connected to a gate of a transistor of the previous row.

The pixel 40210 includes a transistor 40211, a liquid crystal element 40212, and a capacitor 40213. A gate of the transistor 40211 is connected to a wiring 40215. A first electrode of the transistor 40211 is connected to the wiring 40204. A second electrode of the transistor 40211 is connected to a first electrode of the liquid crystal element 40212 and a first electrode of the capacitor 40213. A second electrode of the liquid crystal element 40212 corresponds to a counter electrode 40217. A second electrode of the capacitor 40213 is connected to a wiring which is the same as the wiring connected to the gate of the transistor of the previous row (the wiring 40205).

The wiring 40204 functions as a signal line. The wiring 40205 functions as a scan line of the N-th row. The wiring 40205 also functions as a capacitor line of the (N+1)th row. The transistor 40201 functions as a switch. The capacitor 40203 functions as a storage capacitor.

The wiring 40215 functions as a scan line of the (N+1)th row. The wiring 40215 also functions as a capacitor line of an (N+2)th row. The transistor 40211 functions as a switch. The capacitor 40213 functions as a storage capacitor.

It is only necessary that each of the transistor 40201 and the transistor 40211 function as a switch, and each of the transistor 40201 and the transistor 40211 may be a P-channel transistor or an N-channel transistor.

Figure 62:
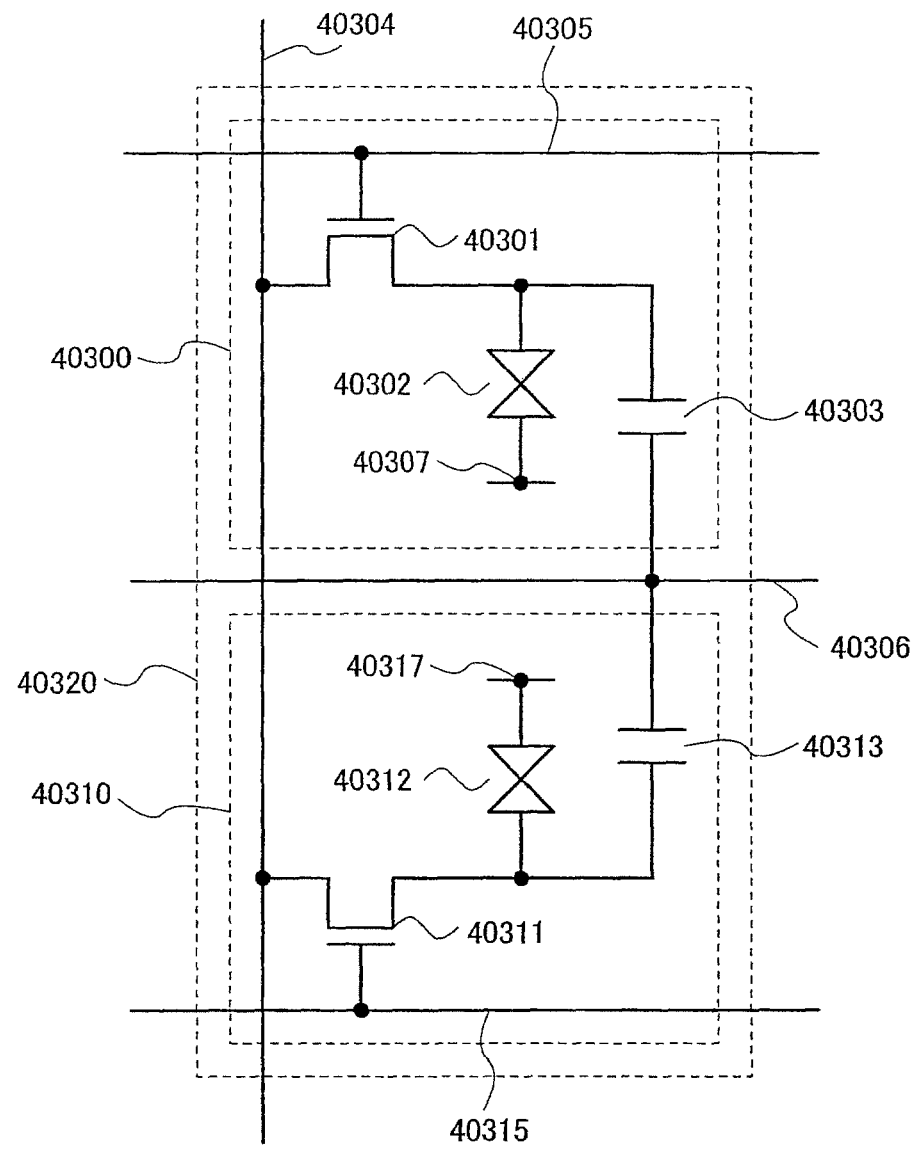
FIG. 62 is a diagram showing a structure of a panel circuit of a semiconductor device in accordance with the present invention.

FIG. 62 is a diagram showing an example of a pixel structure which can be applied to the liquid crystal display device. In particular, FIG. 62 is a diagram showing an example of a pixel structure in which a viewing angle can be improved by using a subpixel.

A pixel 40320 includes a subpixel 40300 and a subpixel 40310. Although the case in which the pixel 40320 includes two subpixels is described, the pixel 40320 may include three or more subpixels.

The subpixel 40300 includes a transistor 40301, a liquid crystal element 40302, and a capacitor 40303. A gate of the transistor 40301 is connected to a wiring 40305. A first electrode of the transistor 40301 is connected to a wiring 40304. A second electrode of the transistor 40301 is connected to a first electrode of the liquid crystal element 40302 and a first electrode of the capacitor 40303. A second electrode of the liquid crystal element 40302 corresponds to a counter electrode 40307. A second electrode of the capacitor 40303 is connected to a wiring 40306.

The subpixel 40310 includes a transistor 40311, a liquid crystal element 40312, and a capacitor 40313. A gate of the transistor 40311 is connected to a wiring 40315. A first electrode of the transistor 40311 is connected to the wiring 40304. A second electrode of the transistor 40311 is connected to a first electrode of the liquid crystal element 40312 and a first electrode of the capacitor 40313. A second electrode of the liquid crystal element 40312 corresponds to a counter electrode 40317. A second electrode of the capacitor 40313 is connected to a wiring 40306.

The wiring 40304 functions as a signal line. The wiring 40305 functions as a scan line. The wiring 40315 functions as a signal line. The wiring 40306 functions as a capacitor line. The transistor 40301 functions as a switch. The transistor 40311 functions as a switch. The capacitor 40303 functions as a storage capacitor. The capacitor 40313 functions as a storage capacitor.

It is only necessary that the transistor 40301 function as a switch, and the transistor 40301 may be a P-channel transistor or an N-channel transistor. It is only necessary that the transistor 40311 function as a switch, and the transistor 40311 may be a P-channel transistor or an N-channel transistor.

A video signal input to the subpixel 40300 may be a value which is different from that of a video signal input to the subpixel 40310. In this case, the viewing angle can be widened because alignment of liquid crystal molecules of the liquid crystal element 40302 and alignment of liquid crystal molecules of the liquid crystal element 40312 can be varied from each other.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 13]

In this embodiment mode, various liquid crystal modes are described.

First, various liquid crystal modes are described with reference to cross-sectional views.

Figure 63A:
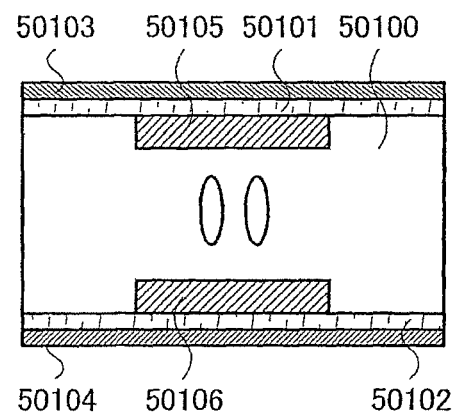
FIGS. 63A and 63B are cross-sectional views of display elements of a semiconductor device in accordance with the present invention.
Figure 63B:
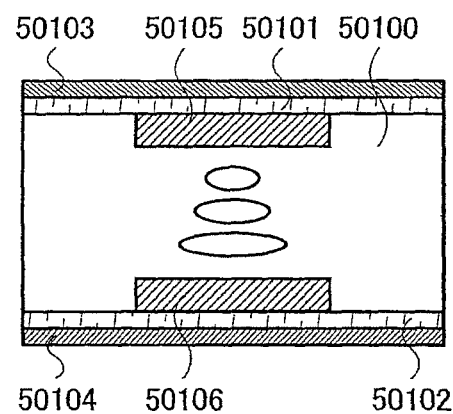

FIGS. 63A and 63B are schematic views of cross sections of a TN mode.

A liquid crystal layer 50100 is held between a first substrate 50101 and a second substrate 50102 which are provided so as to be opposite to each other. A first electrode 50105 is formed on a top surface of the first substrate 50101. A second electrode 50106 is formed on a top surface of the second substrate 50102. A first polarizing plate 50103 is provided on a surface of the first substrate 50101, which does not face the liquid crystal layer 50100. A second polarizing plate 50104 is provided on a surface of the second substrate 50102, which does not face the liquid crystal layer 50100. Note that the first polarizing plate 50103 and the second polarizing plate 50104 are provided so as to be in a cross nicol state.

The first polarizing plate 50103 may be provided on the top surface of the first substrate 50101, i.e., may be provided between the first substrate 50101 and the liquid crystal layer 50100. The second polarizing plate 50104 may be provided on the top surface of the second substrate 50102, i.e., may be provided between the second substrate 50102 and the liquid crystal layer 50100.

It is only necessary that at least one of the first electrode 50105 and the second electrode 50106 have light-transmitting properties (a transmissive or reflective liquid crystal display device). Alternatively, both the first electrode 50105 and the second electrode 50106 may have light-transmitting properties, and part of one of the electrodes may have reflectivity (a semi-transmissive liquid crystal display device).

FIG. 63A is a schematic view of a cross section in the case where voltage is applied to the first electrode 50105 and the second electrode 50106 (referred to as a vertical electric field mode).

FIG. 63B is a schematic view of a cross section in the case where voltage is not applied to the first electrode 50105 and the second electrode 50106.

Figure 64A:
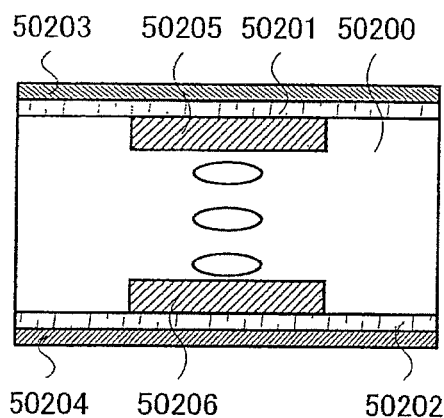
FIGS. 64A to 64D are cross-sectional views of display elements of a semiconductor device in accordance with the present invention.
Figure 64B:
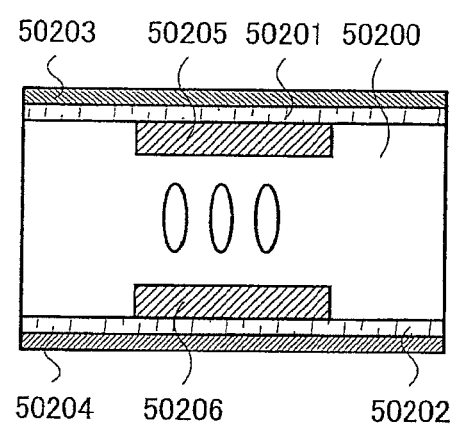

FIGS. 64A and 64B are schematic views of cross sections of a VA mode. In the VA mode, liquid crystal molecules are aligned such that they are vertical to a substrate when there is no electric field.

A liquid crystal layer 50200 is held between a first substrate 50201 and a second substrate 50202 which are provided so as to be opposite to each other. A first electrode 50205 is formed on a top surface of the first substrate 50201. A second electrode 50206 is formed on a top surface of the second substrate 50202. A first polarizing plate 50203 is provided on a surface of the first substrate 50201, which does not face the liquid crystal layer 50200. A second polarizing plate 50204 is provided on a surface of the second substrate 50202, which does not face the liquid crystal layer 50200. Note that the first polarizing plate 50203 and the second polarizing plate 50204 are provided so as to be in a cross nicol state.

The first polarizing plate 50203 may be provided on the top surface of the first substrate 50201, i.e., may be provided between the first substrate 50201 and the liquid crystal layer 50200. The second polarizing plate 50204 may be provided on the top surface of the second substrate 50202, i.e., may be provided between the second substrate 50202 and the liquid crystal layer 50200.

It is only necessary that at least one of the first electrode 50205 and the second electrode 50206 have light-transmitting properties (a transmissive or reflective liquid crystal display device). Alternatively, both the first electrode 50205 and the second electrode 50206 may have light-transmitting properties, and part of one of the electrodes may have reflectivity (a semi-transmissive liquid crystal display device).

FIG. 64A is a schematic view of a cross section in the case where voltage is applied to the first electrode 50205 and the second electrode 50206 (referred to as a vertical electric field mode).

FIG. 64B is a schematic view of a cross section in the case where voltage is not applied to the first electrode 50205 and the second electrode 50206.

Figure 64C:
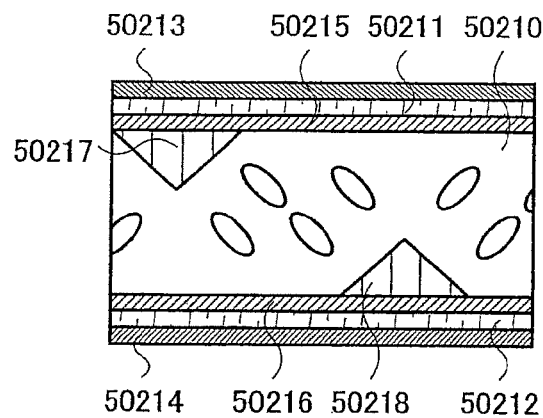
Figure 64D:
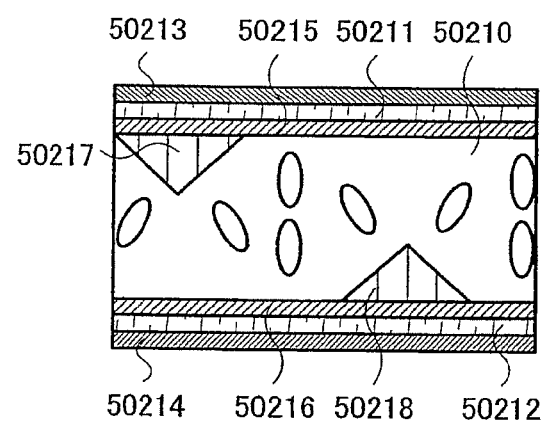

FIGS. 64C and 64D are schematic views of cross sections of an MVA mode. In the MVA mode, viewing angle dependency of each portion is compensated by each other.

A liquid crystal layer 50210 is held between a first substrate 50211 and a second substrate 50212 which are provided so as to be opposite to each other. A first electrode 50215 is formed on a top surface of the first substrate 50211. A second electrode 50216 is formed on a top surface of the second substrate 50212. A first projection 50217 for controlling alignment is formed on the first electrode 50215. A second projection 50218 for controlling alignment is formed over the second electrode 50216. A first polarizing plate 50213 is provided on a surface of the first substrate 50211, which does not face the liquid crystal layer 50210. A second polarizing plate 50214 is provided on a surface of the second substrate 50212, which does not face the liquid crystal layer 50210. Note that the first polarizing plate 50213 and the second polarizing plate 50214 are provided so as to be in a cross nicol state.

The first polarizing plate 50213 may be provided on the top surface of the first substrate 50211, i.e., may be provided between the first substrate 50211 and the liquid crystal layer 50210. The second polarizing plate 50214 may be provided on the top surface of the second substrate 50212, i.e., may be provided between the second substrate 50212 and the liquid crystal layer 50210.

It is only necessary that at least one of the first electrode 50215 and the second electrode 50216 have light-transmitting properties (a transmissive or reflective liquid crystal display device). Alternatively, both the first electrode 50215 and the second electrode 50216 may have light-transmitting properties, and part of one of the electrodes may have reflectivity (a semi-transmissive liquid crystal display device).

FIG. 64C is a schematic view of a cross section in the case where voltage is applied to the first electrode 50215 and the second electrode 50216 (referred to as a vertical electric field mode).

FIG. 64D is a schematic view of a cross section in the case where voltage is not applied to the first electrode 50215 and the second electrode 50216.

Figure 65A:
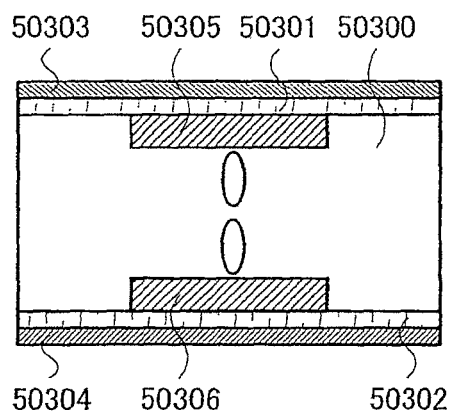
FIGS. 65A to 65D are cross-sectional views of display elements of a semiconductor device in accordance with the present invention.
Figure 65B:
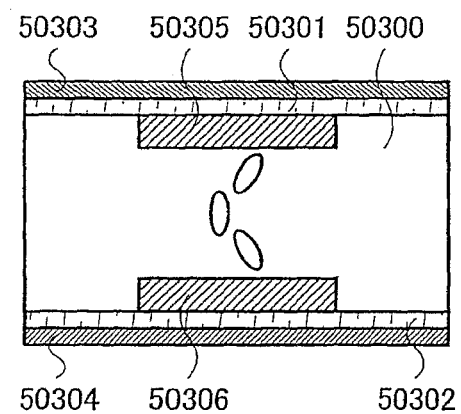

FIGS. 65A and 65B are schematic views of cross sections of an OCB mode. In the OCB mode, viewing angle dependency is low because alignment of liquid crystal molecules in a liquid crystal layer can be optically compensated. This state of the liquid crystal molecules is referred to as bend alignment.

A liquid crystal layer 50300 is held between a first substrate 50301 and a second substrate 50302 which are provided so as to be opposite to each other. A first electrode 50305 is formed on a top surface of the first substrate 50301. A second electrode 50306 is formed on a top surface of the second substrate 50302. A first polarizing plate 50303 is provided on a surface of the first substrate 50301, which does not face the liquid crystal layer 50300. A second polarizing plate 50304 is provided on a surface of the second substrate 50302, which does not face the liquid crystal layer 50300. Note that the first polarizing plate 50303 and the second polarizing plate 50304 are provided so as to be in a cross nicol state.

The first polarizing plate 50303 may be provided on the top surface of the first substrate 50301, i.e., may be provided between the first substrate 50301 and the liquid crystal layer 50300. The second polarizing plate 50304 may be provided on the top surface of the second substrate 50302, i.e., may be provided between the second substrate 50302 and the liquid crystal layer 50300.

It is only necessary that at least one of the first electrode 50305 and the second electrode 50306 have light-transmitting properties (a transmissive or reflective liquid crystal display device). Alternatively, both the first electrode 50305 and the second electrode 50306 may have light-transmitting properties, and part of one of the electrodes may have reflectivity (a semi-transmissive liquid crystal display device).

FIG. 65A is a schematic view of a cross section in the case where voltage is applied to the first electrode 50305 and the second electrode 50306 (referred to as a vertical electric field mode).

FIG. 65B is a schematic view of a cross section in the case where voltage is not applied to the first electrode 50305 and the second electrode 50306.

Figure 65C:
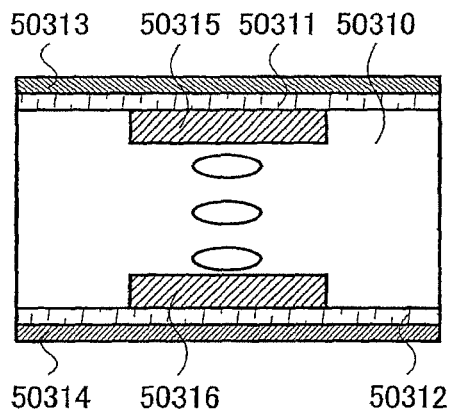
Figure 65D:
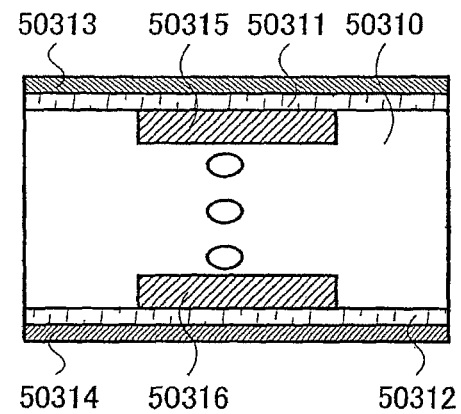

FIGS. 65C and 65D are schematic views of cross sections of an FLC mode or an AFLC mode.

A liquid crystal layer 50310 is held between a first substrate 50311 and a second substrate 50312 which are provided so as to be opposite to each other. A first electrode 50315 is formed on a top surface of the first substrate 50311. A second electrode 50316 is formed on a top surface of the second substrate 50312. A first polarizing plate 50313 is provided on a surface of the first substrate 50311, which does not face the liquid crystal layer 50310. A second polarizing plate 50314 is provided on a surface of the second substrate 50312, which does not face the liquid crystal layer 50310. Note that the first polarizing plate 50313 and the second polarizing plate 50314 are provided so as to be in a cross nicol state.

The first polarizing plate 50313 may be provided on the top surface of the first substrate 50311, i.e., may be provided between the first substrate 50311 and the liquid crystal layer 50310. The second polarizing plate 50314 may be provided on the top surface of the second substrate 50312, i.e., may be provided between the second substrate 50312 and the liquid crystal layer 50310.

It is only necessary that at least one of the first electrode 50315 and the second electrode 50316 have light-transmitting properties (a transmissive or reflective liquid crystal display device). Alternatively, both the first electrode 50315 and the second electrode 50316 may have light-transmitting properties, and part of one of the electrodes may have reflectivity (a semi-transmissive liquid crystal display device).

FIG. 65C is a schematic view of a cross section in the case where voltage is applied to the first electrode 50315 and the second electrode 50316 (referred to as a vertical electric field mode).

FIG. 65D is a schematic view of a cross section in the case where voltage is not applied to the first electrode 50315 and the second electrode 50316.

Figure 66A:
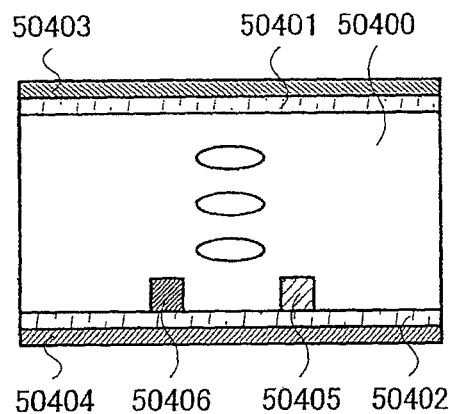
FIGS. 66A to 66D are cross-sectional views of display elements of a semiconductor device in accordance with the present invention.
Figure 66B:
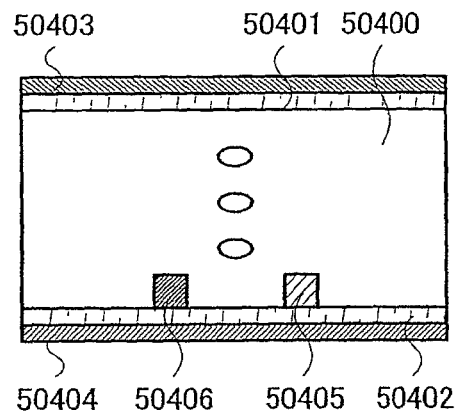

FIGS. 66A and 66B are schematic views of cross sections of an IPS mode. In the IPS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50400 is held between a first substrate 50401 and a second substrate 50402 which are provided so as to be opposite to each other. A first electrode 50405 and a second electrode 50406 are formed on a top surface of the second substrate 50402. A first polarizing plate 50403 is provided on a surface of the first substrate 50401, which does not face the liquid crystal layer 50400. A second polarizing plate 50404 is provided on a surface of the second substrate 50402, which does not face the liquid crystal layer 50400. Note that the first polarizing plate 50403 and the second polarizing plate 50404 are provided so as to be in a cross nicol state.

The first polarizing plate 50403 may be provided on the top surface of the first substrate 50401, i.e., may be provided between the first substrate 50401 and the liquid crystal layer 50400. The second polarizing plate 50404 may be provided on the top surface of the second substrate 50402, i.e., may be provided between the second substrate 50402 and the liquid crystal layer 50400.

It is only necessary that at least one of the first electrode 50405 and the second electrode 50406 have light-transmitting properties (a transmissive or reflective liquid crystal display device). Alternatively, both the first electrode 50405 and the second electrode 50406 may have light-transmitting properties, and part of one of the electrodes may have reflectivity (a semi-transmissive liquid crystal display device).

FIG. 66A is a schematic view of a cross section in the case where voltage is applied to the first electrode 50405 and the second electrode 50406 (referred to as a vertical electric field mode).

FIG. 66B is a schematic view of a cross section in the case where voltage is not applied to the first electrode 50405 and the second electrode 50406.

Figure 66C:
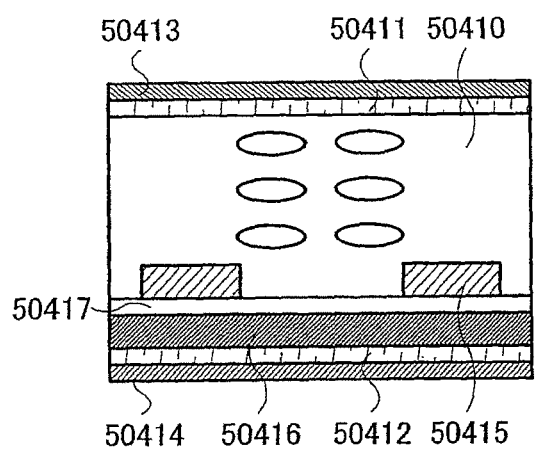
Figure 66D:
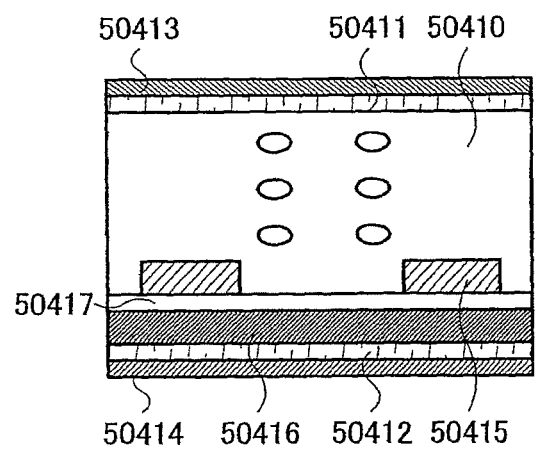

FIGS. 66C and 66D are schematic views of cross sections of an FFS mode. In the FFS mode, alignment of liquid crystal molecules in a liquid crystal layer can be optically compensated, the liquid crystal molecules are constantly rotated in a plane parallel to a substrate, and a horizontal electric field method in which electrodes are provided only on one substrate side is used.

A liquid crystal layer 50410 is held between a first substrate 50411 and a second substrate 50412 which are provided so as to be opposite to each other. A second electrode 50416 is formed on a top surface of the second substrate 50412. An insulating film 50417 is formed on a top surface of the second electrode 50416. A first electrode 50415 is formed over the insulating film 50417. A first polarizing plate 50413 is provided on a surface of the first substrate 50411, which does not face the liquid crystal layer 50410. A second polarizing plate 50414 is provided on a surface of the second substrate 50412, which does not face the liquid crystal layer 50410. Note that the first polarizing plate 50413 and the second polarizing plate 50414 are provided so as to be in a cross nicol state.

The first polarizing plate 50413 may be provided on the top surface of the first substrate 50411, i.e., may be provided between the first substrate 50411 and the liquid crystal layer 50410. The second polarizing plate 50414 may be provided on the top surface of the second substrate 50412, i.e., may be provided between the second substrate 50412 and the liquid crystal layer 50410.

It is only necessary that at least one of the first electrode 50415 and the second electrode 50416 have light-transmitting properties (a transmissive or reflective liquid crystal display device). Alternatively, both the first electrode 50415 and the second electrode 50416 may have light-transmitting properties, and part of one of the electrodes may have reflectivity (a semi-transmissive liquid crystal display device).

FIG. 66C is a schematic view of a cross section in the case where voltage is applied to the first electrode 50415 and the second electrode 50416 (referred to as a vertical electric field mode).

FIG. 66D is a schematic view of a cross section in the case where voltage is not applied to the first electrode 50415 and the second electrode 50416.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 14]

In this embodiment mode, a pixel structure of a display device is described. In particular, a pixel structure of a liquid crystal display device is described.

A pixel structure in the case where each liquid crystal mode and a transistor are combined is described with reference to cross-sectional views of a pixel.

Note that as the transistor, a thin film transistor (a TFT) including a non-single crystalline semiconductor layer typified by amorphous silicon, polycrystalline silicon, micro crystalline (also referred to as semi-amorphous) silicon, or the like can be used.

As a structure of the transistor, a top-gate structure, a bottom-gate structure, or the like can be used. Note that a channel-etched transistor, a channel-protective transistor, or the like can be used as a bottom-gate transistor.

Figure 67:
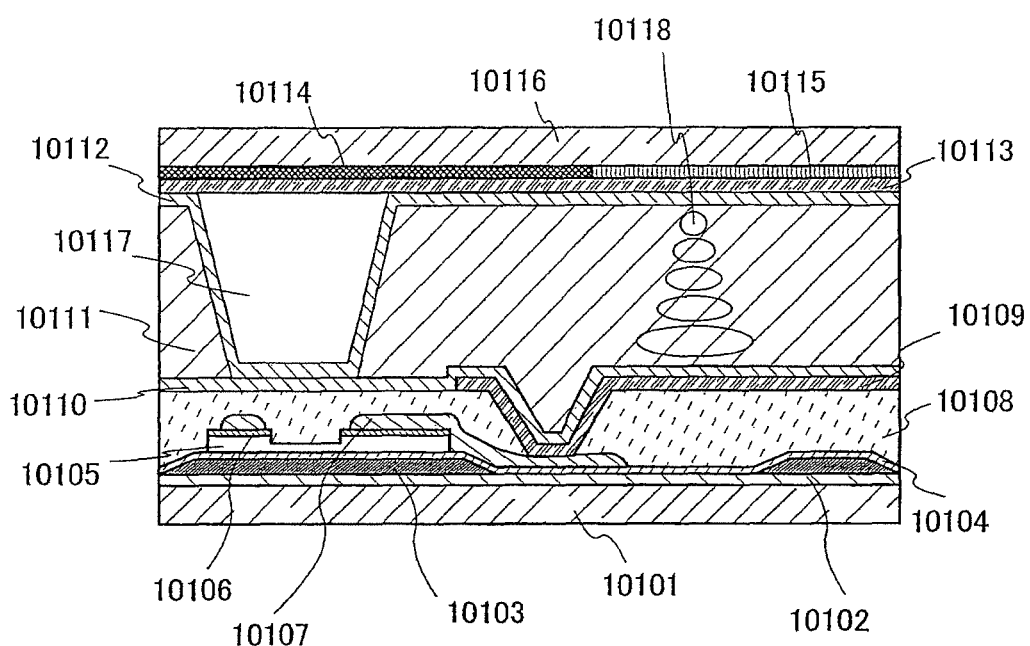
FIG. 67 is a top plan view of a pixel of a semiconductor device in accordance with the present invention.

FIG. 67 is an example of a cross-sectional view of a pixel in the case where a TN mode and a transistor are combined. A liquid crystal 10111 having liquid crystal molecules 10118 is held between a first substrate 10101 and a second substrate 10116. A transistor, a pixel electrode, an alignment film, and the like are provided over the first substrate 10101, and a light-shielding film 10114, a color filter 10115, a counter electrode, an alignment film, and the like are provided on the second substrate 10116. In addition, a spacer 10117 is provided between the first substrate 10101 and the second substrate 10116. By applying the pixel structure shown in FIG. 67 to a liquid crystal display device, a liquid crystal display device can be formed at low cost.

Figure 68A:
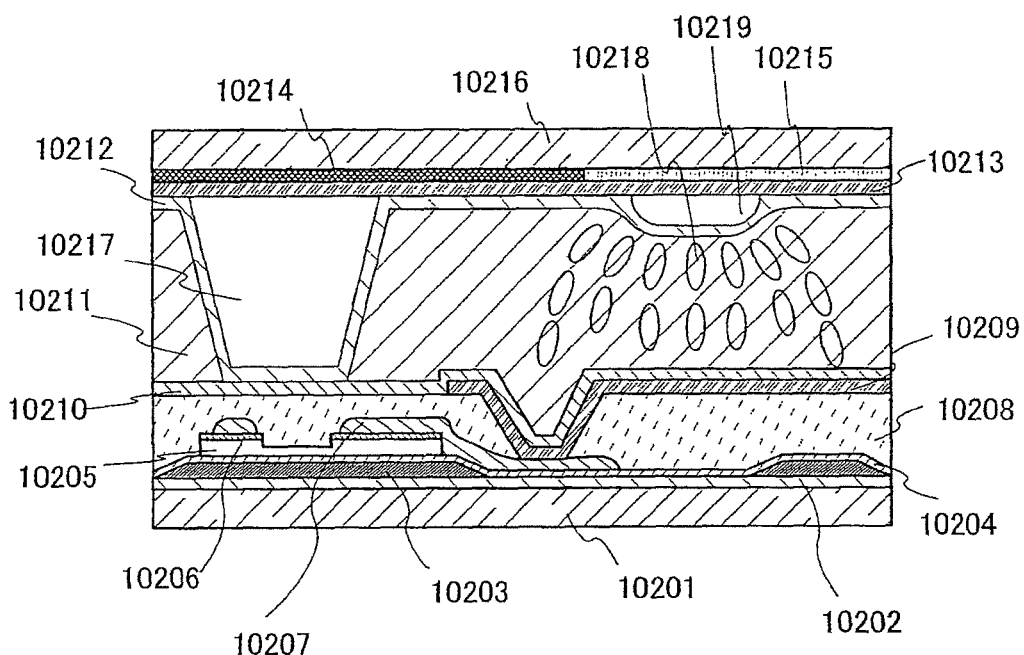
FIGS. 68A and 68B are top plan views of pixels of a semiconductor device in accordance with the present invention.

FIG. 68A is an example of a cross-sectional view of a pixel in the case where an MVA (Multi-domain Vertical Alignment) mode and a transistor are combined. A liquid crystal 10211 having liquid crystal molecules 10218 is held between a first substrate 10201 and a second substrate 10216. A transistor, a pixel electrode, an alignment film, and the like are provided over the first substrate 10201, and a light-shielding film 10214, a color filter 10215, a counter electrode, an alignment control projection 10219, an alignment film, and the like are provided on the second substrate 10216. In addition, a spacer 10217 is provided between the first substrate 10201 and the second substrate 10216. By applying the pixel structure shown in FIG. 68A to a liquid crystal display device, a liquid crystal display device having a wide viewing angle, high response speed, and high contrast can be obtained.

Figure 68B:
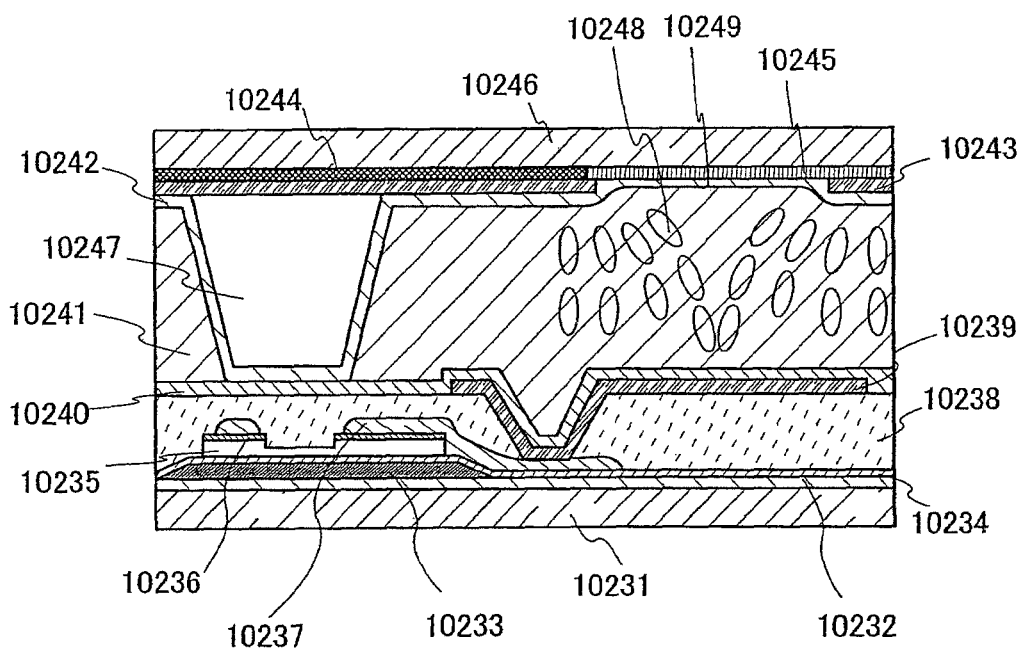

FIG. 68B is an example of a cross-sectional view of a pixel in the case where a PVA (Patterned Vertical Alignment) mode and a transistor are combined. A liquid crystal 10241 having liquid crystal molecules 10248 is held between a first substrate 10231 and a second substrate 10246. A transistor, a pixel electrode, an alignment film, and the like are provided over the first substrate 10231, and a light-shielding film 10244, a color filter 10245, a counter electrode, an alignment film, and the like are provided on the second substrate 10246. Note that the pixel electrode includes an electrode notch portion 10249. In addition, a spacer 10247 is provided between the first substrate 10231 and the second substrate 10246. By applying the pixel structure shown in FIG. 68B to a liquid crystal display device, a liquid crystal display device having a wide viewing angle, high response speed, and high contrast can be obtained.

Figure 69A:
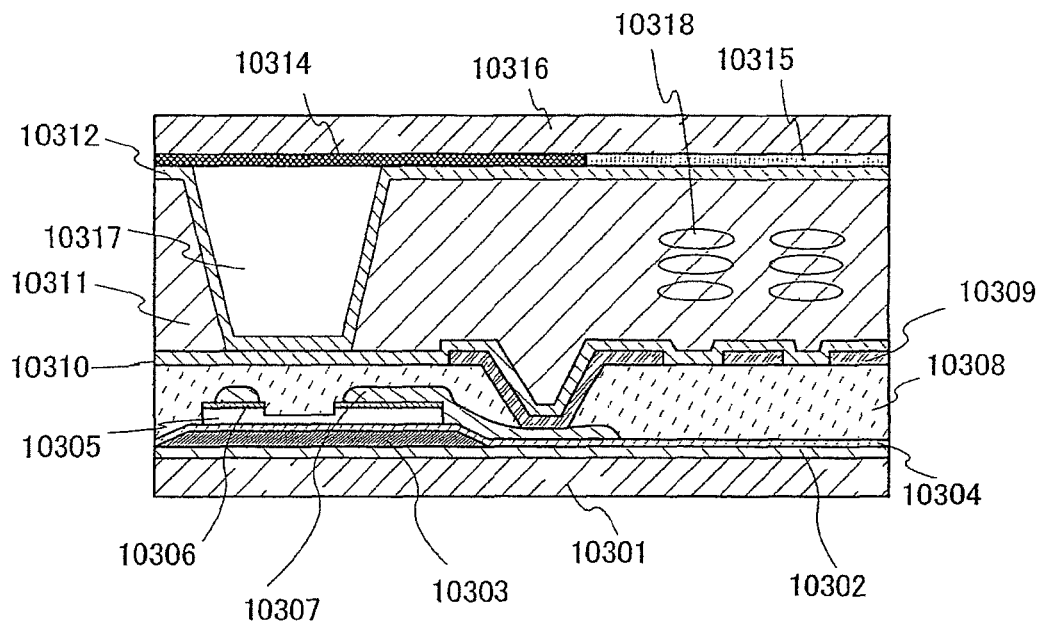
FIGS. 69A and 69B are top plan views of pixels of a semiconductor device in accordance with the present invention.

FIG. 69A is an example of a cross-sectional view of a pixel in the case where an IPS (In-Plane-Switching) mode and a transistor are combined. A liquid crystal 10311 having liquid crystal molecules 10318 is held between a first substrate 10301 and a second substrate 10316. A transistor, a pixel electrode, a common electrode, an alignment film, and the like are provided over the first substrate 10301, and a light-shielding film 10314, a color filter 10315, an alignment film, and the like are provided on the second substrate 10316. In addition, a spacer 10317 is provided between the first substrate 10301 and the second substrate 10316. By applying the pixel structure shown in FIG. 69A to a liquid crystal display device, a liquid crystal display device theoretically having a wide viewing angle and response speed which has low dependency on a gray scale can be obtained.

Figure 69B:
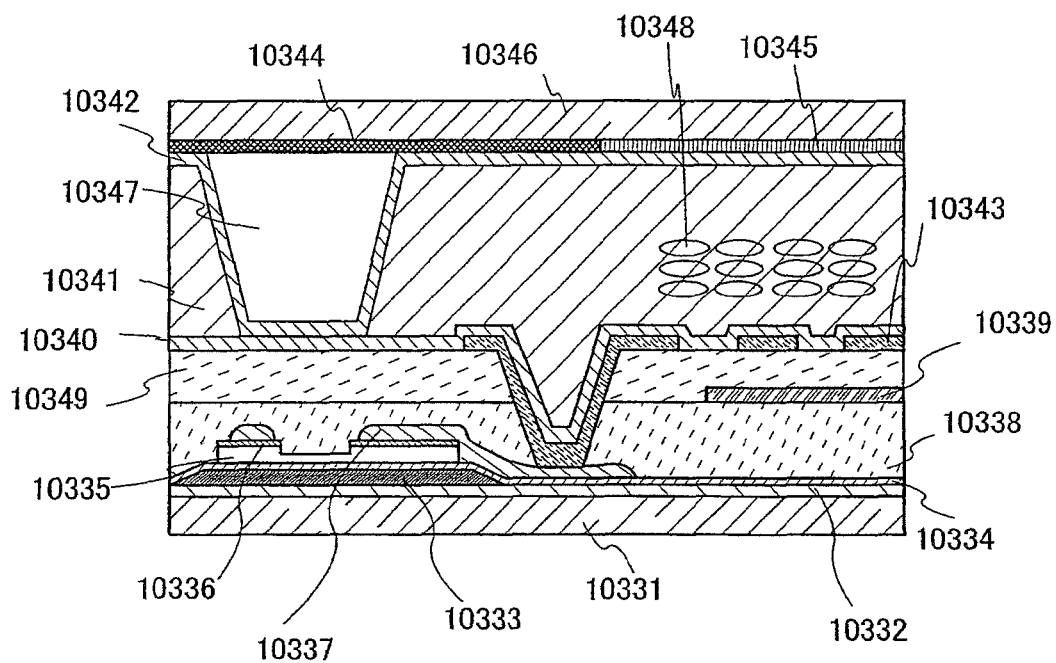

FIG. 69B is an example of a cross-sectional view of a pixel in the case where an FFS (Fringe Field Switching) mode and a transistor are combined. A liquid crystal 10341 having liquid crystal molecules 10348 is held between a first substrate 10331 and a second substrate 10346. A transistor, a pixel electrode, a common electrode, an alignment film, and the like are provided over the first substrate 10331, and a light-shielding film 10344, a color filter 10345, an alignment film, and the like are provided on the second substrate 10346. In addition, a spacer 10347 is provided between the first substrate 10331 and the second substrate 10346. By applying the pixel structure shown in FIG. 69B to a liquid crystal display device, a liquid crystal display device theoretically having a wide viewing angle and response speed which has low dependency on a gray scale can be obtained.

Here, materials which can be used for conductive layers or insulating films are described.

As a first insulating film 10102 in FIG. 67, a first insulating film 10202 in FIG. 68A, a first insulating film 10232 in FIG. 68B, a first insulating film 10302 in FIG. 69A, or a first insulating film 10332 in FIG. 69B, an insulating film such as a silicon oxide film, a silicon nitride film, or a silicon oxynitride ($SiO_xN_y$) film can be used. Alternatively, an insulating film having a stacked-layer structure in which two or more of a silicon oxide film, a silicon nitride film, a silicon oxynitride ($SiO_xN_y$) film, and the like are combined can be used.

As a first conductive layer 10103 in FIG. 67, a first conductive layer 10203 in FIG. 68A, a first conductive layer 10233 in FIG. 68B, a first conductive layer 10303 in FIG. 69A, or a first conductive layer 10333 in FIG. 69B, Mo, Ti, Al, Nd, Cr, or the like can be used. Alternatively, a stacked-layer structure in which two or more of Mo, Ti, Al, Nd, Cr, and the like are combined can be used.

As a second insulating film 10104 in FIG. 67, a second insulating film 10204 in FIG. 68A, a second insulating film 10234 in FIG. 68B, a second insulating film 10304 in FIG. 69A, or a second insulating film 10334 in FIG. 69B, a thermal oxide film, a silicon oxide film, a silicon nitride film, a silicon oxynitride film, or the like can be used. Alternatively, a stacked-Layer structure in which two or more of a thermal oxide film, a silicon oxide film, a silicon nitride film, a silicon oxynitride film, and the like are combined can be used. Note that a silicon oxide film is preferable in a portion which is in contact with a semiconductor layer. This is because a trap level at an interface with the semiconductor layer is decreased when a silicon oxide film is used. Note also that a silicon nitride film is preferable in a portion which is in contact with Mo. This is because a silicon nitride film does not oxidize Mo.

As a first semiconductor layer 10105 in FIG. 67, a first semiconductor layer 10205 in FIG. 68A, a first semiconductor layer 10235 in FIG. 68B, a first semiconductor layer 10305 in FIG. 69A, or a first semiconductor layer 10335 in FIG. 69B, silicon, silicon germanium (SiGe), or the like can be used.

As a second semiconductor layer 10106 in FIG. 67, a second semiconductor layer 10206 in FIG. 68A, a second semiconductor layer 10236 in FIG. 68B, a second semiconductor layer 10306 in FIG. 69A, or a second semiconductor layer 10336 in FIG. 69B, silicon or the like including phosphorus can be used, for example.

As a light-transmitting material of a second conductive layer 10107, a third conductive layer 10109, and a fourth conductive layer 10113 in FIG. 67; a second conductive layer 10207, a third conductive layer 10209, and a fourth conductive layer 10213 in FIG. 68A; a second conductive layer 10237, a third conductive layer 10239, and a fourth conductive layer 10243 in FIG. 68B; a second conductive layer 10307 and a third conductive layer 10309 in FIG. 69A; or a second conductive layer 10337, a third conductive layer 10339, and a fourth conductive layer 10343 in FIG. 69B, an indium tin oxide (ITO) film formed by mixing tin oxide into indium oxide, an indium tin silicon oxide (ITSO) film formed by mixing silicon oxide into indium tin oxide (ITO), an indium zinc oxide (IZO) film formed by mixing zinc oxide into indium oxide, a zinc oxide film, a tin oxide film, or the like can be used. Note that IZO is a light-transmitting conductive material formed by sputtering using a target in which 2 to 20 wt % of zinc oxide (ZnO) is mixed into ITO.

As a reflective material of the second conductive layer 10107 and the third conductive layer 10109 in FIG. 67; the second conductive layer 10207 and the third conductive layer 10209 in FIG. 68A; the second conductive layer 10237 and the third conductive layer 10239 in FIG. 68B; the second conductive layer 10307 and the third conductive layer 10309 in FIG. 69A; or the second conductive layer 10337, the third conductive layer 10339, and the fourth conductive layer 10343 in FIG. 69B, Ti, Mo, Ta, Cr, W, Al, or the like can be used. Alternatively, a two-layer structure in which Al and Ti, Mo, Ta, Cr, or W are stacked, or a three-layer structure in which Al is interposed between metals such as Ti, Mo, Ta, Cr, and W may be used.

As the third insulating film 10108 in FIG. 67, the third insulating film 10208 in FIG. 68A, the third insulating film 10238 in FIG. 68B, the third conductive layer 10239 in FIG. 68B, the third insulating film 10308 in FIG. 69A, or the third insulating film 10338 and the fourth insulating film 10349 in FIG. 69B, an inorganic material (e.g., silicon oxide, silicon nitride, or silicon oxynitride), an organic compound material having a low dielectric constant (e.g., a photosensitive or nonphotosensitive organic resin material), or the like can be used. Alternatively, a material including siloxane can be used. Note that siloxane is a material in which a skeleton structure is formed by a bond of silicon (Si) and oxygen (O). As a substituent, an organic group including at least hydrogen (e.g., an alkyl group or aromatic hydrocarbon) is used. Alternatively, a fluoro group may be used as the substituent. Further alternatively, the organic group including at least hydrogen and the fluoro group may be used as the substituent.

As a first alignment film 10110 and a second alignment film 10112 in FIG. 67; a first alignment film 10210 and a second alignment film 10212 in FIG. 68A; a first alignment film 10240 and a second alignment film 10242 in FIG. 68B; a first alignment film 10310 and a second alignment film 10312 in FIG. 69A; or a first alignment film 10340 and a second alignment film 10342 in FIG. 69B, a film of a high molecular compound such as polyimide can be used.

Next, the pixel structure in the case where each liquid crystal mode and the transistor are combined is described with reference to a top plan view (a layout diagram) of the pixel.

Note that as the liquid crystal mode, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti-Ferroelectric Liquid Crystal) mode, or the like can be used.

Figure 70:
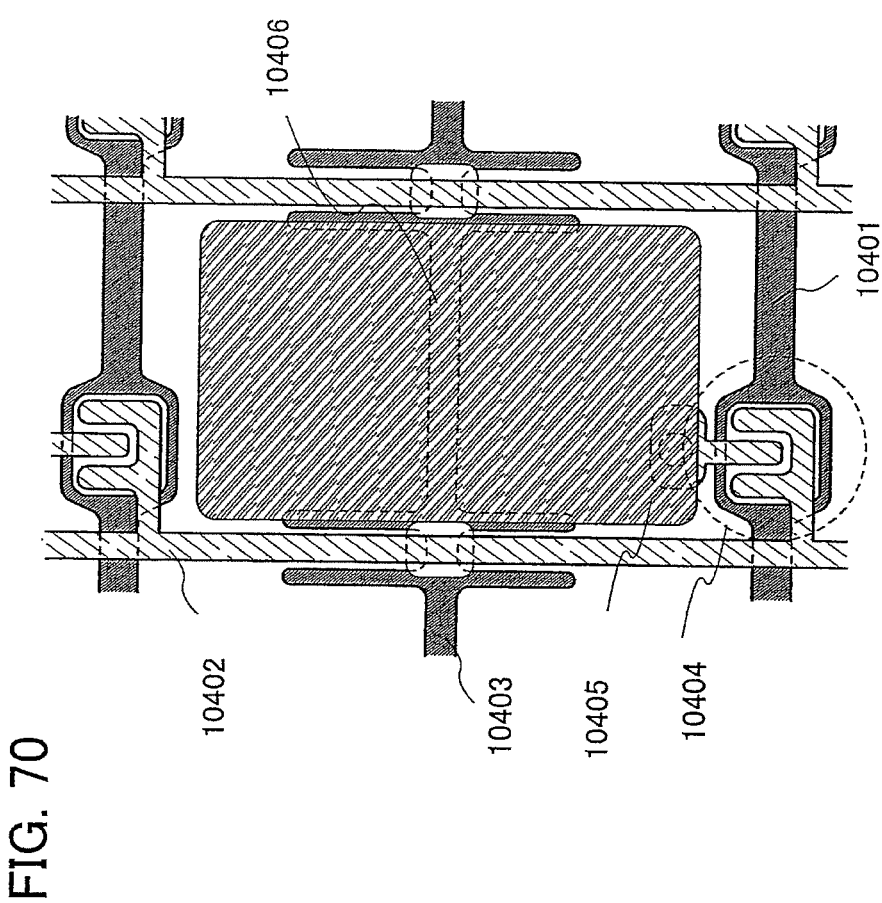
FIG. 70 is an example of pixel layout of a semiconductor device in accordance with the present invention.

FIG. 70 is an example of a top plan view of a pixel in the case where a TN mode and a transistor are combined. By applying the pixel structure shown in FIG. 70 to a liquid crystal display device, a liquid crystal display device can be formed at low cost.

The pixel shown in FIG. 70 includes a scan line 10401, a video signal line 10402, a capacitor line 10403, a transistor 10404, a pixel electrode 10405, and a pixel capacitor 10406.

Figure 71A:
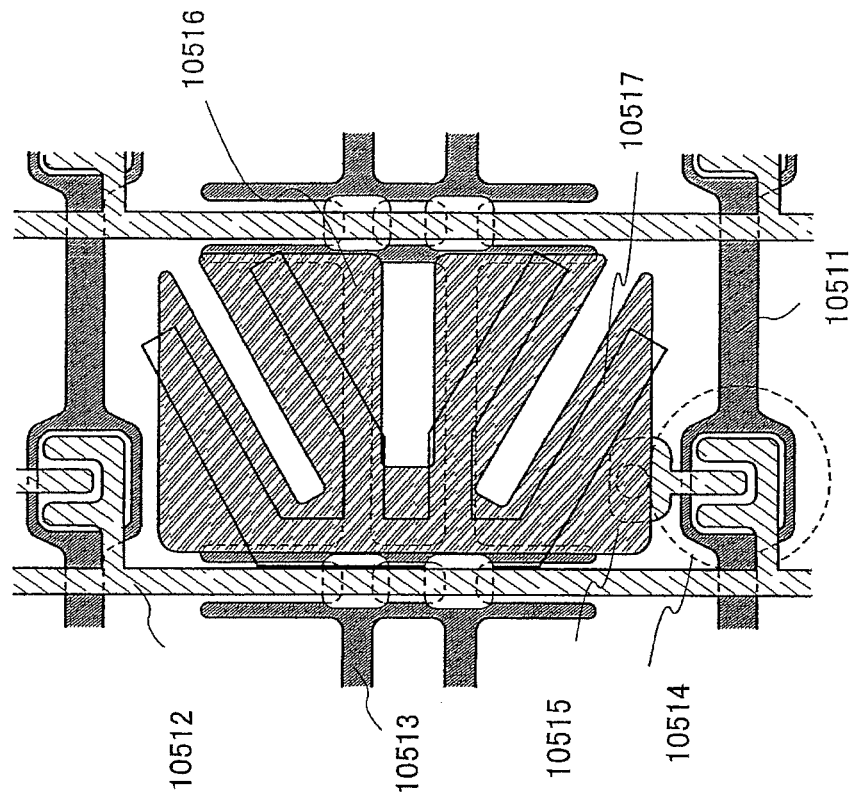
FIGS. 71A and 71B are examples of pixel layout of a semiconductor device in accordance with the present invention.

FIG. 71A is an example of a top plan view of a pixel in the case where an MVA mode and a transistor are combined. By applying the pixel structure shown in FIG. 71A to a liquid crystal display device, a liquid crystal display device having a wide viewing angle, high response speed, and high contrast can be obtained.

The pixel shown in FIG. 71A includes a scan line 10501, a video signal line 10502, a capacitor line 10503, a transistor 10504, a pixel electrode 10505, a pixel capacitor 10506, and an alignment control projection 10507.

Figure 71B:
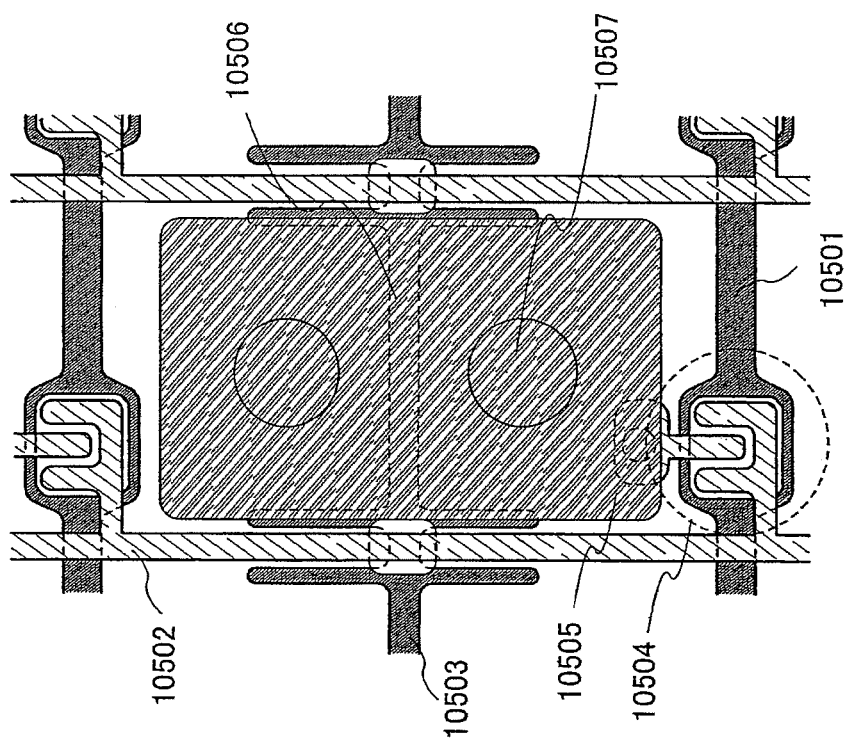

FIG. 71B is an example of a top plan view of a pixel in the case where a PVA mode and a transistor are combined. By applying the pixel structure shown in FIG. 71B to a liquid crystal display device, a liquid crystal display device having a wide viewing angle, high response speed, and high contrast can be obtained.

The pixel shown in FIG. 71B includes a scan line 10511, a video signal line 10512, a capacitor line 10513, a transistor 10514, a pixel electrode 10515, a pixel capacitor 10516, and an electrode notch portion 10517.

Figure 72A:
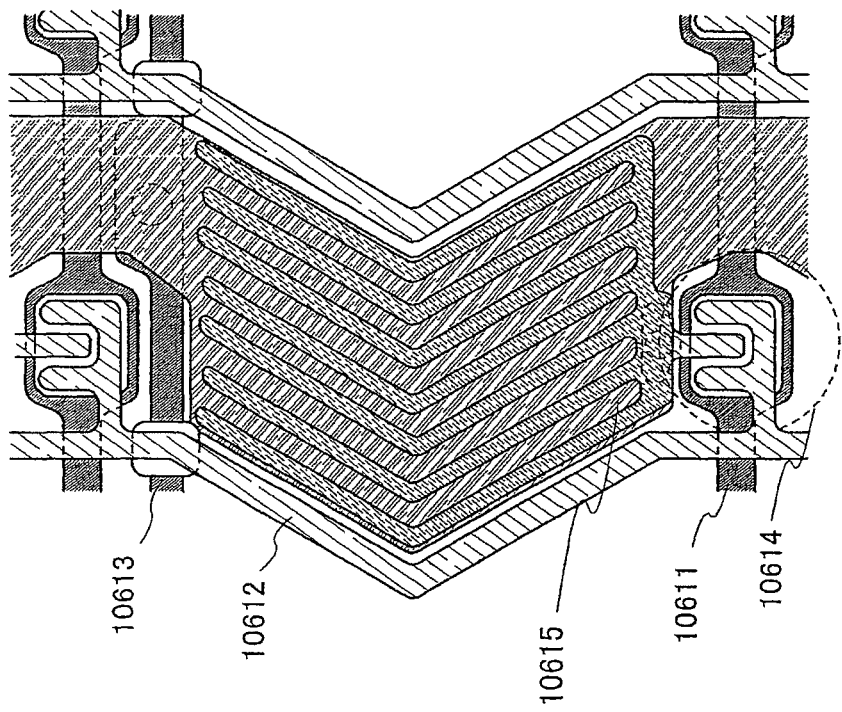
FIGS. 72A and 72B are examples of pixel layout of a semiconductor device in accordance with the present invention.

FIG. 72A is an example of a top plan view of a pixel in the case where an IPS mode and a transistor are combined. By applying the pixel structure shown in FIG. 72A to a liquid crystal display device, a liquid crystal display device theoretically having a wide viewing angle and response speed which has low dependency on a gray scale can be obtained.

The pixel shown in FIG. 72A includes a scan line 10601, a video signal line 10602, a common electrode 10603, a transistor 10604, and a pixel electrode 10605.

Figure 72B:
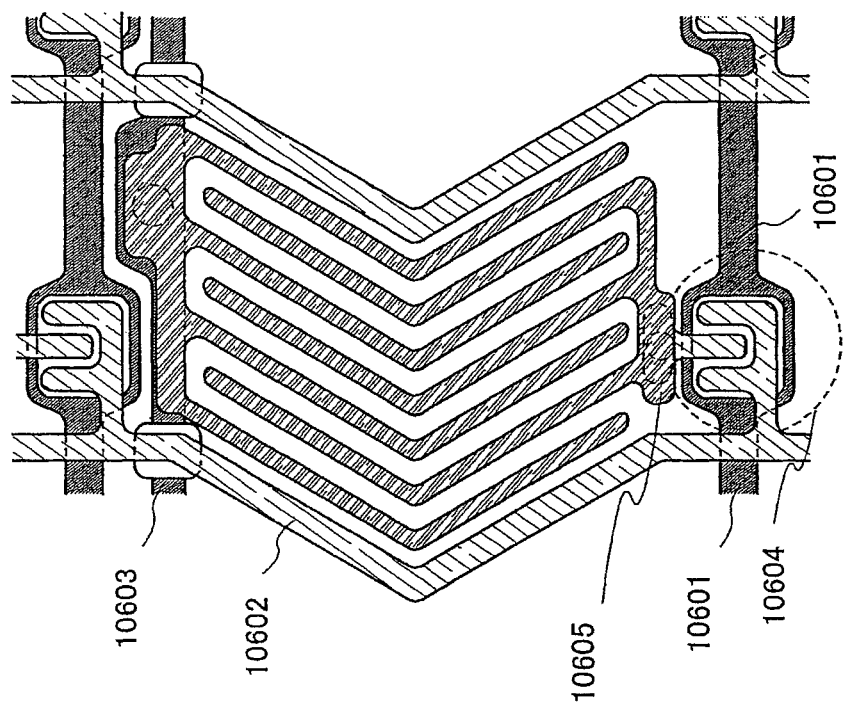

FIG. 72B is an example of a top plan view of a pixel in the case where an FFS mode and a transistor are combined. By applying the pixel structure shown in FIG. 72B to a liquid crystal display device, a liquid crystal display device theoretically having a wide viewing angle and response speed which has low dependency on a gray scale can be obtained.

The pixel shown in FIG. 72B includes a scan line 10611, a video signal line 10612, a common electrode 10613, a transistor 10614, and a pixel electrode 10615.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 15]

In this embodiment mode, a structure and an operation of a pixel in a display device are described.

Figures 73A, 73B:
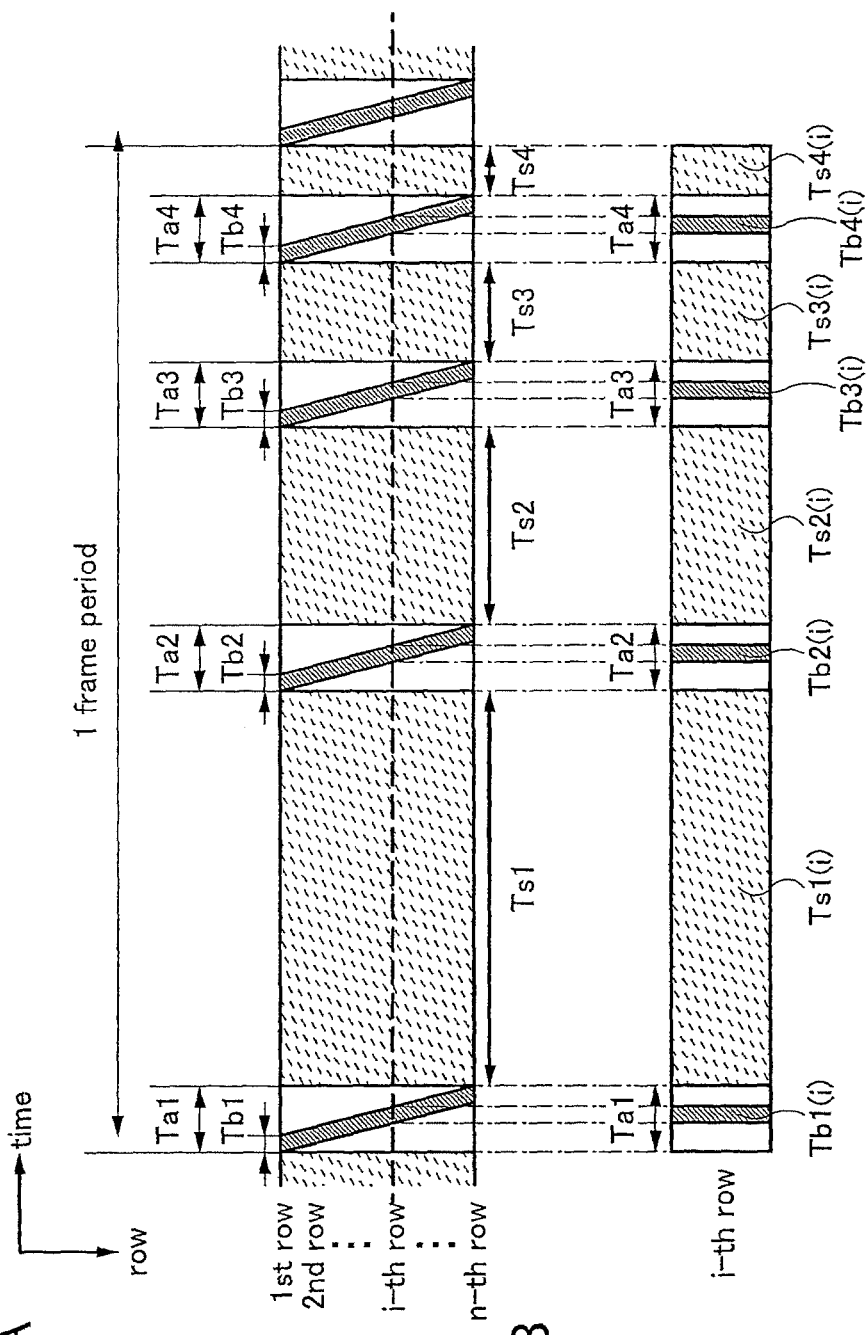
FIGS. 73A and 73B are timing charts each showing a method for driving a semiconductor device in accordance with the present invention.

FIGS. 73A and 73B are timing charts showing an example of digital time ratio gray scale driving. The timing chart in FIG. 73A shows a driving method in which a signal writing period (an address period) to a pixel and a light-emitting period (a sustain period) are divided.

One frame period is a period for fully displaying an image for one display region. One frame period includes a plurality of subframe periods, and one subframe period includes an address period and a sustain period. Address periods Ta1 to Ta4 indicate time for writing signals to pixels in all rows, and periods Tb1 to Tb4 indicate time for writing signals to pixels in one row (or one pixel). Sustain periods Ts1 to Ts4 indicate time for maintaining a lighting state or a non-lighting state in accordance with a video signal written to the pixel, and a ratio of the length of the sustain periods is set to satisfy Ts1:Ts2:Ts3:Ts4=$2^3$:$2^2$:$2^1$:$2^0$=8:4:2:1. A gray scale is expressed depending on which sustain period light emission is performed.

Here, a pixel of the i-th row is described with reference to FIG. 73B. First, in the address period Ta1, a pixel selection signal is input to a scan line in order from a first row, and in a period Tb1($i$) in the address period Ta1, the pixel of the i-th row is selected. Then, while the pixel of the i-th row is selected, a video signal is input to the pixel of the i-th row from a signal line. Then, when the video signal is written to the pixel of the i-th row, the pixel of the i-th row maintains the signal until a signal is input again. Lighting and non-lighting of the pixel of the i-th row in the sustain period Ts1 are controlled by the written video signal. Similarly, in the address periods Ta2, Ta3, and Ta4, a video signal is input to the pixel of the i-th row, and lighting and non-lighting of the pixel of the i-th row in the sustain periods Ts2, Ts3, and Ts4 are controlled by the video signal. Then, in each subframe period, a pixel to which a signal for not lighting in the address period and for lighting when the sustain period starts after the address period ends is written is lit.

Here, the case where a 4-bit gray scale is expressed; however, the number of bits and the number of gray scales are not limited to these. Note that lighting is not needed to be performed in order of Ts1, Ts2, Ts3, and Ts4, and the order may be random or light emission may be performed in the period divided into a plurality of periods. A ratio of lighting times of Ts1, Ts2, Ts3, and Ts4 is not needed to be power-of-two, and may be the same length or slightly different from a power of two.

Next, a driving method when a signal writing period (an address period) to a pixel and a light-emitting period (a sustain period) are not divided is described. A pixel in a row in which a writing operation of a video signal is completed maintains the signal until another signal is written to the pixel (or the signal is erased). Data holding time is a period between the writing operation and until another signal is written to the pixel. In the data holding time, the pixel is lit or not lit in accordance with the video signal written to the pixel. The same operations are performed until the last row, and the address period ends. Then, an operation proceeds to a signal writing operation in a next subframe period sequentially from a row in which the data holding time ends.

As described above, in the case of a driving method in which a pixel is lit or not lit in accordance with a video signal written to the pixel immediately after the signal writing operation is completed and the data holding time starts, signals cannot be input to two rows at the same time. Accordingly, address periods need to be prevented from overlapping. Therefore, the data holding time cannot be made shorter than the address period. As a result, it becomes difficult to perform high-level gray scale display.

Figures 74A, 74B:
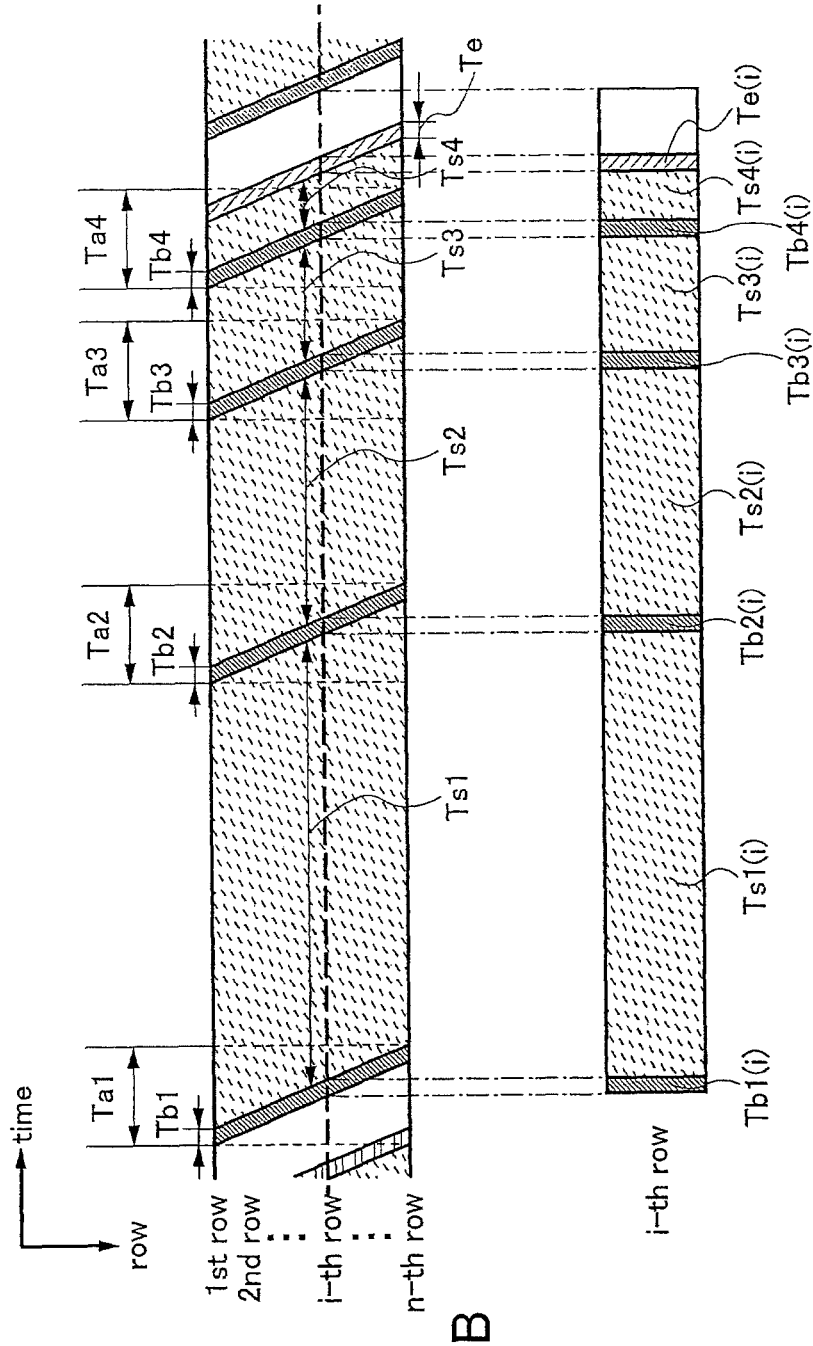
FIGS. 74A and 74B are timing charts each showing a method for driving a semiconductor device in accordance with the present invention.

Thus, the data holding time is set to be shorter than the address period by providing an erasing period. FIG. 74A shows a driving method when the data holding time is set shorter than the address period by providing an erasing period.

Here, the pixel of the i-th row is described with reference to FIG. 74B. In the address period Ta1, a pixel scan signal is input to a scan line in order from a first row, and a pixel is selected. Then, in the period Tb1($i$), while the pixel of the i-th row is selected, a video signal is input to the pixel of the i-th row. Then, when the video signal is written to the pixel of the i-th row, the pixel of the i-th row maintains the signal until a signal is input again. Lighting and non-lighting of the pixel of the i-th row in the sustain period Ts1(i) are controlled by the written video signal. That is, the pixel of the i-th row is lit or not lit in accordance with the video signal written to the pixel immediately after the writing operation of the video signal to the i-th row is completed. Similarly, in the address periods Ta2, Ta3, and Ta4, a video signal is input to the pixel of the i-th row, and lighting and non-lighting of the pixel of the i-th row in the sustain periods Ts2, Ts3, and Ts4 are controlled by the video signal. Then, the end of a sustain period Ts4(i) is set by the start of an erasing operation. This is because the pixel is forced to be not lit regardless of the video signal written to the pixel of the i-th row in an erasing time Te(i). That is, the data holding time of the pixel of the i-th row ends when the erasing time Te(i) starts.

Thus, a display device with a high-level gray scale, a high duty ratio (a ratio of a lighting period in one frame period) can be provided, in which data holding time is shorter than an address period without dividing the address period and a sustain period can be provided. Reliability of a display element can be improved because instantaneous luminance can be lowered.

Here, the case where a 4-bit gray scale is expressed; however, the number of bits and the number of gray scales are not limited to these. Note that lighting is not needed to be performed in order of Ts1, Ts2, Ts3, and Ts4, and the order may be random or light emission may be performed in the period divided into a plurality of periods. A ratio of lighting times of Ts1, Ts2, Ts3, and Ts4 is not needed to be power-of-two, and may be the same length or slightly different from a power of two.

A structure and an operation of a pixel to which digital time ratio gray scale driving can be applied are described.

Figure 75:
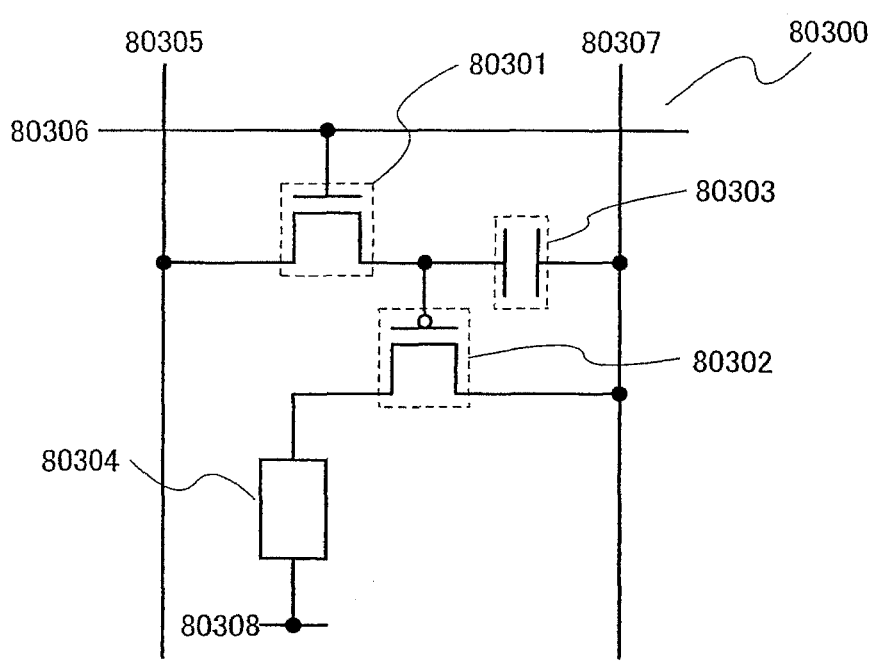
FIG. 75 is a diagram showing a structure of a pixel of a semiconductor device in accordance with the present invention.

FIG. 75 is a diagram showing an example of a pixel structure to which digital time ratio gray scale driving can be applied.

A pixel 80300 includes a switching transistor 80301, a driving transistor 80302, a light-emitting element 80304, and a capacitor 80303. A gate of the switching transistor 80301 is connected to a scan line 80306; a first electrode (one of a source electrode and a drain electrode) of the switching transistor 80301 is connected to a signal line 80305; and a second electrode (the other of the source electrode and the drain electrode) of the switching transistor 80301 is connected to a gate of the driving transistor 80302. The gate of the driving transistor 80302 is connected to a power supply line 80307 through the capacitor 80303; a first electrode of the driving transistor 80302 is connected to the power supply line 80307; and a second electrode of the driving transistor 80302 is connected to a first electrode (a pixel electrode) of the light-emitting element 80304. A second electrode of the light-emitting element 80304 corresponds to a common electrode 80308.

The second electrode of the light-emitting element 80304 (the common electrode 80308) is set to a low power supply potential. The low power supply potential is a potential satisfying the low power supply potential<a high power supply potential based on the high power supply potential set to the power supply line 80307. As the low power supply potential, GND, 0 V, and the like may be employed, for example. A potential difference between the high power supply potential and the low power supply potential is applied to the light-emitting element 80304, and current is supplied to the light-emitting element 80304. Here, in order to make the light-emitting element 80304 emit light, each potential is set so that the potential difference between the high power supply potential and the low power supply potential is a forward threshold voltage or more.

Gate capacitance of the driving transistor 80302 may be used as a substitute for the capacitor 80303, so that the capacitor 80303 can be omitted. The gate capacitance of the driving transistor 80302 may be formed in a region where a source region, a drain region, an LDD region, overlaps with the gate electrode. Alternatively, capacitance may be formed between a channel region and the gate electrode.

In the case of voltage-input voltage driving method, a video signal is input to the gate of the driving transistor 80302 so that the driving transistor 80302 is in either of two states of being sufficiently turned on and turned off. That is, the driving transistor 80302 operates in a linear region.

The video signal such that the driving transistor 80302 operates in a saturation region is input, so that current can be supplied to the light-emitting element 80304. When the light-emitting element 80304 is an element luminance of which is determined in accordance with current, luminance decay due to deterioration of the light-emitting element 80304 can be suppressed. Further, when the video signal is an analog signal, current corresponding to the video signal can be supplied to the light-emitting element 80304. In this case, analog gray scale drive can be performed.

A structure and an operation of a pixel called a threshold voltage compensation pixel are described. A threshold voltage compensation pixel can be applied to digital time gray scale drive and analog gray scale drive.

Figure 76:
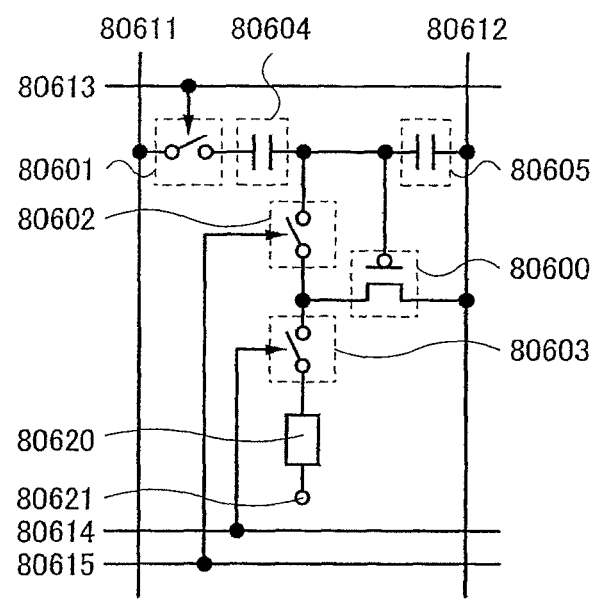
FIG. 76 is a diagram showing a structure of a pixel of a semiconductor device in accordance with the present invention.

FIG. 76 is a diagram showing an example of a structure of a pixel called a threshold voltage compensation pixel.

The pixel in FIG. 76 includes a driving transistor 80600, a first switch 80601, a second switch 80602, a third switch 80603, a first capacitor 80604, a second capacitor 80605, and a light-emitting element 80620. A gate of the driving transistor 80600 is connected to a signal line 80611 through the first capacitor 80604 and the first switch 80601 in this order. Further, the gate of the driving transistor 80600 is connected to a power supply line 80612 through the second capacitor 80605. A first electrode of the driving transistor 80600 is connected to the power supply line 80612. A second electrode of the driving transistor 80600 is connected to a first electrode of the light-emitting element 80620 through the third switch 80603. Further, the second electrode of the driving transistor 80600 is connected to the gate of the driving transistor 80600 through the first electrode of the light-emitting element 80620. A second electrode of the light-emitting element 80620 corresponds to a common electrode 80621. Note that on/off of the first switch 80601, the second switch 80602, and the third switch 80603 is controlled by a signal input to a first scan line 80613, a signal input to a second scan line 80615, and a signal input to a third scan line 80614, respectively.

A pixel structure shown in FIG. 76 is not limited this. For example, a switch, a resistor, a capacitor, a transistor, a logic circuit, or the like may be added to the pixel in FIG. 76. For example, the second switch 80602 may include a P-channel transistor or an n-channel transistor, the third switch 80603 may include a transistor with polarity opposite to that of the second switch 80602, and the second switch 80602 and the third switch 80603 may be controlled by the same scan line.

A structure and an operation of a pixel called a current input pixel are described. A current input pixel can be applied to digital gray scale driving and analog gray scale driving.

Figure 77:
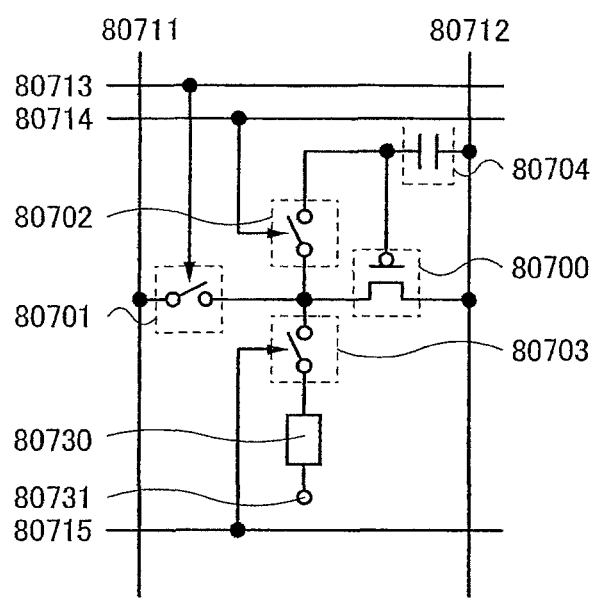
FIG. 77 is a diagram showing a structure of a pixel of a semiconductor device in accordance with the present invention.

FIG. 77 is a diagram showing an example of a structure of a pixel called a current input pixel.

The pixel in FIG. 77 includes a driving transistor 80700, a first switch 80701, a second switch 80702, a third switch

80703, a capacitor 80704, and a light-emitting element 80730. A gate of the driving transistor 80700 is connected to a signal line 80711 through the second switch 80702 and the first switch 80701 in this order. Further, the gate of the driving transistor 80700 is connected to a power supply line 80712 through the capacitor 80704. A first electrode of the driving transistor 80700 is connected to the power supply line 80712. A second electrode of the driving transistor 80700 is connected to the signal line 80711 through the first switch 80701. Further, the second electrode of the driving transistor 80700 is connected to a first electrode of the light-emitting element 80730 through the third switch 80703. A second electrode of the light-emitting element 80730 corresponds to a common electrode 80731. Note that on/off of the first switch 80701, the second switch 80702, and the third switch 80703 is controlled by a signal input to a first scan line 80713, a signal input to a second scan line 80714, and a signal input to a third scan line 80715, respectively.

A pixel structure shown in FIG. 77 is not limited to this. For example, a switch, a resistor, a capacitor, a transistor, a logic circuit, or the like may be added to the pixel in FIG. 77. For example, the first switch 80701 may include a P-channel transistor or an N-channel transistor, the second switch 80702 may include a transistor with the same polarity as that of the first switch 80701, and the first switch 80701 and the second switch 80702 may be controlled by the same scan line. The second switch 80702 may be provided between the gate of the driving transistor 80700 and the signal line 80711.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 16]

In this embodiment mode, a pixel structure of a display device is described. In particular, a pixel structure of a display device using an organic EL element is described.

Figure 78A:
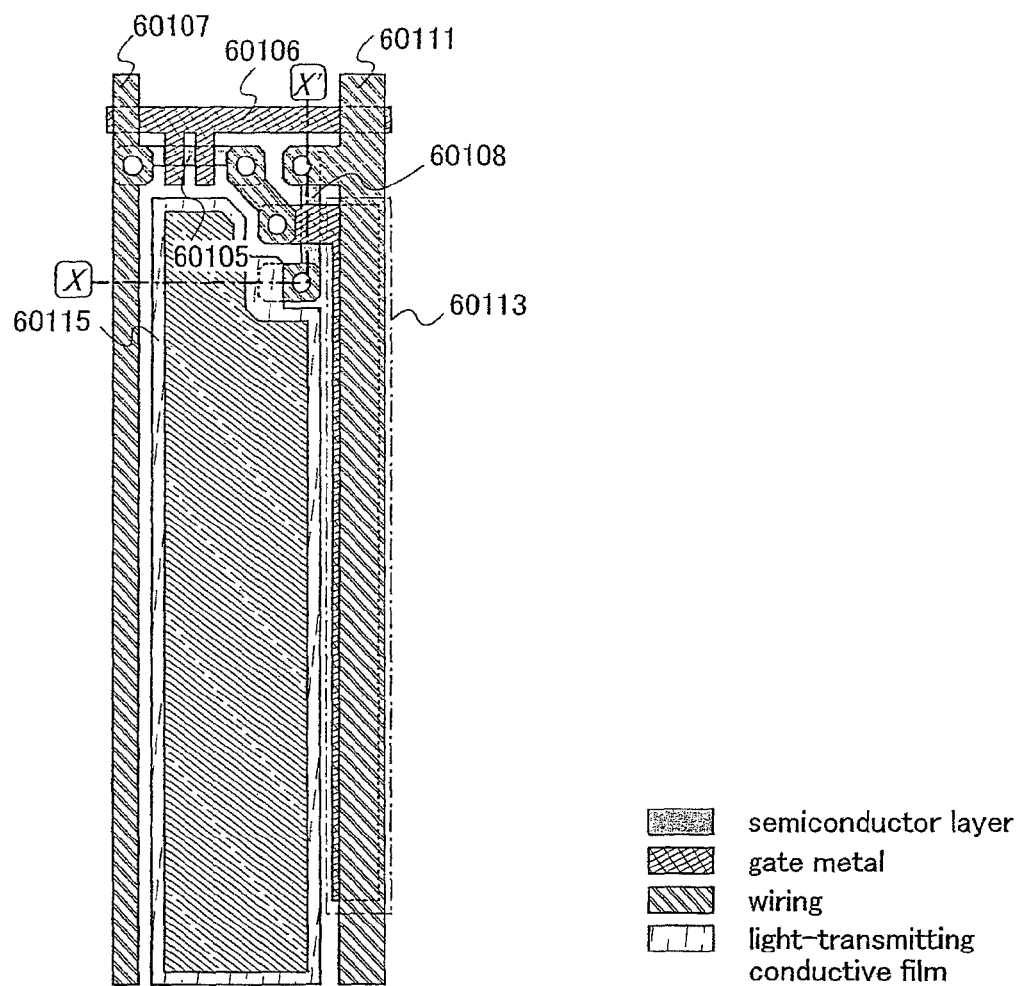
FIGS. 78A and 78B are an example of pixel layout of a semiconductor device and a cross-sectional view thereof in accordance with the present invention.
Figure 78B:
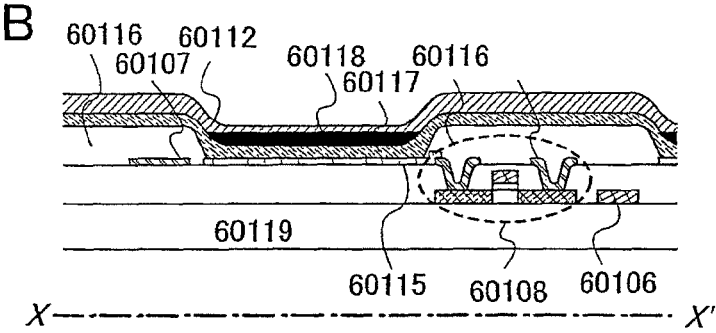

FIG. 78A shows an example of a top plan view (a layout diagram) of a pixel including two transistors. FIG. 78B shows an example of a cross-sectional view taken along X-X' in FIG. 78A.

FIGS. 78A and 78B show a first transistor 60105, a first wiring 60106, a second wiring 60107, a second transistor 60108, a third wiring 60111, a counter electrode 60112, a capacitor 60113, a pixel electrode 60115, a partition wall 60116, an organic conductive film 60117, an organic thin film 60118, and a substrate 60119. Note that it is preferable that the first transistor 60105 be used as a switching transistor, the second transistor 60108 as a driving transistor, the first wiring 60106 as a gate signal line, the second wiring 60107 as a source signal line, and the third wiring 60111 as a current supply line.

A gate electrode of the first transistor 60105 is electrically connected to the first wiring 60106, one of a source electrode and a drain electrode of the first transistor 60105 is electrically connected to the second wiring 60107, and the other of the source electrode or the drain electrode of the first transistor 60105 is electrically connected to a gate electrode of the second transistor 60108 and one electrode of the capacitor 60113. Note that the gate electrode of the first transistor 60105 includes a plurality of gate electrodes. Accordingly, leakage current in the off state of the first transistor 60105 can be reduced.

One of a source electrode and a drain electrode of the second transistor 60108 is electrically connected to the third wiring 60111, and the other of the source electrode or the drain electrode of the second transistor 60108 is electrically connected to the pixel electrode 60115. Accordingly, current flowing to the pixel electrode 60115 can be controlled by the second transistor 60108.

The organic conductive film 60117 is provided over the pixel electrode 60115, and the organic thin film 60118 (an organic compound layer) is further provided thereover. The counter electrode 60112 is provided over the organic thin film 60118 (the organic compound layer). Note that the counter electrode 60112 may be formed over a surface of all pixels to be commonly connected to all the pixels, or may be patterned using a shadow mask or the like.

Light emitted from the organic thin film 60118 (the organic compound layer) is transmitted through either the pixel electrode 60115 or the counter electrode 60112.

In FIG. 78B, the case where light is emitted to the pixel electrode side, that is, a side on which the transistor and the like are formed is referred to as bottom emission; and the case where light is emitted to the counter electrode side is referred to as top emission.

In the case of bottom emission, it is preferable that the pixel electrode 60115 be formed of a light-transmitting conductive film. In the case of top emission, it is preferable that the counter electrode 60112 be formed of a light-transmitting conductive film.

In a light-emitting device for color display, EL elements having respective light emission colors of RGB may be separately formed, or an EL element with a single color may be formed over an entire surface uniformly and light emission of RGB can be obtained by using a color filter.

Note that the structures shown in FIGS. 78A and 78B are examples, and various structures can be employed for a pixel layout, a cross-sectional structure, a stacking order of electrodes of an EL element, and the like, as well as the structures shown in FIGS. 78A and 78B. Further, as a light-emitting element, various elements such as a crystalline element such as an LED, and an element formed of an inorganic thin film can be used as well as the element formed of the organic thin film shown in the drawing.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 17]

In this embodiment mode, a structure of an EL element is described. In particular, a structure of an organic EL element is described.

A structure of a mixed junction EL element is described. As an example, a structure is described, which includes a layer (a mixed layer) in which a plurality of materials among a hole injecting material, a hole transporting material, a light-emitting material, an electron transporting material, an electron injecting material, and the like are mixed (hereinafter referred to as a mixed junction type EL element), which is different from a stacked-layer structure where a hole injecting layer formed of a hole injecting material, a hole transporting layer formed of a hole transporting material, a light-emitting layer formed of a light-emitting material, an electron transporting layer formed of an electron transporting material, an electron injecting layer formed of an electron injecting material, and the like are clearly distinguished.

FIGS. 79A to 79E are schematic views each showing a structure of a mixed junction type EL element. Note that a layer interposed between the anode 190101 and the cathode 190102 corresponds to an EL layer.

In the structure shown in FIG. 79A, the EL layer includes a hole transporting region 190103 formed of a hole transporting material and an electron transporting region 190104 formed of an electron transporting material. The hole transporting region 190103 is closer to the anode than the electron transporting region 190104. A mixed region 190105 including both the hole transporting material and the electron transporting material is provided between the hole transporting region 190103 and the electron transporting region 190104.

In the direction from the anode 190101 to the cathode 190102, a concentration of the hole transporting material in the mixed region 190105 is decreased and a concentration of the electron transporting material in the mixed region 190105 is increased.

A concentration gradient can be freely set. For example, a ratio of concentrations of each functional material may be changed (a concentration gradient may be formed) in the mixed region 190105 including both the hole transporting material and the electron transporting material, without including the hole transporting layer 190103 formed of only the hole transporting material. Alternatively, a ratio of concentrations of each functional material may be changed (a concentration gradient may be formed) in the mixed region 190105 including both the hole transporting material and the electron transporting material, without including the hole transporting layer 190103 formed of only the hole transporting material and the electron transporting layer 190104 formed of only the electron transporting material. A ratio of concentrations may be changed depending on a distance from the anode or the cathode. Further, the ratio of concentrations may be changed continuously.

A region 190106 to which a light-emitting material is added is included in the mixed region 190105. A light emission color of the EL element can be controlled by the light-emitting material. Further, carriers can be trapped by the light-emitting material. As the light-emitting material, various fluorescent dyes as well as a metal complex having a quinoline skeleton, a benzooxazole skeleton, or a benzothiazole skeleton can be used. The light emission color of the EL element can be controlled by adding the light-emitting material.

As the anode 190101, an electrode material having a high work function is preferably used in order to inject holes efficiently. For example, a transparent electrode formed of indium tin oxide (ITO), indium zinc oxide (IZO), ZnO, SnO$_2$, In$_2$O$_3$, or the like can be used. When a light-transmitting property is not needed, the anode 190101 may be formed of an opaque metal material.

As the hole transporting material, an aromatic amine compound or the like can be used.

As the electron transporting material, a metal complex having a quinoline derivative, 8-quinolinol, or a derivative thereof as a ligand (especially tris(8-quinolinolato)aluminum (Alq$_3$)), or the like can be used.

As the cathode 190102, an electrode material having a low work function is preferably used in order to inject electrons efficiently. For example, a metal such as aluminum, indium, magnesium, silver, calcium, barium, or lithium can be used by itself. Alternatively, an alloy of the aforementioned metal or an alloy of the aforementioned metal and another metal may be used.

FIG. 79B is the schematic view of the structure of the EL element, which is different from that of FIG. 79A. Note that portions which are the same as those in FIG. 79A are denoted by the same reference numerals and description thereof is omitted.

In FIG. 79B, a region to which a light-emitting material is added is not included. However, when a material (an electron-transporting and light-emitting material) having both an electron transporting property and a light-emitting property, for example, tris(8-quinolinolato)aluminum (Alq$_3$) is used as a material added to the electron transporting region 190104, light emission can be performed.

Alternatively, as a material added to the hole transporting region 190103, a material (a hole-transporting and light-emitting material) having both a hole transporting property and a light-emitting property may be used.

FIG. 79C is the schematic view of the structure of the EL element, which is different from those of FIGS. 79A and 79B. Note that portions which are the same as those in FIGS. 79A and 79B are denoted by the same reference numerals and description thereof is omitted.

In FIG. 79C, a region 190107 included in the mixed region 190105 is provided, to which a hole blocking material having a larger energy difference between the highest occupied molecular orbital and the lowest unoccupied molecular orbital than the hole transporting material is added. The region 190107 to which the hole blocking material is added is provided closer to the cathode 190102 than the region 190106 to which the light-emitting material is added in the mixed region 190105; thus, a recombination rate of carriers and light emission efficiency can be increased. The aforementioned structure provided with the region 190107 to which the hole blocking material is added is especially effective in an EL element which utilizes light emission (phosphorescence) by a triplet exciton.

FIG. 79D is the schematic view of the structure of the EL element, which is different from those of FIGS. 79A to 79C.

Note that portions which are the same as those in FIGS. 79A to 79C are denoted by the same reference numerals and description thereof is omitted.

In FIG. 79D, a region 190108 included in the mixed region 190105 is provided, to which an electron blocking material having a larger energy difference between the highest occupied molecular orbital and the lowest unoccupied molecular orbital than the electron transporting material is added. The region 190108 to which the electron blocking material is added is provided closer to the anode 190101 than the region 190106 to which the light-emitting material is added in the mixed region 190105; thus, a recombination rate of carriers and light emission efficiency can be increased. The aforementioned structure provided with the region 190108 to which the electron blocking material is added is especially effective in an EL element which utilizes light emission (phosphorescence) by a triplet exciton.

FIG. 79E is the schematic view of the structure of the mixed junction type EL element, which is different from those of FIGS. 79A to 79D. FIG. 79E shows an example of a structure where a region 190109 to which a metal material is added is included in part of an EL layer in contact with an electrode of the EL element. In FIG. 79E, portions which are the same as those in FIGS. 79A to 79D are denoted by the same reference numerals and description thereof is omitted. In FIG. 79E, MgAg (a Mg—Ag alloy) may be used as the cathode 190102, and the region 190109 to which an Al (aluminum) alloy is added may be included in a region of the electron transporting region 190104 to which the electron transporting material is added, which is in contact with the cathode 190102, for example. By the aforementioned structure, oxidation of the cathode can be prevented, and electron injection efficiency from the cathode can be increased. Therefore, the lifetime of the mixed junction type EL element can be extended, and a driving voltage can be lowered.

As a method of forming the aforementioned mixed junction type EL element, a co-evaporation method or the like can be used.

In the mixed junction type EL elements as shown in FIGS. 79A to 79E, a clear interface between the layers does not exist, and charge accumulation can be reduced. Thus, the lifetime of the EL element can be extended, and a driving voltage can be lowered.

Note that the structures shown in FIGS. 79A to 79E can be combined with each other.

A structure of the mixed junction type EL element is not limited to those described above, and various structures can be freely used.

An organic material which forms an EL layer of an EL element may be a low molecular material or a high molecular material, and both of the materials may be used. When a low molecular material is used as an organic compound material, a film can be formed by an evaporation method. When a high molecular material is used as the EL layer, the high molecular material is dissolved in a solvent and a film can be formed by a spin coating method or an ink-jet method.

The EL layer may be formed of a middle molecular material. In this specification, a middle molecule organic light-emitting material denotes an organic light-emitting material without a sublimation property and with a polymerization degree of approximately 20 or less. When a middle molecular material is used as the EL layer, a film can be formed by an ink-jet method or the like.

A low molecular material, a high molecular material, and a middle molecular material may be used in combination.

An EL element may utilize either light emission (fluorescence) by a singlet exciton or light emission (phosphorescence) by a triplet exciton.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 18]

In this embodiment mode, a structure of an EL element is described. In particular, a structure of an inorganic EL element is described.

As a base material to be used for a light-emitting material, sulfide, oxide, or nitride can be used. As sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used, for example. As oxide, zinc oxide (ZnO), yttrium oxide ($Y_2O_3$), or the like can be used, for example. As nitride, aluminum nitride (AlN), gallium nitride (GaN), indium nitride (InN), or the like can be used, for example. Further, zinc selenide (ZnSe), zinc telluride (ZnTe), or the like; or a ternary mixed crystal such as calcium gallium sulfide ($CaGa_2S_4$), strontium gallium sulfide ($SrGa_2S_4$), or barium gallium sulfide ($BaGa_2S_4$) may be used.

As a luminescence center for localized light emission, manganese (Mn), copper (Cu), samarium (Sm), terbium (Tb), erbium (Er), thulium (Tm), europium (Eu), cerium (Ce), praseodymium (Pr), or the like can be used. Further, a halogen element such as fluorine (F) or chlorine (Cl) may be added for charge compensation.

On the other hand, as a luminescence center for donor-acceptor recombination light emission, a light-emitting material including a first impurity element forming a donor level and a second impurity element forming an acceptor level can be used. As the first impurity element, fluorine (F), chlorine (Cl), aluminum (Al), or the like can be used, for example. As the second impurity element, copper (Cu), silver (Ag), or the like can be used, for example.

Figure 80A:
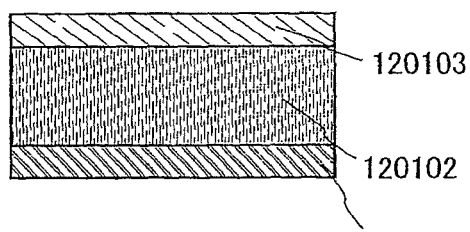
FIGS. 80A to 80C are cross-sectional views of display elements of a semiconductor device in accordance with the present invention.
Figure 80B:
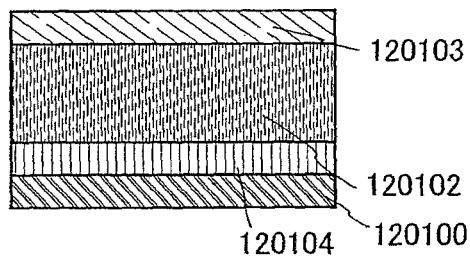
Figure 80C:
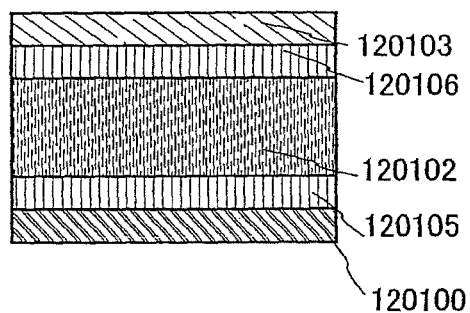

FIGS. 80A to 80C each show an example of a thin-film type inorganic EL element which can be used as a light-emitting element. In FIGS. 80A to 80C, the light-emitting element includes a first electrode layer 120100, an electroluminescent layer 120102, and a second electrode layer 120103.

The light-emitting elements in FIGS. 80B and 80C each have a structure where an insulating film is provided between the electrode layer and the electroluminescent layer in the light-emitting element in FIG. 80A. The light-emitting element in FIG. 80B includes an insulating film 120104 between the first electrode layer 120100 and the electroluminescent layer 120102. The light-emitting element in FIG. 80C includes an insulating film 120105 between the first electrode layer 120100 and the electroluminescent layer 120102, and an insulating film 120106 between the second electrode layer 120103 and the electroluminescent layer 120102. Accordingly, the insulating film may be provided between the electroluminescent layer and one of the electrode layers interposing the electroluminescent layer, or may be provided between the electroluminescent layer and each of the electrode layers interposing the electroluminescent layer. Further, the insulating film may be a single layer or stacked layers including a plurality of layers.

Figure 81A:
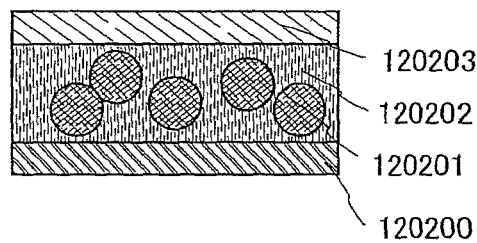
FIGS. 81A to 81C are cross-sectional views of display elements of a semiconductor device in accordance with the present invention.
Figure 81B:
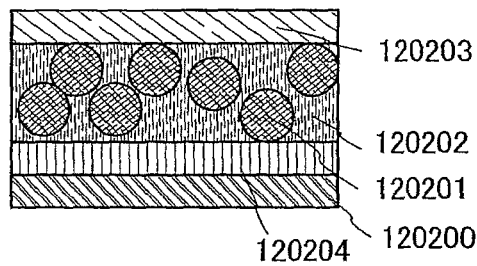
Figure 81C:
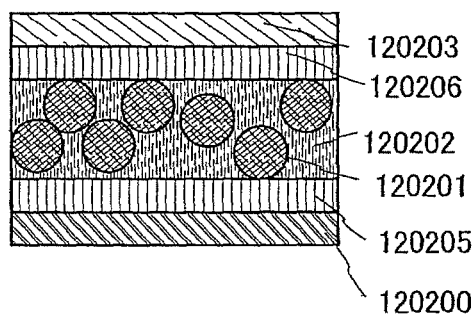

FIGS. 81A to 81C each show an example of a dispersion type inorganic EL element which can be used as a light-emitting element. A light-emitting element in FIG. 81A has a stacked-layer structure of a first electrode layer 120200, an electroluminescent layer 120202, and a second electrode layer 120203. The electroluminescent layer 120202 includes a light-emitting material 120201 held by a binder.

The light-emitting elements in FIGS. 81B and 81C each have a structure where an insulating film is provided between the electrode layer and the electroluminescent layer in the light-emitting element in FIG. 81A. The light-emitting element in FIG. 81B includes an insulating film 120204 between the first electrode layer 120200 and the electroluminescent layer 120202. The light-emitting element in FIG. 81C includes an insulating film 120205 between the first electrode layer 120200 and the electroluminescent layer 120202, and an insulating film 120206 between the second electrode layer 120203 and the electroluminescent layer 120202. Accordingly, the insulating film may be provided between the electroluminescent layer and one of the electrode layers interposing the electroluminescent layer, or may be provided between the electroluminescent layer and each of the electrode layers interposing the electroluminescent layer. Further, the insulating film may be a single layer or stacked layers including a plurality of layers.

The insulating film 120204 is provided in contact with the first electrode layer 120200 in FIG. 81B; however, the insulating film 120204 may be provided in contact with the second electrode layer 120203 by reversing the positions of the insulating film and the electroluminescent layer.

It is preferable that a material which can be used for the insulating films such as the insulating film 120104 in FIG. 80B and the insulating film 120204 in FIG. 81B has high withstand voltage and dense film quality. Further, the material preferably has high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), or zirconium oxide ($ZrO_2$); or a mixed film of those materials or a stacked-layer film including two or more of those materials can be used. The insulating film can be formed by sputtering, evaporation, CVD, or the like. Alternatively, the insulating film may be formed by dispersing particles of these insulating materials in a binder. A binder material may be formed using a material similar to that of a binder contained in the electroluminescent layer, by using a method similar thereto. The thickness of the insulating film is not particularly limited, but preferably in the range of 10 to 1000 nm.

The light-emitting element can emit light when a voltage is applied between the pair of electrode layers interposing the electroluminescent layer. The light-emitting element can operate with DC drive or AC drive.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 19]

In this embodiment mode, an example of a display device is described. In particular, the case where a display device is optically treated is described.

A rear projection display device 130100 in FIGS. 82A and 82B is provided with a projector unit 130111, a mirror 130112, and a screen panel 130101. The rear projection display device 130100 may also be provided with a speaker 130102 and operation switches 130104. The projector unit 130111 is provided at a lower portion of a housing 130110 of the rear projection display device 130100, and projects incident light for projecting an image based on an image signal to the mirror 130112. The rear projection display device 130100 displays an image projected from a rear surface of the screen panel 130101.

Figure 83:
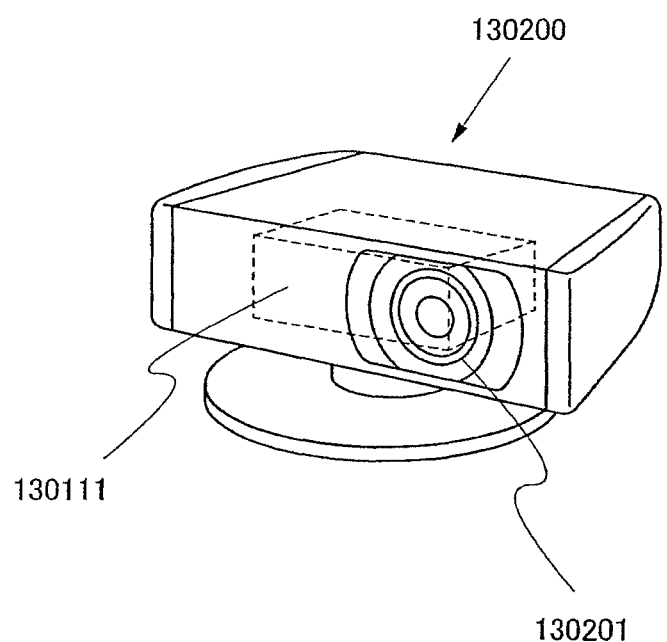
FIG. 83 is a view showing a structure of a semiconductor device in accordance with the present invention.

FIG. 83 shows a front projection display device 130200. The front projection display device 130200 is provided with the projector unit 130111 and a projection optical system 130201. The projection optical system 130201 projects an image to a screen or the like provided at the front.

Hereinafter, a structure of the projector unit 130111 which is applied to the rear projection display device 130100 in FIGS. 82A and 82B and the front projection display device 130200 in FIG. 83 is described.

Figure 84:
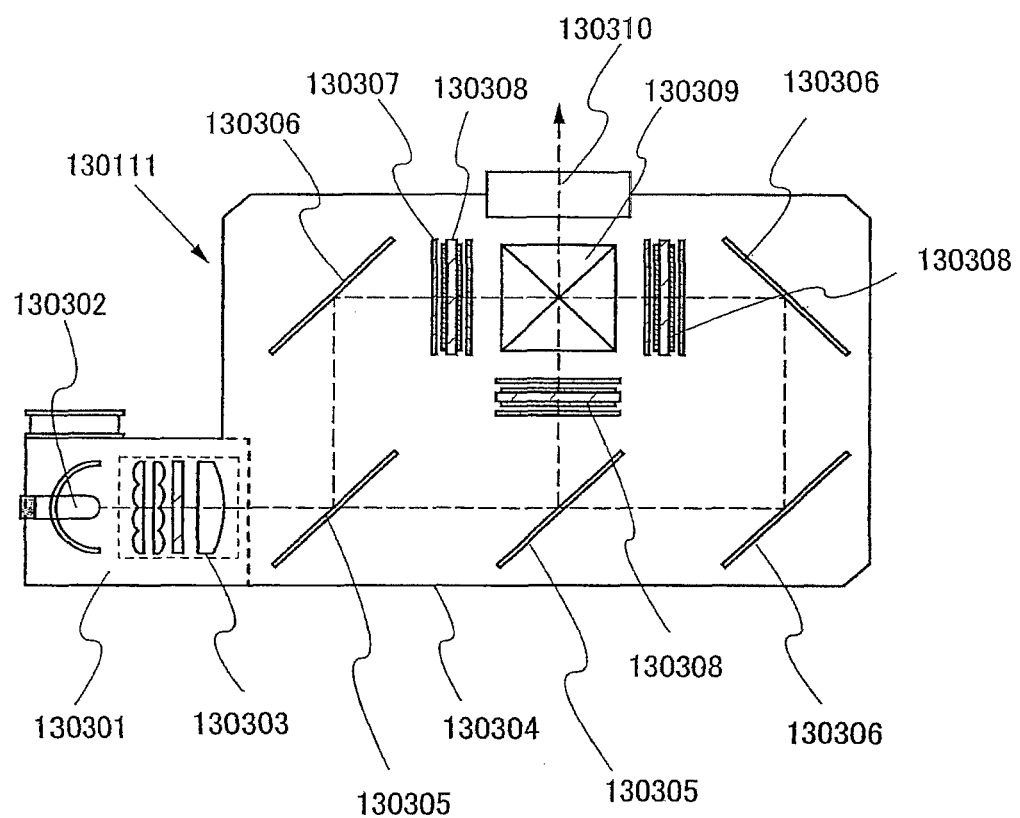
FIG. 84 is a view showing a structure of a semiconductor device in accordance with the present invention.

FIG. 84 shows a structure example of the projector unit 130111. The projector unit 130111 is provided with a light source unit 130301 and a modulation unit 130304. The light source unit 130301 is provided with a light source optical system 130303 including lenses and a light source lamp 130302. The light source lamp 130302 is stored in a housing so that stray light is not scattered. As the light source lamp 130302, a high-pressure mercury lamp or a xenon lamp, for example, which can emit a large amount of light is used. The light source optical system 130303 is provided with an optical lens, a film having a function to polarize light, a film for adjusting phase difference, an IR film, or the like as appropriate. The light source unit 130301 is provided so that incident light is incident on the modulation unit 130304. The modulation unit 130304 is provided with a plurality of display panels 130308, a color filter, a dichroic mirror 130305, a total reflection mirror 130306, a retardation plate 130307, a prism 130309, and a projection optical system 130310. Light emitted from the light source unit 130301 is split into a plurality of optical paths by the dichroic mirror 130305.

Each optical path is provided with a color filter which transmits light with a predetermined wavelength or wavelength range and the display panel 130308. The transmissive display panel 130308 modulates transmitted light based on an image signal. Light of each color transmitted through the display panel 130308 is incident on the prism 130309, and an image is displayed on the screen through the projection optical system 130310. Note that a Fresnel lens may be provided between the mirror and the screen. Projected light which is projected by the projector unit 130111 and reflected by the mirror is converted into generally parallel light by the Fresnel lens to be projected on the screen. Displacement between a chief ray and an optical axis is preferably ±10° or less, and more preferably, ±5° or less.

Figure 85:
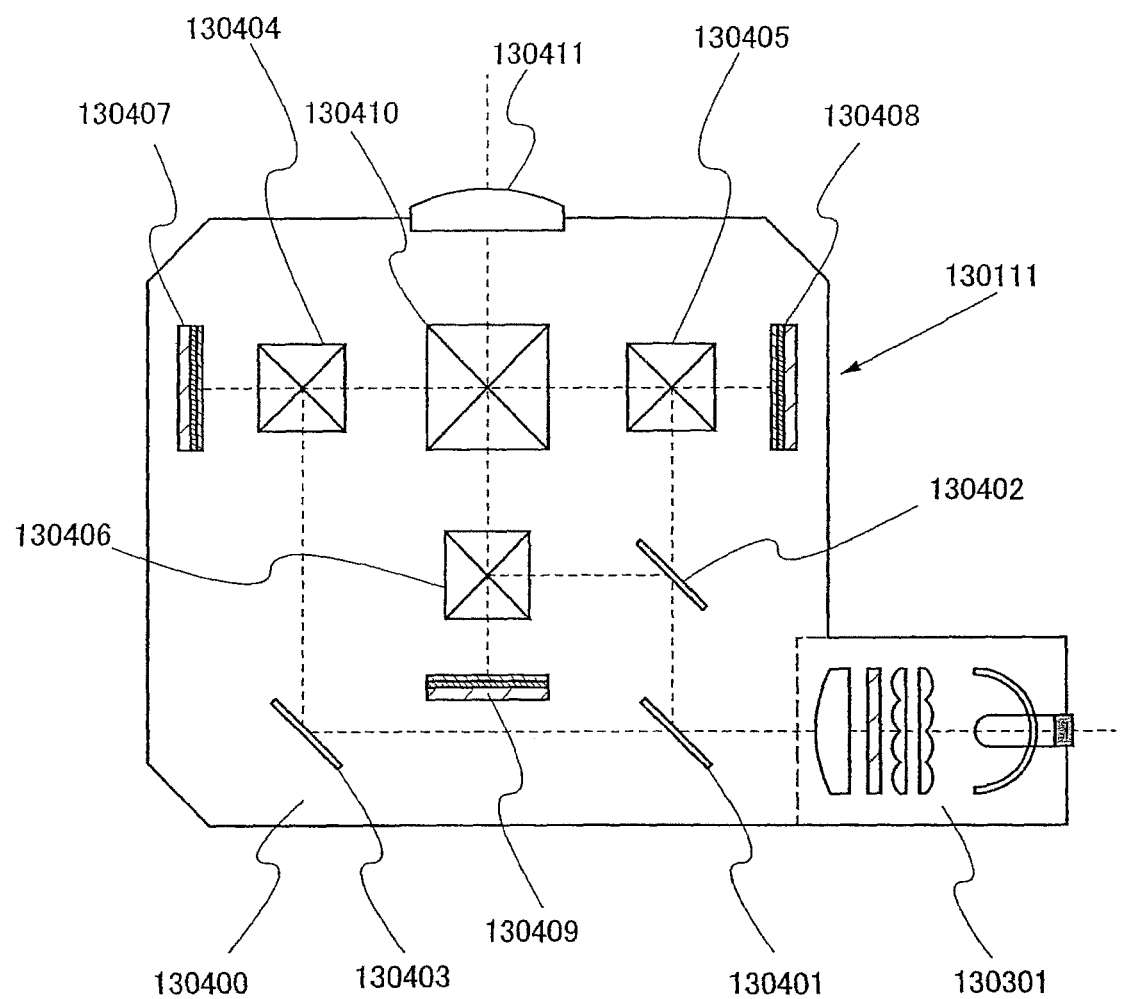
FIG. 85 is a view showing a structure of a semiconductor device in accordance with the present invention.

The projector unit 130111 shown in FIG. 85 includes reflective display panels 130407, 130408, and 130409.

The projector unit 130111 in FIG. 85 includes the light source unit 130301 and a modulation unit 130400. The light source unit 130301 may have a structure similar to that in FIG. 84. Light from the light source unit 130301 is split into a plurality of optical paths by dichroic mirrors 130401 and 130402 and a total reflection mirror 130403 to be incident on polarization beam splitters 130404, 130405, and 130406. The polarization beam splitters 130404, 130405, and 130406 are provided corresponding to the reflective display panels 130407, 130408, and 130409 which correspond to respective colors. The reflective display panels 130407, 130408, and 130409 modulate reflected light based on an image signal. Light of each color, which are reflected by the reflective display panels 130407, 130408, and 130409, is incident on a prism 130410 to be composed, and projected through a projection optical system 130411.

Among light emitted from the light source unit 130301, only light in a wavelength region of red is transmitted through the dichroic mirror 130401 and light in wavelength regions of green and blue is reflected by the dichroic mirror 130401. Further, only the light in the wavelength region of green is reflected by the dichroic mirror 130402. The light in the wavelength region of red, which is transmitted through the dichroic mirror 130401, is reflected by the total reflection mirror 130403 and incident on the polarization beam splitter 130404. The light in the wavelength region of blue is incident on the polarization beam splitter 130405. The light in the wavelength region of green is incident on the polarization beam splitter 130406. The polarization beam splitters 130404, 130405, and 130406 have a function to split incident light into P-polarized light and S-polarized light and a function to transmit only P-polarized light. The reflective display panels 130407, 130408, and 130409 polarize incident light based on an image signal.

Only the S-polarized light corresponding to each color is incident on the reflective display panels 130407, 130408, and 130409 corresponding to each color. Note that the reflective display panels 130407, 130408, and 130409 may be liquid crystal panels. In this case, the liquid crystal panel operates in an electrically controlled birefringence (ECB) mode. Liquid crystal molecules are vertically aligned at an angle to a substrate. Accordingly, in the reflective display panels 130407, 130408, and 130409, when a pixel is turned off, display molecules are aligned not to change a polarization state of incident light so as to reflect the incident light. When the pixel is turned on, alignment of the display molecules is changed, and the polarization state of the incident light is changed.

The projector unit 130111 shown in FIG. 85 can be applied to the rear projection display device 130100 in FIGS. 82A and 8213 and the front projection display device 130200 in FIG. 83.

Figure 86A:
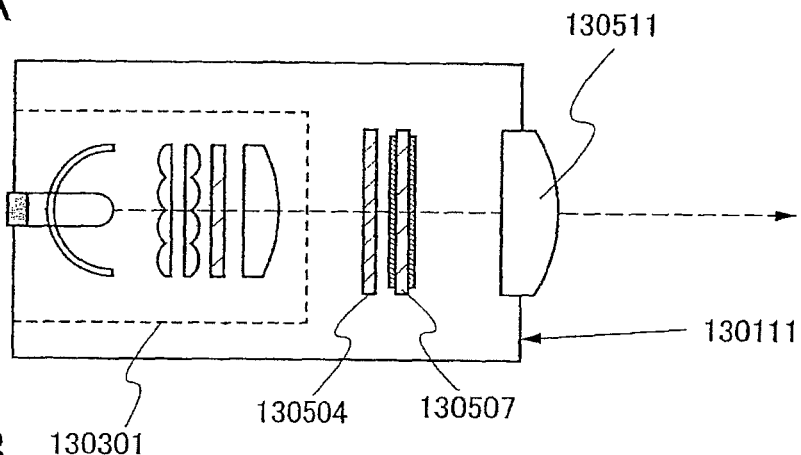
FIGS. 86A to 86C are views each showing a structure of a semiconductor device in accordance with the present invention.
Figure 86B:
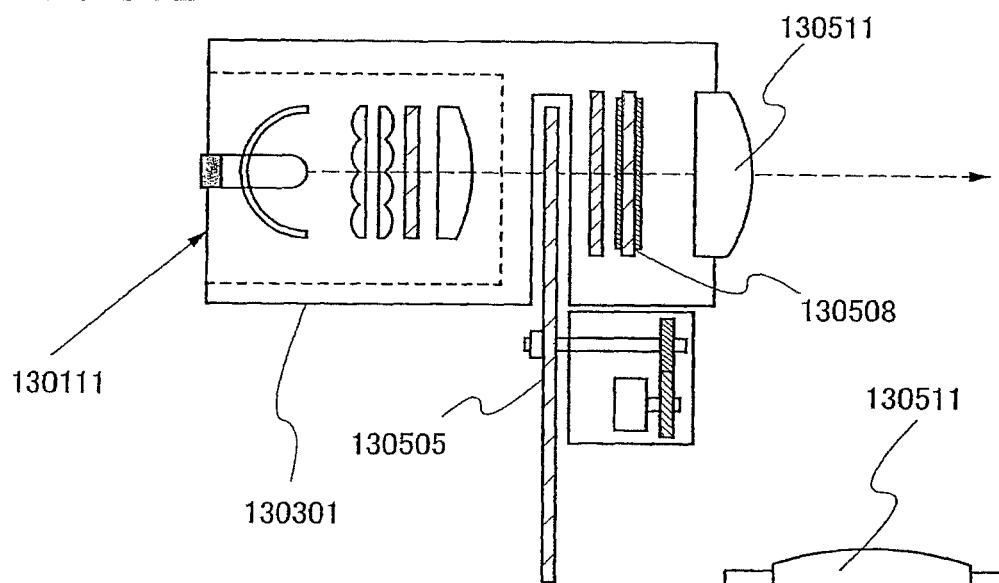
Figure 86C:
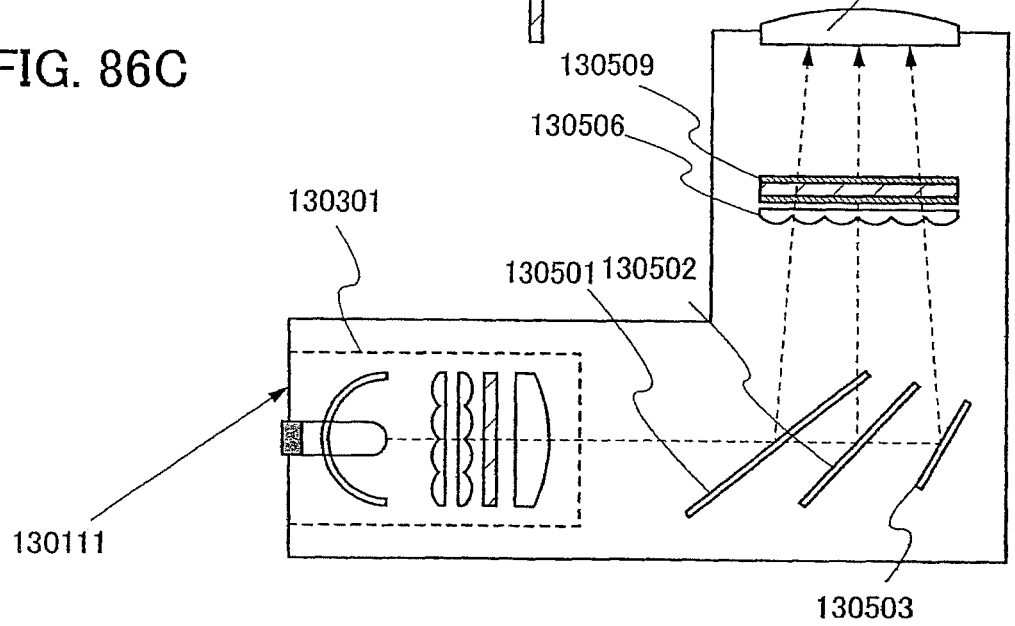

FIGS. 86A to 86C each show a single-panel type projector unit. The projector unit 130111 shown in FIG. 86A is provided with the light source unit 130301, a display panel 130507, a projection optical system 130511, and a retardation plate 130504. The projection optical system 130511 includes one or a plurality of lenses. The display panel 130507 may be provided with a color filter.

FIG. 86B shows a structure of the projector unit 130111 operating in a field sequential mode. The field sequential mode corresponds to a mode in which color display is performed by light of respective colors such as red, green, and blue sequentially incident on a display panel with a time lag, without a color filter. A higher-definition image can be displayed particularly by combination with a display panel with high-speed response to change in input signal. The projector unit 130111 in FIG. 86B is provided with a rotating color filter plate 130505 including a plurality of color filters with red, green, blue, or the like between the light source unit 130301 and a display panel 130508.

FIG. 86C shows a structure of the projector unit 130111 with a color separation system using a micro lens, as a color display method. The color separation system corresponds to a system in which color display is realized by providing a micro lens array 130506 on the side of a display panel 130509, on which light is incident, and light of each color is emitted from each direction. The projector unit 130111 employing this system has little loss of light due to a color filter, so that light from the light source unit 130301 can be efficiently utilized. The projector unit 130111 in FIG. 86C is provided with dichroic mirrors 130501, 130502, and 130503 so that light of each color is emitted to the display panel 130509 from each direction.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 20]

In this embodiment mode, examples of electronic devices are described.

Figure 87:
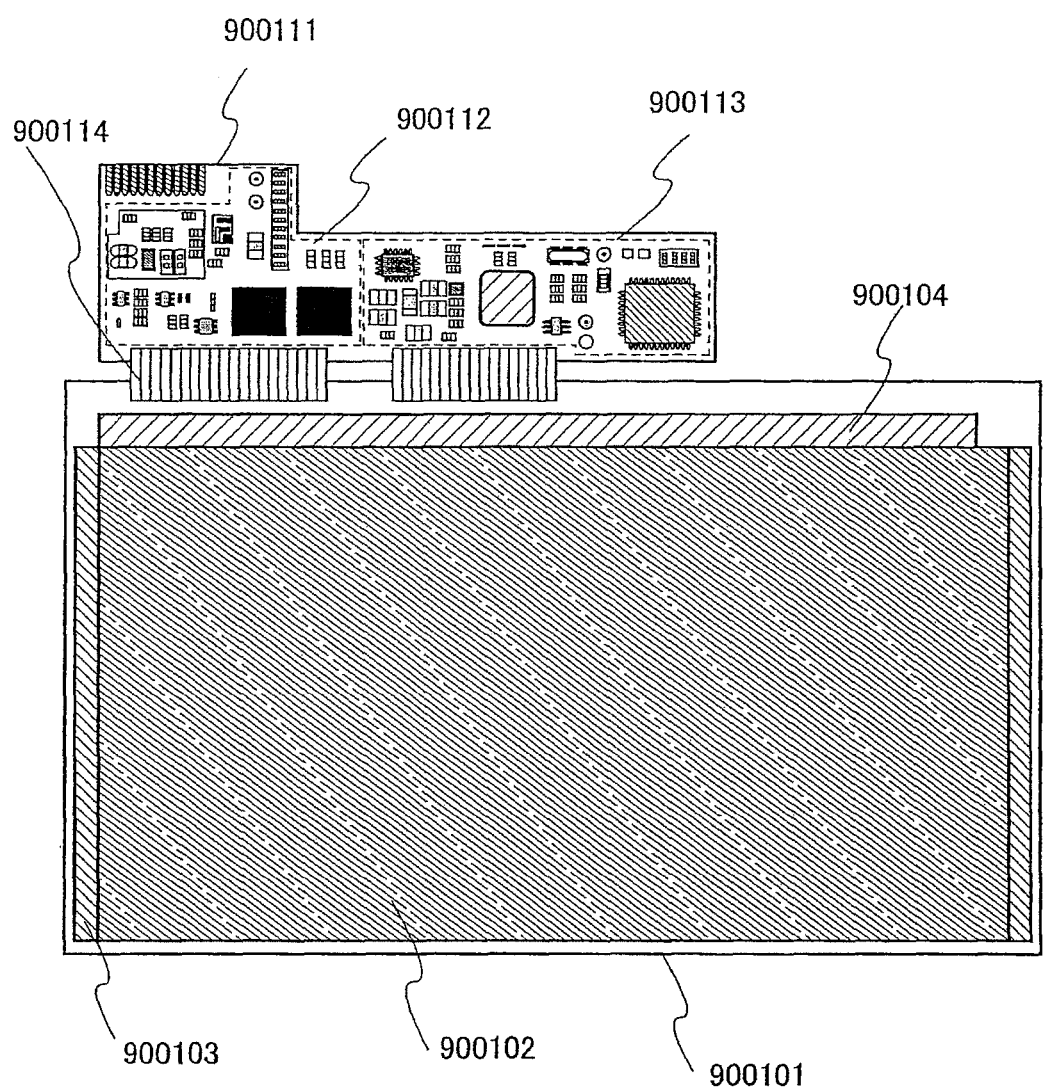
FIG. 87 is a view showing a structure of a semiconductor device in accordance with the present invention.

FIG. 87 shows a display panel module combining a display panel 900101 and a circuit board 900111. The display panel 900101 includes a pixel portion 900102, a scan line driver circuit 900103, and a signal line driver circuit 900104. The circuit board 900111 is provided with a control circuit 900112, a signal dividing circuit 900113, and the like, for example. The display panel 900101 and the circuit board 900111 are connected to each other by a connection wiring 900114. An FPC or the like can be used as the connection wiring.

Figure 92:
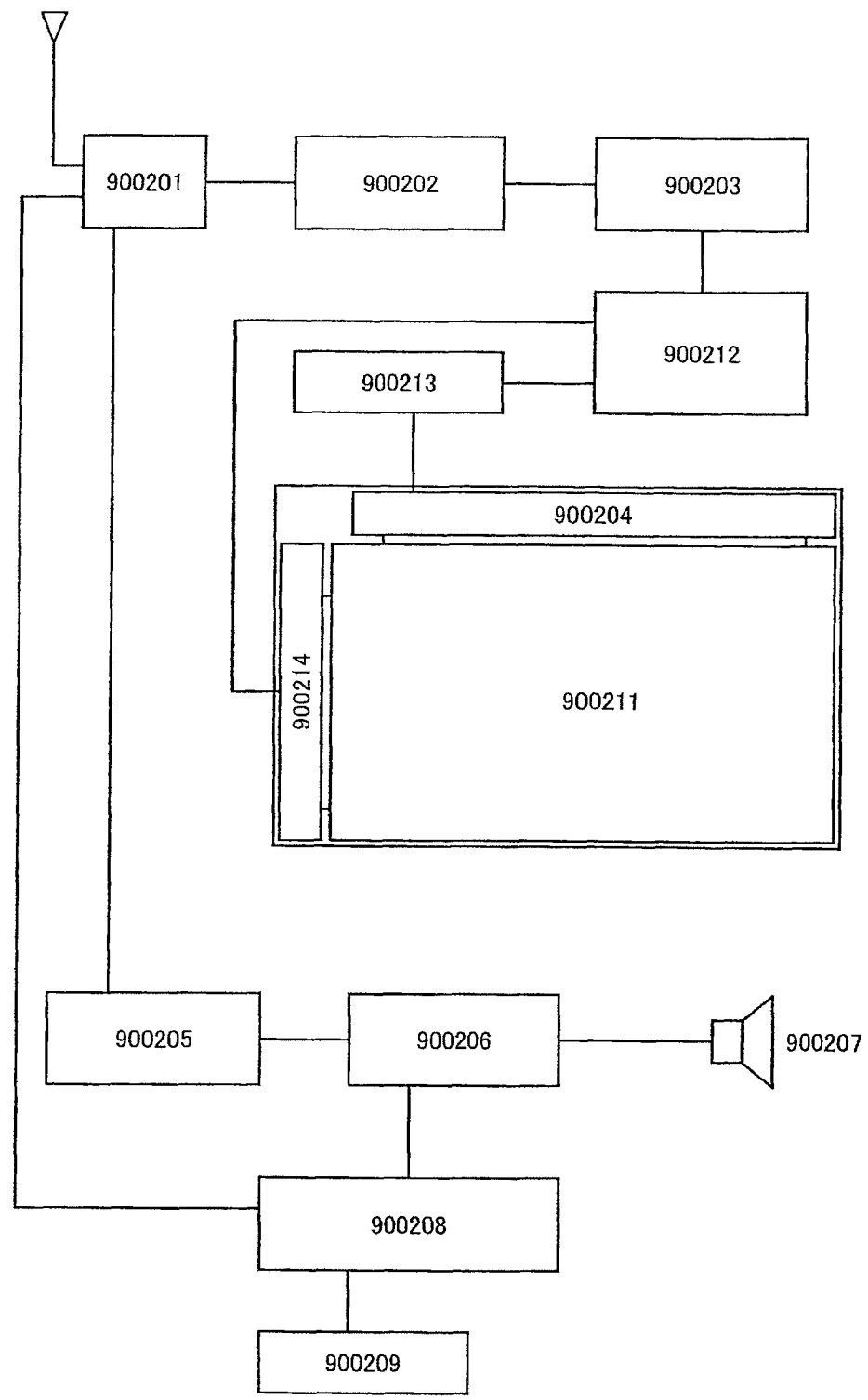
FIG. 92 is a diagram showing a structure of a semiconductor device in accordance with the present invention.

FIG. 92 is a block diagram showing a main structure of a television receiver. A tuner 900201 receives an image signal and an audio signal. The image signals are processed by an image signal amplifier circuit 900202; an image signal processing circuit 900203 which converts a signal output from the image signal amplifier circuit 900202 into a color signal corresponding to each color of red, green and blue; and a control circuit 900212 which converts the image signal into the input specification of a driver circuit. The control circuit 900212 outputs a signal to each of a scan line driver circuit 900214 and a signal line driver circuit 900204. The scan line driver circuit 900214 and the signal line driver circuit 900204 drive a display panel 900211. When performing digital drive, a structure may be employed in which a signal dividing circuit 900213 is provided on the signal line side so that an input digital signal is divided into m signals (m corresponds to a positive integer) to be supplied.

Among the signals received by the tuner 900201, an audio signal is transmitted to an audio signal amplifier circuit 900205, and an output thereof is supplied to a speaker 900207 through an audio signal processing circuit 900206. A control circuit 900208 receives control information on receiving station (receiving frequency) and volume from an input portion 900209 and transmits signals to the tuner 900201 or the audio signal processing circuit 900206.

Figure 93A:
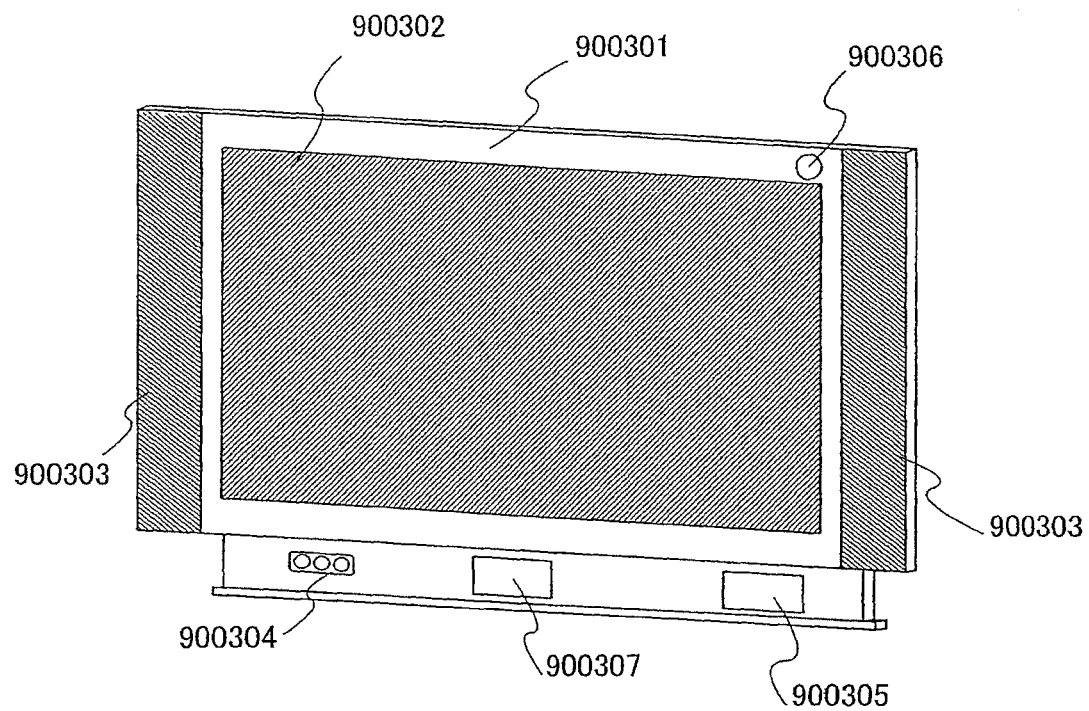
FIGS. 93A and 93B are views each showing an electronic device using a semiconductor device in accordance with the present invention.

FIG. 93A shows a television receiver incorporated with a display panel module, which is different from FIG. 92. In FIG. 93A, a display screen 900302 incorporated in a housing 900301 is formed using the display panel module. Note that speakers 900303, input means (an operation key 900304, a connection terminal 900305, a sensor 900306 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900307), and the like may be provided as appropriate.

Figure 93B:
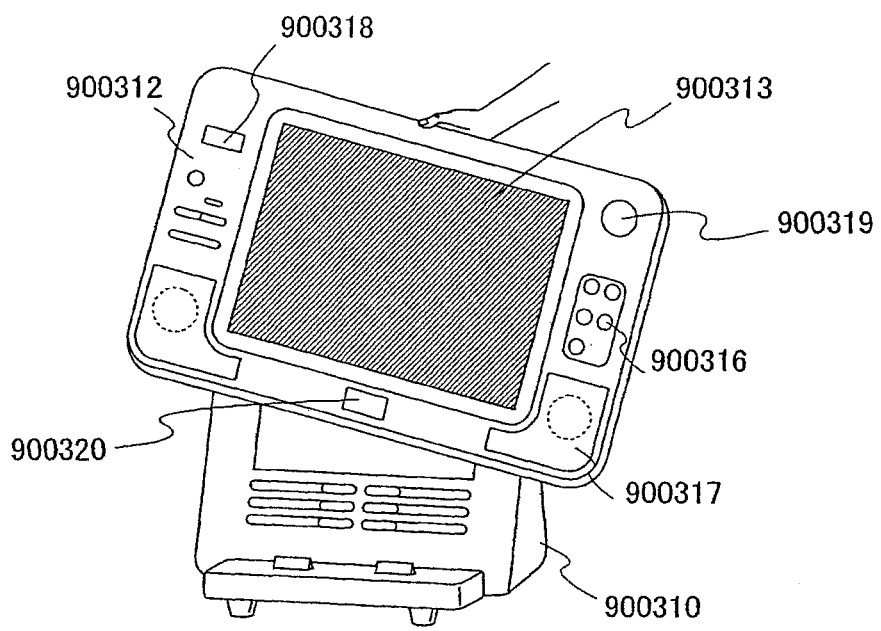

FIG. 93B shows a television receiver in which only a display can be carried wirelessly. The television receiver is provided with a display portion 900313, a speaker portion 900317, input means (an operation key 900316, a connection terminal 900318, a sensor 900319 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900320), and the like as appropriate. A battery and a signal receiver are incorporated in a housing 900312. The battery drives the display portion 900313, the speaker portion 900317, the sensor 900319, and the microphone 900320. The battery can be repeatedly charged by a charger 900310. The charger 900310 can transmit and receive an image signal and transmit the image signal to the signal receiver of the display. The device in FIG. 93B is controlled by the operation key 900316. Alternatively, the device in FIG. 93B can transmit a signal to the charger 900310 by operating the operation key 900316. That is, the device may be an image and audio interactive communication device. Further alternatively, by operating the operation key 900316, the device in FIG. 93B may transmit a signal to the charger 900310 and another electronic device is made to receive a signal which can be transmitted from the charger 900310; thus, the device in FIG. 93B can control communication of another electronic device. That is, the device may be a general-purpose remote control device. Note that the contents (or part thereof) described in each drawing of this embodiment mode can be applied to the display portion 900313.

Next, a structure example of a mobile phone is described with reference to FIG. 94.

A display panel 900501 is detachably incorporated in a housing 900530. The shape and size of the housing 900530 can be changed as appropriate in accordance with the size of the display panel 900501. The housing 900530 which fixes the display panel 900501 is fitted in a printed wiring board 900531 to be assembled as a module.

The display panel 900501 is connected to the printed wiring board 900531 through an FPC 900513. The printed wiring board 900531 is provided with a speaker 900532, a microphone 900533, a transmitting/receiving circuit 900534, a signal processing circuit 900535 including a CPU, a controller, and the like, and a sensor 900541 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an operation key 900536, a battery 900537, and an antenna 900540 are combined and stored in a housing 900539. A pixel portion of the display panel 900501 is provided to be seen from an opening window formed in the housing 900539.

In the display panel 900501, the pixel portion and part of peripheral driver circuits (a driver circuit having a low operation frequency among a plurality of driver circuits) may be formed over the same substrate by using transistors, and another part of the peripheral driver circuits (a driver circuit having high operation frequency among the plurality of driver circuits) may be formed over an IC chip. Then, the IC chip may be mounted on the display panel 900501 by COG (Chip On Glass). Alternatively, the IC chip may be connected to a glass substrate by using TAB (Tape Automated Bonding) or a printed wiring board. With such a structure, power consumption of a display device can be reduced and operation time of the mobile phone per charge can be extended. Further, reduction in cost of the mobile phone can be realized.

Figure 94:
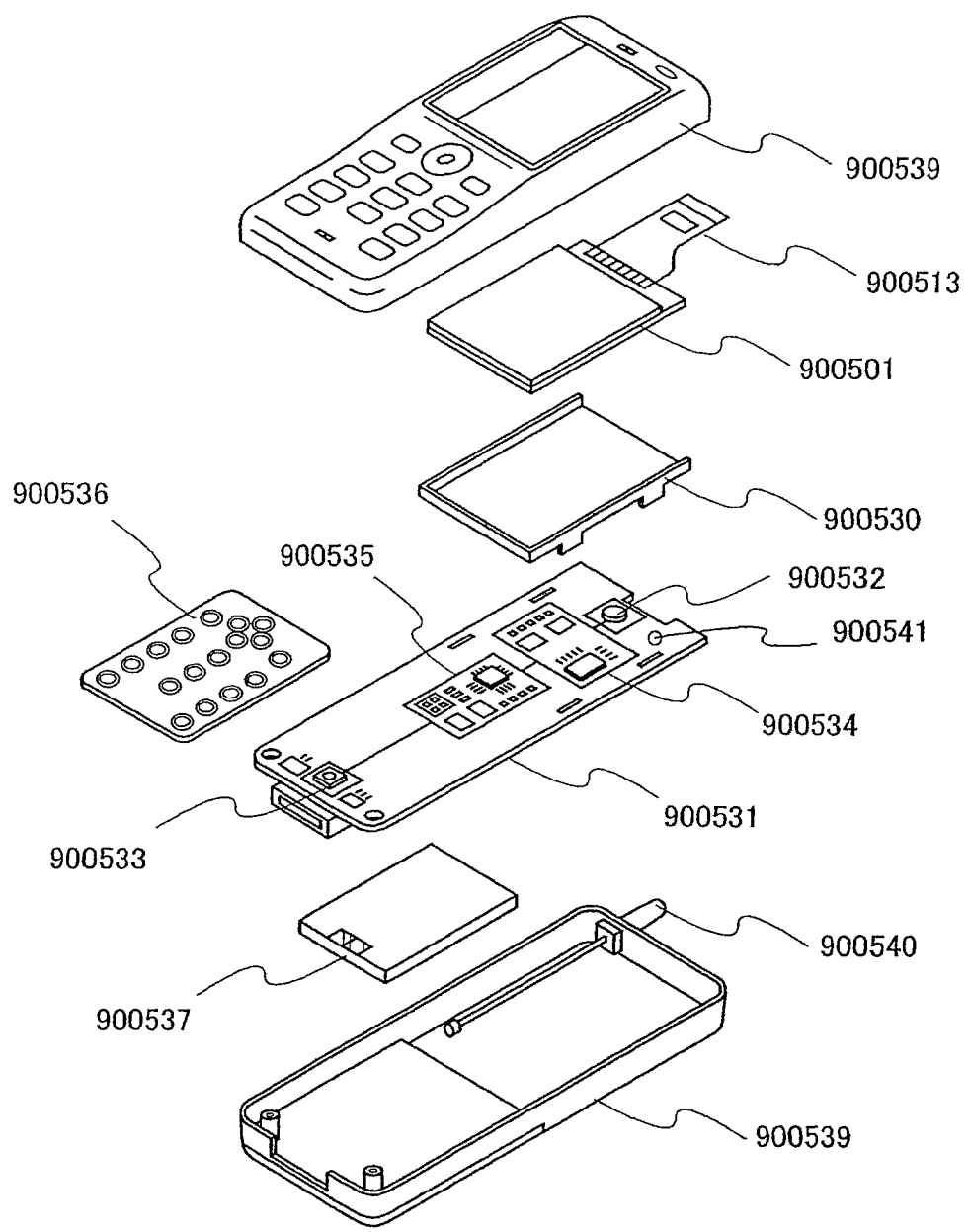
FIG. 94 is a view showing a structure of a semiconductor device in accordance with the present invention.

The mobile phone in FIG. 94 has various functions such as, but not limited to, a function to display various kinds of information (e.g., a still image, a moving image, and a text image); a function to display a calendar, a date, the time, and the like on a display portion; a function to operate or edit the information displaying on the display portion; a function to control processing by various kinds of software (programs); a function of wireless communication; a function to communicate with another mobile phone, a fixed phone, or an audio communication device by using the wireless communication function; a function to connect with various computer networks by using the wireless communication function; a function to transmit or receive various kinds of data by using the wireless communication function; a function to operate a vibrator in accordance with incoming call, reception of data, or an alarm; and a function to generate a sound in accordance with incoming call, reception of data, or an alarm.

Figure 95A:
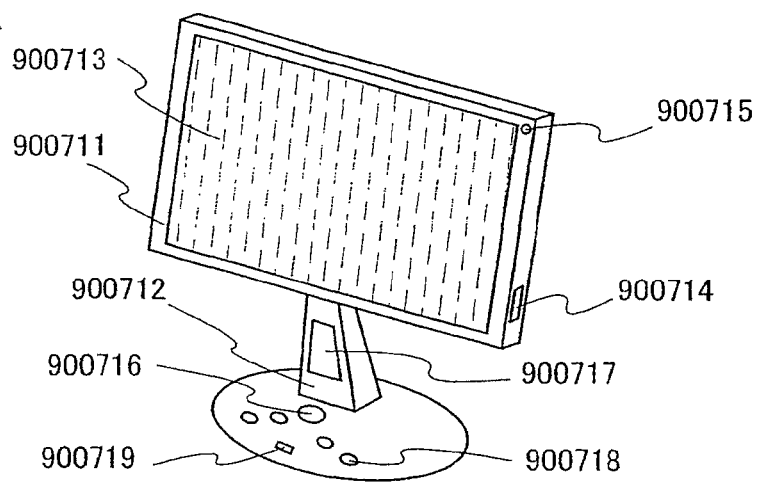
FIGS. 95A to 95C are views each showing an electronic device using a semiconductor device in accordance with the present invention.

FIG. 95A shows a display, which includes a housing 900711, a support base 900712, a display portion 900713, a speaker 900717, an LED lamp 900719, input means (a connection terminal 900714, a sensor 900715 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), a microphone 900716, and an operation key 900718), and the like. The display shown in FIG. 95A can have various functions such as, but not limited to, a function to display various kinds of information (e.g., a still image, a moving image, and a text image) on the display portion.

Figure 95B:
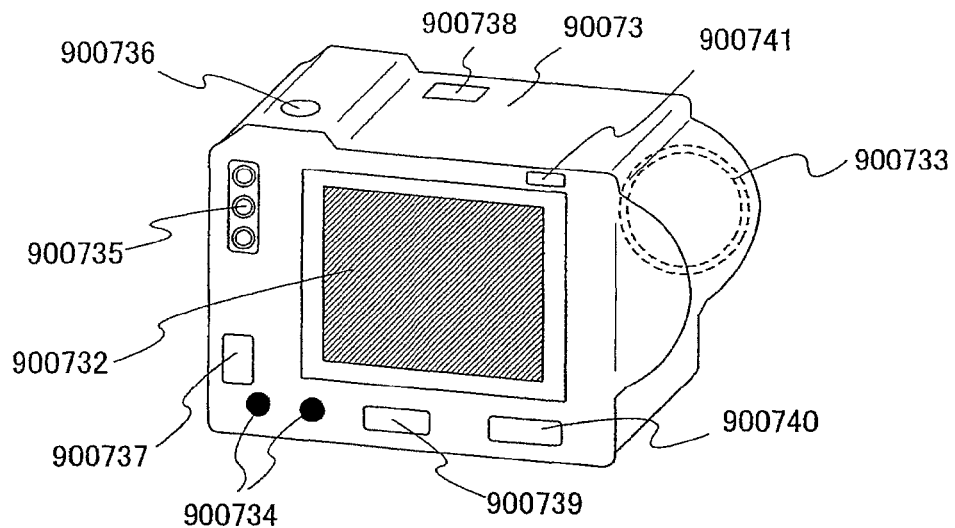

FIG. 95B shows a camera, which includes a main body 900731, a display portion 900732, a shutter button 900736, a speaker 900740, an LED lamp 900741, input means (an image receiving portion 900733, operation keys 900734, an external connection port 900735, a connection terminal 900737, a sensor 900738 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900739), and the like. The camera shown in FIG. 95B can have various functions such as, but not limited to, a function to photograph a still image or a moving image; a function to automatically adjust the photographed image (still image or moving image); a function to store the photographed image in a recording medium (provided externally or incorporated in the camera); and a function to display the photographed image on the display portion.

Figure 95C:
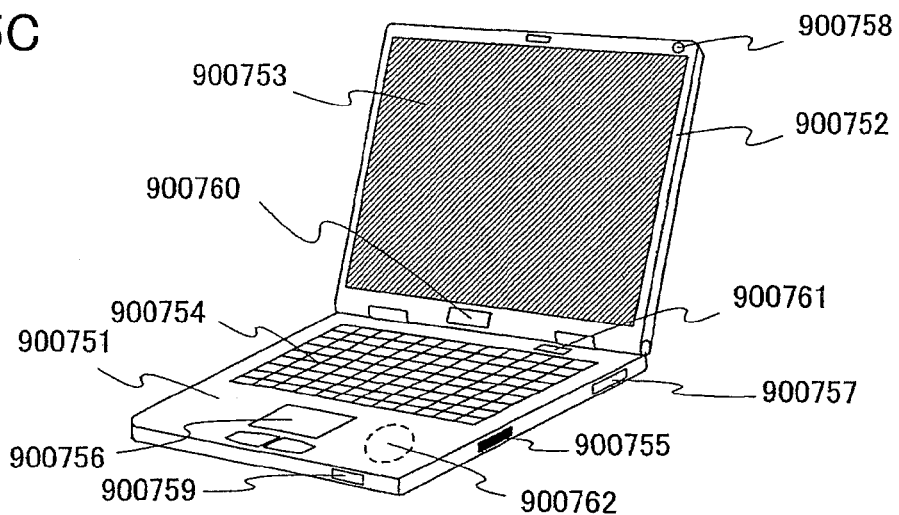

FIG. 95C shows a computer, which includes a main body 900751, a housing 900752, a display portion 900753, a speaker 900760, an LED lamp 900761, a reader/writer 900762, input means (a keyboard 900754, an external connection port 900755, a pointing device 900756, a connection terminal 900757, a sensor 900758 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 900759), and the like. The computer shown in FIG. 95C can have various functions such as, but not limited to, a function to display various kinds of information (e.g., a still image, a moving image, and a text image) on the display portion; a function to control processing by various kinds of software (programs); a communication function such as wireless communication or wire communication; a function to connect with various computer networks by using the communication function; and a function to transmit or receive various kinds of data by using the communication function.

Figure 102A:
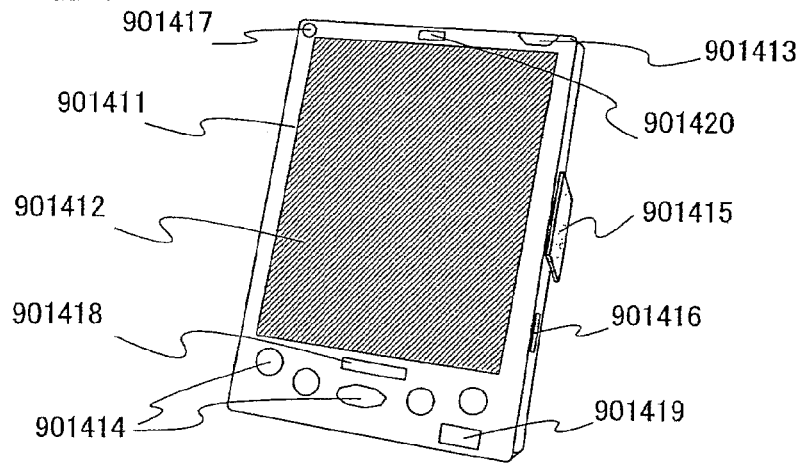
FIGS. 102A to 102C are views each showing an electronic device using a semiconductor device in accordance with the present invention.

FIG. 102A shows a mobile computer, which includes a main body 901411, a display portion 901412, a switch 901413, a speaker 901419, an LED lamp 901420, input means (operation keys 901414, an infrared port 901415, a connection terminal 901416, a sensor 901417 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901418), and the like. The mobile computer shown in FIG. 102A can have various functions such as, but not limited to, a function to display various kinds of information (e.g., a still image, a moving image, and a text image) on a display portion; a touch panel function provided on the display portion; a function to display a calendar, a date, the time, and the like on the display portion; a function to control processing by various kinds of software (programs); a function of wireless communication; a function to connect with various computer networks by using the wireless communication function; and a function to transmit or receive various kinds of data by using the wireless communication function.

Figure 102B:
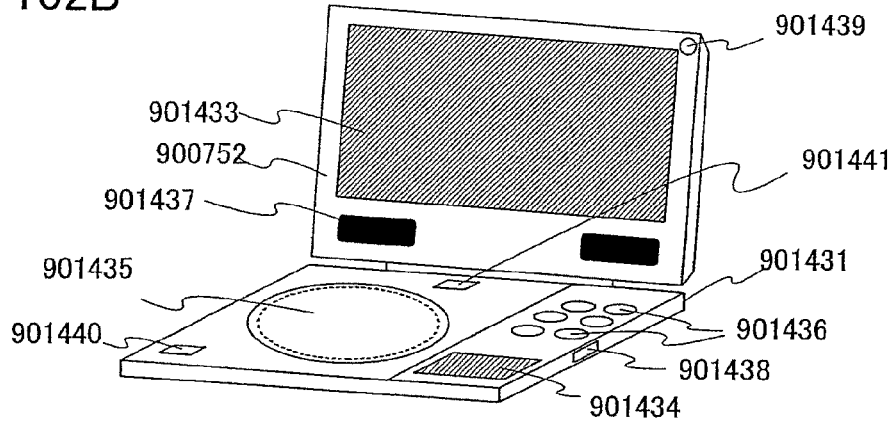

FIG. 102B shows a portable image reproducing device having a recording medium (e.g., a DVD player), which includes a main body 901431, a housing 901432, a display portion A 901433, a display portion B 901434, a speaker portion 901437, an LED lamp 901441, input means (a recording medium (e.g., a DVD) reading portion 901435, operation keys 901436, a connection terminal 901438, a sensor 901439 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901440), and the like. The display portion A 901433 mainly displays image information and the display portion B 901434 mainly displays text information.

Figure 102C:
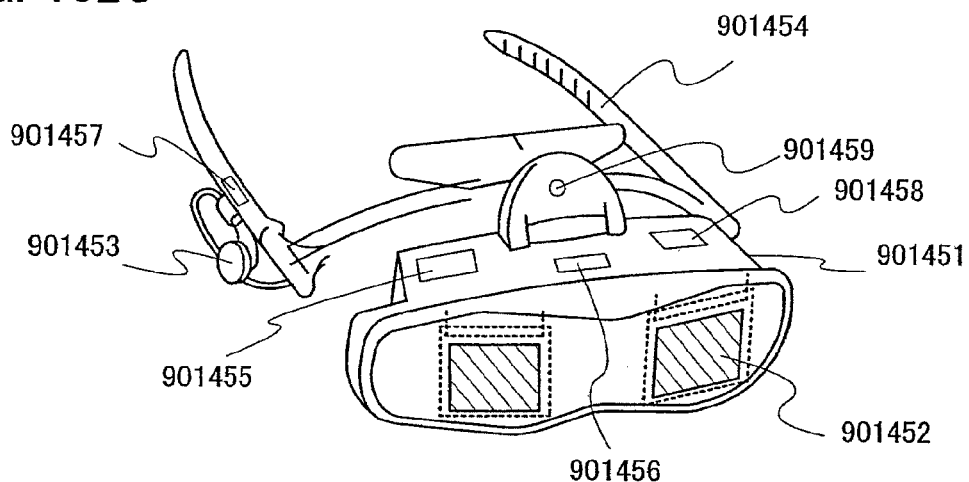

FIG. 102C shows a goggle-type display, which includes a main body 901451, a display portion 901452, an earphone 901453, a support portion 901454, an LED lamp 901459, a speaker 901458, input means (a connection terminal 901455, a sensor 901456 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901457), and the like. The goggle-type display shown in FIG. 102C can have various functions such as, but not limited to, a function to display an externally obtained image (e.g., a still image, a moving image, and a text image) on the display portion.

Figure 103A:
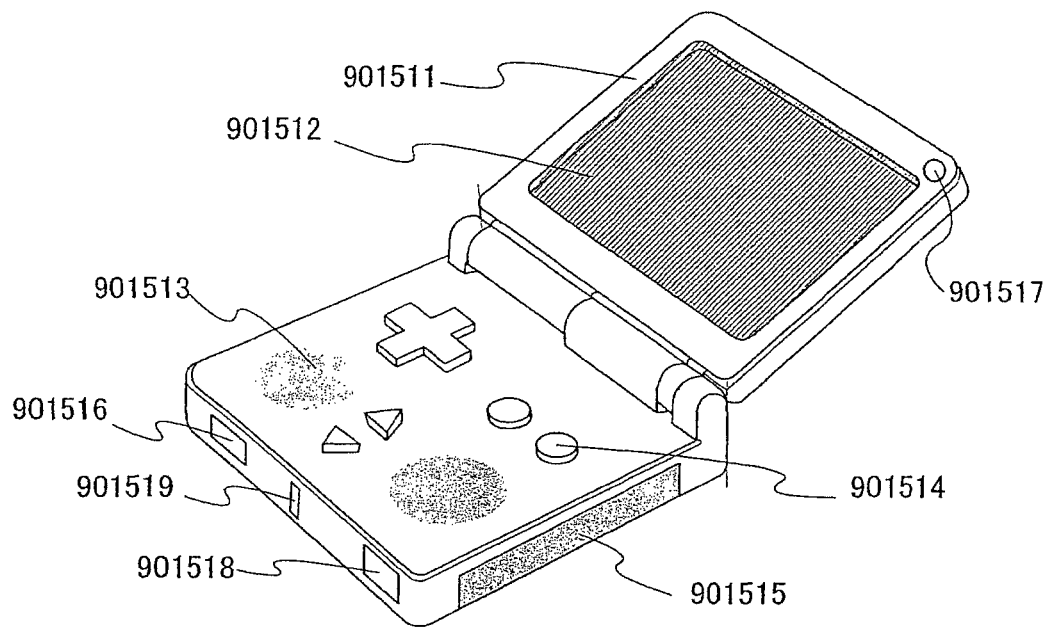
FIGS. 103A and 103B are views each showing an electronic device using a semiconductor device in accordance with the present invention.

FIG. 103A shows a portable game machine, which includes a housing 901511, a display portion 901512, a speaker portion 901513, a recording medium insert portion 901515, an LED lamp 901519, input means (an operation key 901514, a connection terminal 901516, a sensor 901517 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901518), and the like. The portable game machine shown in FIG. 103A can have various functions such as, but not limited to, a function to read a program or data stored in the recording medium to display on the display portion; and a function to share information by wireless communication with another portable game machine.

Figure 103B:
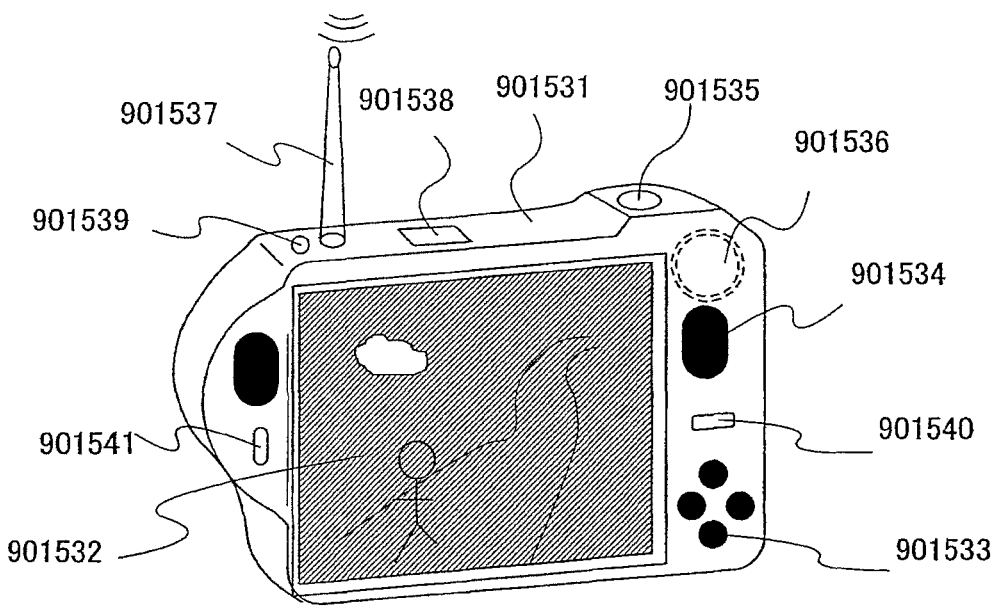

FIG. 103B shows a digital camera having a television reception function, which includes a housing 901531, a display portion 901532, a speaker 901534, a shutter button 901535, an LED lamp 901541, input means (an operation key 901533, an image receiving portion 901536, an antenna 901537, a connection terminal 901538, a sensor 901539 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901540), and the like. The digital camera having a television reception function shown in FIG. 103B can have various functions such as, but not limited to, a function to photograph a still image or a moving image; a function to automatically adjust the photographed image; a function to obtain various kinds of information from the antenna; a function to store the photographed image or the information obtained from the antenna; and a function to display the photographed image or the information obtained from the antenna on the display portion.

Figure 104:
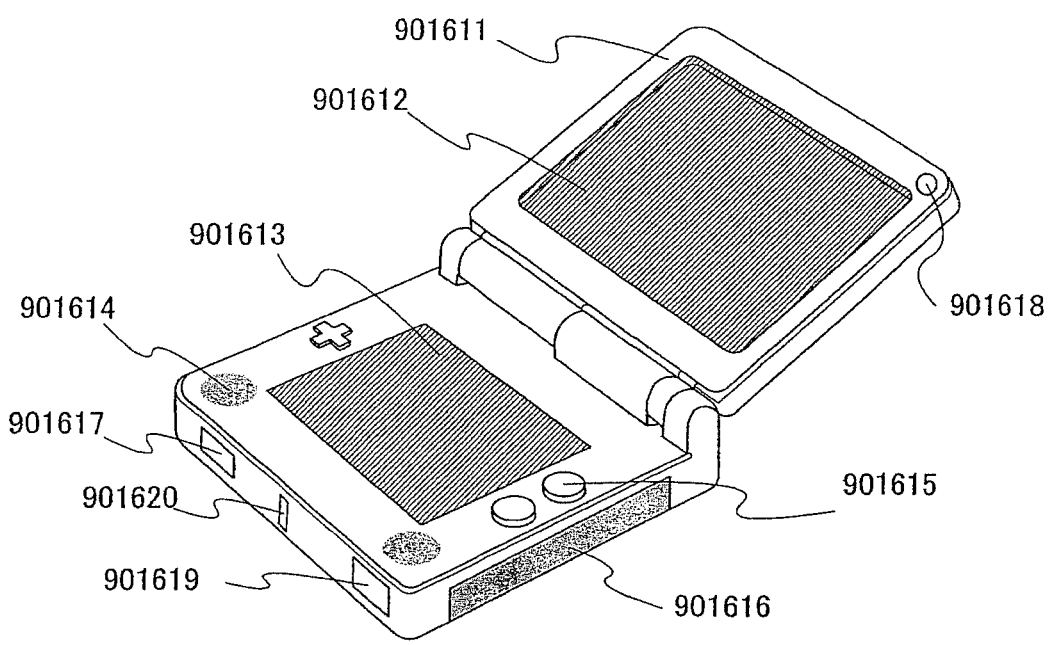
FIG. 104 is a view showing an electronic device using a semiconductor device in accordance with the present invention.

FIG. 104 shows a portable game machine, which includes a housing 901611, a first display portion 901612, a second display portion 901613, a speaker portion 901614, a recording medium insert portion 901616, an LED lamp 901620, input means (an operation key 901615, a connection terminal 901617, a sensor 901418 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 901619), and the like. The portable game machine shown in FIG. 104 can have various functions such as, but not limited to, a function to read a program or data stored in the recording medium to display on the display portion; and a function to share information by wireless communication with another portable game machine.

As shown in FIGS. 95A to 95C, 102A to 102C, 103A to 103C, and 104, the electronic device includes a display portion for displaying some kind of information.

Next, application examples of a semiconductor device are described.

Figure 96:
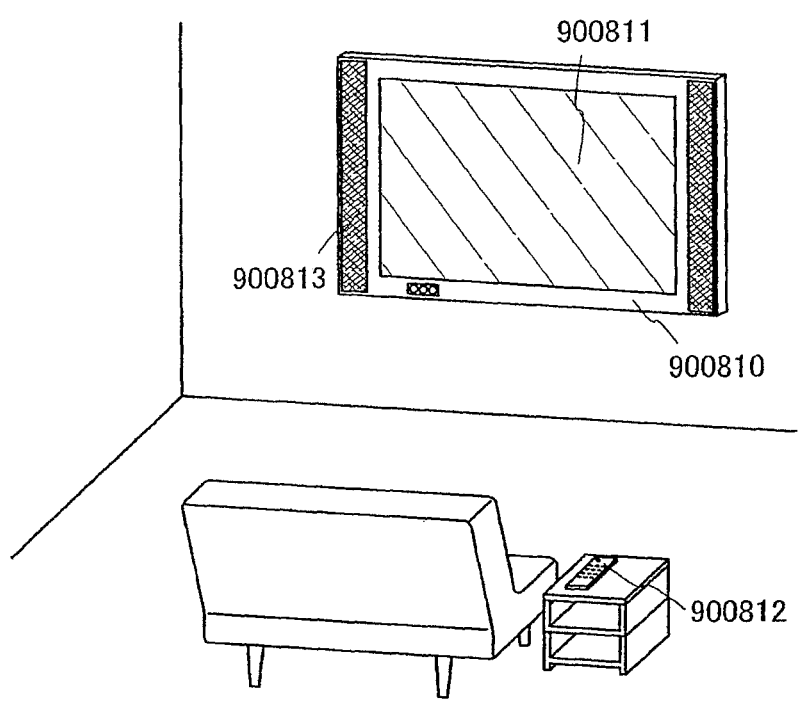
FIG. 96 is a view showing an electronic device using a semiconductor device in accordance with the present invention.

FIG. 96 shows an example where a semiconductor device is incorporated in a constructed object. FIG. 96 shows a housing 900810, a display portion 900811, a remote control device 900812 which is an operation portion, a speaker portion 900813, and the like. The semiconductor device is incorporated in the constructed object as a wall-hanging type and can be provided without requiring a large space.

Figure 97:
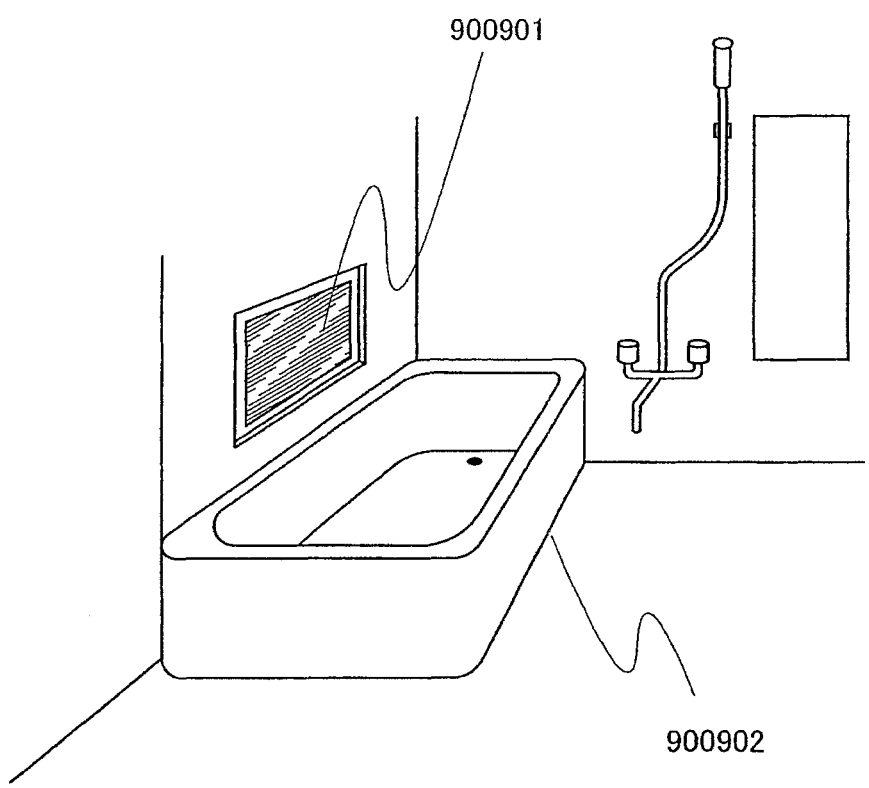
FIG. 97 is a view showing an electronic device using a semiconductor device in accordance with the present invention.

FIG. 97 shows another example where a semiconductor device is incorporated in a constructed object. A display panel 900901 is incorporated with a prefabricated bath 900902, and a person who takes a bath can view the display panel 900901. The display panel 900901 has a function to display information by an operation by a person who takes a bath; and a function to be used as an advertisement or an entertainment means.

The semiconductor device can be provided not only to a side wall of the prefabricated bath 900902 as shown in FIG. 97, but also to various places. For example, the semiconductor device can be incorporated with part of a mirror, a bathtub itself, or the like. At this time, a shape of the display panel 900901 may be changed in accordance with a shape of the mirror or the bathtub.

Figure 98:
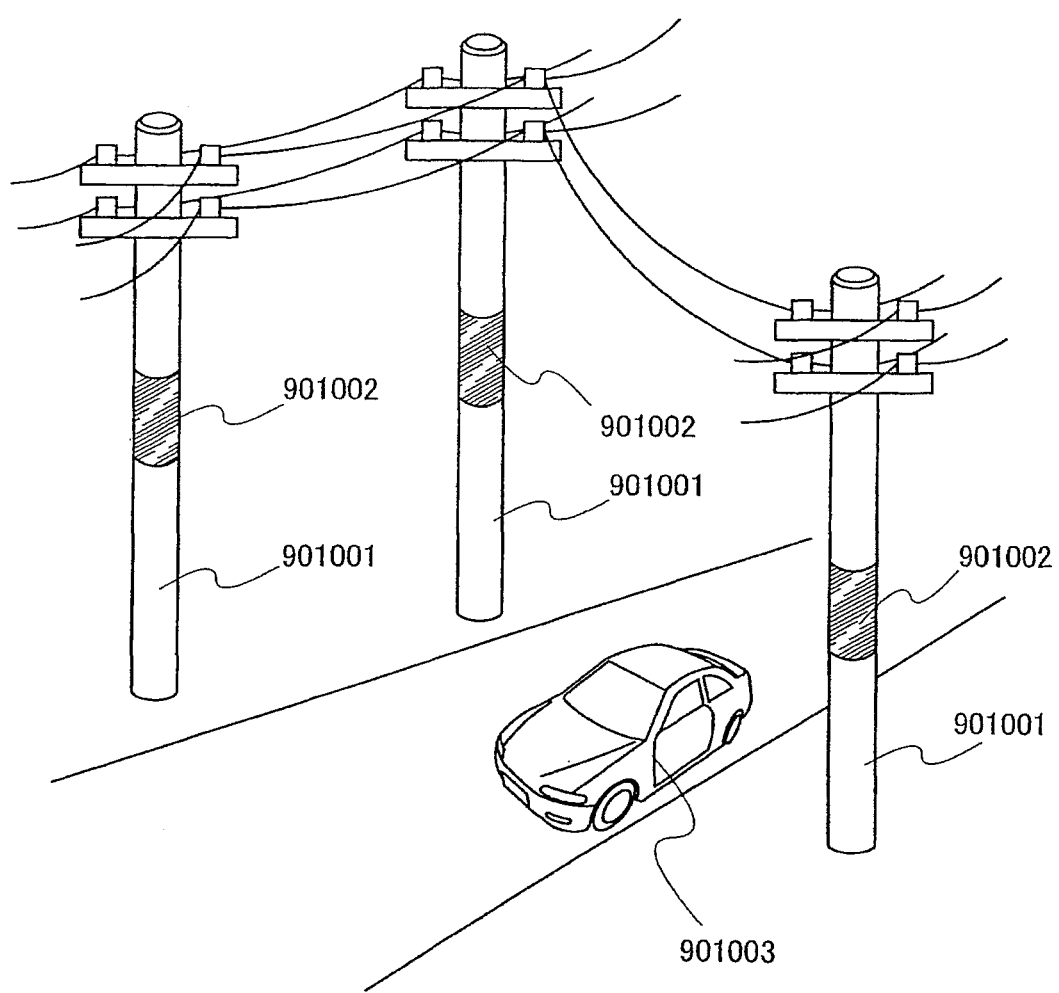
FIG. 98 is a view showing an electronic device using a semiconductor device in accordance with the present invention.

FIG. 98 shows another example where a semiconductor device is incorporated in a constructed object. A display panel 901002 is bent and attached to a curved surface of a column-shaped object 901001. Here, a utility pole is described as the column-shaped object 901001.

The display panel 901002 shown in FIG. 98 is provided at a position higher than a human viewpoint. When the same images are displayed on the display panels 901002 provided in constructed objects which stand together in large numbers outdoors, such as utility poles, advertisement can be performed to unspecified number of viewers. Since it is easy for the display panel 901002 to display the same images and instantly switch images by external control, highly effective information display and advertisement effect can be expected. When provided with self-luminous display elements, the display panel 901002 can be effectively used as a highly visible display medium even at night. When the display panel 901002 is provided in the utility pole, a power supply means for the display panel 901002 can be easily obtained. In an emergency such as disaster, the display panel 901002 can also be used as a means to rapidly transmit correct information to victims.

As the display panel 901002, a display panel in which a switching element such as an organic transistor is provided over a film-shaped substrate, and a display element is driven, so that an image can be displayed can be used, for example.

In this embodiment mode, a wall, a column-shaped object, and a prefabricated bath are shown as examples of a constructed object; however, this embodiment mode is not limited thereto, and various constructed objects can be provided with a semiconductor device.

Next, examples where a semiconductor device is incorporated with a moving object are described.

Figure 99:
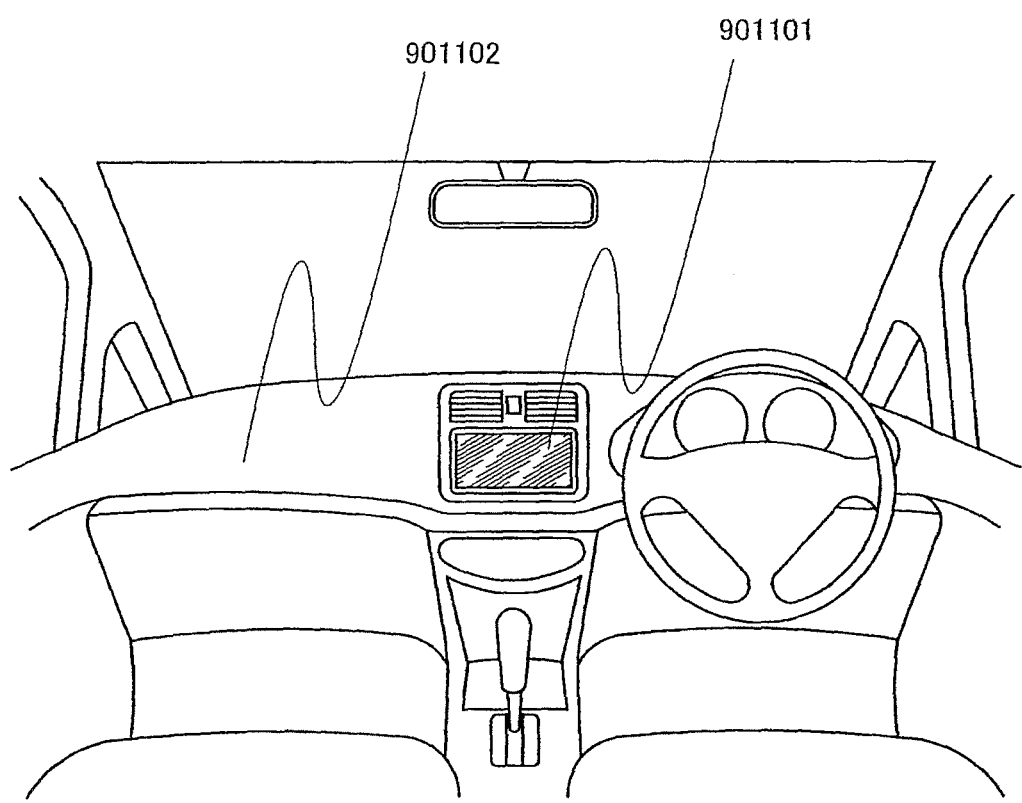
FIG. 99 is a view showing an electronic device using a semiconductor device in accordance with the present invention.

FIG. 99 shows an example where a semiconductor device is incorporated with a car. A display panel 901102 is incorporated with a car body 901101, and can display an operation of the car body or information input from inside or outside the car body on demand. Note that a navigation function may be provided.

The semiconductor device can be provided not only to the car body 901101 as shown in FIG. 99, but also to various places. For example, the semiconductor device can be incorporated with a glass window, a door, a steering wheel, a gear shift, a seat, a rear-view mirror, and the like. At this time, a shape of the display panel 901102 may be changed in accordance with a shape of an object provided with the semiconductor device.

Figure 100A:
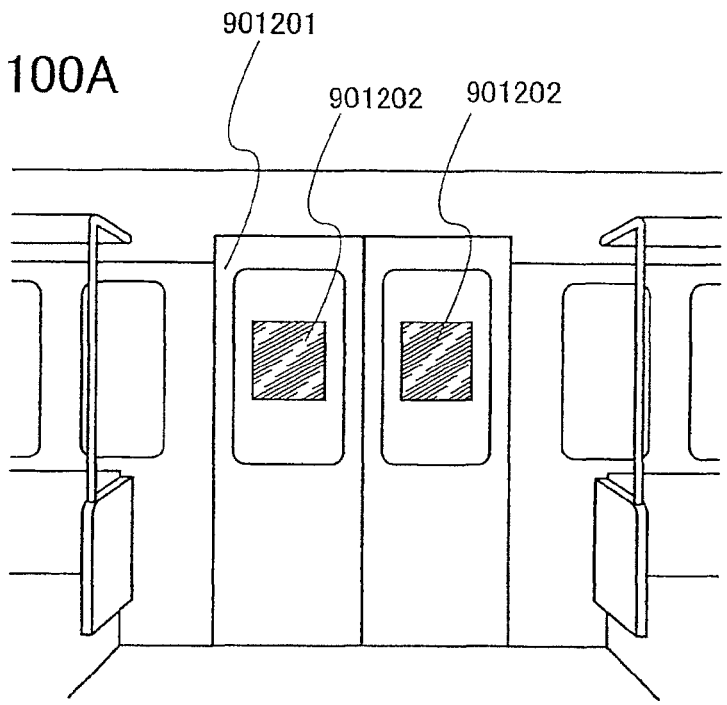
FIGS. 100A and 100B are views each showing an electronic device using a semiconductor device in accordance with the present invention.
Figure 100B:
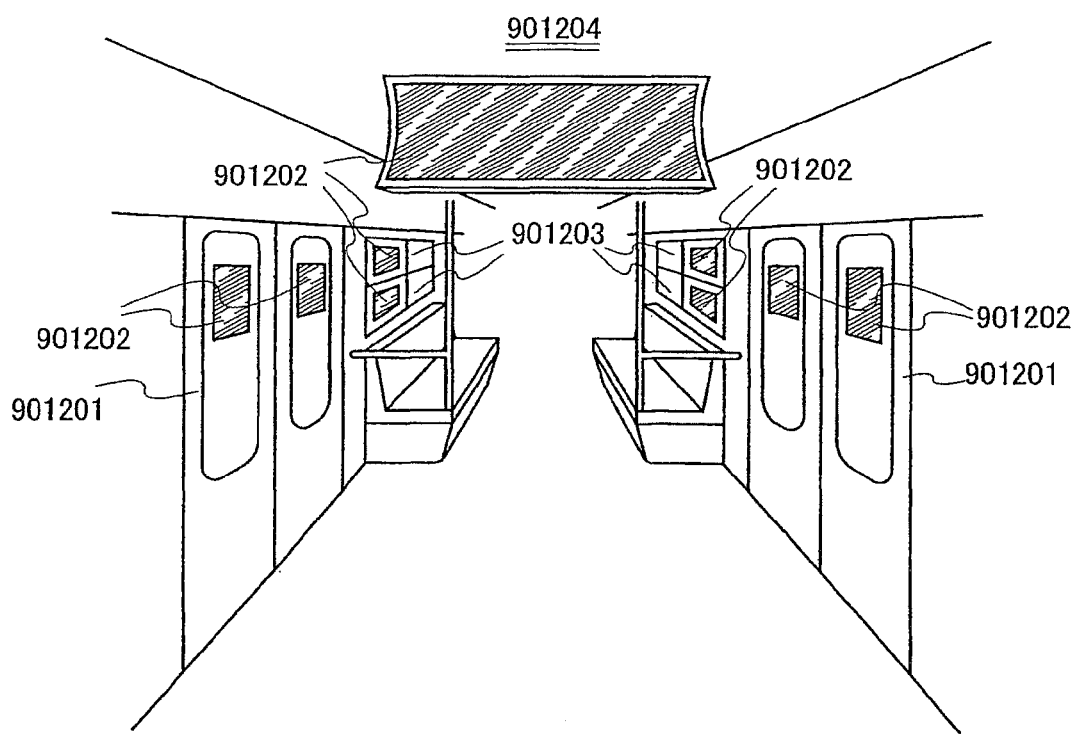

FIGS. 100A and 100B show examples where a semiconductor device is incorporated with a train car are described.

FIG. 100A shows an example where a display panel 901202 is provided in glass of a door 901201 in a train car, which has an advantage compared with a conventional advertisement using paper in that labor cost for changing an advertisement is not necessary. Since the display panel 901202 can instantly switch images displaying on a display portion by an external signal, images on the display panel can be switched in every time period when types of passengers on the train are changed, for example; thus, more effective advertisement effect can be expected.

FIG. 100B shows an example where the display panels 901202 are provided to a glass window 901203 and a ceiling 901204 as well as the glass of the door 901201 in the train car. In this manner, the semiconductor device can be easily provided to a place where the semiconductor device has been difficult to be provided conventionally; thus, effective advertisement effect can be obtained. Further, the semiconductor device can instantly switch images displayed on a display portion by an external signal; thus, cost and time for changing an advertisement can be reduced, and more flexible advertisement management and information transmission can be realized.

The semiconductor device can be provided not only to the door 901201, the glass window 901203, and the ceiling 901204 as shown in FIG. 100, but also to various places. For example, the semiconductor device can be incorporated with a strap, a seat, a handrail, a floor, and the like. At this time, a shape of the display panel 901202 may be changed in accordance with a shape of an object provided with the semiconductor device.

Figure 101A:
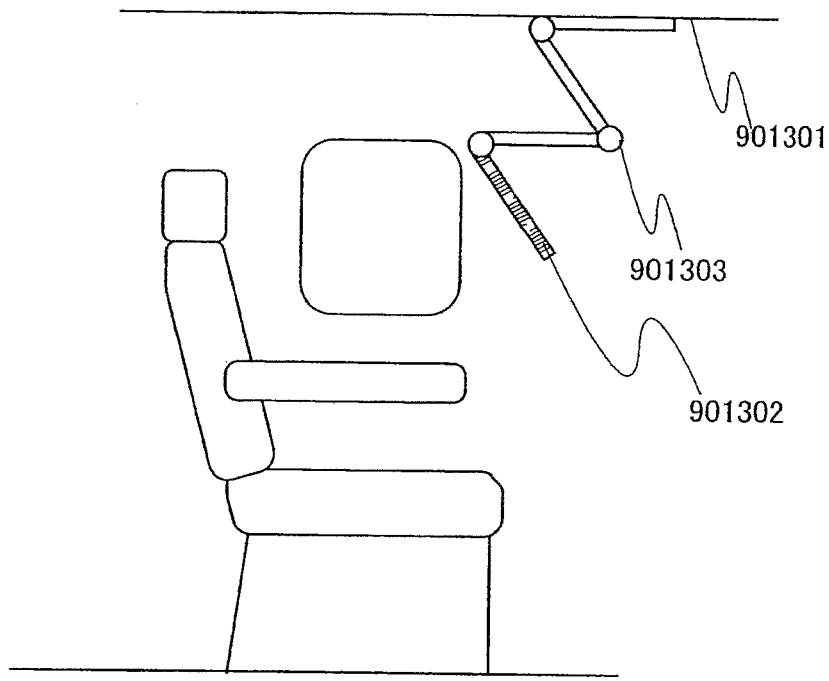
FIGS. 101A and 101B are views each showing an electronic device using a semiconductor device in accordance with the present invention.
Figure 101B:
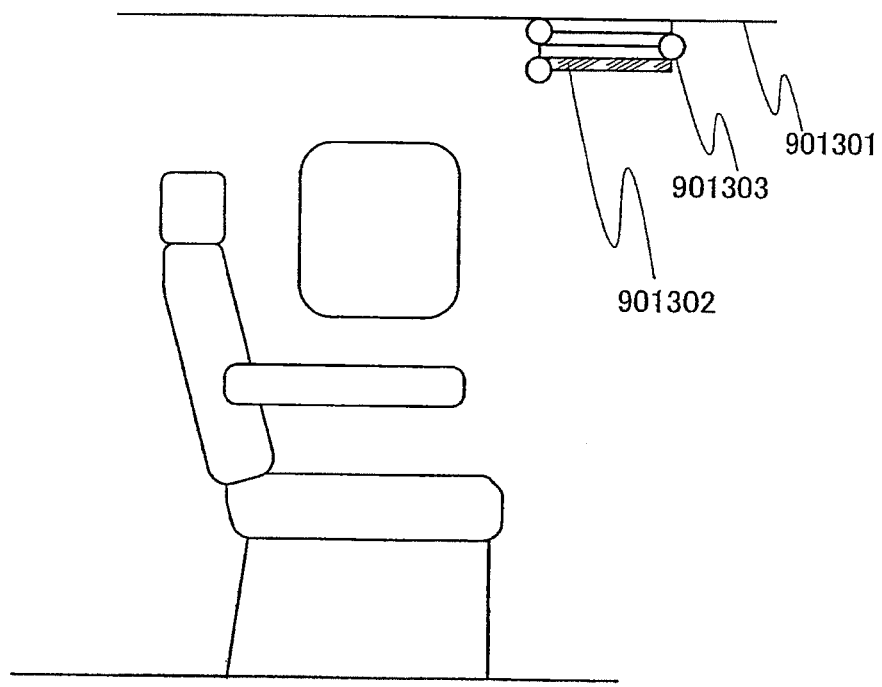

FIGS. 101A and 101B show an example where a semiconductor device is incorporated with a passenger airplane.

FIG. 101A shows a shape of a display panel 901302 attached to a ceiling 901301 above a seat of the passenger airplane when the display panel 901302 is used. The display panel 901302 is incorporated with the ceiling 901301 using a hinge portion 901303, and the passenger can view the display panel 901302 by stretching of the hinge portion 901303. The display panel 901302 has a function to display information by an operation by the passenger and a function to be used as an advertisement or an entertainment means. In addition, when the hinge portion is bent and put in the ceiling 901301 of the airplane as shown in FIG. 101B, safety in taking-off and landing can be assured. Note that when a display element in the display panel is lit in an emergency, the display panel can also be used as an information transmission means and an evacuation light.

The semiconductor device can be provided not only to the ceiling 901301 as shown in FIGS. 101A and 101B, but also to various places. For example, the semiconductor device can be incorporated with a seat, a table attached to a seat, an armrest, a window, and the like. A large display panel which a large number of people can view may be provided at a wall of an airframe. At this time, a shape of the display panel 901302 may be changed in accordance with a shape of an object provided with the semiconductor device.

Note that in this embodiment mode, bodies of a train car, a car, and an airplane are shown as a moving object; however, the invention is not limited thereto, and a semiconductor device can be provided to various objects such as a motorcycle, an four-wheel drive car (including a car, a bus, and the like), a train (including a monorail, a railroad car, and the like), and a vessel. Since a semiconductor device can instantly switch images displayed on a display panel in a moving object by an external signal, a moving object is provided with the semiconductor device, so that the moving object can be used as an advertisement display board for an unspecified number of customers, an information display board in disaster, and the like.

Although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

[Embodiment Mode 21]

As described above, the following inventions are at least included in this specification.

A liquid crystal display device includes a pixel having a liquid crystal element, and a driver circuit. The driver circuit includes a first transistor, a second transistor, a third transistor, a fourth transistor, a fifth transistor, a sixth transistor, a seventh transistor, and an eighth transistor. A first electrode of the first transistor is electrically connected to a fourth wiring and a second electrode of the first transistor is electrically connected to a third wiring. A first electrode of the second transistor is electrically connected to a seventh wiring; a second electrode of the second transistor is electrically connected to the third wiring; and a gate electrode of the second transistor is electrically connected to a fifth wiring. A first electrode of the third transistor is electrically connected to a sixth wiring; a second electrode of the third transistor is electrically connected to a gate electrode of the sixth transistor; and a gate electrode of the third transistor is electrically connected to the fourth wiring. A first electrode of the fourth transistor is electrically connected to the seventh wiring; a second electrode of the fourth transistor is electrically connected to the gate electrode of the sixth transistor; and a gate electrode of the fourth transistor is electrically connected to the fifth wiring. A first electrode of the fifth transistor is electrically connected to the sixth wiring; a second electrode of the fifth transistor is electrically connected to a gate electrode of the first transistor; and a gate electrode of the fifth transistor is electrically connected to a first wiring. A first electrode of the sixth transistor is electrically connected to the seventh wiring and a second electrode of the sixth transistor is electrically connected to the gate electrode of the first transistor. A first electrode of the seventh transistor is electrically connected to the seventh wiring; a second electrode of the seventh transistor is electrically connected to the gate electrode of the first transistor; and a gate electrode of the seventh transistor is electrically connected to a second wiring. A first electrode of the eighth transistor is electrically connected to the seventh wiring; a second electrode of the eighth transistor is electrically connected to the gate electrode of the sixth transistor; and a gate electrode of the eighth transistor is electrically connected to the gate electrode of the first transistor.

In the above-described structure, the first transistor can be formed so as to have the largest value of W/L (a ratio of a channel width W to a channel length L) among the first to eighth transistors. In addition, the value of W/L of the first transistor may be twice to five times a value of W/L of the fifth transistor. Further, channel length L of the third transistor may be longer than channel length L of the eighth transistor. Furthermore, a capacitor may be provided between the second electrode and the gate electrode of the first transistor. Moreover, the first to eighth transistors may be N-channel transistors. The first to eighth transistors may be formed by using amorphous silicon.

A liquid crystal display device includes a pixel having a liquid crystal element, a first driver circuit, and a second driver circuit. The first driver circuit includes a first transistor, a second transistor, a third transistor, a fourth transistor, a fifth transistor, a sixth transistor, a seventh transistor, and an eighth transistor. A first electrode of the first transistor is electrically connected to a fourth wiring and a second electrode of the first transistor is electrically connected to a third wiring. A first electrode of the second transistor is electrically connected to a seventh wiring; a second electrode of the second transistor is electrically connected to the third wiring; and a gate electrode of the second transistor is electrically connected to a fifth wiring. A first electrode of the third transistor is electrically connected to a sixth wiring; a second electrode of the third transistor is electrically connected to a gate electrode of the sixth transistor; and a gate electrode of the third transistor is electrically connected to the fourth wiring. A first electrode of the fourth transistor is electrically connected to the seventh wiring; a second electrode of the fourth transistor is electrically connected to the gate electrode of the sixth transistor; and a gate electrode of the fourth transistor is electrically connected to the fifth wiring. A first electrode of the fifth transistor is electrically connected to the sixth wiring; a second electrode of the fifth transistor is electrically connected to a gate electrode of the first transistor; and a gate electrode of the fifth transistor is electrically connected to a first wiring. A first electrode of the sixth transistor is electrically connected to the seventh wiring and a second electrode of the sixth transistor is electrically connected to the gate electrode of the first transistor. A first electrode of the seventh transistor is electrically connected to the seventh wiring; a second electrode of the seventh transistor is electrically connected to the gate electrode of the first transistor; and a gate electrode of the seventh transistor is electrically connected to a second wiring. A first electrode of the eighth transistor is electrically connected to the seventh wiring; a second electrode of the eighth transistor is electrically connected to the gate electrode of the sixth transistor; and a gate electrode of the eighth transistor is electrically connected to the gate electrode of the first transistor. The second driver circuit includes a ninth transistor, a tenth transistor, an eleventh transistor, a twelfth transistor, a thirteenth transistor, a fourteenth transistor, a fifteenth transistor, and a sixteenth transistor. A first electrode of the ninth transistor is electrically connected to an eleventh wiring and a second electrode of the ninth transistor is electrically connected to a tenth wiring. A first electrode of the tenth transistor is electrically connected to a fourteenth wiring; a second electrode of the tenth transistor is electrically connected to the tenth wiring; and a gate electrode of the tenth transistor is electrically connected to a twelfth wiring. A first electrode of the eleventh transistor is electrically connected to a thirteenth wiring; a second electrode of the eleventh transistor is electrically connected to a gate electrode of the fourteenth transistor; and a gate electrode of the eleventh transistor is electrically connected to the eleventh wiring. A first electrode of the twelfth transistor is electrically connected to the fourteenth wiring; a second electrode of the twelfth transistor is electrically connected to the gate electrode of the fourteenth transistor; and a gate electrode of the twelfth transistor is electrically connected to the twelfth wiring. A first electrode of the thirteenth transistor is electrically connected to the thirteenth wiring; a second electrode of the thirteenth transistor is electrically connected to a gate electrode of the ninth transistor; and a gate electrode of the thirteenth transistor is electrically connected to an eighth wiring. A first electrode of the fourteenth transistor is electrically connected to the fourteenth wiring and a second electrode of the fourteenth transistor is electrically connected to the gate electrode of the ninth transistor. A first electrode of the fifteenth transistor is electrically connected to the fourteenth wiring; a second electrode of the fifteenth transistor is electrically connected to the gate electrode of the ninth transistor; and a gate electrode of the fifteenth transistor is electrically connected to a ninth wiring. A first electrode of the sixteenth transistor is electrically connected to the fourteenth wiring; a second electrode of the sixteenth transistor is electrically connected to the gate electrode of the fourteenth transistor; and a gate electrode of the sixteenth transistor is electrically connected to the gate electrode of the ninth transistor.

The fourth wiring and the eleventh wiring may be electrically connected; the fifth wiring and the twelfth wiring may be electrically connected; the sixth wiring and the thirteenth wiring may be electrically connected; and the seventh wiring and the fourteenth wiring may be electrically connected. The fourth wiring and the eleventh wiring may be the same wiring; the fifth wiring and the twelfth wiring may be the same wiring; the sixth wiring and the thirteenth wiring may be the same wiring; and the seventh wiring and the fourteenth wiring may be the same wiring. The third wiring and the tenth wiring may be electrically connected. The third wiring and the tenth wiring may be the same wiring. In addition, The first transistor may be formed so as to have the largest value of W/L (a ratio of a channel width W to a channel length L) among the first to eighth transistors, and the ninth transistor may be formed so as to have the largest value of W/L (a ratio of a channel width W to a channel length L) among the ninth to sixteenth transistors. Further, the value of W/L of the first transistor may be twice to five times a value of W/L of the fifth transistor, and the value of W/L of the ninth transistor may be twice to five times a value of W/L of the twelfth transistor. Furthermore, channel length L of the third transistor may be longer than channel length L of the eighth transistor, and channel length L of the eleventh transistor may be longer than channel length L of the sixteenth transistor. Moreover, a capacitor may be provided between the second electrode and the gate electrode of the first transistor, and a capacitor may be provided between the second electrode and the gate electrode of the ninth transistor. The first to sixteenth transistors may be N-channel transistors. The first to sixteenth transistors may use amorphous silicon as semiconductor layers.

Each of the liquid crystal display device shown in this embodiment mode corresponds to the liquid crystal display device described in this specification. Therefore, operation effects which are similar to those of other embodiment modes is obtained.

This application is based on Japanese Patent Application serial No. 2006-270016 filed in Japan Patent Office on Sep. 29, 2006, the entire contents of which are hereby incorporated by reference.

What is claimed is:
1. A semiconductor device comprising:
 a pixel portion formed over a substrate;
 a scan line driver circuit formed over the substrate, the scan line driver circuit comprising:
  a shift register comprising:
   an output terminal;
   a first transistor;
   a second transistor;
   a third transistor;
   a fourth transistor;
   a fifth transistor;
   a sixth transistor;
   a seventh transistor; and
   an eighth transistor;
 a first switch formed over the substrate; and
 a second switch formed over the substrate,
 wherein one of a source and a drain of the first transistor is directly connected to the output terminal,
 wherein one of a source and a drain of the second transistor is directly connected to the output terminal,
 wherein one of a source and a drain of the third transistor is directly connected to one of a source and a drain of the fourth transistor,
 wherein a gate of the fourth transistor is directly connected to a gate of the second transistor, wherein one of a source and a drain of the fifth transistor is directly connected to a gate of the first transistor,
wherein one of a source and a drain of the sixth transistor is directly connected to the gate of the first transistor,
wherein a gate of the sixth transistor is directly connected to the one of the source and the drain of the third transistor,
wherein one of a source and a drain of the seventh transistor is directly connected to the gate of the first transistor,
wherein one of a source and a drain of the eighth transistor is directly connected to the one of the source and the drain of the third transistor,
wherein a gate of the eighth transistor is directly connected to the gate of the first transistor,
wherein a gate of the fifth transistor is directly connected to the other of the source and the drain of the fifth transistor,
wherein a clock signal is input to a gate of the third transistor,
wherein the output terminal is operationally connected to a scan line,
wherein a wiring is electrically connected to a first signal line via the first switch,
wherein the wiring is electrically connected to a second signal line via the second switch,
wherein the wiring is electrically connectable to a driver IC, and
wherein the second transistor comprises a channel region comprising an oxide semiconductor.

2. The semiconductor device according to claim 1, wherein the oxide semiconductor comprises In and Zn.

3. The semiconductor device according to claim 2, wherein the oxide semiconductor comprises InGaZnO.

4. The semiconductor device according to claim 3, wherein the oxide semiconductor comprises a-InGaZnO.

5. The semiconductor device according to claim 1,
wherein the clock signal is input to the other of the source and the drain of the first transistor, and
wherein an inverted signal of the clock signal is input to a gate of the second transistor.

6. A semiconductor device comprising:
a pixel portion formed over a substrate;
a scan line driver circuit formed over the substrate, the scan line driver circuit comprising:
    a shift register comprising:
        an output terminal;
        a first transistor;
        a second transistor;
        a third transistor;
        a fourth transistor;
        a fifth transistor;
        a sixth transistor;
        a seventh transistor; and
        an eighth transistor; and
a signal line driver circuit comprising:
    a first switch formed over the substrate;
    a second switch formed over the substrate; and
    a driver IC formed by utilizing a single crystalline substrate,
wherein one of a source and a drain of the first transistor is directly connected to the output terminal,
wherein one of a source and a drain of the second transistor is directly connected to the output terminal,
wherein one of a source and a drain of the third transistor is directly connected to one of a source and a drain of the fourth transistor,
wherein a gate of the fourth transistor is directly connected to a gate of the second transistor,
wherein one of a source and a drain of the fifth transistor is directly connected to a gate of the first transistor,
wherein one of a source and a drain of the sixth transistor is directly connected to the gate of the first transistor,
wherein a gate of the sixth transistor is directly connected to the one of the source and the drain of the third transistor,
wherein one of a source and a drain of the seventh transistor is directly connected to the gate of the first transistor,
wherein one of a source and a drain of the eighth transistor is directly connected to the one of the source and the drain of the third transistor,
wherein a gate of the eighth transistor is directly connected to the gate of the first transistor,
wherein a gate of the fifth transistor is directly connected to the other of the source and the drain of the fifth transistor,
wherein a clock signal is input to a gate of the third transistor,
wherein the output terminal is operationally connected to a scan line,
wherein a wiring is electrically connected to a first signal line via the first switch,
wherein the wiring is electrically connected to a second signal line via the second switch,
wherein the wiring is electrically connected to the driver IC, and
wherein the second transistor comprises a channel region comprising an oxide semiconductor.

7. The semiconductor device according to claim 6, wherein the oxide semiconductor comprises In and Zn.

8. The semiconductor device according to claim 7, wherein the oxide semiconductor comprises InGaZnO.

9. The semiconductor device according to claim 8, wherein the oxide semiconductor comprises a-InGaZnO.

10. The semiconductor device according to claim 6,
wherein the clock signal is input to the other of the source and the drain of the first transistor, and
wherein an inverted signal of the clock signal is input to a gate of the second transistor.

11. A semiconductor device comprising:
a pixel portion formed over a substrate; and
a scan line driver circuit formed over the substrate, the scan line driver circuit comprising:
    a shift register comprising:
        an output terminal;
        a first transistor;
        a second transistor;
        a third transistor;
        a fourth transistor;
        a fifth transistor;
        a sixth transistor;
        a seventh transistor; and
        an eighth transistor,
wherein one of a source and a drain of the first transistor is directly connected to the output terminal,
wherein one of a source and a drain of the second transistor is directly connected to the output terminal,
wherein one of a source and a drain of the third transistor is directly connected to one of a source and a drain of the fourth transistor,
wherein a gate of the fourth transistor is directly connected to a gate of the second transistor,
wherein one of a source and a drain of the fifth transistor is directly connected to a gate of the first transistor,
wherein one of a source and a drain of the sixth transistor is directly connected to the gate of the first transistor, wherein a gate of the sixth transistor is directly connected to the one of the source and the drain of the third transistor, wherein one of a source and a drain of the seventh transistor is directly connected to the gate of the first transistor, wherein one of a source and a drain of the eighth transistor is directly connected to the one of the source and the drain of the third transistor, wherein a gate of the eighth transistor is directly connected to the gate of the first transistor, wherein a gate of the fifth transistor is directly connected to the other of the source and the drain of the fifth transistor, wherein a clock signal is input to a gate of the third transistor, and wherein the second transistor comprises a channel region comprising an oxide semiconductor.

12. The semiconductor device according to claim 11, wherein the oxide semiconductor comprises In and Zn.

13. The semiconductor device according to claim 12, wherein the oxide semiconductor comprises InGaZnO.

14. The semiconductor device according to claim 13, wherein the oxide semiconductor comprises a-InGaZnO.

15. The semiconductor device according to claim 11, wherein the clock signal is input to the other of the source and the drain of the first transistor, and wherein an inverted signal of the clock signal is input to a gate of the second transistor.

* * * * *

UNITED STATES PATENT AND TRADEMARK OFFICE
CERTIFICATE OF CORRECTION

PATENT NO. : 8,743,044 B2
APPLICATION NO. : 13/289100
DATED : June 3, 2014
INVENTOR(S) : Atsushi Umezaki and Hiroyuki Miyake Page 1 of 1

It is certified that error appears in the above-identified patent and that said Letters Patent is hereby corrected as shown below:

In the Specification

Column 22, line 16 – replace "$V24+\beta$" with --$V2+\beta$--;

Column 32, line 4 – replace "1101." with --$1101\_i$.--;

Column 35, line 23 – replace "19026" with --1902b--;

Column 38, line 56 – replace "2401_)" with --2401_n)--;

Column 40, line 32 – replace "2401_41" with --$2401\_i+1$--;

Column 45, line 29 – before "corresponds" replace "y" with --$\gamma$--;

Column 48, line 11 – replace "56213;" with --5621_J;--;

Column 49, line 37 – replace "7-th" with --J-th--;

Column 49, line 46 – replace "5621_7," with --5621_J,--;

Column 54, line 7 – replace "3813," with --38B,--;

Column 56, line 43 – after "46G" insert --,--;

Column 57, line 46 – replace "tower." with --lower.--;

Column 57, line 66 – replace "Or" with --or--;

Column 60, line 16 – replace "(Loft)" with --(Loff)--;

Column 80, line 6 – after "G" insert --,--;

Column 91, line 27 – replace "stacked Layer" with --stacked-layer--;

Column 92, line 8 – replace "AI" with --Al--;

Column 92, line 10 – replace "AI" with --Al--;

Column 100, line 5 – replace "tight-emitting" with --light-emitting--;

Column 101, line 28 – replace "AI" with --Al--;

Column 102, line 39 – replace "(MN)," with --(AlN),--; and

Column 106, line 3 – replace "8213" with --82B--.

Signed and Sealed this
Twenty-fifth Day of August, 2015

Michelle K. Lee
*Director of the United States Patent and Trademark Office*